United States Patent [19]

Putrow et al.

[11] Patent Number: 4,849,744
[45] Date of Patent: Jul. 18, 1989

[54] DIGITAL ENGINE ANALYZER

[75] Inventors: Michael C. Putrow, Kenosha, Wis.; Craig F. Govekar, Gurnee, Ill.

[73] Assignee: Snap-on-Tools Corporation, Kenosha, Wis.

[21] Appl. No.: 88,888

[22] Filed: Oct. 9, 1987

Related U.S. Application Data

[62] Division of Ser. No. 769,150, Aug. 23, 1985.

[51] Int. Cl.$^4$ .............................................. G09G 1/16
[52] U.S. Cl. .................................. 340/721; 340/731; 340/722; 324/378
[58] Field of Search ............... 340/721, 731, 735, 748, 340/750, 722; 324/378, 379

[56] References Cited

U.S. PATENT DOCUMENTS

| | | |
|---|---|---|
| 4,283,724 | 8/1981 | Edwards .......................... 340/731 |
| 4,357,604 | 11/1982 | Imazeki et al. ..................... 340/731 |
| 4,467,323 | 8/1984 | Kling et al. ........................ 340/722 |

Primary Examiner—Gerald L. Brigance
Attorney, Agent, or Firm—Emrich & Dithmar

[57] ABSTRACT

A microprocessor controlled digital engine analyzer receives analog input signals from an engine being analyzed, engine parameter data entered via a keyboard, and function data, selecting one of several operating modes for the analyzer and which information is to be displayed, entered via the keyboard, and displays on a CRT screen the selected information such as cylinder firing order, RPM, Dwell, KV and DC volts, alphanumerically, information such as primary and secondary ignition and voltage, alternator and fuel injector information through the use of continuous waveform patterns, and additional information pertaining to Dwell, KV and Cylinder Shorting through the use of bar graphs. The waveform pattern data derived form the analog input signals is stored in a dual bank waveform memory and read out for display on the CRT screen under hardware control, and address data representing alphanumeric data and screen formats for the various operating modes to be displayed is stored in a dual bank display memory for application to a character generator, a bank switching arrangement being used for both the waveform memory and the display memory to enable the banks of each memory to be alternately written to and read from. A main microprocessor receives and processes analog input signals, other than the waveform pattern signals, and a display microprocessor receives numerical data from the main microprocessor and causes display of the numerical data on the CRT screen.

6 Claims, 66 Drawing Sheets

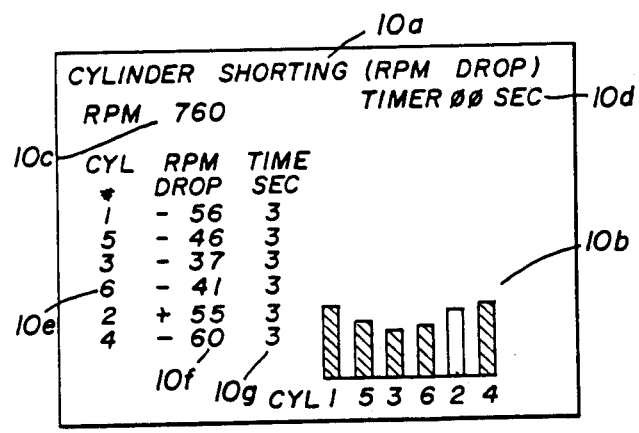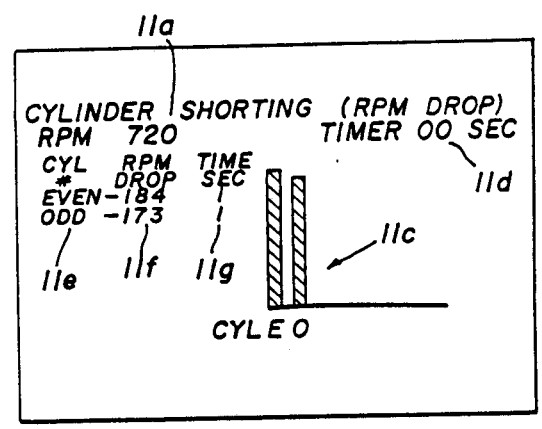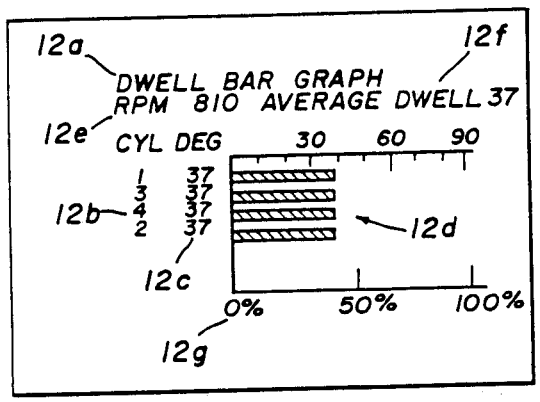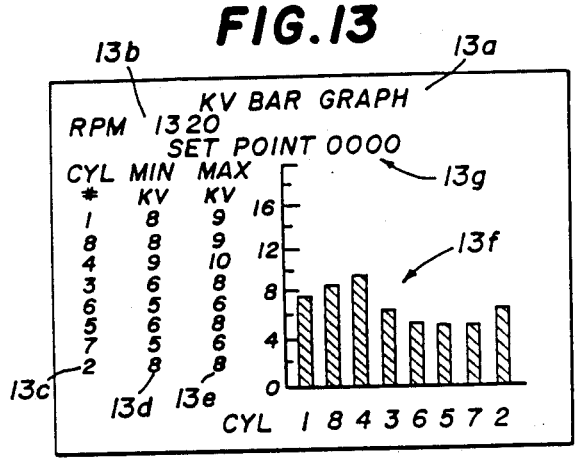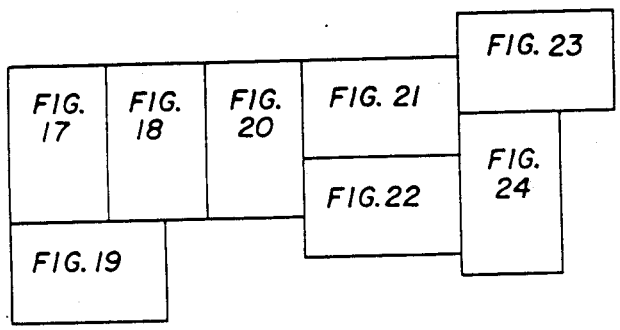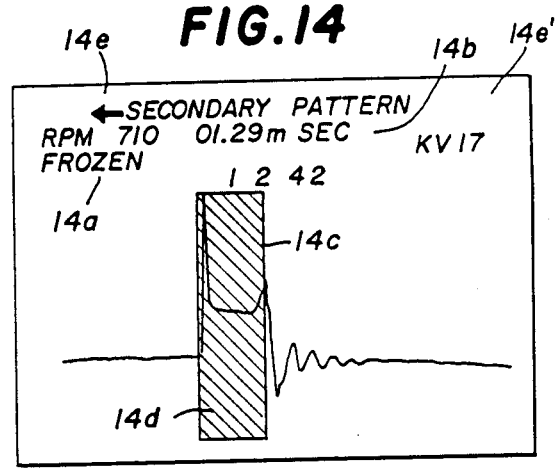

BLANKER CIRCUIT 87

PEAK CONTROL LOGIC 216

MEMORY CONTROL CIRCUITS 160

VCO CLOCK GEN. 204

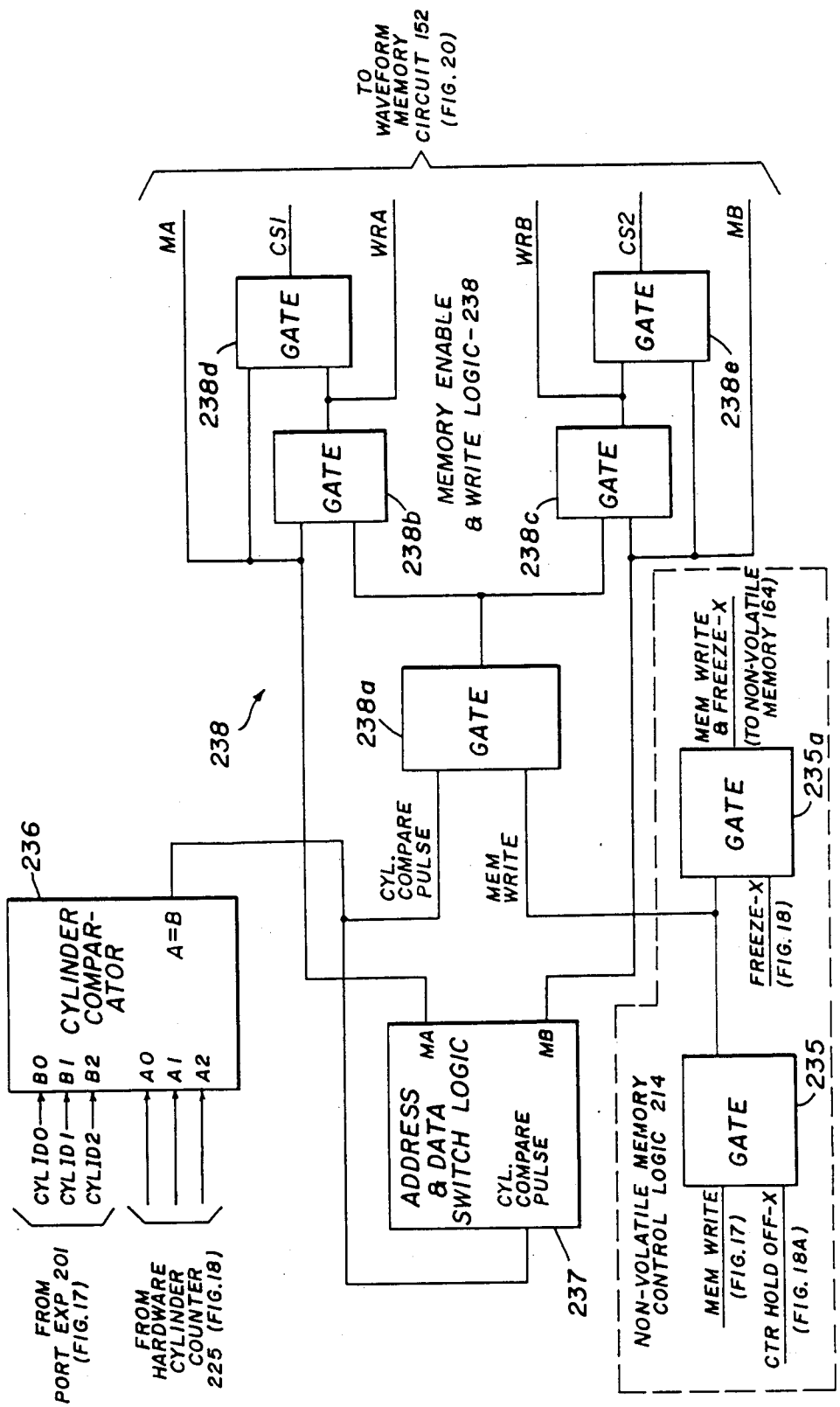

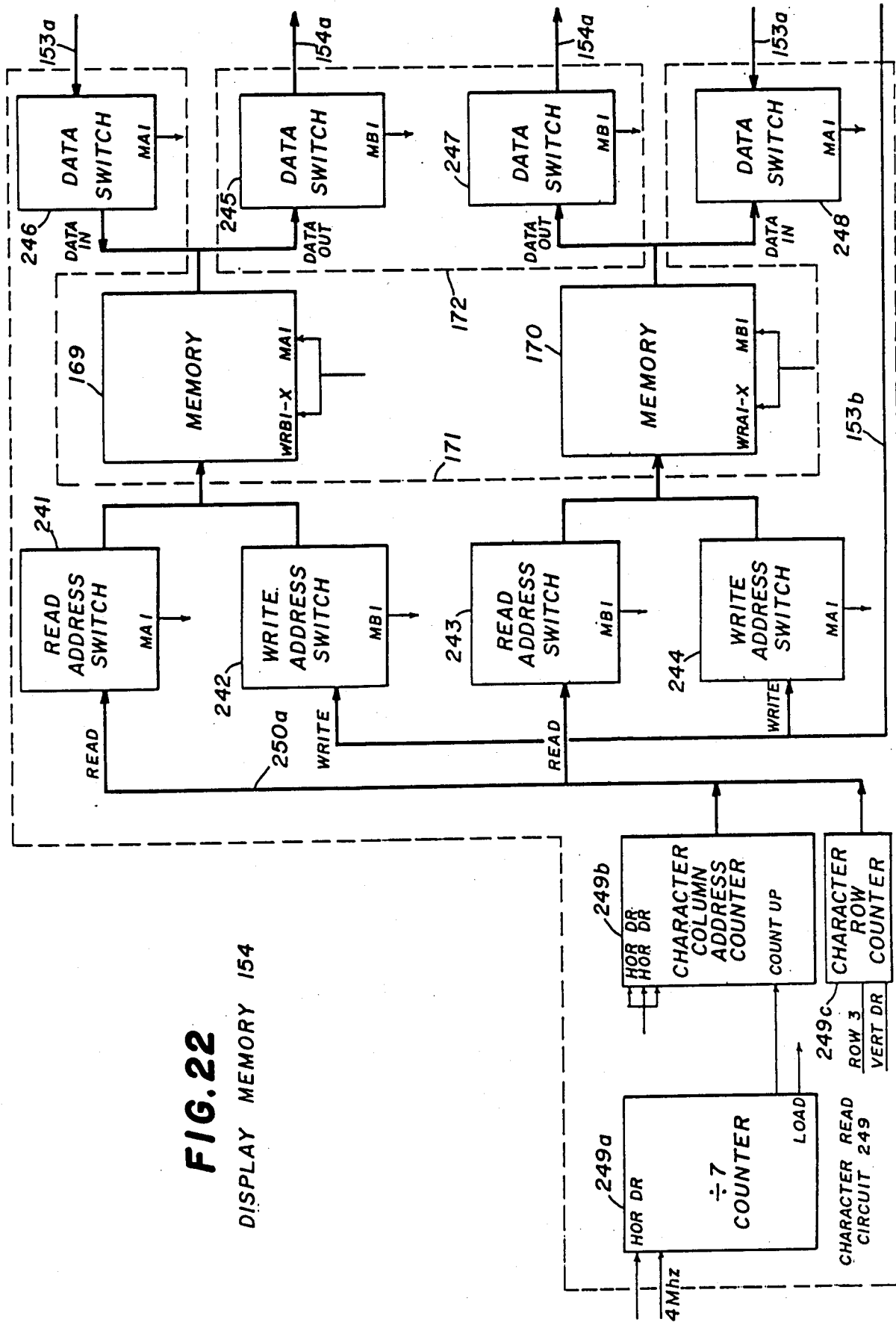

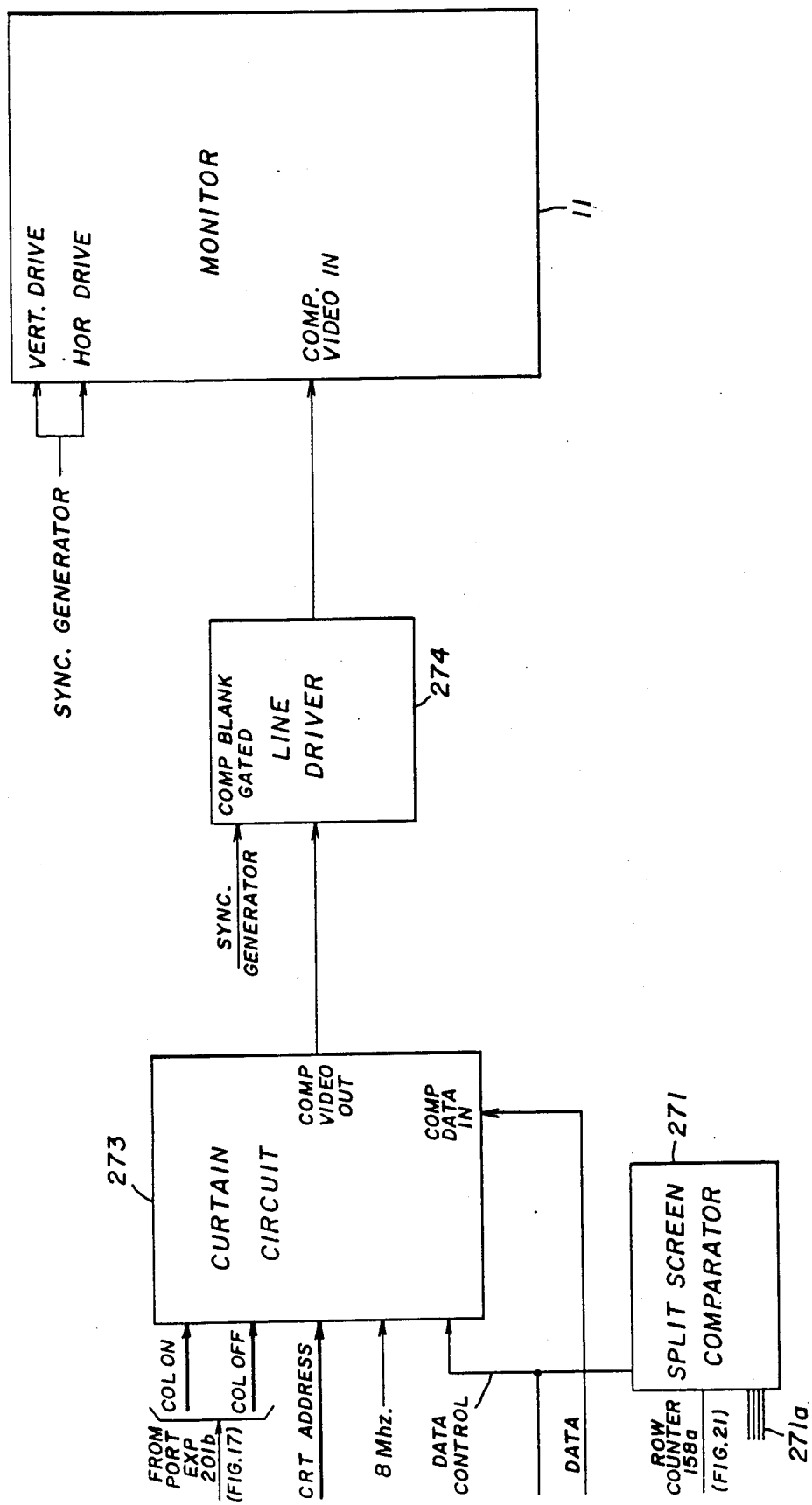

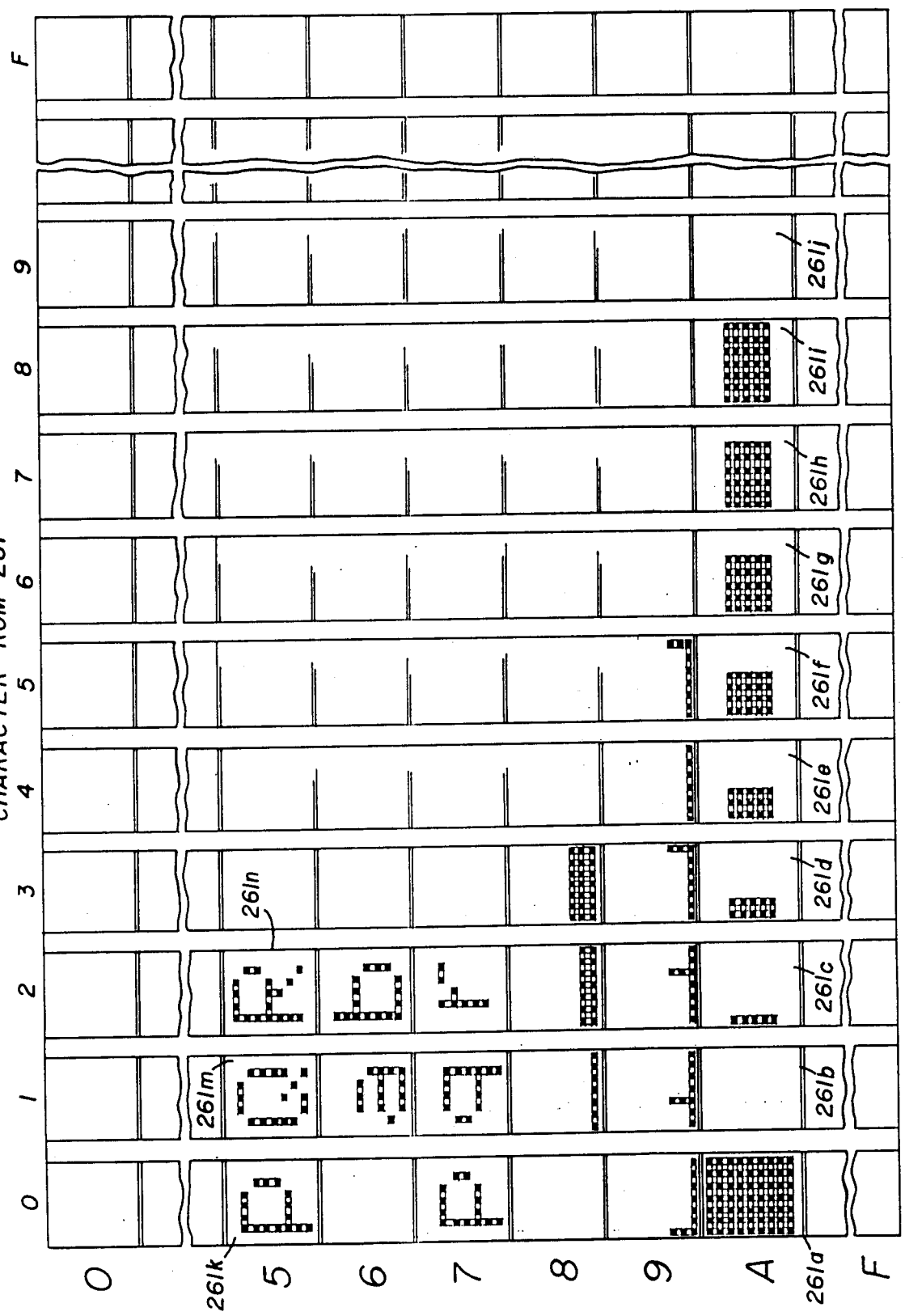
FIG. 23A CHARACTER ROM 261

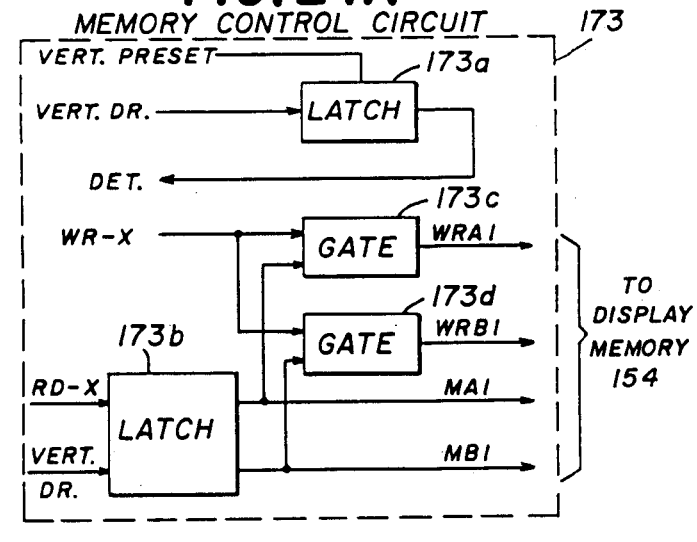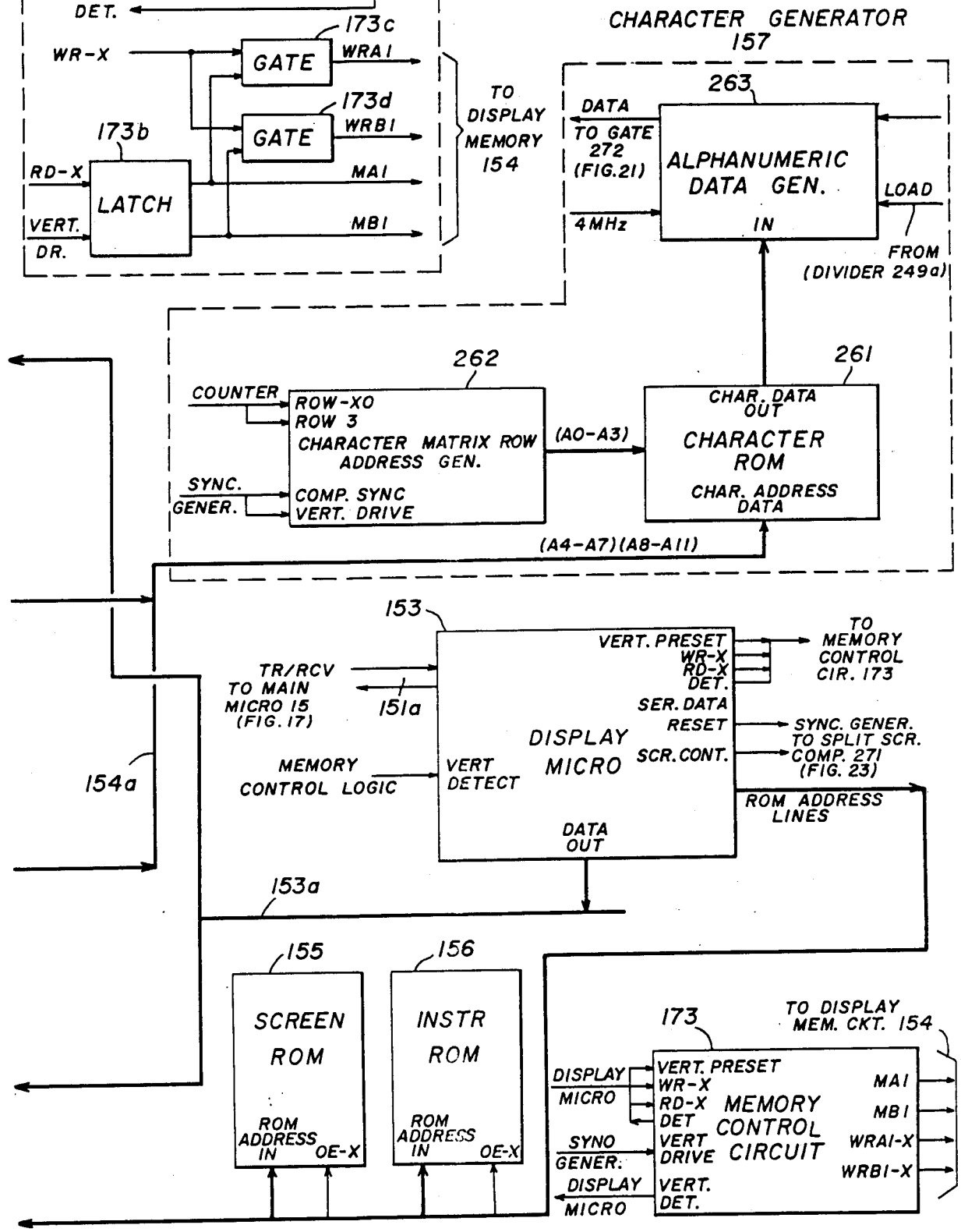

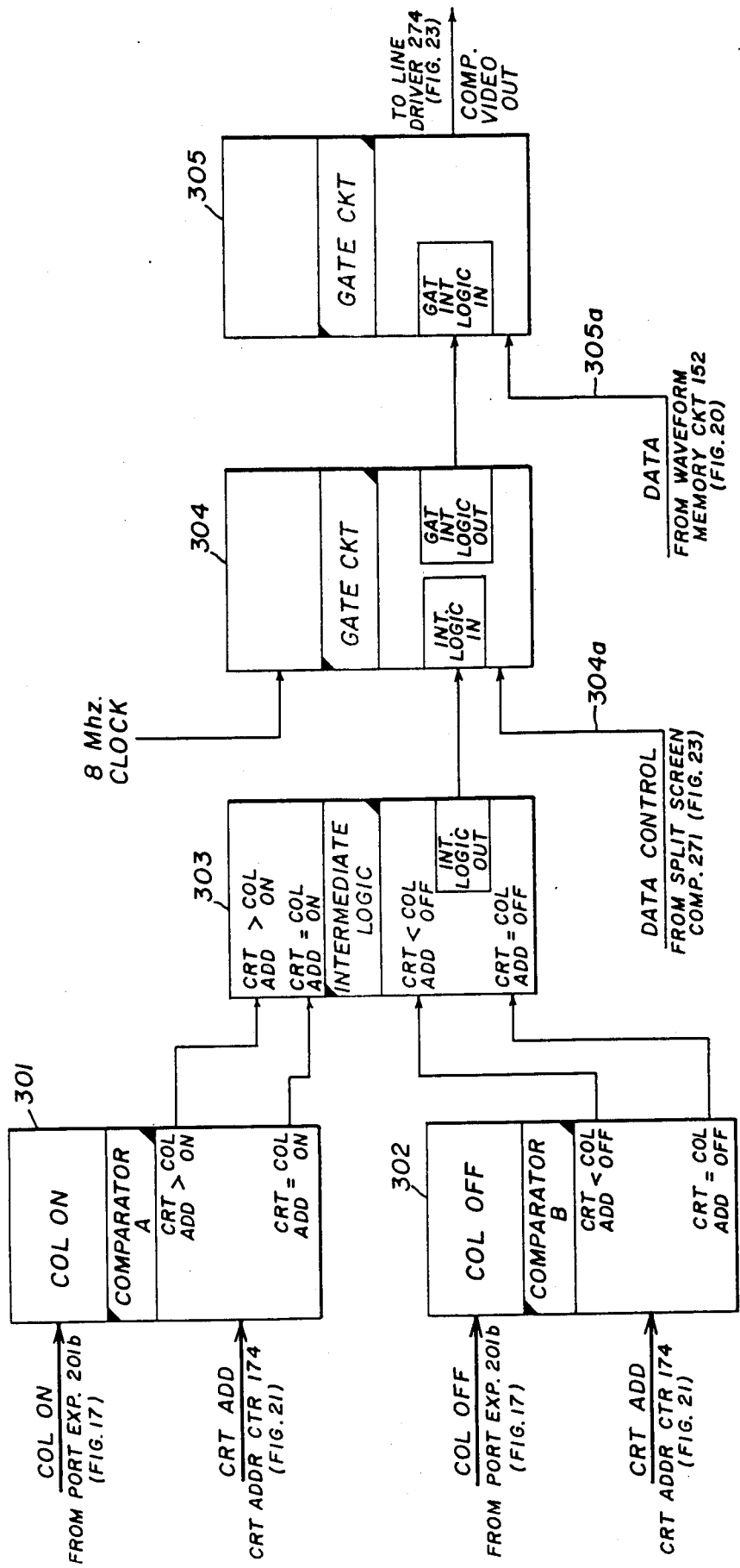

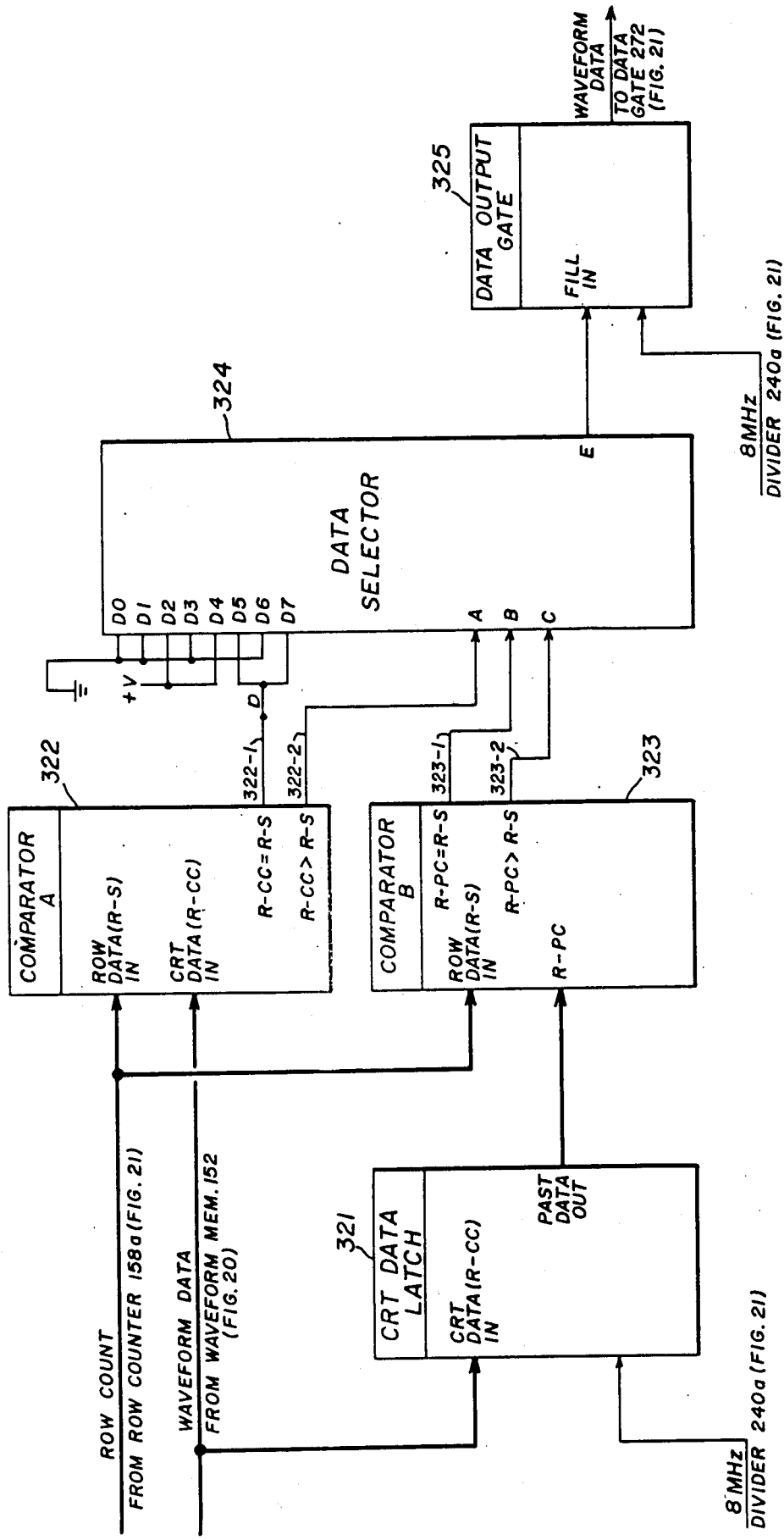

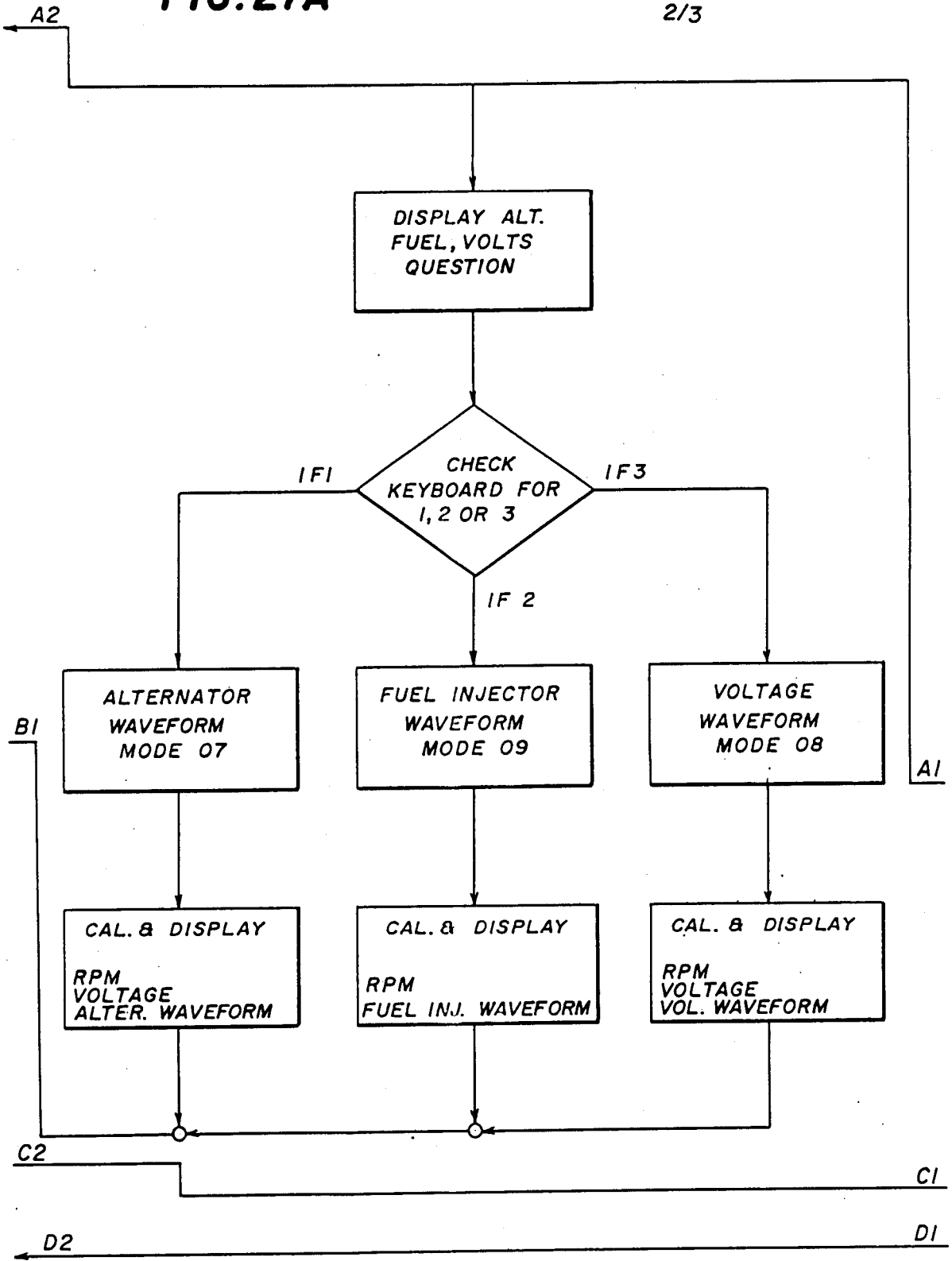
FIG. 27A — MAIN FLOW 2/3

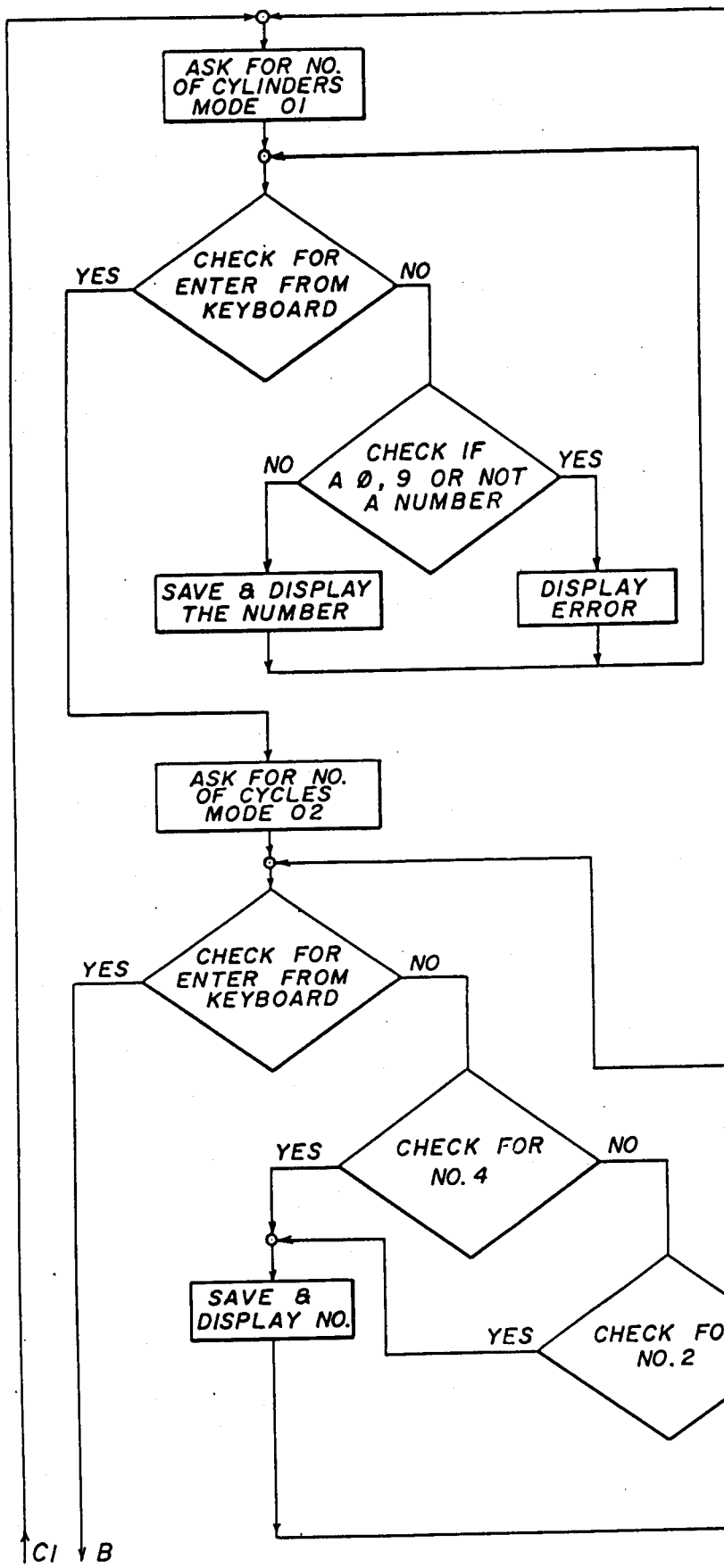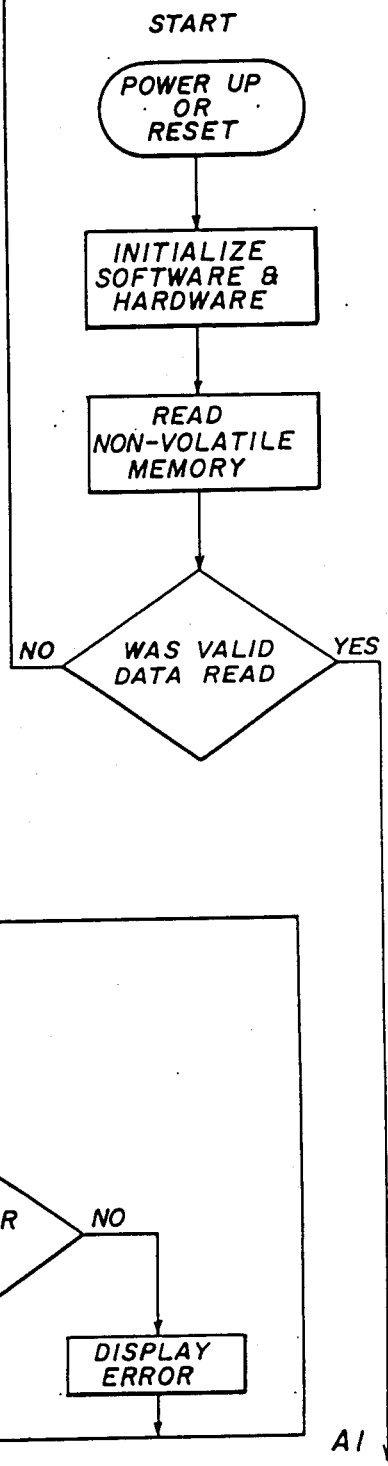
FIG. 28
MODES 00-04
1/3

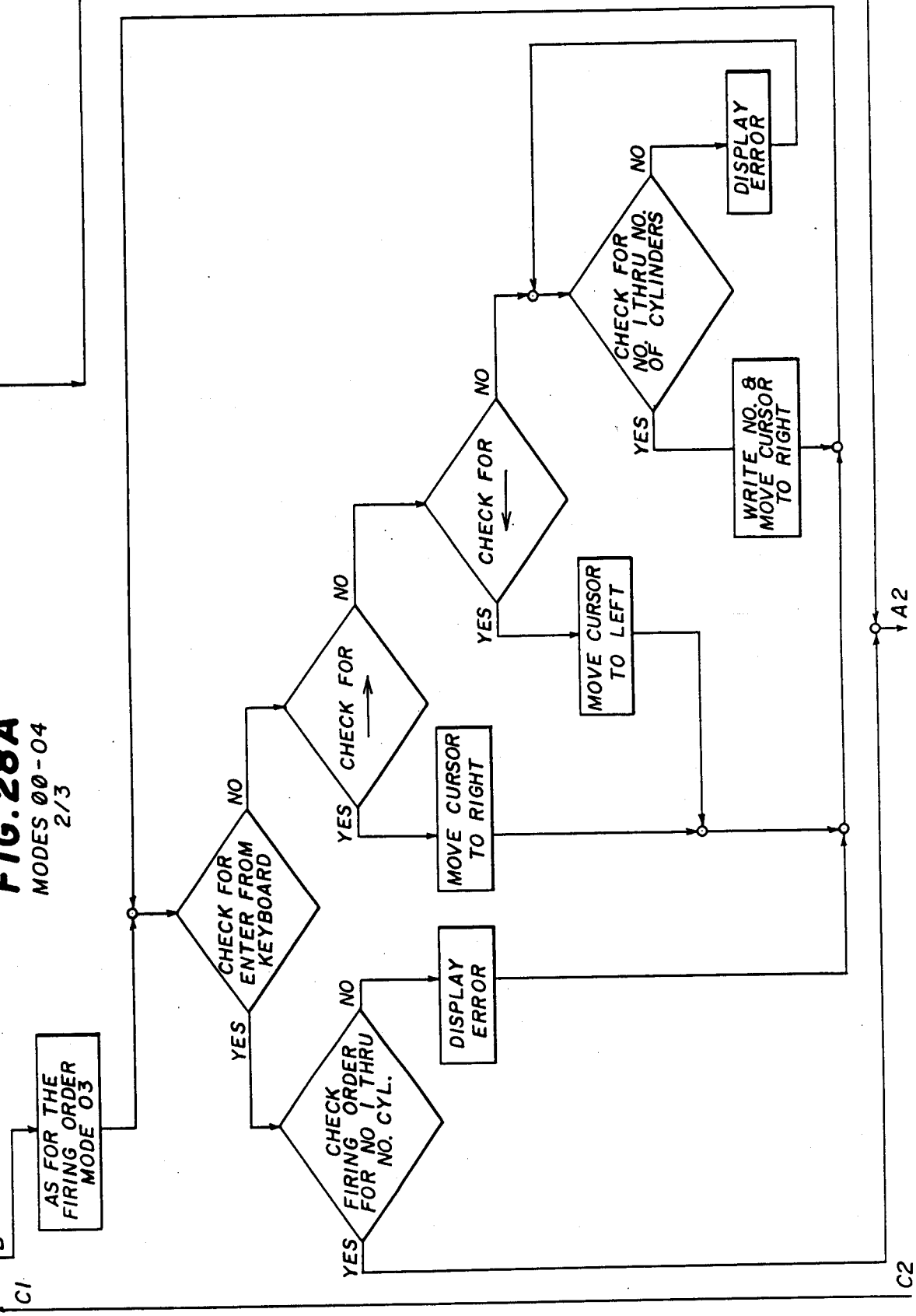

MODES 00-04
3/3

INSTRUCTION (MAIN) 1-1

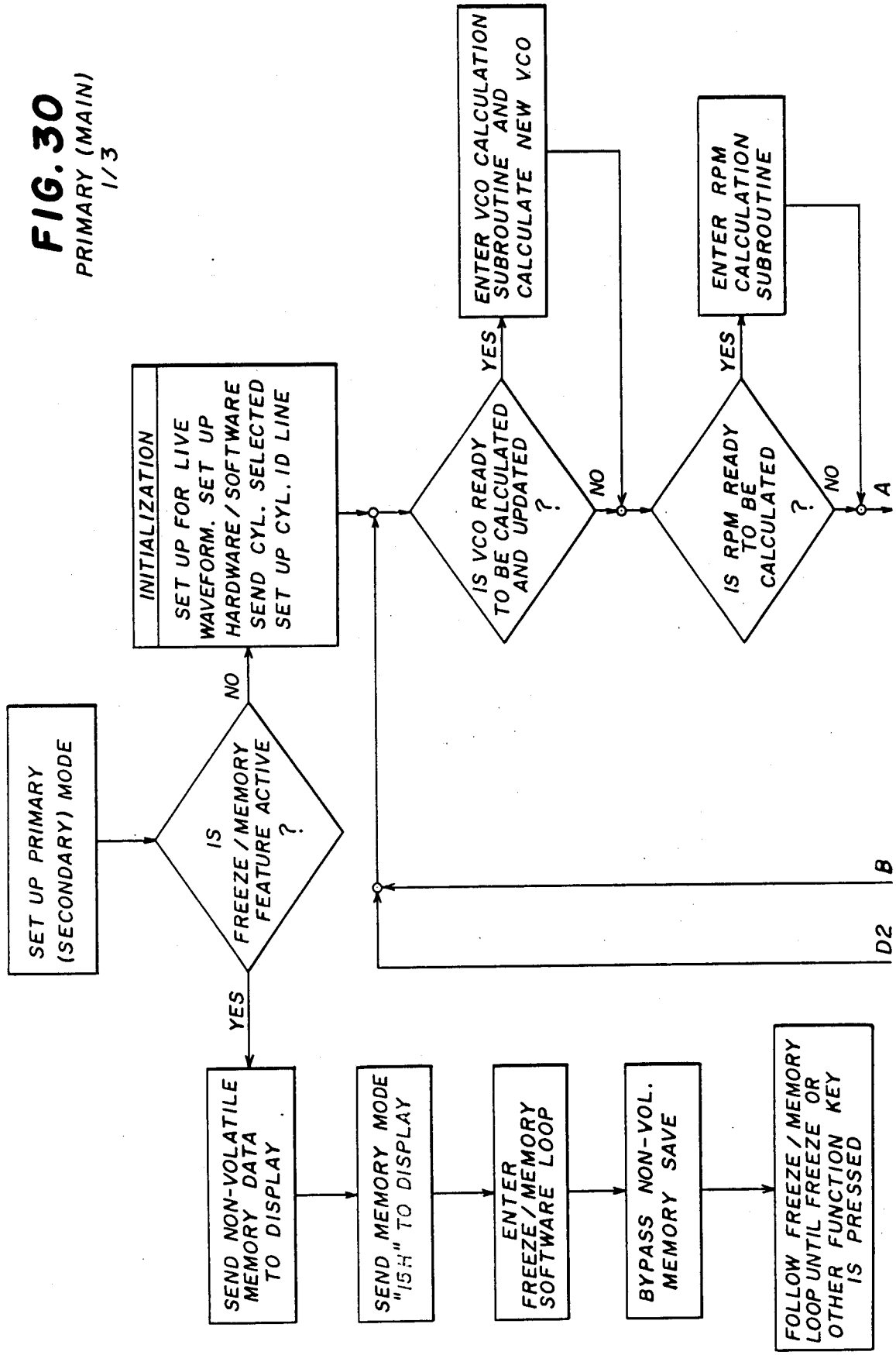

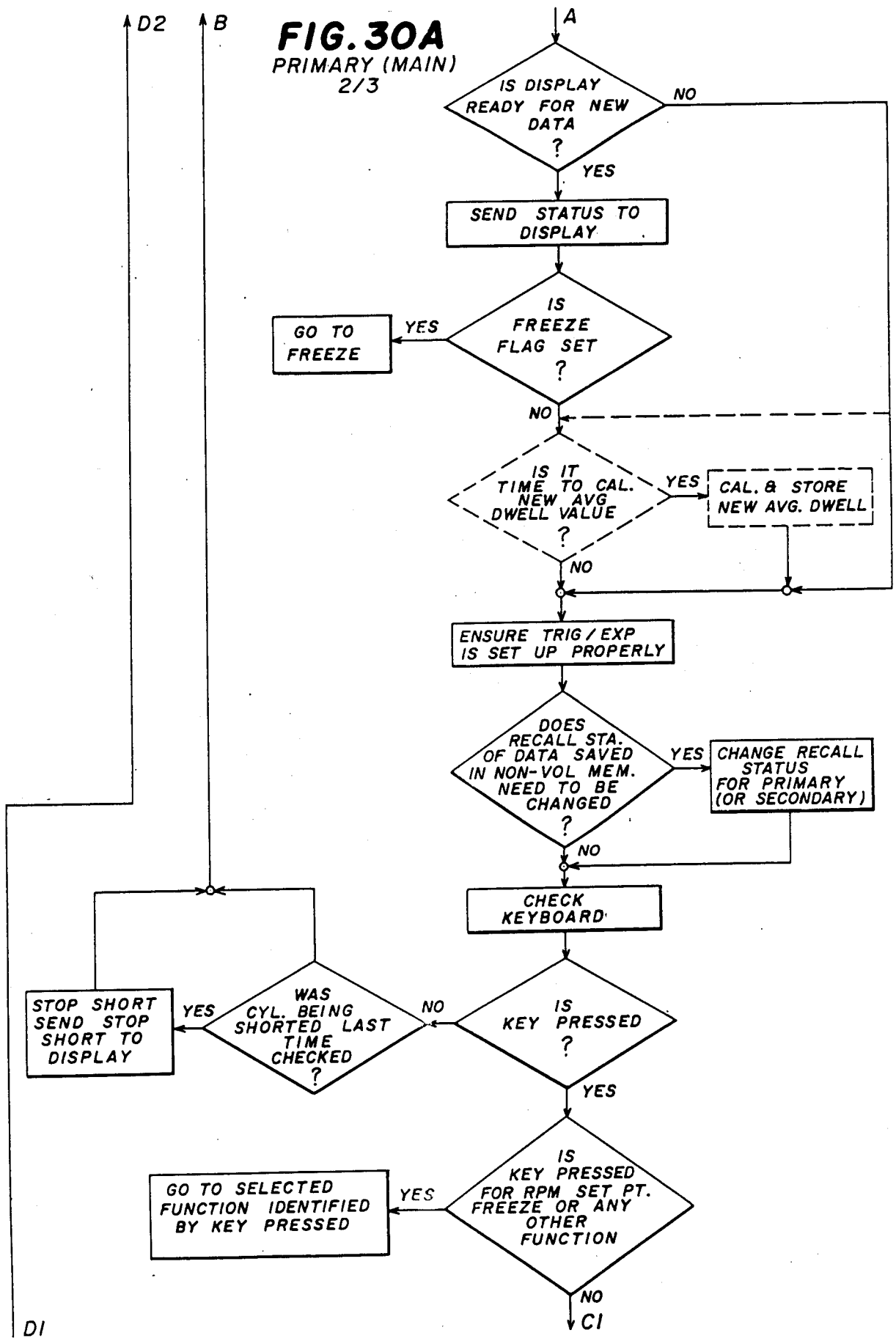

PRIMARY (MAIN)
3/3

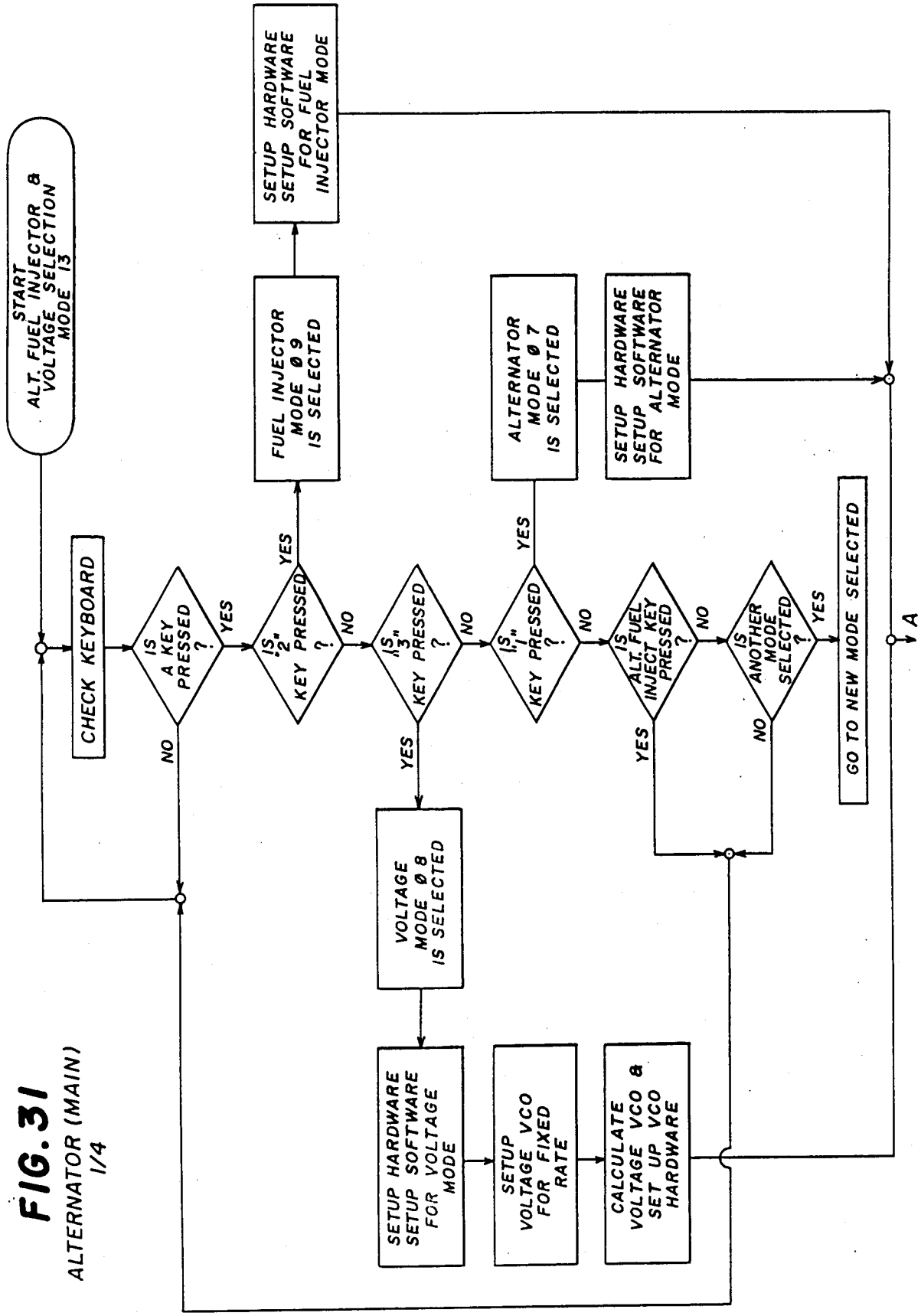
FIG. 31 ALTERNATOR (MAIN) 1/4

ALTERNATOR (MAIN)
2/4

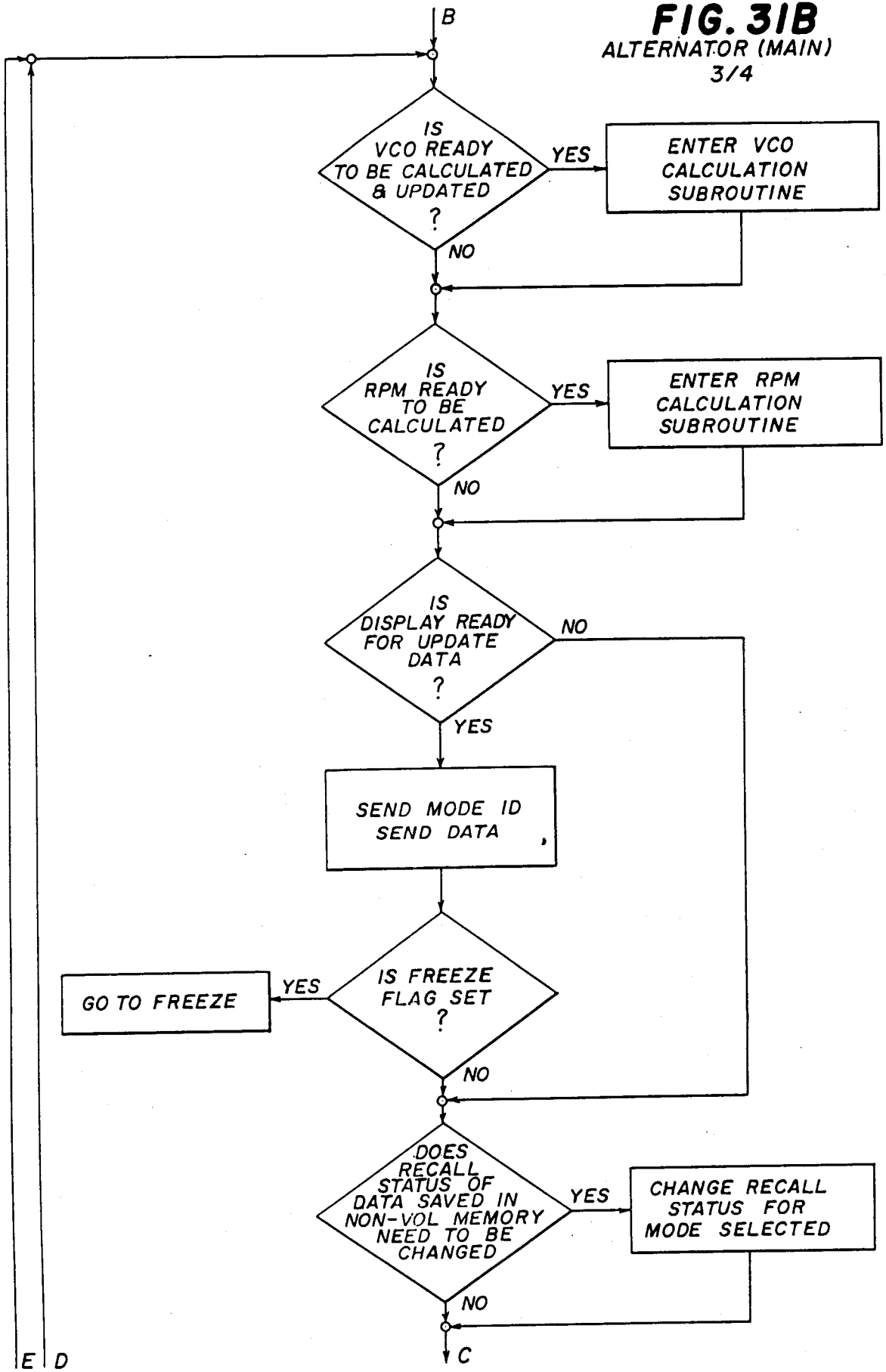

ALTERNATOR
4/4

KV BAR (MAIN)
1/2

KV BAR (MAIN)
2/2

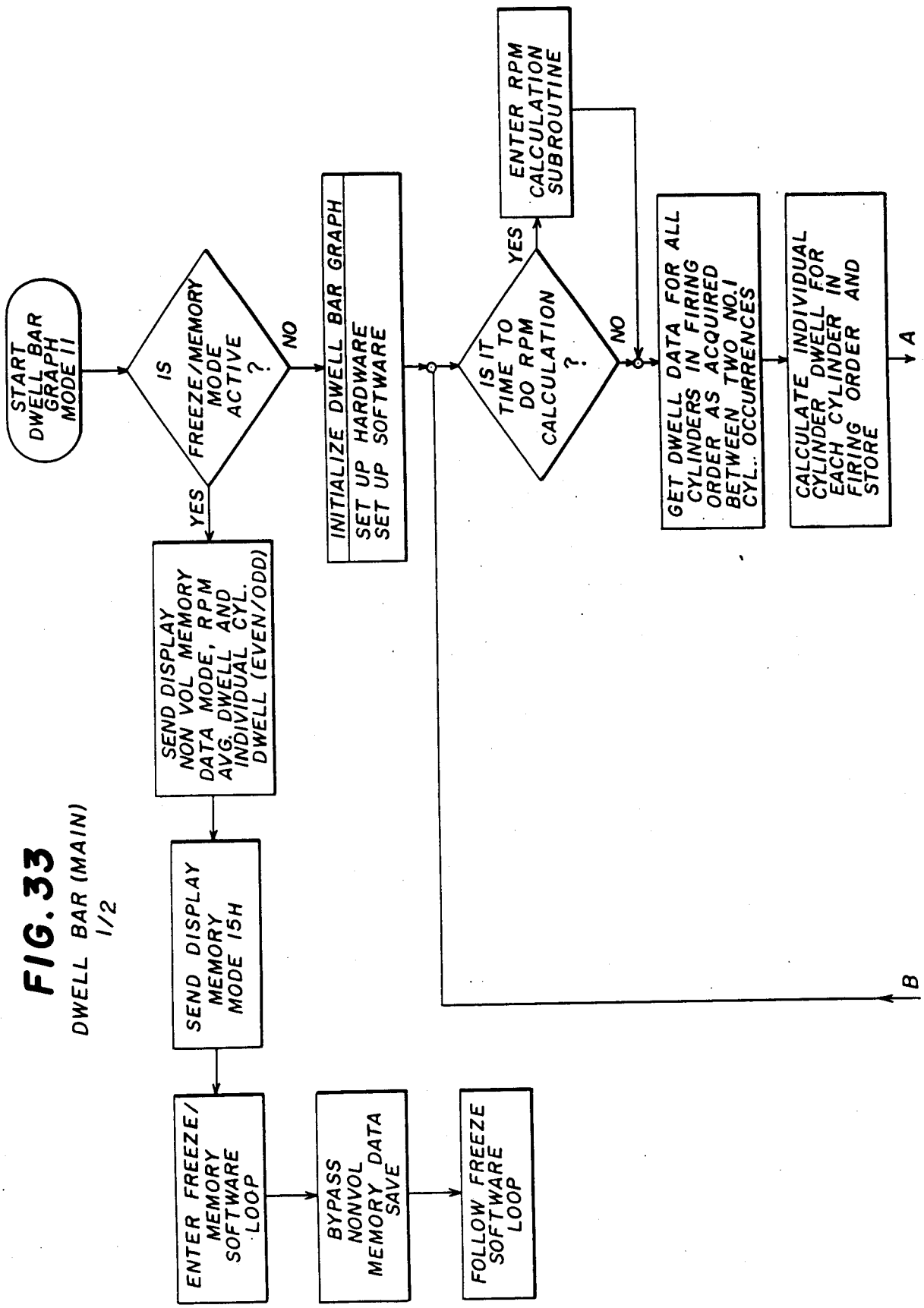

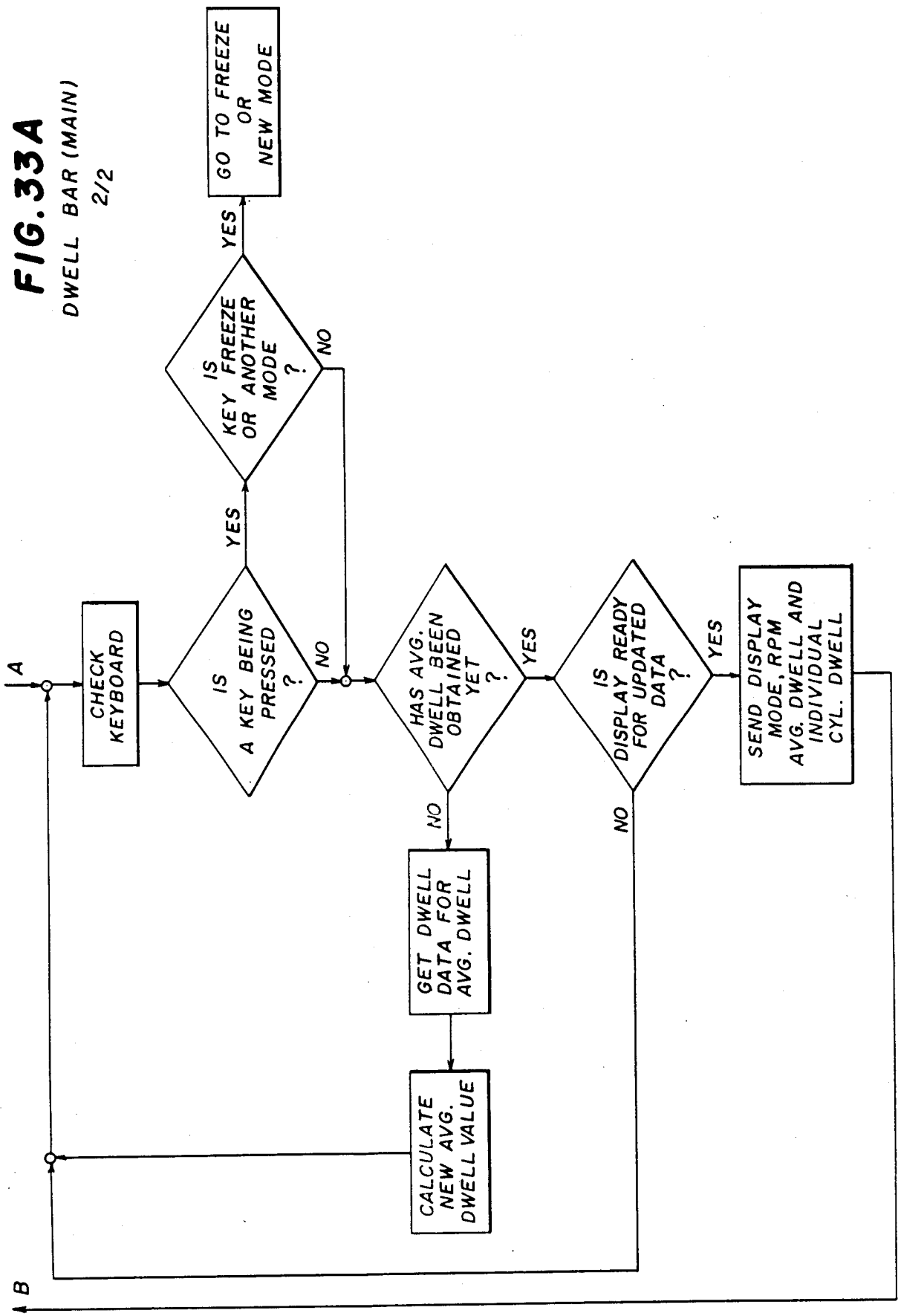
FIG.33A DWELL BAR (MAIN) 2/2

CYL SHORTING (MAIN)
1/4

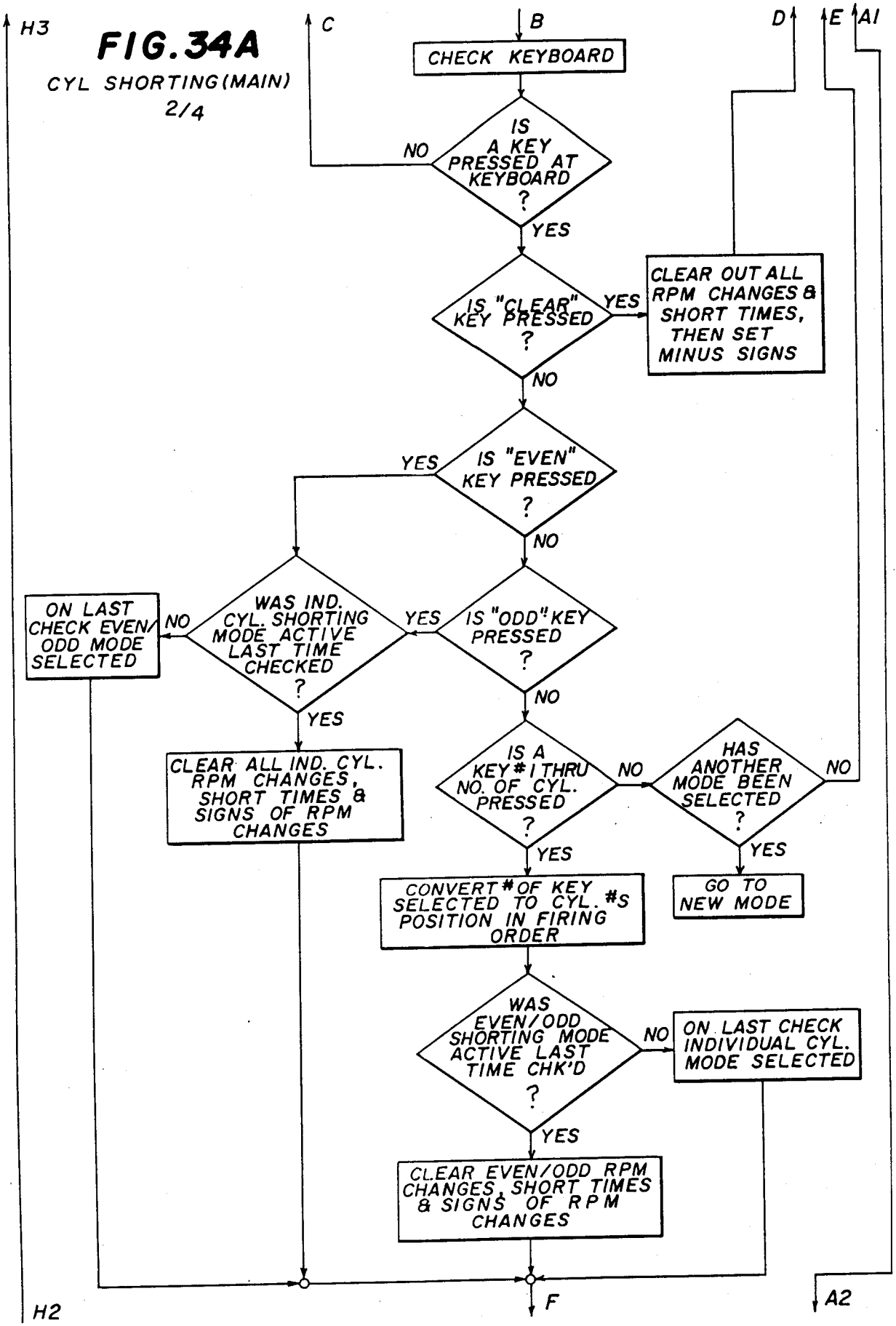

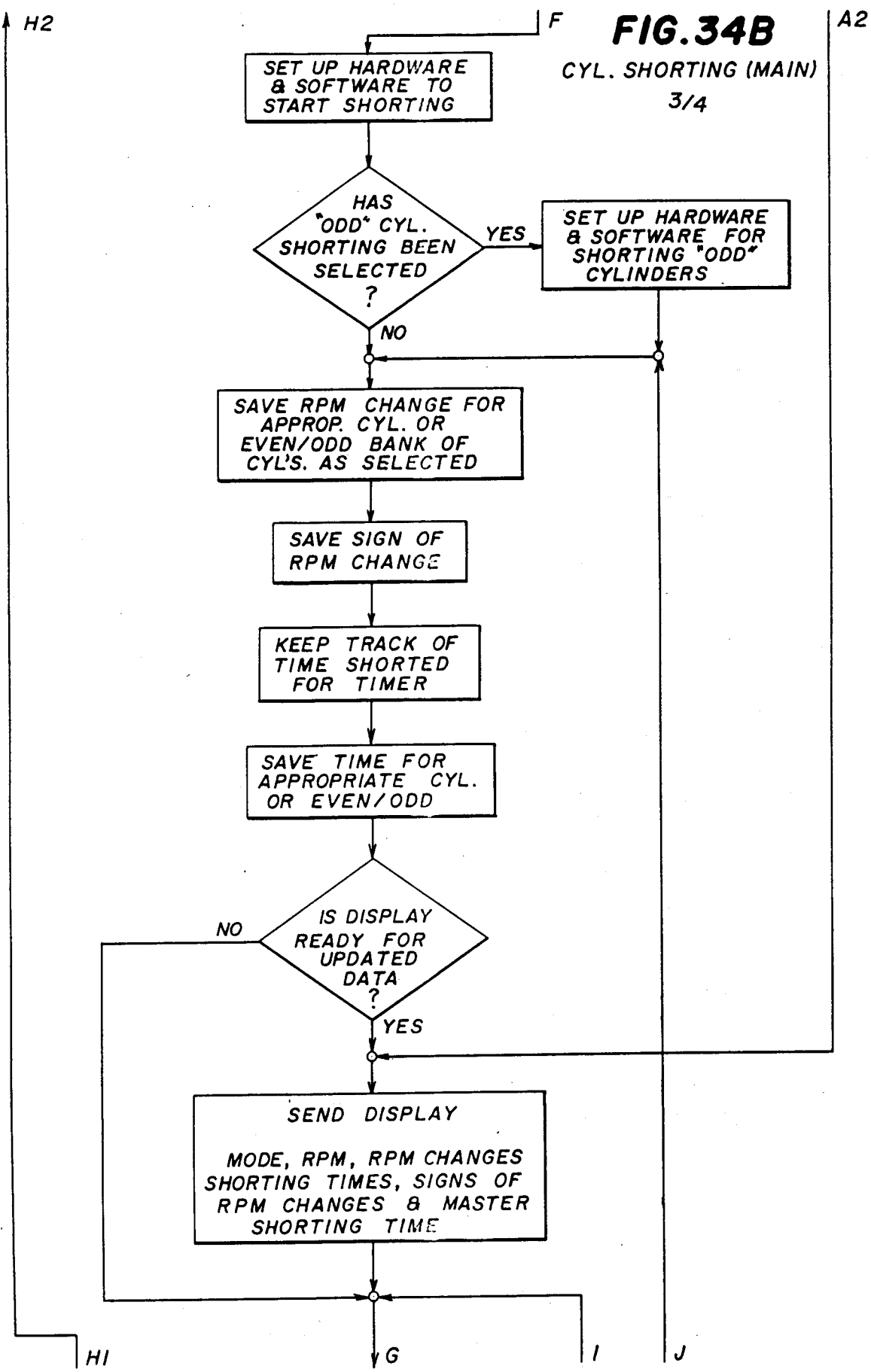

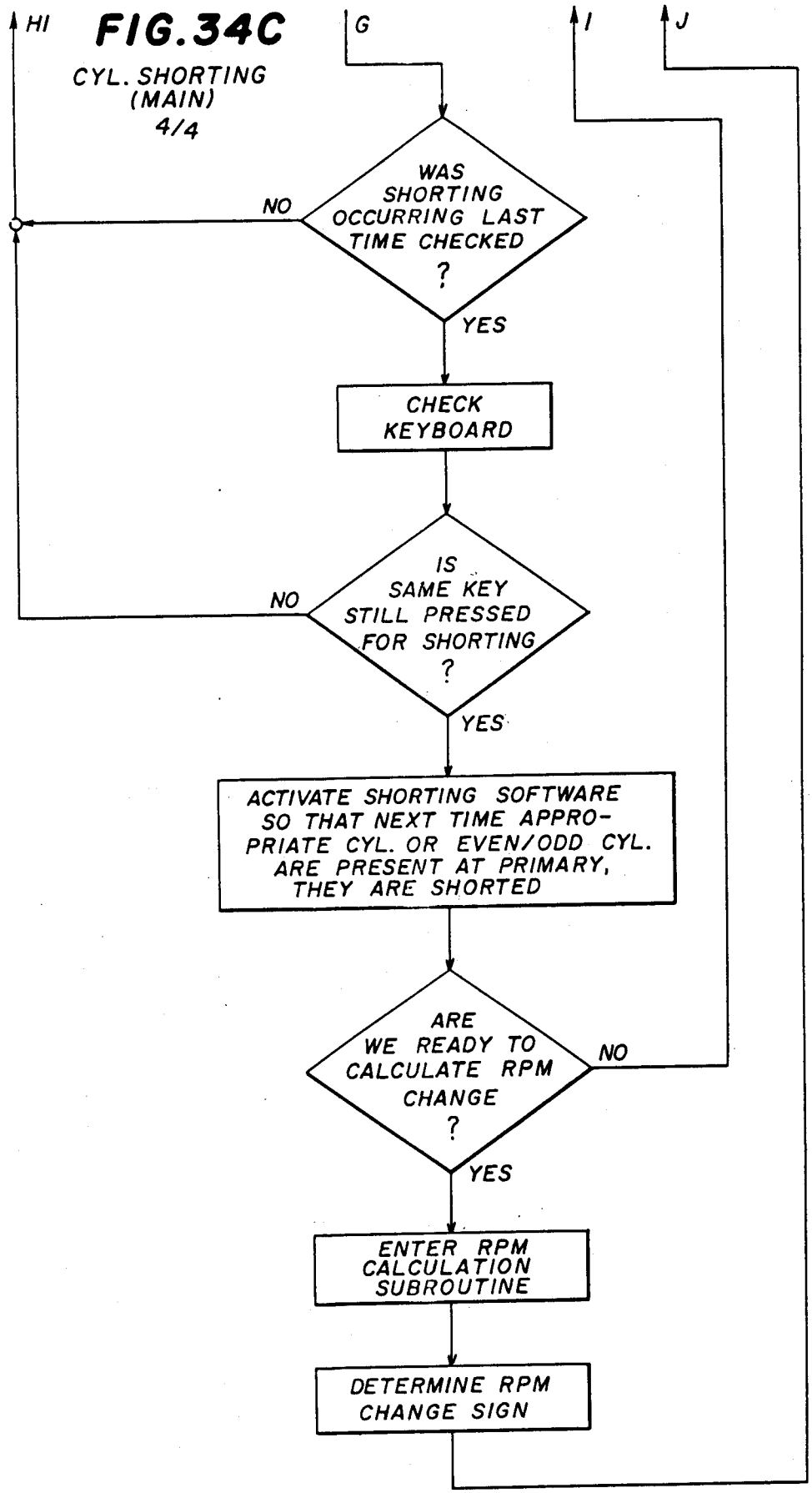

INSTRUCTIONS (DISPLAY)
1/1

PRIMARY (DISPLAY)
1/3

PRIMARY (DISPLAY)
2/3

PRIMARY (DISPLAY)
3/3

TO – ALTERNATOR VOLTAGE (FIG. 37)
FUEL INJECTOR (FIG. 37)
KV BAR GRAPH (FIG. 38)
DWELL BAR GRAPH (FIG. 39)
CYL. SH. BAR GRAPH (FIG. 40A)

ALTERNATOR (DISPLAY)
1/1

KV BAR (DISPLAY)
1/1

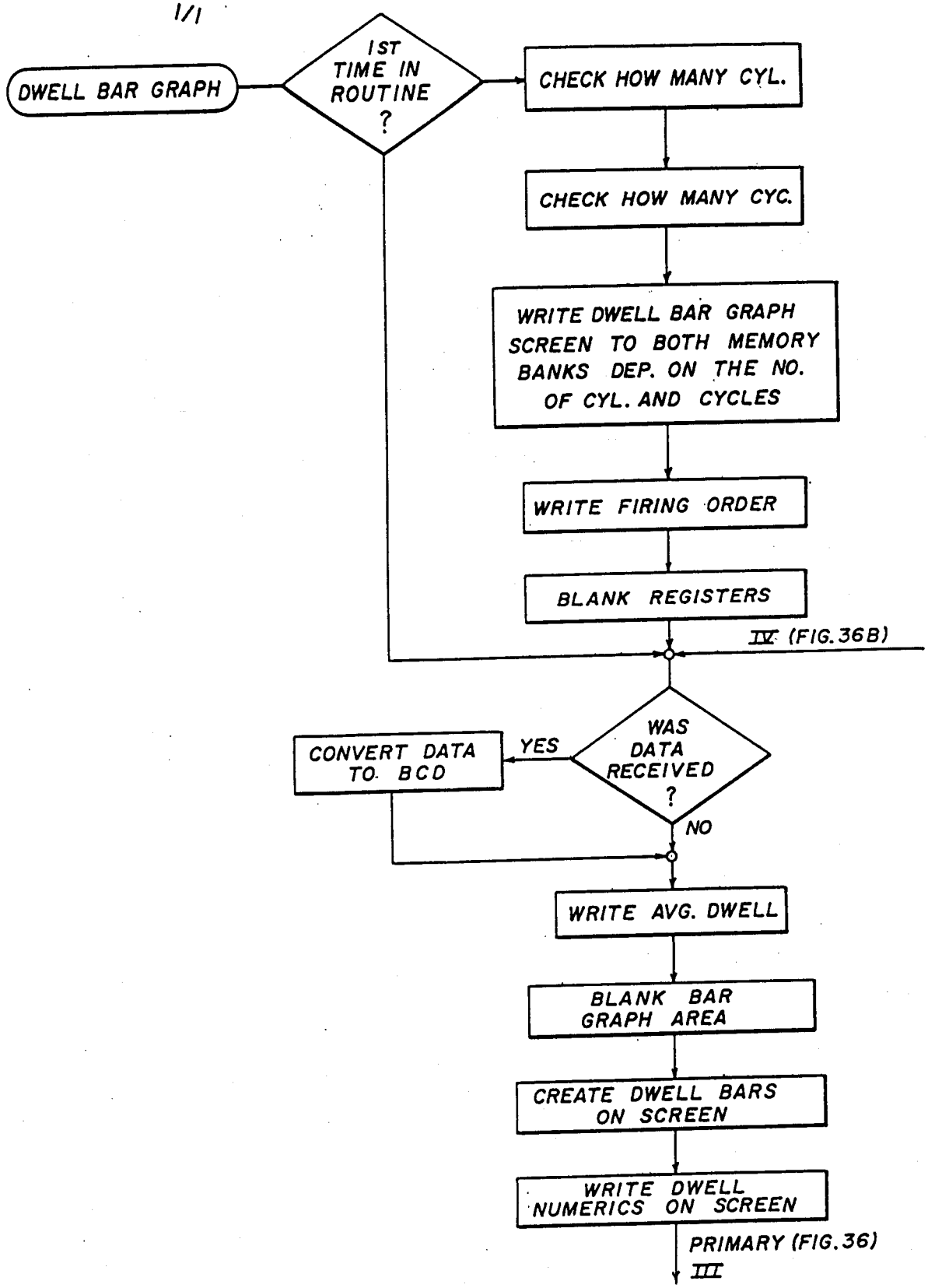
FIG.39 DWELL BAR (DISPLAY) 1/1

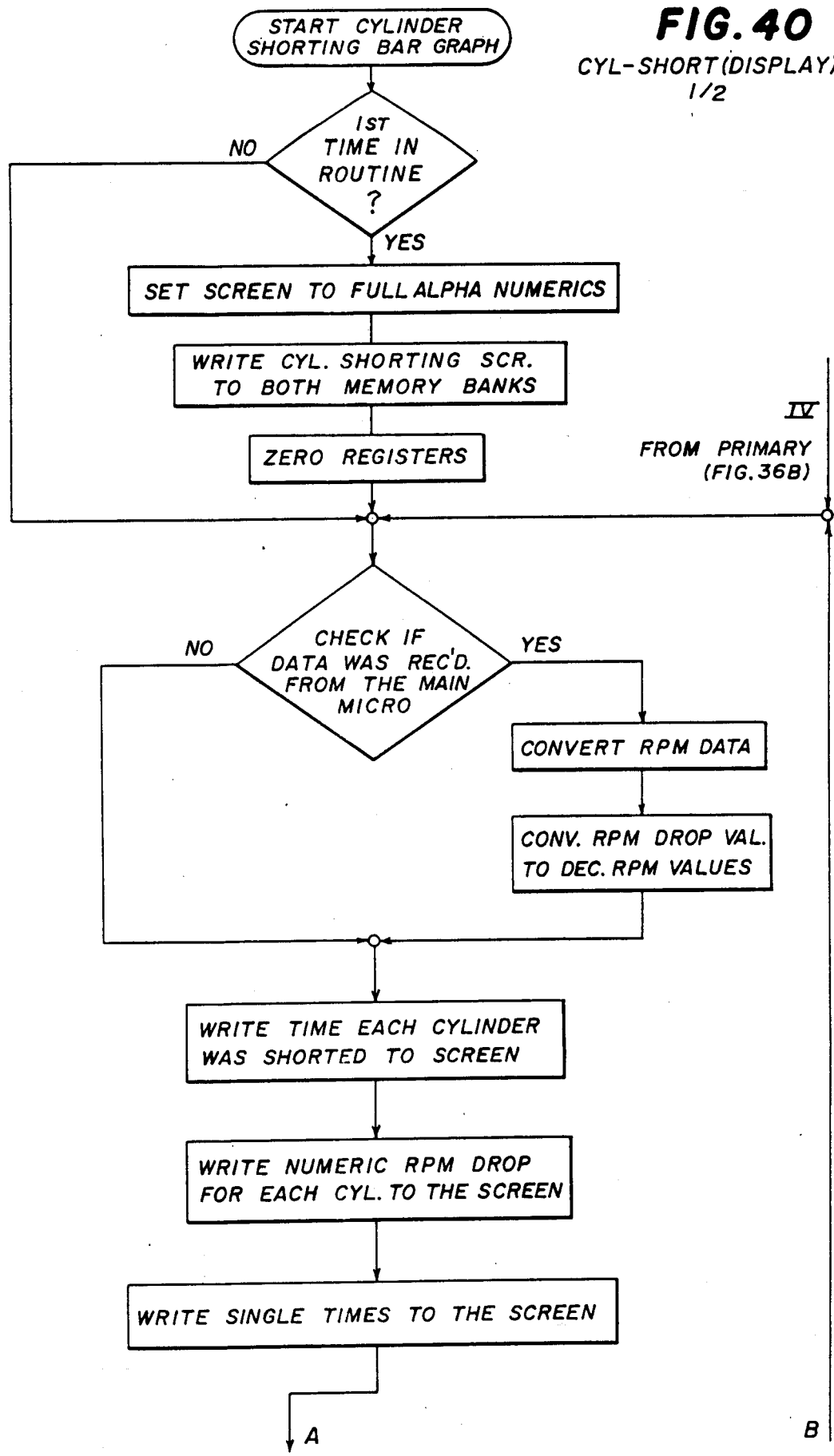

CYL SHORT (DISPLAY)
2/2

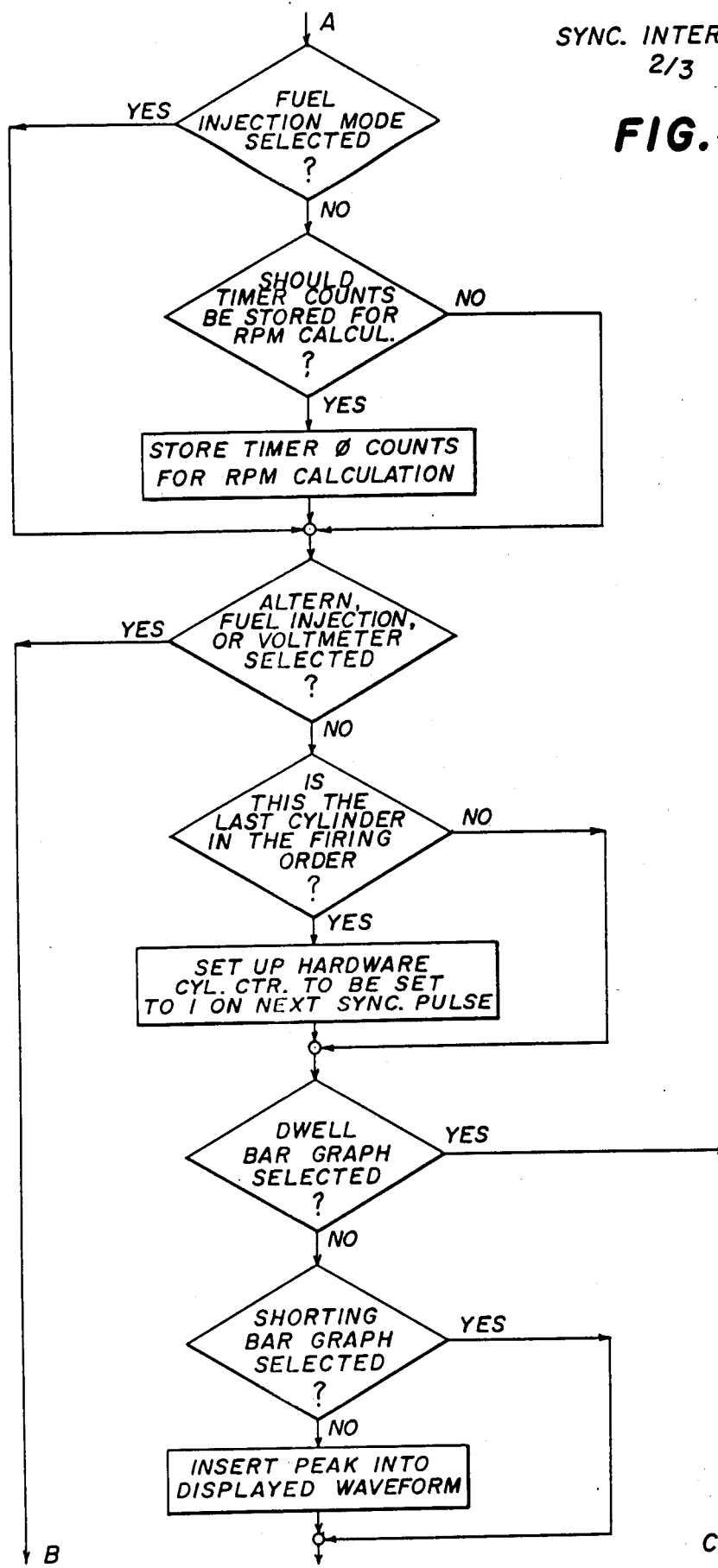
FIG. 41A — SYNC. INTERRUPT 2/3

RPM CALCULATION

VCO CALCULATION

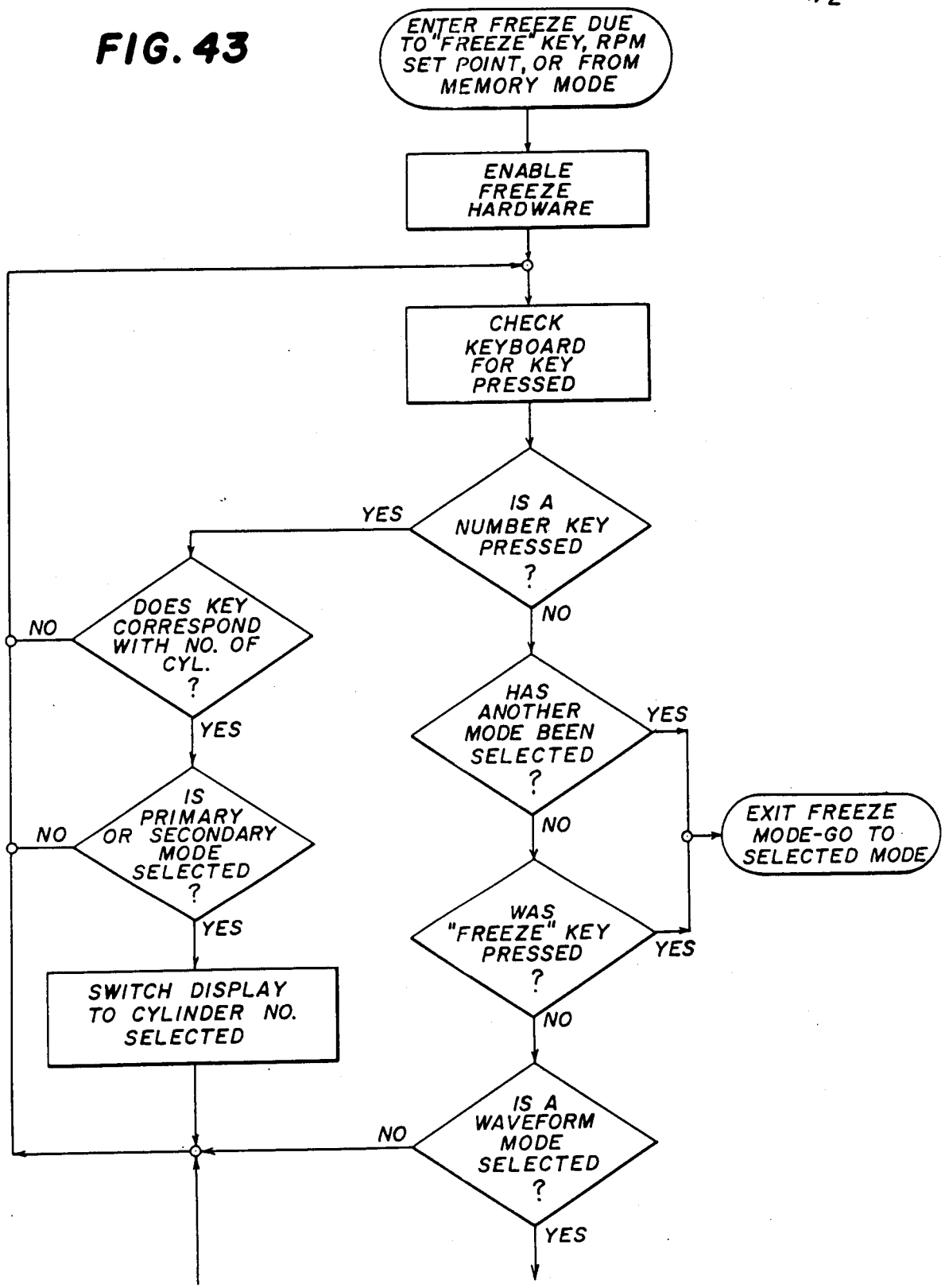

SERIAL INTERRUPT
1/2

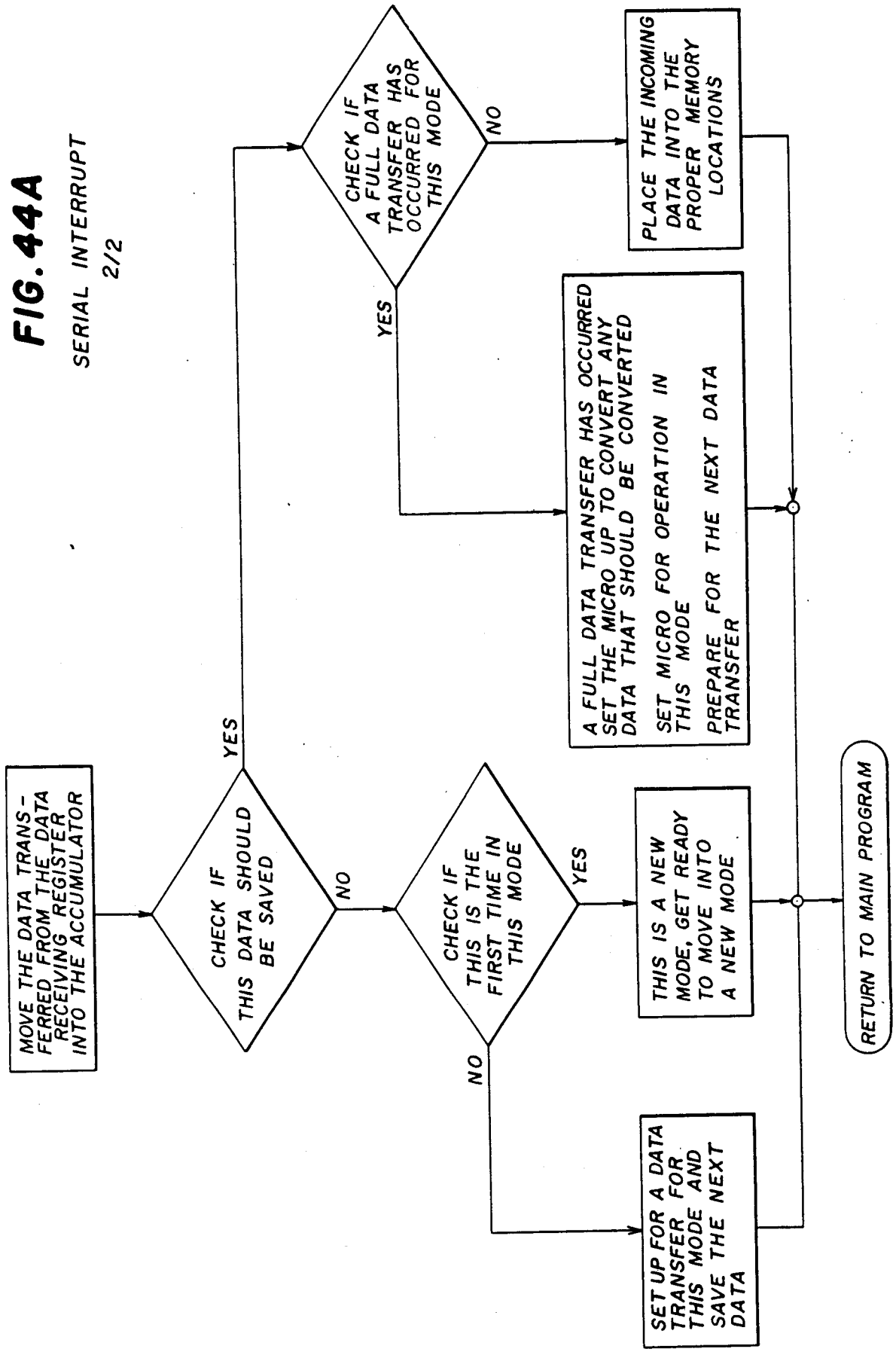

CONVERT COMPLETE INTERRUPT

DWELL COUNTING

DIGITAL ENGINE ANALYZER

This is a division of application Ser. No. 769,150, filed Aug. 23, 1985.

BACKGROUND OF THE INVENTION

This application deals generally with apparatus that analyzes analog electrical signals by converting them into digital signals and then displaying them on a cathode ray tube. The analyzer has particular applicability to the diagnosis of internal combustion engines. Most engine analyzers in the marketplace today are of the analog type. A vehicle produces several kinds of electrical signals such as primary and secondary ignition signals which the analyzer displays. In the case of an analog scope, the analog signal wave is processed and applied to the cathode ray tube. The waveform is continuous and therefore continuously matches the electrical signal itself. In a digital analyzer, the analog engine signals are converted into digital information and that digital information is displayed on the cathode ray tube. The waveform can be frozen, that is, the operator can carefully analyze a waveform that was generated at a particular incident of time that has already passed. This capability permits examination of the waveform without the fluctuations or flicker of the waveform that one commonly sees in an analog engine analyzer. The sweep rate for analog engine analyzers varies as a function of engine RPM, so that flicker results particularly at low RPM values. The digital analyzer has a constant sweep rate. Since the sweep rate is independent of variation in engine RPM, flicker of the displayed waveform is eliminated, even at low engine RPM. Also the digital waveform can be stored for future use.

Another advantage of a digital analyzer is that alphanumeric information such as the engine speed, firing voltages, and dwell can be displayed on the screen.

There are digital analyzers in the marketplace today. Also, the prior art does disclose digital analyzers. However, they have certain disadvantages. First they are large, heavy and expensive and must operate from a 120 volt, AC power supply.

Also, the waveforms displayed by prior art digital analyzers consist of a multiplicity of dots. This is not a serious problem when the amplitude of the waveform is constant over time or the rate of change is not great. However, during those portions of the waveform where the fast rise and fall times are present, such as during the firing line of the cylinder, the dots can be widespread making it more difficult to analyze the waveform. Also, when introducing service station operators and others to digital analyzers, it is psychologically important that the waveform appear as similar as possible to the analog waveforms that have been customary on analog analyzers.

The firing line of an ignition signal often requires detailed analysis. However, the firing line normally occurs at the left edge of the CRT screen where it is difficult to study. Prior art digital analyzers do not have the capability of shifting the waveform to the right so that the firing line is more toward the center. Of course, it may be helpful to review the initial portion of waveforms in response to other than ignition signals.

Prior digital analyzers have insufficient capability insofar as measuring the time elapsed between two selected points on a waveform that is being displayed. These prior art analyzers also have relative inflexibility with the alphanumeric and graphic characters that they display.

Because the firing line has such a rapid rise time, it often occurs between two adjacent data sampling points of the analog to digital converter so that the peak display is not completely accurate. Also the approach of prior art digital analyzers in separating the alphanumeric information and the waveform information on the CRT screen is not satisfactory.

Often engine specifications require a waveform of a certain character at a specified engine speed. It is time-consuming and rather difficult for the operator to monitor the change in engine speed so as to be exactly at or nearly at the specified speed and then examine the waveform.

While certain prior art digital analyzers do have the capability of some storage of waveforms for future use, they are unable to save data that has been frozen for any particular waveform and for bar graphs.

Prior art engine analyzers suffer the disadvantage of having the capability of displaying only a single fuel injector waveform at a time, whereas in certain instances, it is desirable to be able to display two or more complete fuel injector waveforms, so that the time between consecutive injector firings can be measured. Prior art analyzers have very substantial memory capability but that adds substantially to their cost. The engine tends to produce extraneous signals which may affect the performance of prior analyzers. Finally, they do not have the capability of expanding a portion of the waveform in order to facilitate analysis.

SUMMARY OF THE INVENTION

It is therefore an important object of the present invention to provide a digital engine analyzer which is smaller and less expensive than those heretofore available.

Another object is to provide a digital engine analyzer which is portable and can be powered by the DC battery voltage from a vehicle as well as AC power.

Another object is to provide a read-only memory which contains programmed patterns of various alphanumeric and graphic characters that are to be displayed on the CRT screen to enable greater flexibility on the characters displayed and making a circuitry and software required to produce the characters relatively simple.

In another aspect of the invention, there is provided apparatus for analyzing analog signals, comprising an analog to digital converter for converting the analog signals into digital signals, a cathode ray tube including a screen and an electron beam which is swept across the screen, the screen being defined by a plurality of beam rows and a plurality of beam columns, the screen being further divided into a plurality of character rows and a plurality of character columns defining a plurality of character areas, the electron beam scanning the screen along a row in one row after the next, the electron beam being selectively operable to illuminate selected points at the intersections of the beam rows and the beam columns, means for monitoring the beam row in which the electron beam is sweeping at an instant of time, character ROM means having stored at a multiplicity of locations therein character matrices respectively corresponding to a multiplicity of characters and respectively being accessed by a multiplicity of access signals, memory means coupled to the character ROM means for storing access signals for the character matrices to be displayed in the character areas, character address means for addressing the memory means with respect to each character matrix one after another in each character row one character row after the other for supplying character matrices corresponding to the characters to be displayed respectively in the character areas, matrix row address means coupled to the character ROM means for causing one row of data for each character matrix selected by the memory means to be simultaneously released, and data generator means coupled to the character ROM means for changing the data simultaneously released therefrom into a sequence of data.

The invention consists of certain novel features and a combination of elements hereinafter fully described, illustrated in the accompanying drawings, and particularly pointed out in the appended claims, it being understood that various changes in the details may be made without departing from the spirit, or sacrificing any of the advantages of the present invention.

DESCRIPTION OF THE DRAWINGS

For the purpose of facilitating and understanding the invention, there is illustrated in the accompanying drawings a preferred embodiment thereof, from an inspection of which, when considered in connection with the following description, the invention, its construction and operation, and many of its advantages will be readily understood and appreciated.

FIGS. 3-14 illustrate various screen displays provided by the digital engine analyzer;

FIGS. 17-24, when arranged as shown in FIG. 47 provided a detailed block diagram of the digital circuits shown in FIG. 16;

FIG. 18B is block diagram of the non-volatile memory and memory bank switch control logic;

FIG. 23A illustrates the layout of a portion of the character ROM;

FIG. 24A is a block diagram of the display memory control circuits;

FIG. 25 is a schematic circuit diagram of the curtain circuit;

FIG. 26 is a schematic circuit diagram of the dot energizing circuit;

FIGS. 27, 27A, and 27B depict a flow chart of the main program in the microprocessor of FIG. 16;

FIGS. 28, 28A, and 28B depict the modes 00-04 of the subroutine for the main microprocessor;

FIG. 30, 30A and 30B depict the primary/secondary subroutines for the main microprocessor;

FIG. 31, 31A, 31B and 31C depict the alternator subroutine for the main microprocessor;

FIG. 33 and 33A depict the dwell bar graph subroutine for the main microprocessor;

FIG. 34, 34A, 34B and 34C depict the cylinder shorting bar graph subroutine for the main microprocessor;

FIG. 39 depicts the dwell bar graph subroutine for the display microprocessor;

FIG. 40 and 40A depict the cylinder shorting bar graph subroutine for the display microprocessor;

FIG. 41, 41A and 41B depict the sync interrupt routine;

FIGS. 43 and 43A depict the flow chart for the freeze mode;

FIGS. 44 and 44A depict the flow chart for the serial interrupt routine;

FIG. 47 shows how FIGS. 17-24 are arranged.

DESCRIPTION OF THE PREFERRED EMBODIMENT

Figure 1:
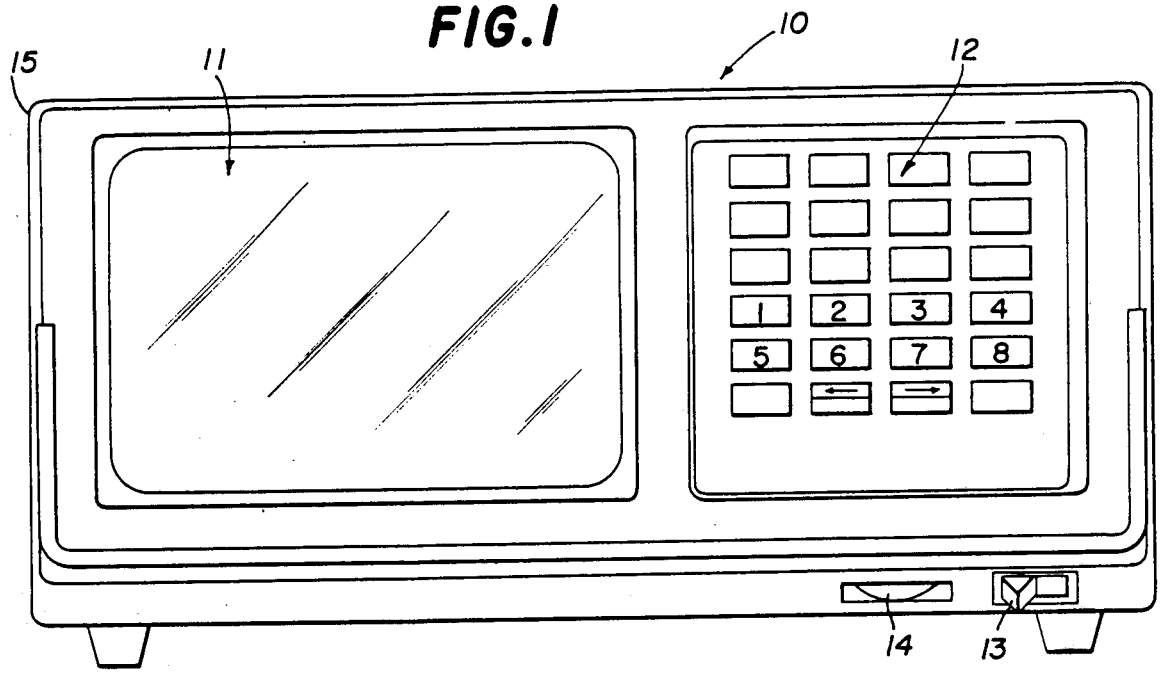
FIG. 1 is a front elevation view of a digital engine analyzer provided by the present invention.

Turning now to the drawings, and more particularly to FIG. 1 thereof, there is depicted a digital engine analyzer 10 incorporating the features of the invention being used for analyzing an internal combustion engine. The digital engine analyzer 10 is a portable unit which operates on AC power or standard 12 volt battery power. The digital engine analyzer 10 includes a CRT monitor 11 for displaying waveform patterns as well as graphic and alphanumeric information. A 24 key keyboard 12 is provided to select functions and enter data into the digital engine analyzer 10. A power switch 13 is used to switch the digital engine analyzer on and off and an intensity control 14 is used to increase or decrease the brightness of the data and pattern displayed on the CRT monitor 11. The electronic circuits of the digital engine analyzer 10, which are shown in block diagram form in FIG. 2, are enclosed within a housing 15.

Figure 2:
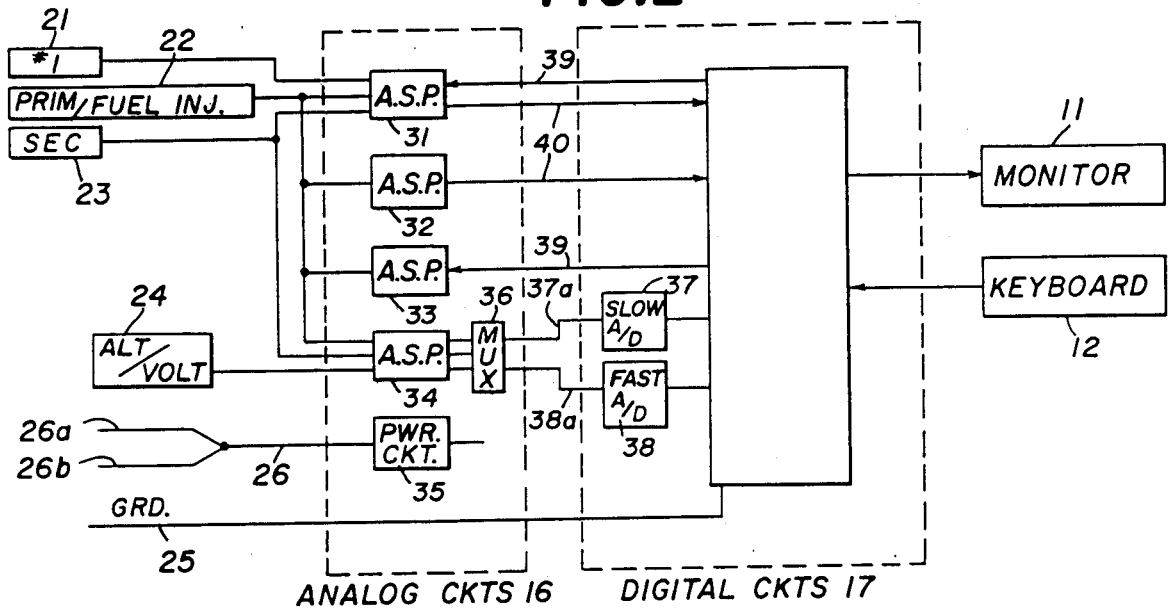
FIG. 2 is a block diagram of the electronic circuits of the digital engine analyzer shown in FIG. 1.

Referring to FIG. 2, the electronic circuits of the digital engine analyzer 10 include analog circuits 16 and digital circuits 17. The digital engine analyzer 10, which is microprocessor controlled, receives analog inputs over five input leads 21-25 which connect to suitable terminals located on the back panel (not shown) of the unit. A further lead set 26 includes separate leads 26a and 26b which provide power from a 110 VAC outlet or 12 VDC power, respectively depending on how the unit is being used.

Lead 21 is an inductive pick up which clamps over the number 1 spark plug wire on the engine being analyzed to monitor the current supplied to that spark plus, providing a reference point for identifying cylinders. Lead 22 is connected to a terminal of the distributor or of the fuel injector, depending on the test being performed, and is used to monitor primary ignition signal, ignition dwell, fuel injection signal and for cylinder shorting operations. Lead 23 is a capacitive pick up which clamps over the coil wire on remote ignition coil type systems to sense the high-voltage surges from the secondary of the ignition coil that will be distributed to each of the spark plugs. For vehicles using an HEI system, an HEI pick up is employed for the secondary input lead 23. Lead 24 provides a connection to the alternator or battery or other voltage source of the engine. Lead 25 provides a ground reference relative to the engine.

The analog circuits 16 include four analog signal processing circuits 31-34. A power supply circuit 35 receives an AC or DC power input via lead set 26. The analog signal processing circuit 31 receives the #1 spark plug signal on lead 21, and the primary signal on lead 22 and the secondary signal on lead 23 and provides sync signal outputs to the digital circuits 17. Analog signal processing circuit 32 derives a dwell signal from the primary signal. Analog signal processing circuit 33 responds to a control output from the digital circuits 17 to effect cylinder shorting. The primary/fuel injector, secondary and alternator/voltage signals on leads 22-24 are applied to analog signal processing circuit 34 the outputs of which are passed to a multiplexer 36 which operates in the manner of two analog selector switches, one for passing slow time varying analog signals such as the alternator voltage or the battery voltage, to a slow A/D converter 37 and the other passing rapidly time varying analog signals such as the primary and secondary signals to a fast A/D converter 38. The slow A/D converter and the fast A/D converter convert the analog signals from the engine to digital signals for use by the digital circuits 17 to provide various operating modes and features to the CRT monitor 11. Further inputs to the digital circuits 17 are provided by the keyboard 12 which allow selection of screens and features.

The digital engine analyzer 10 is operable in ten modes, namely: Start-up, Instructions, Primary Pattern, Secondary Pattern, Alternator Pattern, Fuel Injector Pattern, Voltage Pattern, KV Bar Graph, Dwell Bar Graph and Cylinder Shorting Bar Graph. Features available for some or all these modes include Freeze/-Memory, Cursor/Msec, RPM setpoint, Cylinder Shorting, Expand Waveform, and Standard/Special Trigger.

Referring again to FIG. 1, the various operating modes and features are selected via the keyboard 12 which also enables entry of data into the digital engine analyzer 10. The keyboard 12 consists of seven mode select keys INSTR, PRI PATTERN, SEC PATTERN, DWELL BAR GRAPH, SHORTING BAR GRAPH, KV BAR GRAPH, ALT & FUEL INJ.; eight digit keys 1-8; six feature select keys FREEZE, 0/EVEN, 9/0DD, RPM SET POINT, ←/STD TRIG and →/SPCL TRIG (hereinafter referred to as LEFT ARROW/STD TRIG and RT ARROW/SPCL TRIG); and three control keys ENTER, RESET and CLEAR.

The PRI PATTERN key is used to select the Primary Pattern mode. The SEC PATTERN key is used to select the Secondary Pattern mode. The DWELL BAR GRAPH key is used to select the Dwell Bar Graph mode. The SHORTING BAR GRAPH key is used to select the Cylinder Shorting Bar Graph mode. The KV BAR GRAPH key is used to select the KV Bar Graph mode. The ALT & FUEL INJ key is used to select a screen which prompts the operator to select one of three modes, namely Alternator Pattern mode, Fuel Injector Pattern mode, or Voltage Pattern mode.

The digit keys 1-8 are used for data entry, for selecting cylinders in a screen mode, for shorting individual cylinders in the Cylinder Shorting Bar Graph mode, and for selecting modes from an operator prompted statement.

The INSTR key is used to select the Instructions mode by which instructions as to how to operate the digital engine analyzer are displayed on the screen. The FREEZE key is used to freeze both pattern and data on all of the mode screens (Primary Pattern, Secondary pattern, Dwell Bar Graph, KV Bar Graph, . . . etc.). This key is also used when saving data in non-volatile memory 164 (FIG. 16) and non-volatile memory 115 (FIG. 16) of the digital circuits 17.

The 0/EVEN key is a dual function key enabling a ZERO (0) entry for data entry purposes and for causing shorting of the even cylinders in the firing order when the digital engine analyzer is operating in the Cylinder Shorting Bar Graph mode. The 9/ODD key is a dual function key enabling entry of the digit 9 for data entry purposes and for causing shorting of the odd cylinders in the firing order when the unit is operating in the Cylinder Shorting Bar Graph mode.

The LEFT ARROW/STD TRIG key is a multifunction key which enables selection of the Standard Trigger feature when used with the Primary and Secondary Pattern modes. This key also is used to control the travel of the cursor "curtain", a reverse video highlighting of portions of the waveform displayed, for the Cursor-Msec mode feature available for frozen patterns, to control the "flashing" cursor for the Firing Order section of the engine data screen provided for Start-Up modes, to control the horizontal expansion of any waveform screen and also to control paging through the Instructions mode.

The RT ARROW/SPCL TRIG key is a multifunction key which enables selection of the Special Trigger feature when used with the Primary and Secondary Pattern modes. This key also is used to control the travel of the cursor "curtain" for the Cursor/Msec feature, to control the "flashing" cursor for the Firing Order section of the Engine Data Entry screen, to control the horizontal expansion of any waveform screen, and also to control paging through the Instructions mode.

The RPM SET POINT key is used to select the RPM set point feature in which live screens become frozen automatically when engine RPM reaches or exceeds a selected value.

The ENTER key is used to enter data and select the edge control for the Cursor/Msec feature when working with frozen patterns. In the Primary and Secondary Pattern modes, the ENTER key allows the user to toggle between the Trigger and the Expand features. The RESET key is used to reset the electronic circuits and restart the program, bringing back the start-up or cylinder data entry screen depending on whether or not engine identification data is saved in non-volatile memory.

The CLEAR key clears data (writes data to 0 value) when used with the Cylinder Shorting Bar Graph mode or with the KV Bar Graph mode.

Operating Modes and Features

Before considering the electronic circuits of the digital engine analyzer in more detail, it will be helpful to briefly describe the operating modes and features of the digital engine analyzer. The digital engine analyzer displays ten basic screen patterns on the CRT monitor 11 as follows:

| | |
|---|---|
| 1. Start-up | 6. Voltage waveform |
| 2. Primary waveform | 7. Cylinder Shorting Bar Graph |
| 3. Secondary waveform | 8. Dwell Bar Graph |
| 4. Alternator waveform | 9. KV Bar Graph |
| 5. Fuel Injector waveform | 10. Instructions |

Figure 3:
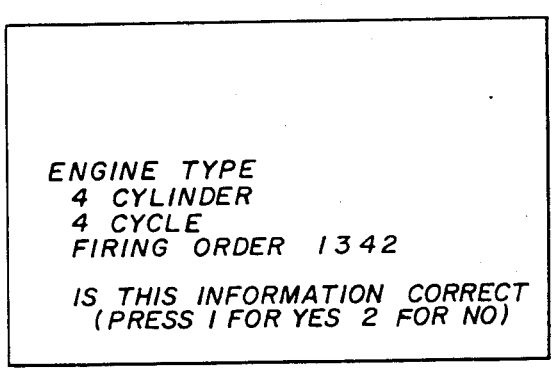

Upon power up or RESET, the CRT monitor 11 will enter the Start-up mode and display the start-up screen shown in FIG. 3 for cylinder data entry mode. If data such as number of cylinders, number of cycles and firing order has been retained in the non-volatile memory, the operator is asked a question "is this information correct?" If the data is correct, the number one (1) on the keyboard is depressed to accept the data. If the data is not correct, the number two (2) on the keyboard is depressed to switch to an engine data entry screen.

If the engine data entry screen is displayed, the digital engine analyzer has not retained engine type data or has incorrect data and is requested that data be entered. The first question displayed asks for the number of cylinders in the engine. The numbers 1-8 on the keyboard are used to answer this question. When a number key is depressed, that number is displayed in the flashing cursor on the screen. Once the correct number is displayed, the ENTER key is depressed to proceed to the next input required. If an improper key is depressed, an error message will be displayed. Once a proper value (1-8) has been depressed, the error message will be removed from the screen. When the error message is present, the ENTER key is treated as an improper key. After the number of cylinders has been entered, the CRT monitor will display a statement asking for the number of cycles. The numbers 2 or 4 on the keyboard are used to respond to this statement. When the desired number is displayed, the ENTER key is depressed to proceed to the next input required. Again, if an improper key is depressed, an error message will be displayed. Once a proper value (2 or 4) has been depressed, the error message will be removed from the screen.

After the number of cycles has been entered, the digital engine analyzer will display a statement asking for the firing order of the engine. The keyboard number keys within the range of the number of cylinders must be used to answer this question, otherwise an error message is displayed. The LEFT ARROW/STD TRIG and RT ARROW/SPCL TRIG keys on the keyboard can be used to move the cursor left or right if only a few numbers need to be corrected. Once the correct firing order is displayed, the ENTER key is depressed to proceed, and the start-up screen referred to previously is displayed on the CRT monitor 11 including the question "is this information correct?"

When the displayed engine information is accepted by depressing the 1 key, the CRT display screen is switched to a function selection screen which displays the titles of the modes of the digital engine analyzer 10. Any of the modes that have display data stored in non-volatile memory have an asterisk next to the mode name. Any one of these modes can be selected by depressing the appropriate key on the keyboard. If there is data in the non-volatile memory for that mode, that data is displayed, otherwise the screen displays a live waveform or bar graph of the selected function.

Primary Pattern Mode

Figure 4:
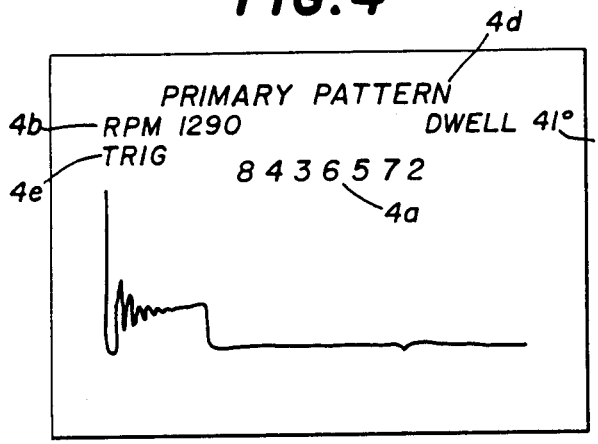

Referring to FIG. 4, the Primary mode, accessed by depressing the PRI PATTERN key, is used for checking the primary ignition waveforms of an engine. The waveform for each cylinder is displayed individually and any cylinder can be selected by depressing the correspondingly numbered digit key. The firing order of the engine is displayed on the screen at 4a with the selected cylinder highlighted. The engine RPM and the average dwell of the engine are also displayed on the screen at 4b and 4c respectively. The title PRIMARY PATTERN is displayed at the top of the screen at 4d. RPM is displayed in increments of 10 RPM and average dwell is displayed in increments of one degree.

Regarding the lead connections necessary for the Primary Pattern mode, the lead 25 (FIG. 2) is connected to the negative (−) terminal of the battery or to a good vehicle ground. The lead 22 is connected to the proper test point, either to the coil negative terminal or the distributor or the tachometer terminal of an HEI distributor. The inductive pick-up lead 21 is placed over the #1 spark plug-wire.

Figure 5:
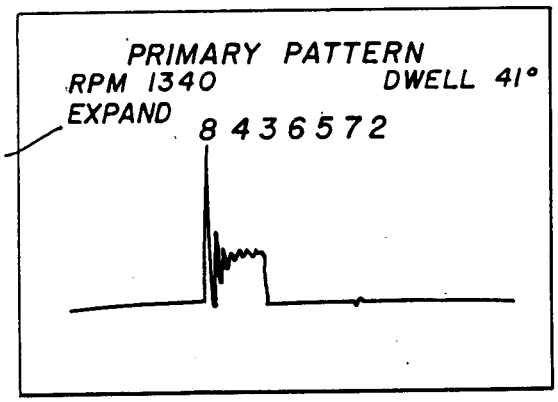

Depressing the ENTER key allows the user to toggle the LEFT ARROW/STD TRIG and RT ARROW/SPCL TRIG keys between Trigger Control and Waveform Expansion features. The selected feature will be shown on the screen. When the word "TRIG" is displayed on the screen in FIG. 4 at 4e, the LEFT ARROW/STD TRIG and the RT ARROW/SPCL TRIG keys on the keyboard can be used to shift the location of the waveform on the screen for better or more desirable viewing. The LEFT ARROW/STD TRID key places the waveform near the left edge of the screen as shown in FIG. 4. The RT ARROW/SPCL TRIG key places the waveform more in the center of the screen as shown in FIG. 5. When the word "EXPAND" is displayed on the screen as in FIG. 5 at 5a, the RT ARROW/SPCL TRIG and LEFT ARROW/STD TRIG keys on the keyboard allow the user to expand and contract the displayed waveform for a desirable viewing size. Depressing the RT ARROW/SPCL TRIG causes expansion of the waveform and depressing the LEFT ARROW/STD TRIG causes contraction of the waveform.

Depressing a number key, one (1) through eight (8) (on an eight cyinder engine, or 1 through 6 on a six cylinder engine, etc.), selects the cylinder of the engine for which the Primary Pattern is to be displayed on the screen. Once a cylinder is selected, that cylinder number in the firing order displayed at 4a is shown highlighted in inverse video. Subsequent depressing the key corresponding to the selected cylinder causes shorting of that cylinder for as long as the key is held depressed. Shorting stops when the key is released.

Figure 16:
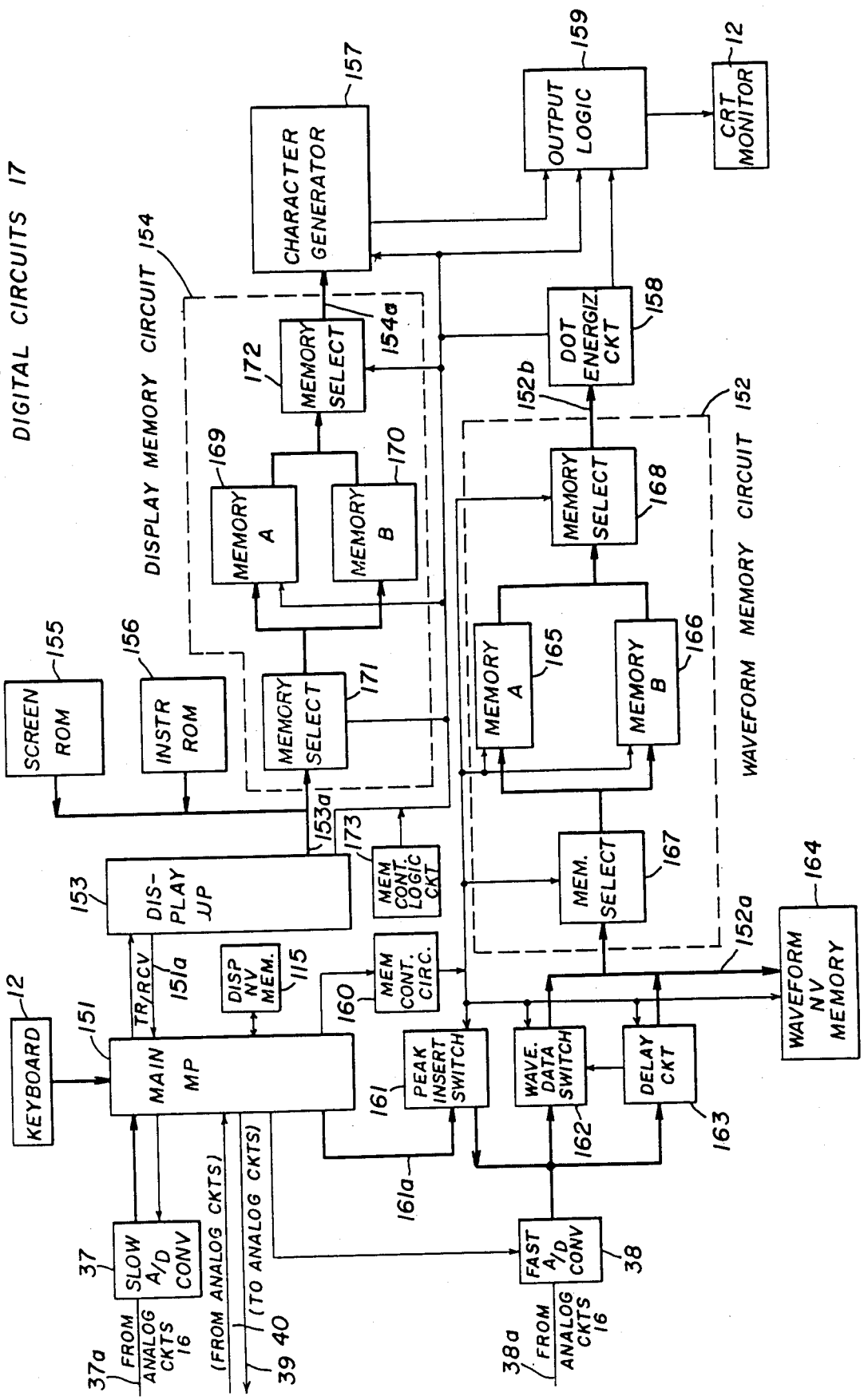
FIG. 16 is a detailed block diagram of digital circuits of the electronic circuits shown in FIG. 2.

Other features that can be used in conjunction with the Primary Pattern mode are the RPM Set point feature and the Freeze feature. The Cursor/Msec feature can be used while the Freeze feature is active. When frozen, the waveform for all cylinders can be selected for viewing one at a time. Freezing the waveform also saves all of the primary waveforms and display information in the non-volatile memory 164 and non-volatile memory 115 respectively (FIG. 16).

Secondary Pattern Mode

Figure 6:
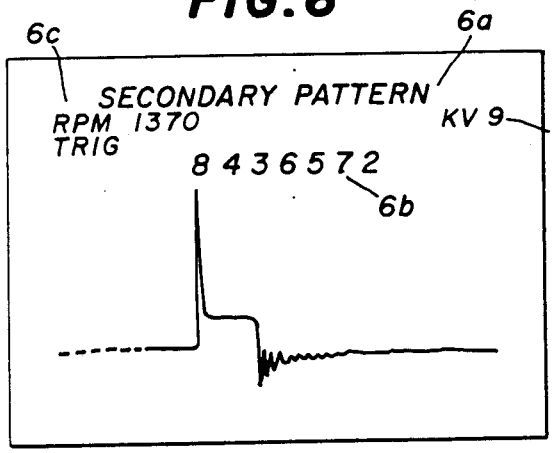

Referring to FIG. 6, the Secondary Pattern mode, accessed by depressing the SEC PATTERN key, is used for checking the secondary ignition waveforms of an engine. The waveform for each cylinder is displayed individually and any cylinder is selected by depressing the correspondingly numbered key. The title SECONDARY PATTERN is displayed at the top of the screen at 6a. The firing order of the engine is displayed on the screen at 6b with the selected cylinder highlighted. The engine RPM and the secondary voltage in kilovolts (KV) for the selected cylinder are also displayed on the screen at 6c and 6d, respectively. The RPM is displayed in increments of 10 RPM and the KV values are shown in 1 KV increments. The screen shows a secondary voltage up to 10 KV. The displayed numeric KV value can be used to check the actual cylinder KV.

Regarding the lead connections for the Secondary Pattern mode, the lead 25 (FIG. 2) is connected to the negative (−) terminal of the battery or to a good vehicle ground. The lead 22 is connected to the proper test point either at the coil negative terminal or the distributor or tachometer terminal of an HEI distributor. The inductive pick-up lead 21 is placed over the #1 spark plug-wire. If the engine under test has a remote coil, the capacitive pick-up lead 23 is clamped over the coil wire. If the engine has HEI ignition, the HEI pick-up is clamped over the distributor.

Waveform Expanding, Waveform Shifting and Cylinder Shorting features are available as for the Primary Pattern mode. Other features that can be used in conjunction with the Secondary Pattern mode include the RPM Set point feature and Freeze feature. The Cursor/Msec feature can be used while the Freeze feature is active. When frozen, all cylinders can still be selected for viewing one at a time. Freezing the pattern also writes all of the secondary waveform data into the non-volatile waveform memory 164 (FIG. 16).

Alternator, Fuel Injector, and Voltage Pattern Modes

Figure 7:
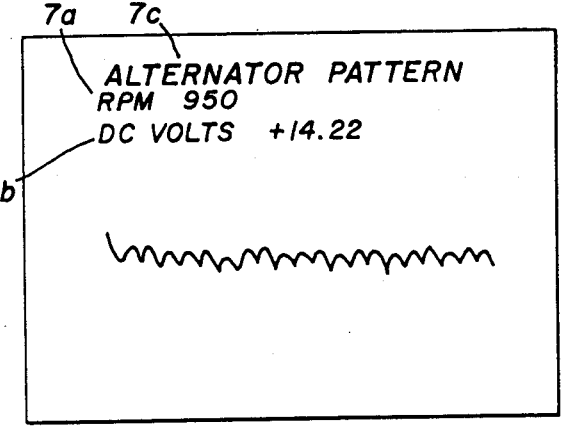
Figure 8:
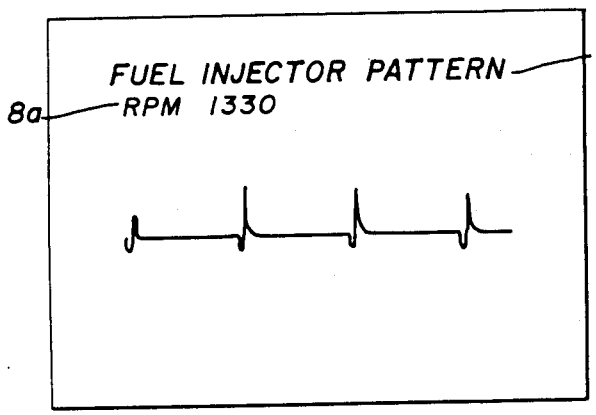
Figure 9:
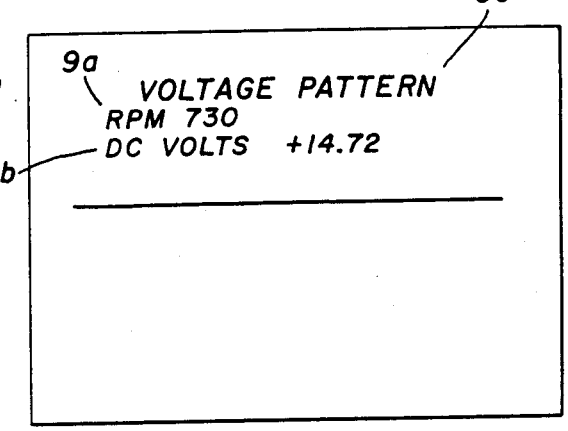

Referring to FIGS. 7-9, the Alternator, Fuel Injector, and Voltage Pattern Modes are accessed by depressing the ALT & FUEL INJ key which causes an Alternator/Fuel Injector/Voltage menu to appear. The screen for one of the three modes, Alternator, Fuel Injector, or Voltage Pattern is selected by depressing a digit key 1, 2 or 3, corresponding to the desired mode. The screens for the Alternator and Voltage Pattern modes (FIGS. 7 and 9) display the engine RPM (at 7a and 9a) the DC voltage level (at 7b and 9b) of the waveform along with the waveform and appropriate titles ALTERNATOR PATTERN (at 7c) and VOLTAGE PATTERN (at 9c). The screen for the Fuel Injector Pattern mode, (FIG. 8) displays the waveform of fuel injector, the engine RPM at 8a and the title FUEL INJECTOR PATTERN at 8b.

The RPM reading is displayed in ten RPM increments. The voltage levels tested must be in the range of −28.00 volts to +28.00 volts and will be displayed with a resolution of 0.01 volt (10 millivolts). Voltages greater than ±28 volts will cause the word "OVERRANGE" to be displayed on the Alternator and Voltage Pattern screens.

For the lead connections for this mode, the lead 25 (FIG. 2) is connected to the negative (−) terminal of the battery or to a good vehicle ground. The inductive pick-up lead 21 is placed over the #1 spark plug-wire. Also, for the Alternator Pattern mode, the lead 24 is connected to the output of the alternator or positive battery terminal. For the Fuel Injector Pattern mode, the lead 22 is connected to a fuel injector adapter. For the Voltage Pattern mode, the lead 24 is connected to any point where the voltage level is to be measured and does not exceed 28 volts.

The RT/ARROW SPCL TRIG and LEFT ARROW/STD TRIG keys on the keyboard allow the user to expand and contract, respectively, the displayed waveform for a desirable viewing size. Other features that can be used with the Alternator Pattern mode are RPM Set point and the Freeze feature. The Freeze feature includes the use of the Cursor/Msec function and also saves the displayed waveform and information in the non-volatile waveform memory 164 and non-volatile display memory 115 (FIG. 16), respectively.

Cylinder Shorting Bar Graph Mode

Referring to FIG. 10, the Cylinder Shorting Bar Graph Mode provides two modes of cylinder shorting, namely individual and Even/Odd. The Cylinder Shorting Bar Graph mode is entered by depressing the SHORTING BAR GRAPH key on the keyboard. The screen shown in FIG. 10 displays the title CYLINDER SHORTING at the top of the screen at 10a, the individual cylinder shorting bar graph at 10b, along with the master engine RMP at 10c. In the upper right corner of the screen, at 10d, is displayed the number of seconds that shorting has been occurring. On the left side of the screen at 10e is a vertical listing of the firing order. Next to that listing at 10f is a column listing the RPM changes that have occurred due to cylinder shorting. To the right of that column is a column at 10g showing the time in seconds that each cylinder has been shorted. To the right of the time column is the area where the bar graphs will be displayed when shorting occurs.

The shorting feature is accomplished in the cylinder shorting mode by depressing and holding the digit key corresponding to the cylinder (or EVEN or ODD keys) that the operator wishes to short. The number of seconds that the key is depressed and held is displayed (10g) on the screen. The RPM drop column at 10f shows the RPM change with reference to the RPM at the time the key was first depressed. The time for which the cylinder selected is shorted is displayed in the time shorted column 10g in the row with the cylinder number and this time value changes to match the time displayed in the upper right corner (10d) of the CRT monitor. The bar corresponding to the selected cylinders being shorted changes proportionally to the RPM change. During shorting, the RMP reading at 10c in the upper left hand corner of the screen is frozen at the value at which shorting started.

The RPM change value that is displayed at 10f is the change from the RPM value at 10c in the upper left corner. It is possible that the RPM change will be an increase rather than a decrease in RPM, caused by an abnormal intake valve condition, failure to disconnect the EGR valve, or due to a vacuum leak, for example.

For this case, a "+" sign is placed next to the RPM drop corresponding to the cylinder (or Even or Odd) being shorted, and the bar corresponding to the RPM change is hollow or in outline form rather than solid. The bars are formed by 10 character segments each representing a change of b 20 RPM for maximum display value of 200 RPM for the bar graph. The segments (full and partial block segments) are generated by a character generator 157 (FIG. 16) described hereinafter.

For lead connections for this mode, the lead 25 (FIG. 2) is connected to the negative (−) terminal of the battery or to a good vehicle ground. The lead 22 is connected to the coil negative terminal or the tachometer terminal of an HEI distributor. The inductive pick-up lead 21 is placed over the #1 spark plug-wire.

Individual cylinder shorting is used to test the power balance of the cylinders with respect to the engine load. Each cylinder is individually shorted by the operator and the resulting RPM changes are displayed numerically and in bar graph form.

The Even/Odd cylinder shorting feature is used for checking and adjusting the balance of multi-barrel carburetors on V-type engines with split (2-plane) intake manifolds. Even/Odd shorting effects shorting of all the even cylinders in the firing order at one time or of all the odd number cylinders in the firing order at one time and records the results numerically and in bar graph form. Depressing the 0/EVEN key or the 9/ODD key switches the display to the Even/Odd feature. Referring to FIG. 11, the screen for the Even/Odd feature is very similar to that for the Cylinder Shorting Bar Graph mode except the firing order at 10e is replaced by the terms EVEN and ODD, (11e) and the bar graph scale cylinder identification is replaced with an "E" (for Even) or an "O" (for Odd).

Operation in the Even/Odd shorting feature is accomplished in the same manner as the individual cylinder shorting. The only difference is that the 0/EVEN or the 9/ODD keys are used, rather than a digit key 1-8.

If a cylinder is to be shorted a second time, the value displayed on the screen for that cylinder is first changed to zero and then the new results are shown.

Depressing the CLEAR key while in this mode causes all of the display values to be changed to zeros.

The Freeze feature is available for use while in this mode. Using the Freeze feature saves the displayed information in non-volatile memory. Only the last display frozen is saved in non-volatile memory.

Dwell Bar Graph Mode

Referring to FIG. 12, the Dwell Bar Graph mode, entered by depressing the DWELL BAR GRAPH key, provides a display of the dwell of each individual cylinder of the engine. The screen displays the title DWELL BAR GRAPH at 12a. The firing order of the engine is shown in a column at 12b and the dwell of each cylinder is displayed numerically at 12c and in bar graph form at 12 d to the right of the corresponding cylinder identification number. The engine RPM and the average dwell are also displayed at 12e and 12 f, respectively. The RPM reading is displayed only in increments of ten. The dwell scale reference for the bar graph information display is determined by the number of cylinders and cycles of the engine and different grids are used for different engine configurations as will be described. Duty cycle is represented at the bottom of the bar graph at 12g.

Regarding the lead connections for this mode, the lead 25 (FIG. 2) is connected to the negative (−) terminal of the battery or to a good vehicle ground. The lead 22 is connected to the coil negative terminal or the tachometer terminal of an HEi distributor. The inductive pick-up lead 21 is placed over the #1 spark plug-wire.

The Freeze feature is available for use while in this mode. Using the Freeze feature saves the displayed information is non-volatile memory.

KV Bar Graph Mode

Referring to FIG. 13, the KV Bar Graph mode, entered by depressing the KV BAR GRAPH key, provides a measurement of the kilovolt values of the secondary voltages for each cylinder. The screen displays the title KV BAR GRAPH at 13a and RPM in numerical form at 13b. The firing order for the engine is shown in a column at 13c and minimum and maximum KV values for each cylinder are shown numerically at 13d and 13e, respectively, to the right of the corresponding cylinder identification number. Individual cylinder KV values are shown in bar graph form at 13f in columns indexed to cylinder numbers. In the live waveform bar graph shown at 13f in FIG. 13, the bars represent the most recent KV sample taken for each cylinder. For minimum/maximum KV values, samples of the secondary voltage for each cylinder are taken and the minimum and the maximum values for each cylinder are stored and displayed numerically. The maximum value displayed in a bar is 20KV. The numeric display shows values from 0 to 50KV. The bar graph and numerics have a 1 KV resolution. When the Memory feature is active, the KV bar graph displays maximum and minimum KV values and bars for the last samples taken of each cylinder.

Regarding lead connections for this mode, the lead 25 (FIG. 2) is connected to the negative (−) terminal of the battery or to a good vehicle ground. The inductive pick-up 21 is placed over the #1 spark plug-wire. If the engine under test has a remote coil, the capacitive pick-up lead 23 is clamped over the coil wire, otherwise, if the engine has HEI ignition, the HEI pick-up is clamped over the distributor.

While in the KV Bar Graph mode, the RPM Set point and the Freeze features can be used. Pressing the FREEZE key also saves the displayed information in non-volatile memory.

RPM Set point Feature

The RPM Set point feature allows the operator to select an RPM value at or above which the Freeze feature is activated automatically, thereby saving the data displayed on the screen as it was at or incrementally greater than the selected RPM value. The proximity to the exact selected value is determined by the rate of RPM change of the engine being tested at the time its RPM surpasses the set point value and the ability of the microprocessor to sample RPM data fast enough.

The RPM Set point can be used when operating in any waveform mode or the KV Bar Graph mode. Once in a selected test mode, the operator can enter a set point by depressing the RPM SETPOINT key on the keyboard and then depressing number keys to enter the desired set point value. Referring to FIG. 13, a set point indication will appear near the top center at 13g on the screen along with spaces for four numbers representing the selected set point value. The right-most space will be blinking until a set point value is entered. During the time a set point value is being entered, the RPM value is not being updated and all other control over the display is interrupted. The number keys are used to enter the desired RPM Set point value. Once the desired numbers have been entered, the ENTER key is depressed to enter the selected set point value and return the system to normal testing.

The operator can then continue testing the engine, but at any time the engine RMP meets or exceeds the set point value, the display freezes. To exit the freeze condition mode and continue testing, the operator depresses the FREEZE key on the keyboard.

The RPM Set point is removed if the RPM SETPOINT key is depressed while the engine RPM is less than the current set point. Changing to a different function screen also removes the set point. To change the RPM Set point value, the previous set point is cleared and then the new value is entered in the manner described above.

Freeze Feature

The Freeze feature provides a completely still picture of the selected waveform or bar graph. This allows the user to analyze the display without the screen image moving or changing due to the updating of the information being displayed. The freeze feature is activated by depressing the FREEZE key on the keyboard. The word "FROZEN" is displayed in the upper left corner of the screen at 14a, as shown for the secondary waveform displayed in FIG. 14.

With continued reference to FIG. 14, if the primary or secondary waveforms have been selected and frozen, all cylinders can be selected and viewed one at a time. Also available when the Freeze feature is active for all waveform screens is the Cursor/Msec feature. When an arrow key is depressed, the cursor appears as a vertical line through the left edge of the waveform pattern on the screen. When the RT ARROW/SPCL TRIG key is depressed, the cursor expands to the right defining an area or "curtain" displayed in inverse video extending from the left edge of the screen to the right edge of the cursor. Depressing the LEFT ARROW/STD TRIG or RT ARROW/SPCL TRIG keys will move the right edge of the cursor curtain left or right.

The ENTER key on the keyboard enables the user to toggle the selected edge of the cursor from the right edge 14c to the left edge 14d or vice versa. Thus, after the ENTER key is operated, the left edge of the cursor area is selected and when the RT ARROW/SPCL TRIG key is depressed the left edge of the cursor curtain moves toward the right. Subsequently, when the LEFT ARROW/STD TRIG key is depressed, the left edge of the cursor curtain moves toward the left. An arrow in the upper right or upper left corner of the screen at 14e, (or 14e') indicates which side of the cursor is selected.

The millisecond time associated with the section of waveform contained within the cursor curtain appears at the top center of the display at 14b. Neither edge can move past the other edge. Each time the cursor area is changed, the millisecond display on the screen is adjusted accordingly. The Freeze feature is disabled by depressing the FREEZE key or any function key.

Memory Feature

The Memory feature provides storage for all bar graphs and a single waveform, such as primary ignition patterns for all cylinders, secondary patters for all cylinders, etc., for later viewing. The memory provides nonvolatile storage of data for about three days, even when power is not supplied to the digital engine analyzer.

Information for a particular bar graph or waveform is entered into non-volatile memory when that screen is frozen. Retrieval of the stored information can be accomplished by either selecting a stored function while in the data entry screen or by freezing a function screen and then selecting the desired function which has already been saved on non-volatile memory. Switching between different memory screens is then possible. If a selected screen has not been entered into memory, the screen comes up live, rather than frozen as it would be in memory.

Depressing the FREEZE key while the Memory feature is activated causes the screen to become live. The stored screen is valid within the memory if it was a bar graph screen. Selecting any live waveform screen destroys the stored waveform information. All stored information is destroyed when the start-up data entry screen (FIG. 3) is accessed. If a particular bar graph screen has been stored in memory and that mode is reselected and then frozen, the new information will be placed in non-volatile memory. The Cursor/Msec feature associated with the Freeze feature is also available for use on a waveform stored in non-volatile memory.

Instruction Mode

Depressing the INSTRUCTION key on the keyboard brings an abbreviated version of the digital engine analyzer operating instructions onto the screen of the CRT monitor. The first two pages of the instructions are a guide by which specific functions can be located elsewhere in those instructions. The RT ARROW/SPCL TRIG and LEFT ARROW/STD TRIG keys on the keyboard allow the user to page forward and backward, respectively, through the instructions which display advice on test modes, features and control functions

Analog Circuits

Figure 15:
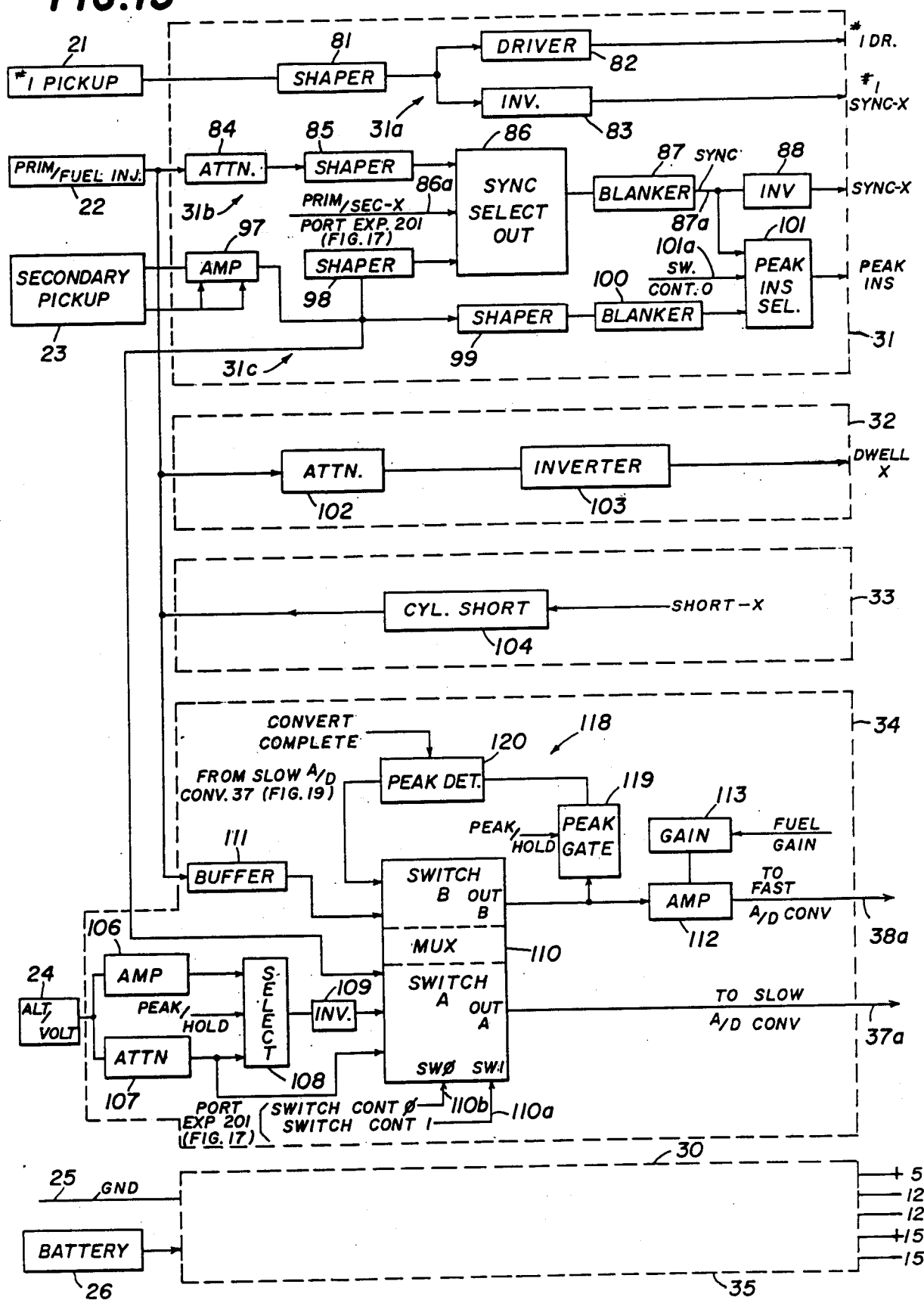
FIG. 15 is a block diagram of the analog circuits of the electronic circuits shown in FIG. 2.

Referring to FIG. 15, there are essentially five signal inputs to the analog circuits 16. These inputs provide over leads 21-25, respectively, include number 1 inductive pickup, the primary/fuel injector, secondary pickup, the alternator/voltage and ground. A separate lead set 26 extends the 12 VDC battery voltage (or another cable if an AC source is used) to the analog circuits 16.

The analog signal processing circuit 31 generates sync pulses, analog signal processing circuit 32 generates a dwell signal, analog signal processing circuit 33 provides a cylinder shorting function, and analog signal processing circuit 34 provides analog signal selection.

Sync Pulse Generation

The analog signal processing circuit 31 includes three sync processing circuits 31a, 31b and 31c. The number 1 inductive pickup signal on input lead 21 is passed to sync processing circuit 31a which is comprised of a pulse shaper 81, a driver circuit 82 and an inverter 83. The pulse shaper 81, which is comprised of two voltage comparators, detects ringing information from the inductive pickup which is a current sensing type device that clamps over the #1 spark plug wire. When ringing occurs, the pulse shaper 81 shapes the ringing signal and provides a pulse called the number 1 sync pulse. The #1 SYNC pulse occurs once and usually coincides with the number 1 cylinder of a given firing order. For an 8 cylinder engine the number 1 sync pulse would occur every time the first cylinder fires. The #1 SYNC pulse is then inverted by inverter 83 and applied directly to the main microprocessor 151, FIG. 16, as #1 SYNC-X, where the suffix "x" denotes complementary state of the signal, and this convention will be used throughout this application. The main microprocessor uses the pulse #1 SYNC-X when making RPM calculations and any other calculations related to engine RPM and to enable the main microprocessor 151 to keep track of which cylinder is firing. The #1 SYNC pulse also is applied to driver circuit 82 which drives external apparatus via an output loop (not shown) on the back panel of the digital engine analyzer.

The primary/fuel injection input on lead 22 is extended to sync processing circuit 31b which includes an attenuator 84, a wave shaper 85, a sync select circuit 86, a noise blanker circuit 87 and a sync inverter 88.

The secondary pickup signal on lead 23 is passed to sync processing circuit 31c which includes a programmable amplifier 97, a wave shaper 98, a wave shaper 99, a noise blanker circuit 100 and a peak insert select circuit 101.

Referring to sync processing circuit 31b, the primary signal passes through attenuator 84 to wave shaper 85, the output of which is connected to an input of the sync select circuit 86 which includes an electronic selector switch. The signal output of wave shaper 85 is applied to one of the three inputs of the sync select circuit 86 which has a second input connected to the output of the waveform shaper 98 and a third input connected via conductor 86a to the main microprocessor to receive a signal PRIM/SEC-X which selects the primary or the secondary sync signal.

Referring to sync processing circuit 31c, the gain of the amplifier 97 is coded as a function of the particular pickup (HEI, etc.), the pickup lead set having two extra wires for coding of this input. The coding selects the gain for the amplifier 97. The signal at the output of the programmable amplifier 97 passes through wave shaper 98 the output of which is connected to an input of the sync select circuit 86. Selection of the particular sync required, either one derived from the primary or secondary signal, is selected by the signal line PRIM/SEC-X from the main microprocessor 151.

The selected sync signal is fed into the noise blanker circuit 87, which insures that only one sync pulse is generated for each cylinder firing. The noise blanker circuit 87 indirectly triggers off of the high voltage spike of the ignition signal. This high voltage spike results when the primary current of the ignition coil is interrupted, normally once per cylinder firing. The typical primary and secondary signals have significant voltage variation other than the wanted trigger voltage, due to noise or variations inherent to the waveform. The function of the noise blanker circuit 87 is to ignore these variations for a certain percentage of the period of one signal during which noise problems are likely to exist. The noise blanked signal generated by the noise blanker circuit 87 is inverted by sync inverter 88 and becomes the signal SYNC-X which ultimately goes to the main microprocessor 151. The signal SYNC-X is used for synchronizing the writing of waveform data into the waveform memory circuit 152 (FIG. 20), and also for computation of RPM and VCO rates in conjunction with the pulse #1 SYNC-X.

Referring to sync processing circuit 31c, the secondary signal is passed through amplifier 97, through wave shaper 99 and noise blanker circuit 100, which performs the same function as noise blanker circuit 87, to one input of the peak insert select circuit 101. The sync signal provided at the output of noise blanker circuit 87 is passed to a second input of the peak insert select circuit 101. Separate noise blanker circuits 87 and 100 are provided to enable selecting a noise blanked sync pulse signal called PEAK INSERT to be derived from either the primary or secondary input signals.

The main microprocessor 151 selects the appropriate pulse derived from the primary or secondary signal, based upon the operating mode at that time. If the primary screen is selected, the main microprocessor normally selects the sync pulse derived from the primary signal. If the secondary screen is selected, the main microprocessor normally selects the sync derived from the secondary waveform. The signal SWITCH CONTROL 0, which is a third input to the peak insert select circuit 101, is set at logic high when the Primary Pattern mode is active, and is set at logic low when the Secondary Pattern mode is active. The signal PEAK INSERT is ultimately used as a sync source for peak control logic 216 (FIG. 18) in the digital circuits 17.

Noise Blanker Circuit

The ignition signals produced by a vehicle ignition system contain information relating to the combustion process of each cylinder. The voltage generated by the coil just prior to combustion commonly referred to as the "firing line" on the secondary waveform is used to initiate the sync pulses for operating the analyzer. However, the ignition signals also tend to include extraneous information due to "noise" they generate. The blanker circuits 87 and 100 (FIG. 15) produce sync pulses coincident with the firing line of a particular cylinder and insure that "noise" does not produce false sync pulses for the desired pulse width. The desired pulse width is a relatively fixed percentage of the period of the incoming signals at most engine speeds.

Figure 15A:
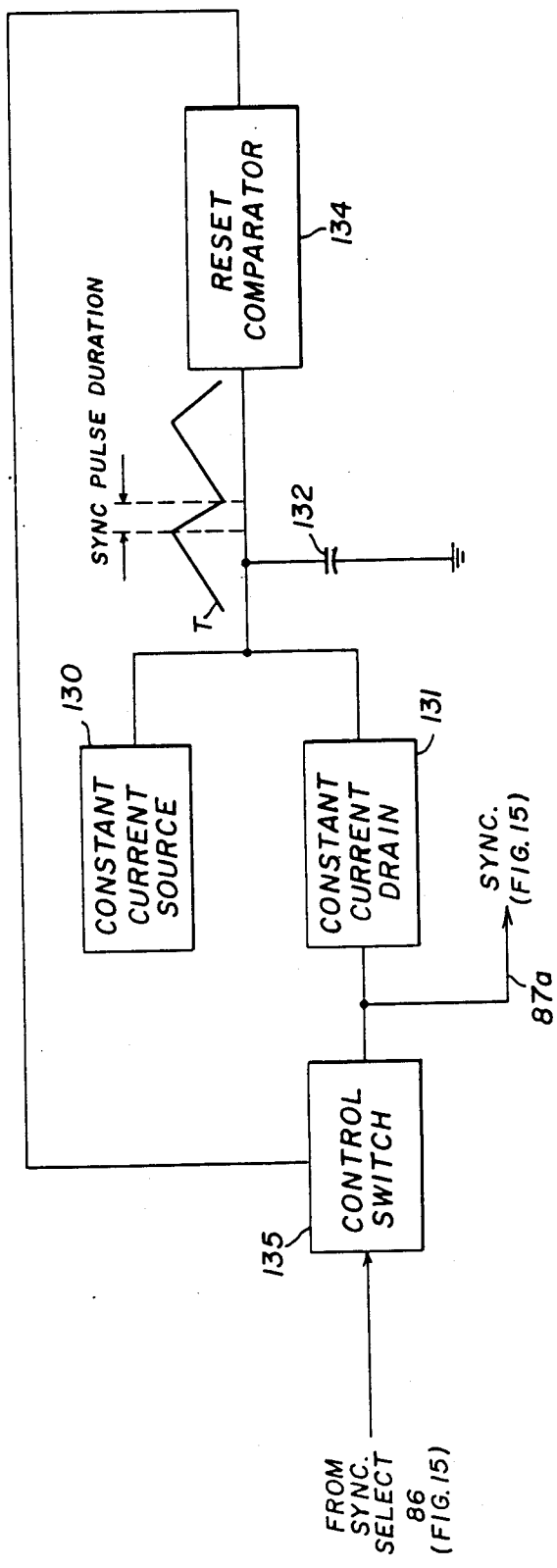
FIG. 15A is a block diagram of a noise blanker circuit of the analog circuits shown in FIG. 15.

Referring to FIG. 15A, the blanker circuit 87 includes a constant current source 130, a constant current drain 131, a capacitor 132, a reset comparator 134 and a control switch 135. The constant current source 130 charges the capacitor 132. Because the current is constant, the charge of the capacitor 132 is substantially linear. The constant current drain 131 is inoperative at this time and the output of the control switch 135 is low.

When a sync pulse from the sync select circuit 86 occurs, the output of the control switch 135 becomes high thereby rendering constant current drain 131 operative, to permit the capacitor 132 to discharge therethrough. The reset comparator 134 has a signal input connected to the capacitor 132 and also has an internal threshold circuit which provides a threshold for the reset comparator. The capacitor 132 discharges to ground through the constant current drain 131 until the voltage thereacross falls to the threshold value of the reset comparator 134. Upon reaching such threshold value, the reset comparator 134 provides a switching voltage which is applied to the reset input of the control switch 135, causing its output to become low, thereby turning off the constant current drain 131.

The rate of charge of the capacitor 132 and thus the slope of the increasing portion of the sawtooth waveform is defined by the value of the capacitor 132 and the charging resistance (not shown) in the constant current source 130. The discharge rate of the capacitor 132 and thus the slope of the falling portion of the sawtooth waveform is determined by the value of the capacitor 132 and the resistance (not shown) in the constant current drain 131 through which it discharges. Both rates are constant and thus unaffected by the engine speed.

During the increasing portion of the sawtooth waveform, the output of the control switch 135 is low, and during the falling portion of the sawtooth waveform, the output is high. Since the rates of charge and discharge do not change, the durations of the rising and falling portions do change and, in fact, are inversely proportional to engine speed. Stated another way, the time during which the output of the control switch 135 is low is inversely proportional to engine speed. If the engine speed is doubled, thereby doubling the frequency of the sync pulses applied to the control switch 135, the duration that the output of the control switch 135 is low is halved.

The blanker circuit 100 (FIG. 15), used to process the sync signals from the engine secondary, it may have a construction identical to that depicted in FIG. 15A. Or, it could incorporate a switch identical to the control switch 135 but use the same elements 130–134. In that event, the output of the reset comparator 134 would be coupled to the control switch in each of the blanker circuits 87 and 100.

Dwell Signal Generation

The analog signal processing circuit 32 (FIG. 15) includes an attenuator 102 and an inverter 103. The primary waveform is passed through attenuator 102 and through inverter 103, the output of which is the signal DWELL-X which is used by the main microprocessor for determining dwell for a particular cylinder.

Cylinder Shorting

Cylinder shorting 33 is done electronically by way of the analog signal processing circuit 33. When the operator selects cylinder shorting by keying in appropriate information to the main microprocessor 151 using keyboard 12 (FIG. 16), the main microprocessor uses an algorithm within its program to compute when a cylinder should be shorted. At the appropriate time, the main microprocessor 151 sets low the signal SHORT-X to enable the analog signal processing circuit 104. The analog signal processing circuit 104 includes a Zener diode (not shown) and an SRC (not shown) which, when gated on, provides a load in the primary side of the ignition coil. This circuit does not provide a complete short, but prevents that particular cylinder from firing.

Analog Signal Processing Circuit

Referring to the analog signal processing circuit 34, this circuit includes alternator diode pattern amplifier 106, an attenuator 07, selector switch 108, inverter 109, a multiplexer 110, and an amplifier 112 having an associated gain selector circuit 113, a peak select switch 119 and a peak detection circuit 120. One function of the analog waveform processing circuit 34 is to select which of the inputs: primary signal, secondary signal, alternator diode pattern, battery voltage or fuel injector is passed to the fast A/D converter.

The Alt/Volt input on lead 24 is a composite of both DC and AC including the actual battery voltage. For the purpose of permitting the operator to view the alternator diode pattern, the signal input on lead 24 is passed to the analog signal processing circuit 34 which provides two different circuit paths, one circuit path including the alternator diode pattern amplifier 106 and the other circuit path including attenuator 107. The respective outputs of amplifier 106 and attenuator 107 are connected to separate inputs of the alternator pattern selector switch 108 which has a third input connected to receive a signal PEAK/HOLD from the main microprocessor 151.

In the Alternator screen, there are three modes which can be selected: Alternator, Fuel Injector and Voltage. The selector switch 108 is controlled by the signal PEAK/HOLD which is provided by the main microprocessor. The main microprocessor establishes which input is to be selected based upon information the operator has keyed into the system via the keyboard 12. This signal PEAK/HOLD is set to the level required to enable the selector switch 108 to pass either the diode pattern signal or the attenuated battery voltage, through inverter 109 and on to the input of the multiplexer (MUX) 110. The diode pattern signal is an AC coupled signal which shows only the ripple voltage of the alternator/battery such that the condition of the alternator diodes and stator windings can be determined. The attenuated battery voltage indicates the charging systems regulated voltage. The voltage signal is a DC coupled signal that allows available voltage, voltage drop, continuity, and electronic ignition pickup coil tests to be performed.

The analog signal processing circuit 34 further provides peak value detection for capturing the full value of the firing line peak voltage for each cylinder. The peak value is used in calculating KV peak values for secondary signals and for generating peak value information which is inserted into the waveform at the proper time so that the full value of the firing peak will be displayed on the CRT screen. To this end, the analog signal processing circuit 34 includes a peak detector circuit 120 and a peak gate 119.

The main microprocessor 151 under program control determines when the peak value for the next cylinder in the firing order is to be obtained and sets the PEAK/HOLD signal to logic high, enabling the peak gate 119 (not shown). When enabled, the peak gate 119 gates the primary (or secondary) signal to the peak detector circuit 120. At the end of the firing period for the selected cylinder, the main microprocessor sets signal PEAK/HOLD low, disabling peak gate 119.

The peak detector circuit 120 captures the peak value of the signal and provides an output which corresponds to the peak value of the signal during the time period the peak gate is enabled.

The multiplexer (MUX) 110 operates as two analog data selector switches one for passing the slow A/D information, such as the attenuated battery voltage and the peak value information, to conductor 37a and the other for passing the fast A/D information, such as the secondary signal, primary signal, and alternator diode signal or fuel injector signals to the input of amplifier 112, the output of which is connected to conductor 38a.

The state of the multiplexer 110 is controlled by the signals SWITCH CONTROL 0 and SWITCH CONTROL 1 provided by the main microprocessor and applied to multiplexer inputs 110a and 110b. Signals SWITCH CONTROL 0 and SWITCH CONTROL 1 are binary coded to define four states to enable the multiplexer 110a to pass one of four signals, primary (01), secondary (00), alternator and volts (10) or fuel injector (11) to the fast A/D converter 38 (FIG. 16). The first bit of each code is the signal SWITCH CONTROL 0 and the second bit is the signal SWITCH CONTROL 1. Whenever SWITCH CONTROL 1 is low, the output of peak detector circuit 120 is pased by multiplexer 110b to the slow A/D converter 37 via conductor 37a. The voltage at the output of the attenuator 107 is passed to conductor 37a when signal SWITCH CONTROL 0 is low and signal SWITCH CONTROL 1 is high.

When Fuel Injector Pattern mode is selected, the main microprocessor sets up hardware in the analog circuits 16 to configure the analog circuits for operation in the Fuel Injector Pattern mode. In particular, amplifier 112 is gain selected based on the mode which is active, the gain being increased to accommodate the Fuel Injector Pattern mode. The gain of the amplifier 112 is increased to insure that the fuel injector pattern is correctly proportioned on the CRT screen. The gain selection is done electronically under the control of the main microprocessor.

When the main microprocessor 151 detects that the Fuel Injector mode has been selected, signals SWITCH CONTROL 0 and SWITCH CONTROL 1 are set high and ANDed to generate a signal FUEL GAIN used to set the gain for the waveform amplifier 112, by switching in a larger feedback resistor to the amplifier 112. The signal, SWITCH CONTROL 1 also enables the multiplexer 110 to extend the fuel injector input (present on input 22) to the conductor 38a. In addition, the main microprocessor sets high the signal PRIM/SEC-X for sync select circuit 86 to select the pulses from the primary/fuel injector input 22, in this case fuel injector pulses. These pulses are noise blanked by noise blanker circuit 87, inverted by inverter 88 and passed on as SYNC-X to the digital circuits 17.

Power Supply Circuit

The power supply 35 includes a DC-DC converter employing a pulse width modulator which responds to the 12 VDC battery voltage to provide pulses which drive the primary of a transformer so as to generate +5, ±12, and ±15 VDC. The supply is over-current protected and will shut down above a predetermined load current.

Digital Circuits

Referring to FIG. 16, the digital circuits 17 include a main microprocessor 151, a waveform memory circuit 152, a display microprocessor 153, a display memory circuit 154, screen ROM 155 and instruction ROM 156. The digital circuits further include a character generator 157, a dot energizing circuit 158 and output logic 159. The main microprocessor 151 and the display microprocessor 153 also have associated memory control circuits 160 and 173, respectively.

The main microprocessor communicates directly with the analog circuits 16 (FIG. 15) via control line 39. Signal inputs to the digital circuits 17 from the analog circuits 16 are provided by conductor 37a which conducts slow A/D information, conductor 38a which conducts the fast A/D information and via signal conductors 40.

The main microprocessor 151 also communicates directly with the display microprocessor 153 via serial data transmit/receive lines 151a and receives and stores KV peak values for each cylinder and supplies these values to the waveform memory circuit 152 via peak insert switch 161 at the appropriate time.

Peak Insertion

Digressing, the firing on the ignition signal, on the primary or on the secondary, has an extremely rapid rise time as can be seen in FIG. 4 and 6. Neither the fast analog to digital converter 38 nor the slow analog to digital converter 37 acts sufficiently fast to insure that the peak of the firing line will occur precisely at the data point. Without additional circuitry, the peak of the firing line on the CRT screen would be likely to be less, and perhaps substantially less, than the actual peak value.

The present application discloses a circuit for detecting the peak of the firing line and causing such peak to be displayed so that the ignition waveform the CRT screen does, indeed, accurately reflect its peak.

When either the Primary or Secondary Pattern mode is selected, the main microprocessor 151 instructs the analog waveform processing circuit 34 (FIG. 15) to sample the waveform and capture the full height of the firing line for each cylinder, providing a signal representing the firing line peak value. At the correct time, this information provided by the slow A/D converter 37 is accessed and converted by the main microprocessor and then inserted into the waveform information being sent to the waveform memory circuit 152 by the fast A/D converter 38 so that the full value of the firing peak for any cylinder firing will be displayed on the CRT screen.

Fast A/D converter 38 supplies information directly to the waveform memory circuit 152 via a data switch 162 or delay circuit 163. Non-volatile data storage is provided by non-volatile display memory 115 and non-volatile waveform memory 164.

Memory Circuits

There are two general classifications of data that are processed. One is waveform data, such as the digital data representing the primary and secondary waveforms which are constructed, temporarily stored in the waveform memory circuit 152 and then extended to CRT monitor 11. The other type of data is alphanumeric address data which is temporarily stored in display memory circuit 154 and which when applied to character generator 157 provides character data to the CRT monitor 11.

The waveform memory circuits 152 include identical memory banks, memory-A 165 and memory-B 166. A memory bank switching arrangement is employed. Selection of which memory is read into and which memory is read out of is controlled by memory control circuits 160 which in turn control memory select circuits 167 and 168.

Similarly, the display memory circuit 154, associated with the display microprocessor 153, employs a bank switching arrangement including memory-A 169, memory-B 170 and associated memory select circuits 171 and 172. Address data for the character generator 157 which formats fixed screen patterns is stored in screen ROM 155 and the instruction ROM 156, both of which ROMs are read out via display memory circuit 154. The accessing of the screen ROM 155 and instruction ROM 156 as well as the addressing of the display memory circuit 154 is controlled by the display microprocessor 153 via memory control circuits 173. The address data read out of display memory circuit 154 is extended to the character generator 157 which supplies appropriate digital signals for representing alphanumeric information to be displayed to output logic 159 which drives the CRT monitor 11.

The slow A/D information (as well as the Engine Information such as number of cylinders and cycles, entered by the user) is stored in the non-volatile display memory 115 under the control of the main microprocessor 151. The slow A/D converter 37 handles information such as the KV peak and battery voltage, and provides digital values corresponding to the analog values of the signals. The main microprocessor also receives inputs from the keyboard 12. The main microprocessor scans the keyboard 12, detects any key operation and effects the command or stores the data represented by the keys operated. The main microprocessor sends digital information to the display microprocessor via serial data transmit/receive lines 151a, including mode identification signals derived from keyboard operation.

Waveform information is stored in the non-volatile waveform memory circuit 164 under control of the memory control circuits 160. The fast A/D converter 38 provides conversion of analog signals to digital signals for primary and secondary signals, alternator diode pattern signals and fuel injector signals and voltage pattern. Due to the nature of the signals, the fast A/D converter 38 must have a very fast response time. Due to the fast response time of the fast A/D converter 38, the fast A/D converter 38 enters data directly into the waveform memory circuit 152. In other words, the main microprocessor 151 does not take part in directing the fast A/D waveform data to waveform memory circuit 152. The fast A/D waveform data is entered into memory-A 165 and memory-B 166 through hardware control by the memory control circuit 160 and memory select circuits 167, 168.

The main microprocessor operates under the control of programs stored in its ROM to receive and process the slower information such as the pulses #1 SYNC-X and SYNC-X from which it derives synchronization. The main microprocessor responds to the SYNC-X pulses, computes RPM and generates a VCO signal based on engine RPM which is used to correlate the sampling rate with engine speed for the fast A/D converter 38 and storage of waveform data in waveform memory circuit 152 and non-volatile waveform memory 164.

There are two ways waveform data can be entered into the waveform memory circuit 152 from the fast A/D converter 38. One is from the fast A/D converter 38 through data switch 162. The other way is through delay circuit 163. The delay circuit 163 digitally delays the digital data to effectively shift the displayed waveform to the right (see FIG. 5) on the CRT screen to facilitate analysis of the leading edge of the waveform. In an actual embodiment, the delay furnished by the delay circuit 163 was fixed at 128 bytes. Since the extend of the CRT screen was 512 bytes, the waveform on the CRT screen is moved to the right approximately 25% of the screen width If the waveform from the fast A/D converter 38 passes through the data switch 162, the leading edge of the waveform under analysis is at the left-hand margin of the screen.

The non-volatile waveform memory 164 also shares the data bus 152a. When enabled, incoming data is stored in the non-volatile waveform memory 164 which can store waveform data for up to eight cylinder firings. However, the non-volatile waveform memory 164 can only store at one time, the data for the primary or the secondary waveforms for all eight cylinders, or the fuel injector waveforms or the alternator diode or voltage patterns. The peak value which is determined by the peak detector circuit 120 (FIG. 15) is received and stored by the main microprocessor 151 and eventually is supplied to data bus 152a for application to the inputs of the delay circuit 163 and the waveform data switch 162, one of which is enabled to pass the peak value data of all the waveforms to the appropriate memory bank at the proper time.

In summary, for waveform data, the waveform memory circuit 152 receives waveform data from the fast A/D converter 38 (or peak insert data from the main microprocessor via peak insert switch 161) via waveform data switch 162, or the delay circuit 163, or data stored in the non-volatile waveform memory 164. The source of data is selected by the memory select circuit 167 under the control of the memory control circuits 160.

A memory bank switching arrangement is employed in passing waveform from the selected input source to the CRT monitor 11 (FIG. 2). Memory select circuits 167 and 168 are operable in complementary fashion, allowing data to be read into one of the memories, such as memory 165 while data is being read out of the other memory 166. When data has been received for the selected waveform, the memory control circuits 160 switches the functions of memory 165 and memory 166 such that data is read out of memory 165 while incoming data is read into memory 166. Data stored in non-volatile display memory 115 representing calculations such as RPM, Dwell, etc. made by the main microprocessor, is passed to the display microprocessr 153 via data serial transmit/receive lines 151a.

The information read out of waveform memory circuit 152 passes to dot energizing circuit 158 which controls turn-on of the electron beams for the CRT monitor 11. The function of the dot energizing circuit is to provide a more continuous waveform by filling in the dots in the column of the one of two adjacent points located in different rows, as in rising or falling waveforms. With this arrangement, only 512 bytes are required to address the portion of the screen on which the waveform is displayed. The dot energizing circuit 158 eliminates the need for memory mapping or bit mapping to the screen.

The output of the dot energizing circuit 158 is extended to output logic 159 which also receives data from the display memory circuit 154 and forms a composite signal of waveform and display format data and drives the CRT monitor 11 (FIG. 2).

The display data is handled in a similar manner as far as memory is concerned. A bank switching arrangement is employed. The display microprocessor 153 indirectly controls through memory select circuits 171 and 172, into which of the memories 169 or 170 data is written to while data is being read out of the other memory. The display microprocessor 153 uses the input data bus 153a for transferring address data between the screen ROM 155 and the instruction ROM 156 and the display memory circuit 154 and uses output data bus 154a for transferring address data from the display memory circuit 154 and the output logic circuit 159. The screen ROM 155 stores address data for application to the character generator 157 to format the various screen patterns. The instruction ROM 156 stores address data for application to the character generator 157 to format instruction screens which display information in text form such as how to use the digital engine analyzer 10 (FIG. 1). The display microprocessor 153 on demand from the control signals provided by the main microprocessor 151 in response to keyboard entry, accesses either the instruction ROM 156 or the screen ROM 155 to read out the appropriate information which is passed via data bus 153a to the display memory circuit 154. The display microprocessor 153 also does some calculation of data, particularly conversion of data such as RPM value from hex code to decimal format and passes this data via data bus 153a to the display memory circuit 154. The display microprocessor also converts decimal values to ASCII or the code necessary for use in character generation.

Switching of memories 169 and 170 between read and write modes is controlled by memory select circuits 171 and 172 which receive control signals and address information from the display microprocessor 153 via memory control circuits 173. The output of display memory circuit 154 is extended to the character generator 157 which responds to the addresses supplied thereto to output the appropriate character data through the output logic 159 for application to the CRT monitor 11 (FIG. 2).

Detailed Digital System

Figure 19A:
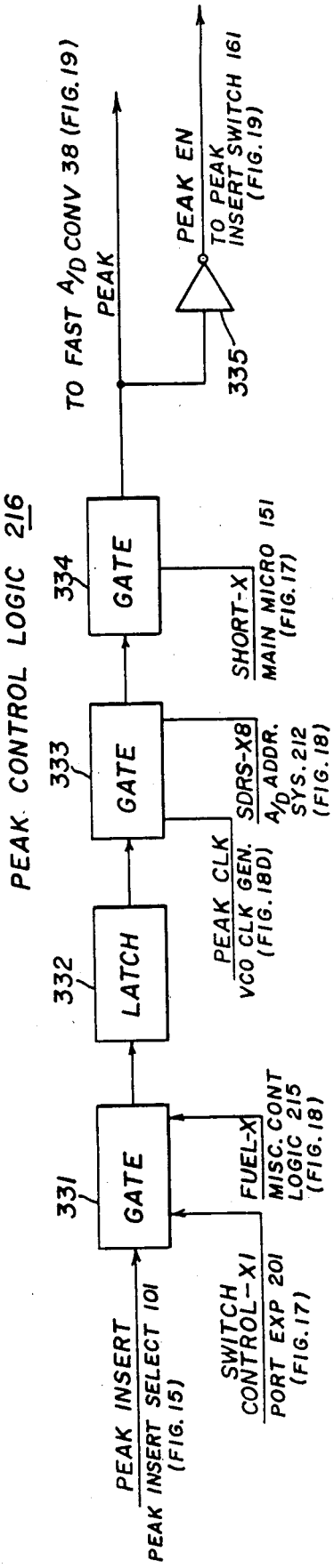
FIG. 19A illustrates the peak control logic of the digital circuits.
Figure 17:
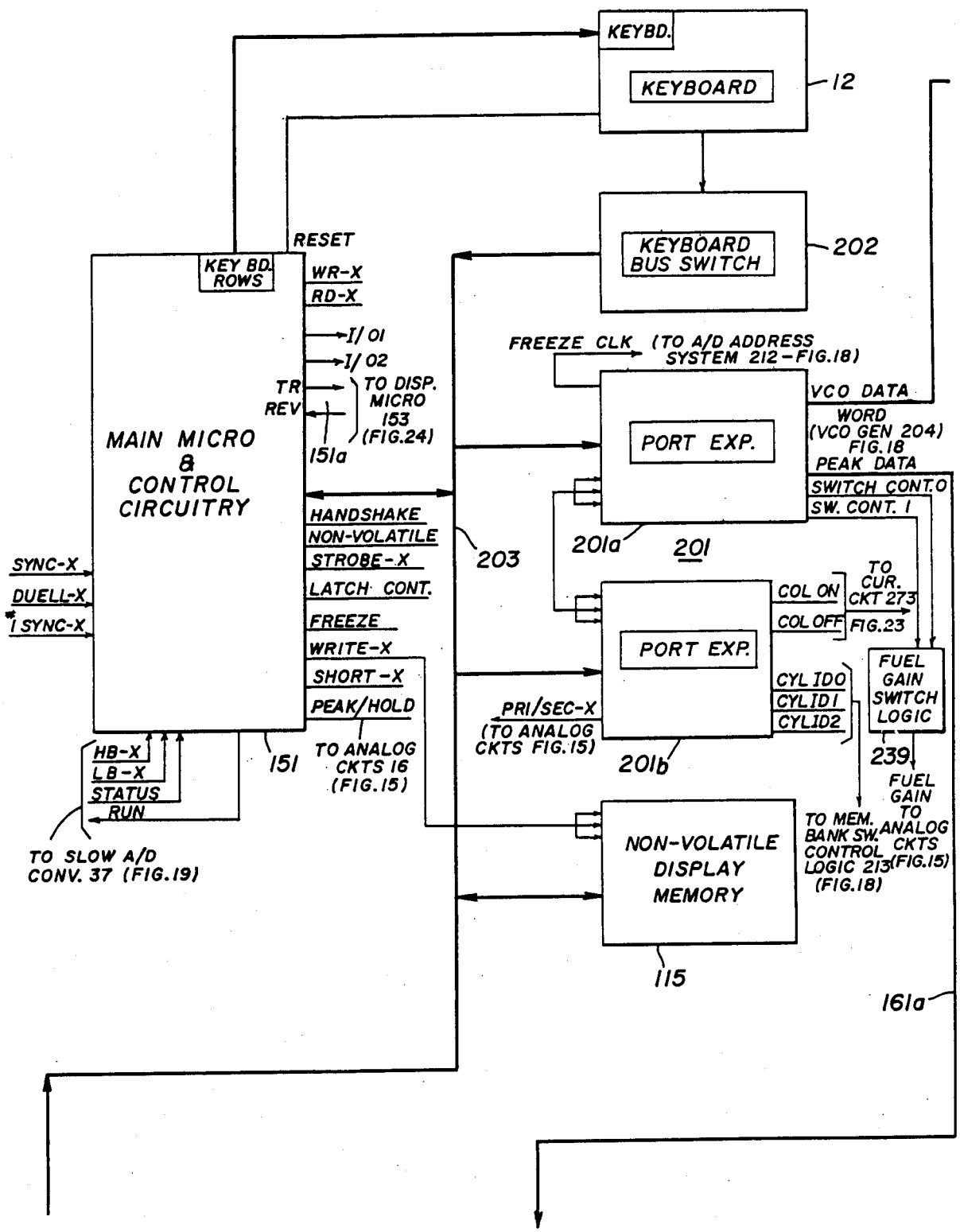
Figure 18:
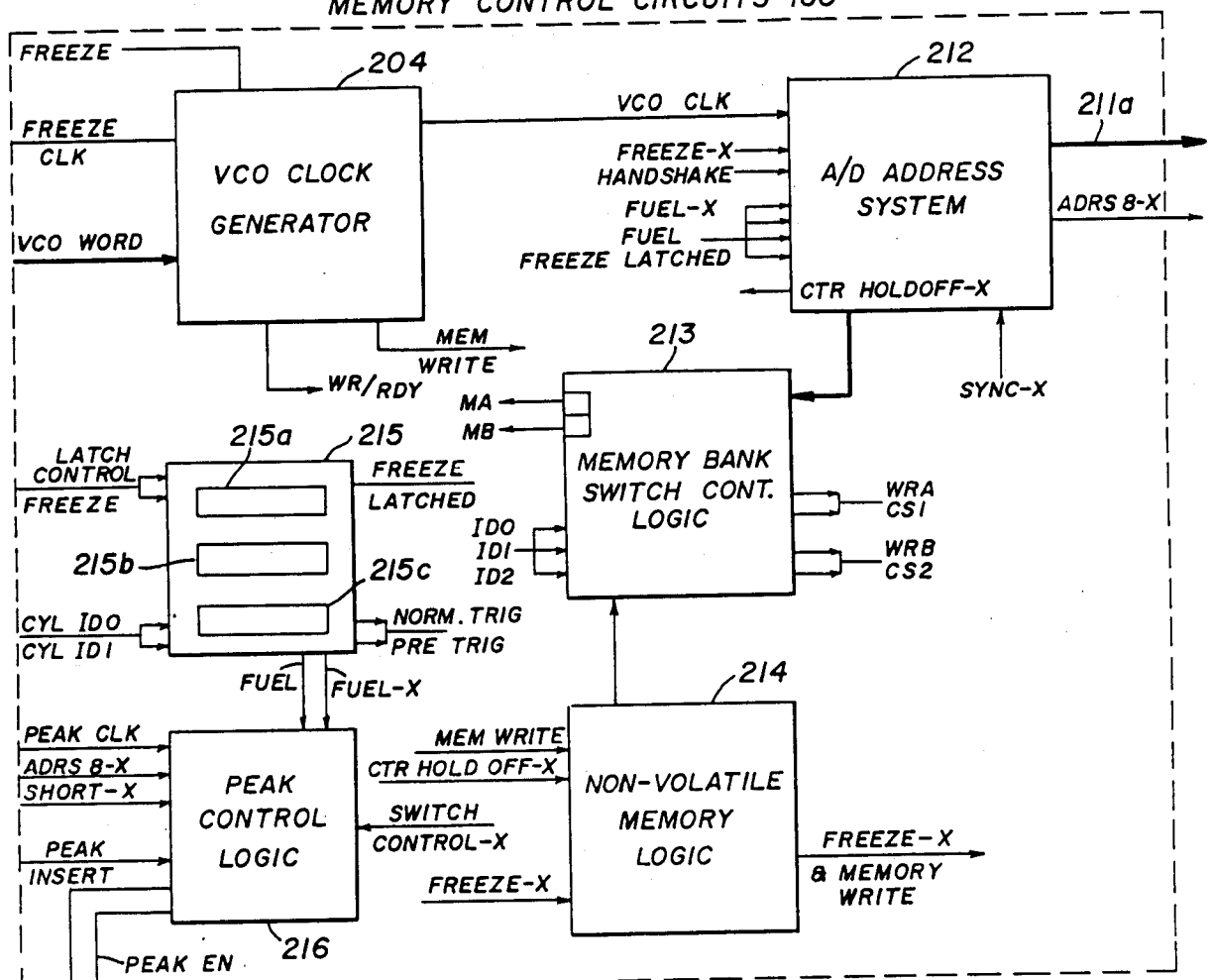
Figure 19:
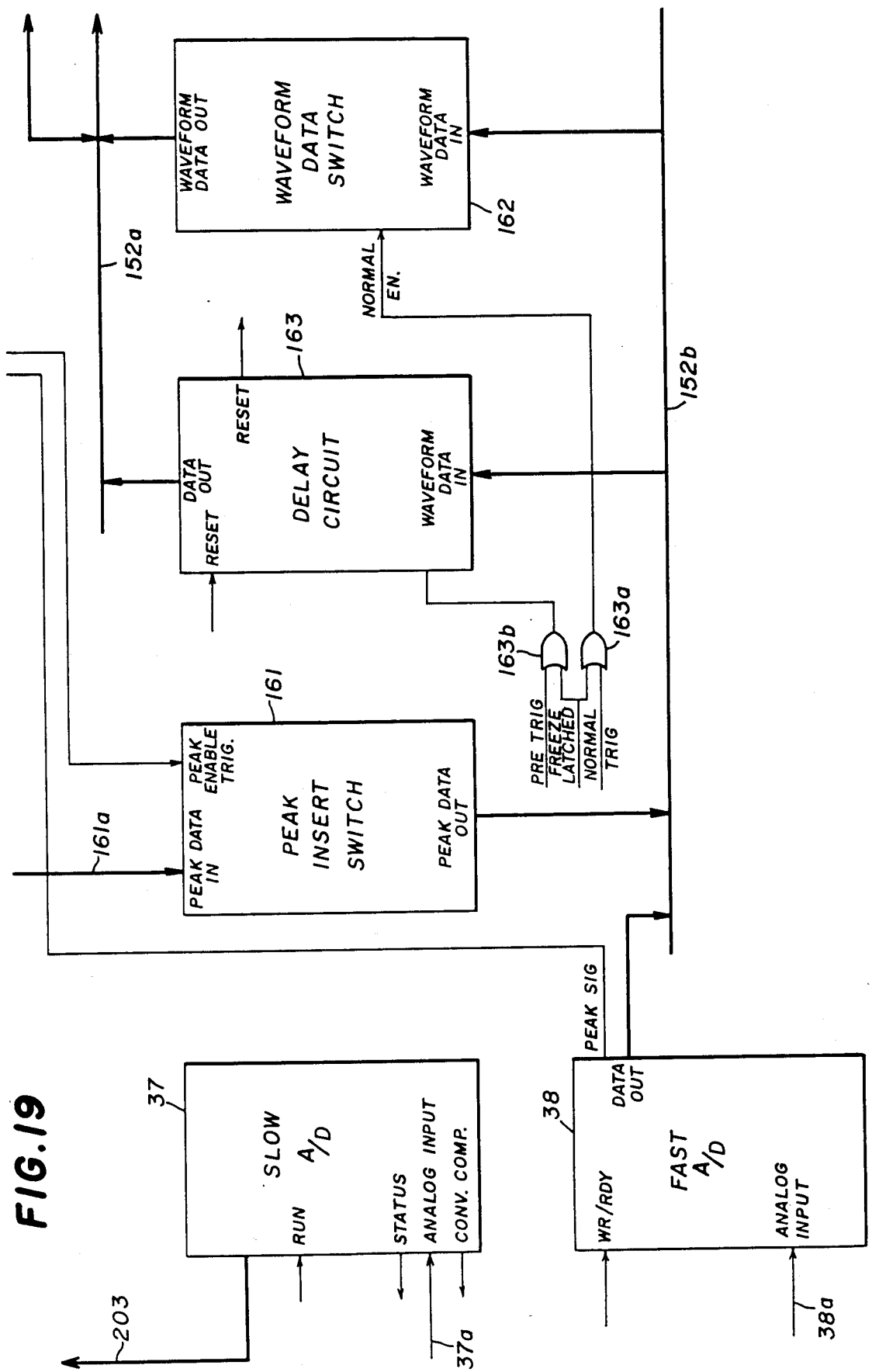
Figure 45:
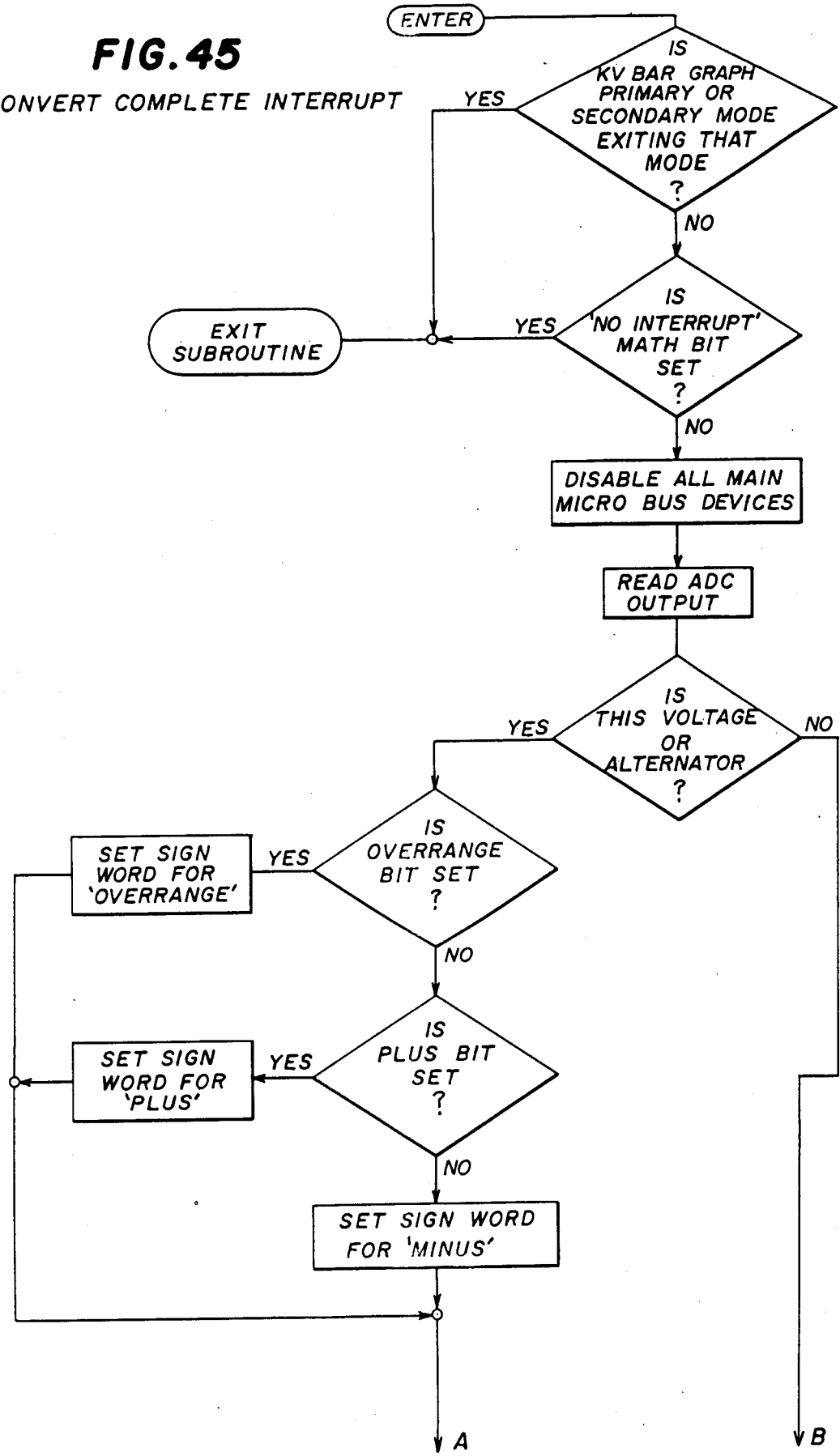
FIGS. 45 and 45A depict the flow chart for the convert complete interrupt routine.

FIGS. 17-24, when arranged as shown in FIG. 45, illustrate a detailed block diagram of the circuits of the digital circuits. Referring first to FIGS. 17 and 19, the main microprocessor 151 has an associated port expander 201 including port expander circuits 201a and 201b which are used to expand the output capability of the main microprocessor via a data and control bus 203 to which are connected inputs of the port expander 201, inputs and outputs of the non-volatile display memory 115 (FIG. 16), and the output of the slow A/D converter 37 (FIG. 16) and keyboard bus switch 202.

The main microprocessor receives input signals #1 SYNC-X, DWELL-X, and SYNC-X from the analog signal processing circuit 31 (FIG. 15) and the STATUS signal from the slow A/D converter 37. The main microprocessor provides control signals RUN, LB-X, HB-X for the slow A/D converter 37, analog circuit control signals SHORT-X and PEAK/HOLD for the appropriate circuits, port expander select signals I/O 1, I/O 2, WR-X, RD-X, and control signals FREEZE, LATCH CONTROL, WRITE-X, STROBE-X, NON-VOLATILE and HANDSHAKE for the memory control circuit 160, as well as RESET and KBD-ENABLE-X for the keyboard bus switch 202 and transmit and receive serial data for the display microprocessor 153.

The port expander 201 outputs main microprocessor signals PRI/SEC-X, CYL ID0, CYL ID1, CYL 1D2, FREEZE CLK, SWITCH CONTROL 0 and SWITCH CONTROL 1 and data words COL ON, COL OFF, PEAK DATA and VCO.

The keyboard 12 has an associated keyboard bus switch 202 which interfaces the keyboard 12 with the main microprocessor via bus 203. The main microprocessor continuously scans the rows of the keyboard and column information as sent to the main microprocessor via keyboard bus switch 202 to enable determination of change in function of any of the switches.

The keyboard is divided into rows and columns. The main microprocessor scans the keyboard monitoring what row it is in and looking for column information. When a key is depressed, the corresponding column line becomes low. The main microprocessor determines which column is low and applies the algorithm for that row and column entry. This is essentially a matrixing technique, the main microprocessor knowing the row and scanning the columns.

Data Format

Referring to FIGS. 17 and 24, the main microprocessor 151 communicates directly with the display microprocessor 153 via serial data transmit/receive lines 151a. The information sent to the display microprocessor 153 via serial data transmit/receive lines 151a includes data such as the number of cylinders, the cylinder firing order, measured data or data calculated by the main microprocessor 151, such as engine RPM, voltage, KV values, average dwell, etc., control information indicating that a mode or feature is being activated or deactivated, and mode words which identify each of operating modes and features. Each set of data sent to the display microprocessor 153 by the main microprocessor 151 is preceded by the mode identifier word. In accordance with a "handshake" arrangement, the display microprocessor 153 upon receipt of data from the main microprocessor 151 sends back to the main microprocessor the mode identifier word to indicate that the data transmitted by the main microprocessor has been received.

In the present illustration, the operating modes and features are assigned the following mode identifiers:

| Decimal | Hex | Mode/Feature |
|---------|-----|--------------|
| 0 | 00 | Start-up Screen |
| 1 | 01 | No. of Cylinders |
| 2 | 02 | No. of Cycles |
| 3 | 03 | Firing Order |
| 4 | 04 | Select Function |
| 5 | 05 | Primary Mode |
| 6 | 06 | Secondary Mode |
| 7 | 07 | Alternator Mode |
| 8 | 08 | Voltage Mode |
| 9 | 09 | Fuel Injector Mode |
| 10 | 0A | Cylinder Shorting Bar Graph Mode |
| 11 | 0B | Dwell Bar Graph Mode |
| 12 | 0C | KV Bar Graph Mode |
| 13 | 0D | Alternator/Fuel Question |
| 14 | 0E | Instructions Mode |
| 15 | 0F | not used |
| 16 | 10 | not used |
| 17 | 11 | Shorting Feature |
| 18 | 12 | Freeze Feature |
| 19 | 13 | RPM Setpoint Feature |
| 20 | 14 | Cylinder Selected |
| 21 | 15 | Memory Feature |

VCO Clock Generator

The main microprocessor also responds to the signal SYNC-X to generate a VCO data word related to engine speed in units of time. The main microprocessor includes internal timers, hereinafter referred to as timer 0 and timer 1, which are enabled to count at the rate of 1 pulse per microsecond for time durations determined by the pulse SYNC-X, for determining VCO rate and RPM rate. The RPM and VCO rates are calculated under software control as will be described with reference to the RPM calculation subroutine, the flow chart for which is illustrated in FIG. 41C, and the VCO calculation subroutine, the flow chart for which is illustrated in FIG. 41D.

Figure 18D:
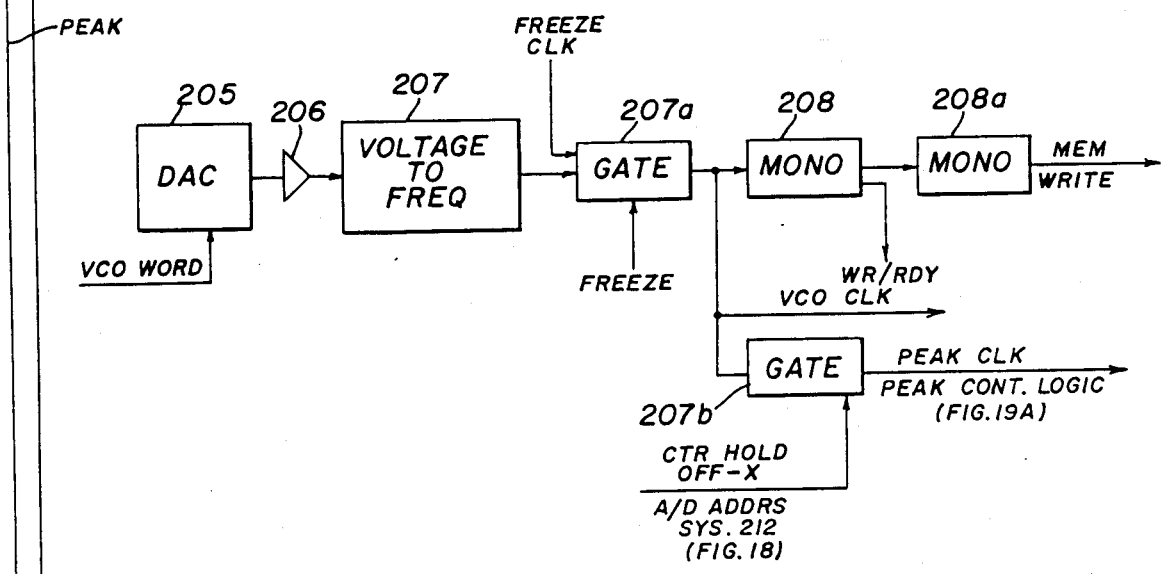
FIG. 18D is a block diagram of the VCO clock generator.

The main microprocessor outputs a VCO data word, via the port expander 201a, which is extended to a VCO clock generator 204 (FIG. 18) of the memory control circuits 160 (FIG. 16). Referring to FIG. 18D, the VCO clock generator 204 comprises a digital/analog converter 205, an amplifier 206, voltage to frequency converter 207, a VCO clock gate 207a and a pair of monostable circuits 208 and 208a.

The digital/analog converter converts the VCO data word to an analog voltage which is amplified by amplifier 206 and applied to the voltage to frequency converter 207 which, through VCO clock gate 207a, outputs a VCO clock signal which varies in frequency from approximately 0 Hz to approximately 250 KHz.

Figure 20:
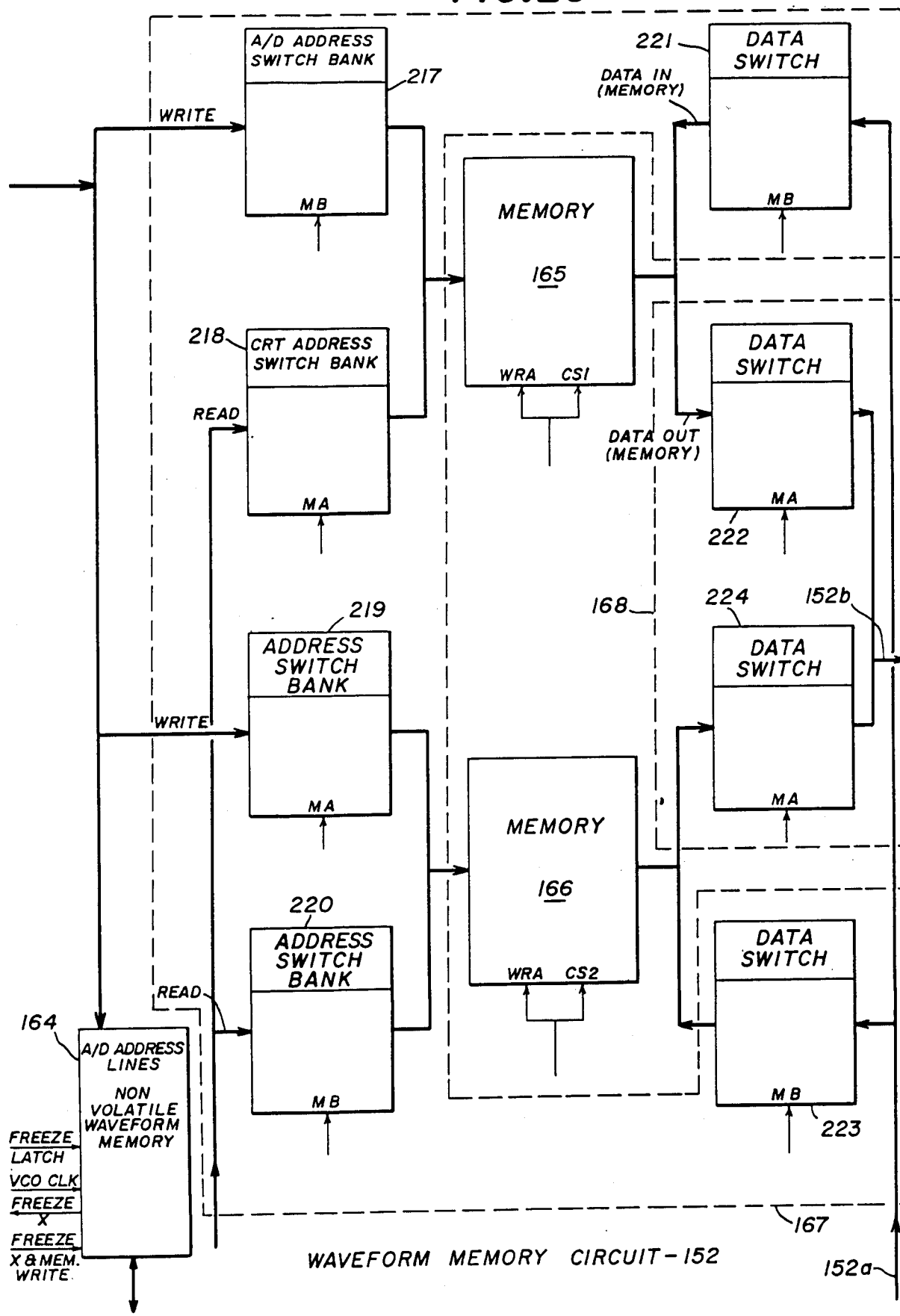

The VCO clock gate AND's the VCO clock is signal with a signal FREEZE-X output by the non-volatile waveform memory 164 (FIG. 16). When the Freeze/-Memory feature is activated, the main microprocessor sets the FREEZE line high and sets LATCH CONTROL high which latches a flip flop in the miscellaneous control logic 215 (FIG. 18). This sets high signal FREEZE LATCH which is applied to the non-volatile waveform memory 164 and inverted to become FREEZE-X (FIG. 20). The VCO clock signal is OR'd with a signal FREEZE CLOCK, a 125 KHz rate signal generated by the main microprocessor as a fixed rate clock pulse which is used whenever the Freeze/Memory feature is active. The VCO clock signal or FREEZE CLOCK signal, depending upon whether or not the Freeze feature is active, clocks monostable circuit 208 which in turn clocks monostable circuit 108a. The monostable circuit 208 generates write signal WR/RDY which is applied to the fast A/D converter 38 causing it to sample at the VCO clock rate. Monostable circuit 208a generates a signal MEM WRITE which is used by the memory control circuits 160. Two monostable circuits 208 and 208a are employed because different pulse widths are required for the two signals WR/RDY and MEM WRITE.

Referring to FIG. 19, the fast A/D converter 38 samples the analog signals supplied to the analog input at a rate determined by the VCO clock signal or FREEZE clock when Freeze feature is activated. The digital output of the fast A/D converter 38 is applied to data bus 152b and ultimately extended to waveform memory circuit 152 (FIG. 20) and non-volatile waveform memory 164 (FIG. 20) by waveform data switch 162 or delay circuit 163.

The slow A/D converter 37 under the control of the main microprocessor 151 receives slow time varying signals including peak data and voltage at its analog input. The slow A/D converter 37 converts signals supplied to its analog input when its input RUN is set high by the main microprocessor 151. When a conversion has been completed the slow A/D converter 37 sets its STATUS output high. The STATUS output is read by the main microprocessor 151 under software control. The main microprocessor then loads the data provided by the slow A/D converter 37 into temporary registers in the main microprocessor for use in calculations. Data obtained from the result of such calculations is passed on to the display microprocessor. Peak data obtained from the slow A/D converter 37 is stored in internal registers of the main microprocessor, a separate register being provided for each cylinder, and that information is transferred to port expander 201b (FIG. 17) at the appropriate time and ultimately extended to data bus 152b via peak insert switch 161 under control of the main microprocessor 151 and the peak control logic 216 (FIG. 18).

Selection of data source, that is waveform data switch 162, delay circuit 163, or the non-volatile waveform memory 164 is controlled by the memory control circuits 160 (FIG. 20).

Gates 163a and 163b associated with delay circuit 163 pass the signals NORMAL-TRIG and PRE-TRIG respectively to the delay circuit 163 and waveform data switch 162. These are complementary outputs and are produced by the miscellaneous control logic 215 (FIG. 18) in conjunction with the main microprocessor 161. When NORMAL-TRIG is selected, the main microprocessor 151 sets the CYL ID0 line low via the port expander 201b and momentarily toggles the latch control line high. This causes the NORMAL-TRIG output of the miscellaneous CONTROL LOGIC to be latched low and the PRE-TRIG ouput to be latched high. In this case, NORMAL-TRIG enables the waveform data switch 162 and PRE-TRIG disables the delay circuit 163.

When PRE-TRIG is selected, the main microprocessor 151 sets the CYL ID0 line high via the port expander 201b and momentarily toggles the latch control line high. This causes the NORMAL-TRIG output of the miscellaneous CONTROL LOGIC to be latched high and the PRE-TRIG output to be latched low. In this case, NORMAL-TRIG disables the waveform data switch 162 and PRE-TRIG enables the delay circuit 163.

The signal FREEZE LATCHED is extended through gates 163a and 163b to inhibit both the waveform data switch and the delay circuit when the Freeze feature is active. Waveform data normally passes through the waveform data switch 162 from the fast A/D converter 38 to waveform memory circuit 152 (FIG. 20). Waveform data is also written into non-volatile waveform memory 164 (FIG. 20) which is controlled and addressed by memory control circuits 160 (FIG. 18) to be written into when FREEZE or MEMORY features are inactive and to be read from when FREEZE or MEMORY features are active. Waveform data from the fast A/D converter 38 passes through the delay circuit 163, when the waveform data switch 162 is inhibited, and FUEL INJECTOR mode or PRE-TRIGGER features are selected.

In an actual embodiment, the main microprocessor 151 was the INTEL type 8051, the port expanders 201a and 201b were the INTEL type 8155 static MOS RAM, the slow A/D converter was the INTERSIL type 7109 12 bit binary A/D converter, the fast A/D converter 38 was the National Semiconductor Type 0820 8-bit high speed compatible A/D converter, the digital/analog converter 205 was the National Semiconductor type DAC 1220 and the voltage/frequency converter was the Type 4153 voltage-to-frequency converter available from Raytheon. The delay circuit 163 was Zilog type 8060 buffer unit and FIFO expander, the peak insert switch 161 and waveform data switch 162 were the TI Type 74HCT245 Octal Bus transceiver. The non-volatile waveform memory 164 was the RCA type 6116 CMOS 2048×8 bit static memory and the display non-volatile memory 115 was the Type 6561 256×4 CMOS RAM available from Harris Semiconductor.

Waveform Memory and Memory Control Circuit

Referring to FIGS. 18 and 20, the memory control circuits 160 include A/D address system 212, memory bank switch control logic 213, non-volatile memory logic 214, miscellaneous control logic 215 and peak control logic 216. The memory select circuit 167 includes A/D address switch 217, CRT address switch 218, A/D address switch 219 CRT address switch 220, and data switch 221 and 223. The memory select circuit 168 includes data output switch 222 and data output switch 224. As indicated, a bank switching arrangement is employed in which data is written into one memory such as memory 165 while data is being read out of the other memory 166. Then the memory configurations are switched and data is read out of memory 165 while data is written into the other memory 166.

The two-memory-bank system enables data to be read into one waveform memory circuits at the slow rate at which it is generated and at the same time read out to enable data previously obtained and stored in the other waveform memory circuit at the high rate required to display the waveform data on the CRT screen without flicker. If a new frame is created less frequently than thirty times per second, the screen flickers. Sixty times per second yields more favorable results. There are 131,072 intersections on the screen (512×256) which when multiplied by 60 (screens per second) is 7.8 MHz. Thus, an 8 MHz sweep rate is selected.

The rate at which data is delivered to the waveform memory circuit varies with engine speed. The rate at which data can be accepted from the viewpoints of sampling and addressing is in the range of 0 to 250 KHz, for a four cylinder engine. The latter value corresponds to an engine speed of 14,648 rpm for 512 samples per waveform. At the maximum engine speed, data is being read out of the waveform memory circuit 162 at a rate 32 times faster than it is being delivered to the wavefrom memory circuit (8 MHz/250 KHz). At 1,000 rpm, data is being read out of the waveform memory circuit almost 500 times faster than it is being delivered to the CRT screen.

Thus, the dual memory bank system enables data to be read from one memory fast even though it is being delivered to the other memory slowly. Of course, the data for each frame will not be new. In fact, it will be the same for at least 32 screens at the highest engine speed and almost 500 frames at 1,000 rpm.

A/D address switches 217 and 219 pass write addresses to the memory 165 and memory 166, respectively and CRT address switches 218 and 220 pass read addresses to the memory 165 and memory 166, respectively. Similarly, data switches 221 and 223 extend waveform data from data bus 152a to the memory 164 and memory 166, respectively and the associated memory is configured for a write operation. Data switches 222 and 224 pass data read out of memory 165 and memory 166, respectively, to the output waveform data bus 152b.

Memory 165 and memory 166 are selected by the memory control circuits 160 (FIG. 18) which enable A/D address switch 217 and data switch 221 to provide addresses through A/D address switch 217 for storing waveform data provided to the memory 165 through data switch 221 while CRT address switch 220 is enable to supply addresses to memory 166 read out data through data switch 224 to the output waveform data bus 152b.

After a block of data from a current sampling interval has been stored in memory 165, such data block being the 512 bytes representing a primary signal, secondary signal, or other waveform information, the waveform memory configuration is switched under the control of the memory control circuits 160 (FIG. 18). Accordingly, A/D address switch 217 and data switch 221 will be disabled and CRT address switch 218 will be enabled to provide addresses to memory 165 to read out data to the output waveform data bus 152b through data switch 222 which is also enabled. CRT address switch 220 and data switch 224 will be disabled and A/D switch 219 and data switch 223 will enable the waveform data from the next sampling interval to be written into memory 166.

Thus, the switches 217-224 provide hardware switching of address lines and data input lines and data output lines, allowing data from one of the data sources, waveform data switch (162 (FIG. 19), delay circuit 163 (FIG. 19) or non-volatile waveform memory 164 (FIG. 19) provided on data bus 152a to be read into one of the memories such as memory 165 while data previously read into memory 166 is being read to the CRT monitor.

The data supplied to the waveform memory circuit 152 is a number representing the vertical height of a particular point on the waveform to be displayed on the screen. The waveform is represented by 512 bytes, each byte addressing a successive column of the CRT screen and the magnitude coded by that byte corresponding to the row of the screen. The information displayed is the waveform for the cylinder selected. In other words, the waveform for only one cylinder can be displayed at a time. Waveform data for all cylinders 512 bytes per cylinder, for the selected screen, such as primary pattern screen, is stored in the non-volatile waveform memory 164 (FIG. 16). When Freeze or Memory feature is activated, the data for the selected cylinder is read out of the non-volatile waveform memory 164 (FIG. 16) to the waveform memory circuit 152 for display on the CRT monitor.

As indicated, data is written into the waveform memory circuit 152 at a first rate and read out of the waveform memory circuit 152 at a second rate. The input addressing rate is a variable rate dependent upon the frequency of the VCO clock signal which is established by the VCO clock generator 204 (FIG. 18) and which establishes the sampling rate for the fast A/D converter. Thus, waveform data being received by the digital circuits is written into the waveform memory circuit 152 at a rate corresponding to the sampling rate of the fast A/D converter.

The data is read out of the waveform memory circuit 152 at a rate of 15,750 Hz, the horizontal scan rate for the CRT address counter 159 (FIG. 21) which also controls the sweep rate for the CRT monitor 11 (FIG. 2). It is pointed out, that when the Freeze or Memory features are active, data is read into the waveform memory circuit 152 at the rate of the 125 MHz freeze clock which is generated by the main microprocessor.

In an actual embodiment, the address and data switches 217-224 were the Type 74HCT245 TI Octal Bus Transceiver, supplemented by an additional address switch, such as the TYPE 7425244, and the memory 165 and memory 166 each comprised two Type 2149H2 INTEL 1024×4-bit ROM.

Memory Control Circuits

The memory control circuits 160 (FIG. 18), which include A/D address system 212, memory bank switch control logic 213, non-volatile memory logic 214, miscellaneous control logic 215 and peak control logic 216, will now be described.

Figure 18A:
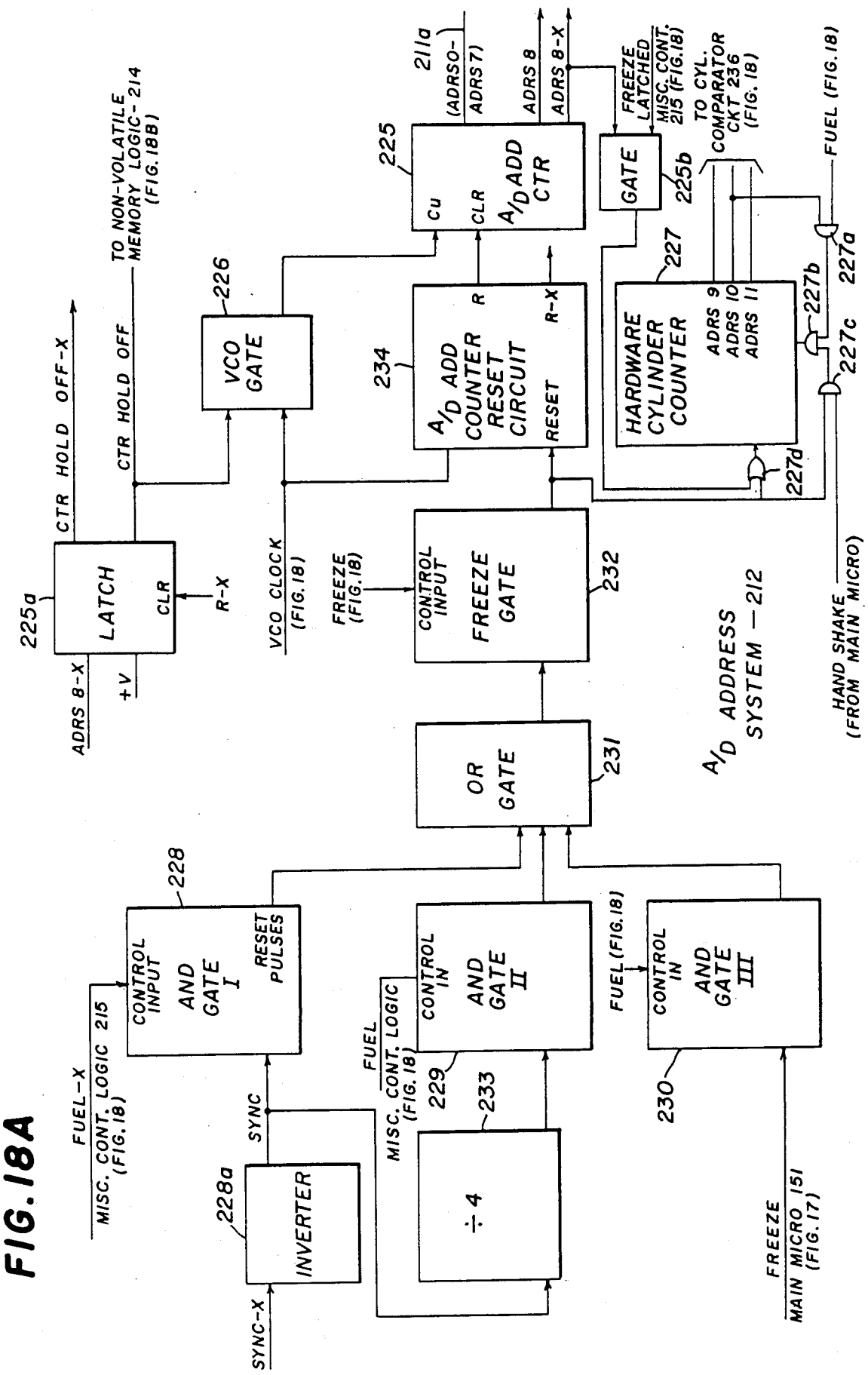
FIG. 18A is a block diagram of the A/D address counter.

Referring to FIG. 18A, the A/D address system 212 includes A/D address counter 225, latch 225A, VCO clock gate 226, hardware cylinder counter 227, and A/D address counter reset circuit including sync gates 228-230, gate 231, freeze gate 232, divider circuit 233 and A/D address counter reset circuit 234. The A/D address counter 225 receives gated VCO clock pulses through VCO clock gate 226 and defines 512 addresses for the waveform memory over output address bus 211a. The reset circuit 234 resets the A/D address counter in response to each SYNC pulse. The reset pulse is gated with the VCO clock signal for synchronization purposes.

The hardware cylinder counter 227 is driven by successive SYNC pulses provided (as reset pulses) to count up from 0 providing an indication of the cylinder which is firing.

The SYNC pulses are normally passed to the reset circuit 234 (and to the hardware cylinder counter 227) through gate 228, gate 231 and freeze gate 232 which passes SYNC pulses to A/D address counter reset circuit 234 only when Freeze Feature is not active.

When the Fuel Injector mode is active, gate 228 is inhibited by signal FUEL-X and gate 229 is enabled. The SYNC pulses are divided by the divider circuit 233 which performs a divide-by-4 circuit operation resulting in one reset signal being passed through gate 229, gate 231 and FREEZE gate 232 to the A/D counter reset circuit 234 for each four fuel injector pulses.

Gate 230 prevents resetting of the A/D address counter 225 by SYNC pulses when the Freeze mode is active. In Freeze mode, the A/D address counter 225 counts continuously.

Referring to FIG. 18, the miscellaneous control logic 215 comprises three data latches 215a–215b and 215c having their data inputs connected outputs FREEZE mode, CYL ID0 and CYL ID1, respectively, of the main microprocessor (signals CYL ID0–ID1 being passed via port expander 201b), and their clock input connected to a LATCH CONTROL signal output of the main microprocessor. The data latches 215a–215c are used to generate output signals FREEZE LATCHED, NORMAL TRIG and PRE-TRIG, and FUEL and FUEL-X, respectively.

The signal FREEZE LATCHED is generated when the Freeze mode is entered. Signal NORMAL TRIG is normally high, but latch 215b is reset to set signal PRE-TRIG high when the Special Trigger feature is enabled. Signal FUEL is set high when Fuel Injector mode is selected. The main microprocessor outputs signals over the lines FREEZE, cylinder ID0 and ID1, for only a short time during an operating cycle, and generates a write command to latch these signals into the data latches 215a–215c when the appropriate commands are generated.

Referring to FIG. 18B, the memory bank switch control logic 213 includes a cylinder comparator circuit 236, address and data switch logic 237 and memory enable and write logic 238. The cylinder comparator circuit 236 compares the outputs of the hardware cylinder counter 227 (FIG. 18A) with the cylinder identification received over lines ID0–ID2 from the main microprocessor. The main microprocessor ID lines ID0–ID2 and the outputs of the hardware cylinder counter 227 (FIG. 18A) identify cylinders as numbers 0–7, with the 0 being significant. Therefore, cylinder number 1 is identified as 0 on the lines ID0–ID2 and hardware cylinder outputs ADDR9–ADDR11, cylinder 2 as 1, etc. The output of the cylinder comparator circuit 236 goes high when the hardware cylinder counter 227 reaches the count of the selected cylinder as indicated by the cylinder ID lines ID0–ID2. The address and data switch logic 237 receives the cylinder compare pulse and switches the state of memory bank select signals MA and MB with the falling edge of the cylinder compare pulse.

The memory enable and write logic 238 includes AND gate 238a, AND gates 238b, 238c and AND gates 238d, 238e. In the memory enable write logic 238, gate 238a AND's the cylinder compare pulse with the gated memory write pulse MEM WRITE provided by non-volatile memory logic 214 (FIG. 18D) and gates 238b and 238c combine the resulting signal with the memory select signals MA and MB to generate write enable signals WRA, WRB. Signals WRA and WRB are combined by gates 238d and 238e with signals MA and MB to provide select signals CS1, CS2 for the memory 165 and memory 166 (FIG. 20), respectively.

Still referring to FIG. 18B, the non-volatile memory logic 214 comprises gate circuit 235 which passes signal MEM WRITE, generated by the VCO clock generator when a signal counter CTR HOLD OFF-X, provided by the A/D address system 212 (FIG. 18), is high. The signal MEM WRITE is combined with the signal FREEZE-X by gate 235a (not shown) to generate signal FREEZE-X and MEM WRITE which control activation of the non-volatile memory 164 (FIG. 20) when FREEZE mode is active.

Waveform data for each cylinder (including peak values) which are passed through the waveform data switch 162 (FIG. 19) (or delay circuit 163) are written into the non-volatile display memory 164 under the control of the address system 212 (FIG. 18). The hardware cylinder counter outputs are the high order address lines of the non-volatile waveform memory 164. The waveform data are being stored in the non-volatile waveform memory 164 in increments of 512 bytes per cylinder. Therefore, the non-volatile waveform memory 164 stores up to eight 512 bytes of waveform data. When Freeze or Memory feature is activated, the waveform data stored in the non-volatile waveform memory is read out of the non-volatile waveform memory 164 to the waveform memory circuit 152 under the control of the A/D address system 212.

Operation of Waveform and Memory Control Circuits

Referring to FIGS. 18 and 20, for purposes of illustration of the operation of the waveform memory circuit 152 and memory control circuits 160, it is assumed that the Primary Pattern mode is selected and that the main microprocessor has sent suitable control signals to the analog circuits 16 (FIG. 15) to initialize the analog circuits. The control signals generated by the main microprocessor for the Primary Pattern mode initialization of the analog circuits include signals SWITCH CONTROL 0 at logic high, SWITCH CONTROL 1 at logic low, and PRIM/SEC-X high. These conditions for these signals select the primary signal and the primary sync. The control of the slow A/D converter 37 (FIG. 19) and the fast A/D converter 38 (FIG. 19) will be described in the next section entitled Peak Insertion, and the instant description will be limited to the addressing and loading of the waveform memory circuit 152 for the condition where Primary Pattern mode is selected.

The main microprocessor will respond to the pulse SYNC-X and #1 SYNC-X to calculate VCO and RPM values as described more fully in the sections entitled VCO Calculation and RPM Calculation. The main microprocessor sets cylinder ID lines ID0–ID2 to identify the cylinder for which the waveform will be displayed on the CRT monitor. In the present example, it is assumed that the third cylinder has been selected and accordingly the binary coding for 2 (starting from 0, with zero significant) is set on cylinder ID lines ID0–ID2. This information via port expander 201b is extended to the cylinder comparator circuit 236 (FIG. 18B). A gated VCO clock generated by the VCO clock generator is extended to the address counter 225 (FIG. 18A). The VCO clock rate is calculated by the main microprocessor in correspondence to the RPM rate for engine speed such that there will be approximately 512 VCO clock pulses for every cylinder firing. These address pulses are applied via A/D address lines 211a to the non-volatile waveform memory 164 (FIG. 20) and to the inputs of the A/D address switch 217 and A/D address switch 219 associated with memory 165 and memory 166, respectively.

Figure 18C:
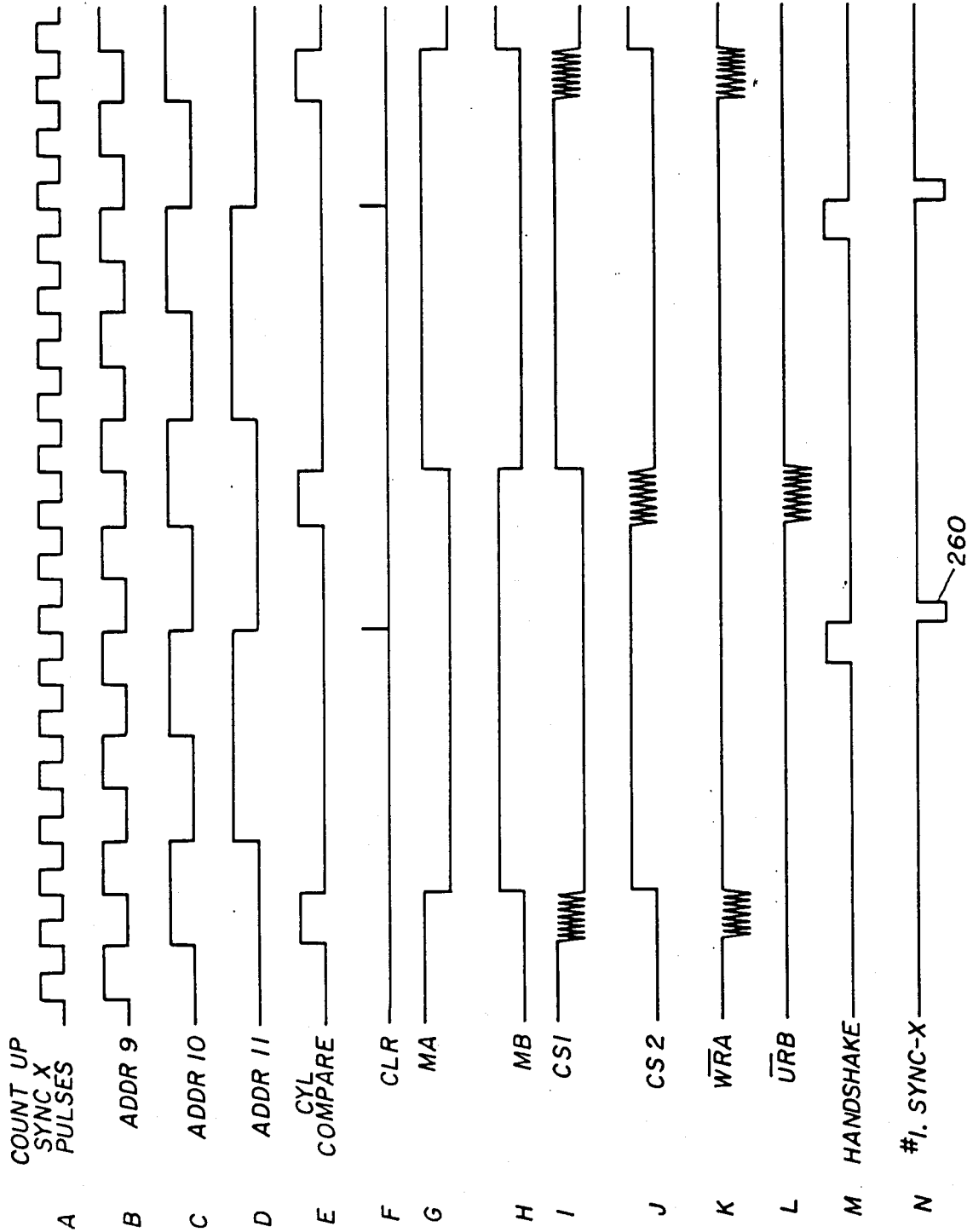
FIG. 18C is a timing diagram illustrating the time relationships of signals of the circuits shown in FIGS. 18A and 18B.

Referring to FIG. 20 and to the timing diagram shown in FIG. 18C, it is assumed initially that signal MA, FIG. 18C, line G is set high and signal MB, FIG. 18C, line H is set low, signal CS1, FIG. 18C, line I is set high and signal CS2, FIG. 18C, line J is set low. Under these conditions, memory 165 is selected to be read from and memory 166 is selected to be written into during the time the waveform signal for the selected cylinder, cylinder 3, is being processed by the fast A/D converter. Thus, address switch 219 is enabled to pass the write pulses to the memory 166 and data switch 223 is enabled to pass the primary signal waveform data on data bus 152a to the memory 166 where it is stored in consecutive locations in accordance with the address pulses applied to memory 166 through address switch 219. Also, CRT address switch 218 is enabled to pass CRT address to memory 165 with data switch 222 being enabled to pass the data read out to be output waveform data bus 152b.

Referring to FIG. 18A, the SYNC-X pulses are inverted by inverter 228a and passed through AND gate 228 (since signal FUEL-X is at logic high), and the SYNC pulses pass through gate 231 and Freeze gate 232, since signal FREEZE-X is a logic high level, to reset circuit 234. The first SYNC pulse resets A/D address counter 225 which then counts VCO clock pulses to generate 512 address pulses for the memory 166. After 512 address pulses have been generated, latch 225a is set by signal ADDR-X 8; setting high the signal COUNTER HOLD OFF. The SYNC pulse gated by HANDSHAKE by gate 227a also resets the hardware cylinder counter 227 to zero. The hardware cylinder counter 227 is then incremented each time a SYNC pulse is received and counts up from 0-7 for an eight cylinder engine and is then reset when the signal HANDSHAKE is sent by the main microprocessor. The outputs ADRS 9-11 of the hardware cylinder counter 227 are passed to the cylinder comparator circuit 236 (FIG. 18B) and compared with the state of the cylinder ID lines ID0-ID2, which are set to a binary 2 code since the waveform for cylinder 3 is to be displayed.

Referring to FIG. 18B and the timing diagram FIG. 18C, the SYNC pulses, FIG. 18C, line A, generated after the occurrence of the first #1 sync pulse shown at 260 in FIG. 18C, line N, increment the hardware cylinder counter. The outputs, FIG. 18C, lines B-D on lines ADDR 9-ADDR 11 represent the binary count (starting with zero) for the number of SYNC pulses received. When three SYNC pulses are received, the binary count equals that for the state of the cylinder ID lines IDO-ID2, and the output of the cylinder comparator circuit 236 goes high (FIG. 18C) line E. This causes the gated MEM WRITE signals to be passed to the select input CS1 and the write WRA of memory 165 to cause the waveform data for cylinder 2 being entered onto the data input bus 152a, that is the waveform data for cylinder 3, to be written into the memory 165.

In response to the next SYNC pulse, cylinder hardware counter 227 (FIG. 18A) is incremented causing the output of the cylinder comparator circuit 236 to go low (FIG. 18C, line E). This causes the address and data switch logic 237 (FIG. 18B) to switch the states of signals MA and MB (FIG. 18C, lines G and H). The memory enable and write logic 238 causes signal CS1 to go to logic low and signal CS2 to go to logic high (FIG. 18C, lines I and J). With these conditions set, A/D address switch 217 is enabled to pass address pulses to memory 165 and data switch 222 is enabled to gate waveform data from input data bus 152a to memory 165. Also, CRT address switch 220 is enabled to gate CRT address pulses to memory 166 and data switch 224 is enabled to pass the data read out of memory 166 to the output data bus 152b. Although the read operation will start immediately, the write operation will be delayed until the next time cylinder 3 is fired as indicated by the output of the cylinder comparator circuit 236 going to a logic high level. It should be noted that the switching of memory 166 from write to read condition and switching of memory 165 from a read to a write condition is done under the control of hardware circuits and is a function of the cylinder selected. Read out of the data from the memory selected for a read operation is controlled by the addressing circuits associated with the display memory circuit 154, the data being read out at the rate required for synchronization with the CRT monitor, independently of the frequency of the write operation. Although memory bank switching may occur midway in a read cycle, corresponding memory locations will be accessed in the memory being switched from a write to a read operation so that the same memory locations in the memory selected for read will be accessed at the time of the memory bank switching operation.

Referring to FIGS. 18A and 18C, just before the end of the firing period of the last cylinder, cylinder 3 in the present example, the main microprocessor sets high the signal HANDSHAKE which is applied to gate 227a at the reset input of the hardware cylinder counter (FIG. 18C, line M). This output is ANDed with the SYNC pulse (FIG. 18C, line A) generating a clear pulses CLR (FIG. 18C, line F) which resets the cylinder hardware counter 227 to zero in preparation for the next cylinder count operation.

Also, after 512 address pulses have been generated, the output on address line ADDR-X 8 goes low generating signal CTR HOLD OFF-X which is applied to gate 235 (FIG. 18B) as an inhibit signal to prevent the gated MEM WRITE pulse from being passed to the memory enable and the write logic 238 until the A/D address counter 225 is reset. The A/D counter reset circuit 234 is clocked at the VCO clock rate to insure that the A/D counter 225 is not reset prematurely.

Peak Insertion

Referring to FIG. 15, when either the Primary or Secondary Pattern mode is selected, the signal SWITCH CONTROL 1, from port expander 201b (FIG. 17), on conductor 110a is at a logic low. For the Primary Pattern mode, the signal SWITCH CONTROL 0, from port expander 201b, on conductors 110b and 101a is at a logic high. For the Secondary Pattern mode, such conductors are at a logic low. A high logic level for signal SWITCH CONTROL 0 causes the peak insert select circuit 101 to select the sync pules derived from the primary waveform, whereas the opposite logic level of signal SWITCH CONTROL 0 causes selection of the sync pulse derived from the secondary waveform. Signals SWITCH CONTROL 0 and SWITCH CONTROL 1 control multiplexer 110 to select which of the primary signal or the secondary signal is passed to the slow A/D converter 37 and the fast A/D converter 38.

Assume, for example, that the Primary Pattern mode is selected. Then, the main microprocessor sets signal PRIM/SEC-X high on conductor 86a high, thereby causing sync select circuit 86 to select the primary waveform as the source of the signal sync. The primary sync signal is passed to the peak insert select circuit 101. For the Primary Pattern mode, signal SWITCH CONTROL 0 is set at logic high, causing the peak select circuit 101 to pass the sync signal to its output as signal PEAK INSERT.

The logic low level on conductor 110a and the logic high level on conductor 110b causes multiplexer 110 to select the primary waveform, appearing at the output of buffer 111, to be passed to the peak gate 119 and through amplifier 112 to the fast A/D converter 38. Multiplexer 110 also connects the output of the peak detector circuit 120 to the input of the slow A/D converter 37.

The main microprocessor 151 operates under stored program control to determine if the peak value for the next cylinder in the firing order is to be inserted. If so, signal PEAK/HOLD is set to a logic high, enabling the be-peak gate 119 to gate the primary waveform to the peak detector circuit 120. In that circuit, the peak value of the primary sync pulse is determined and its value stored. At the end of the firing period for the selected cylinder, the main microprocessor sets signal PEAK/HOLD low, disabling peak gate 119, and provides a logic high at the RUN input of the slow A/D converter 37 (FIG. 19), which had, until that event, been disabled.

The slow A/D converter 37 converts the peak value stored by the peak detector circuit 120 to a two byte digital word. When the conversion is complete, the STATUS output (FIG. 19) of the slow A/D converter 37 is set high. The converter 37 generates a signal CONVERSION COMPLETE which is applied to the peak detector circuit 120 to reset same.

Referring to FIGS. 17 and 19, when the output STATUS of the slow A/D converter 37 becomes high, the main microprocessor 151 sets the slow A/D converter RUN input at logic low and enables outputs HB-X and LB-X, in succession to read out the two bytes of peak value data. The digitally coded peak value from the converter 37 is read into an internal register of the main microprocessor dedicated to the selected cylinder. Other registers are respectively dedicated to the other cylinders. The main microprocessor keeps track of the cylinder count and transfers the digital peak value data to port expander 201b where it is latched. The peak value latched in the port expander 201b will be from either two or three distributor revolutions previous to the present cylinder firing, depending on the number of cylinders selected. However, the peak data will be inserted as one byte into the primary waveform data of the proper cylinder. Peak value insertion is done under the control of the peak control logic 216 shown in FIG. 19a.

The peak insert signal provided by peak insert select circuit 101 (FIG. 15) is applied to the peak control logic circuit 216 which generates two output signals PEAK and PEAK ENABLE. Signal PEAK is coupled to the fast A/D converter 38 to inhibit same for one byte period. Signal PEAK ENABLE is coupled to the peak insert switch 161 (FIG. 19) which gates the peak value data stored in the port expander 201b to the waveform data bus 152b.

More specifically, the peak control logic circuit 216 includes gates 331, 333 and 334 and a latch circuit 332. The signal PEAK INSERT is coupled to the signal input of the gate 331, the control inputs of which are connected to receive signals SWITCH CONTROL-X 1 and FUEL-X. Signal SWITCH CONTROL-X is high during the Voltage and Alternator Modes and signal FUEL-X is high during the Fuel Injector Mode. A high on either of the control inputs disables the gate 331, while a low enables same. Signal SWITCH CONTROL-X1 is low during the Primary and Secondary Modes, so that the gate 331 is enabled while the analyzer is in such modes, and the signal PEAK INSERT is stored in the latch circuit 332.

The gate 333 has a signal input coupled to the latch circuit 332, one control input to receive signal ADD-X 8. Signal PEAK CLOCK enables the gate after the beginning of the operation of VCO, that is, with the start of each 512 count cycle for the A/D address counter 225 (FIG. 18A). Before that time, the gate 333 is disabled. Signal ADRS-X 8 enables the gate 333 only during the first half of the sweep, that is, up to count 256 and disables the gate for the second half, that is, between counts 256 and 512. In combination, therefore, the gate 333 is enabled during the window of counts 0 to 256.

Gate 334 has its signal input coupled to gate 333 and its control input coupled to receive signal SHORT-X. During the Cylinder Shorting Mode, the signal on such control input disables gate 334. The output of gate 334 in the signal PEAK SIG and its complement PEAK ENABLE is generated by inverter 335 (not shown).

Referring to FIG. 19, the signals PEAK ENABLE and PEAK are generated from the present cylinder firing. The signal PEAK ENABLE enables the peak insert tri-state switch 161 to pass the peak information stored by port expander 201b (FIG. 17) to the waveform data bus 152b. At the same time signal PEAK is applied to the fast A/D converter 38 to inhibit same for the duration of one VCO clock pulse.

Freeze/Memory Feature

Referring to FIG. 20, the Freeze feature is activated as a result of the operator depressing the freeze key or the RPM set point being exceeded. The Memory feature is activated upon entering a start-up screen mode with waveform data saved in the non-volatile memory, or in changing from a mode in a freeze state to a mode which has waveform data saved in the non-volatile memory. The main microprocessor causes signal FREEZE to be latched in data latch 215a of the miscellaneous control logic 215 (FIG. 18). This signal is applied to the non-volatile waveform memory 164, which configures same for read operation, allowing waveform data previously written into the non-volatile waveform memory 164 to be read out of it in response to address pulses supplied by the A/D address generator 212 (FIG. 18). The signal FREEZE LATCHED is also applied to the delay circuit 163 (FIG. 19) via gate 163b, inhibiting that circuit. The signal FREEZE LATCHED is applied to the waveform data switch 162 (FIG. 19) via gate 163a, terminating signal NORMAL ENABLE thereby inhibiting the waveform data switch 162. Accordingly, waveform data present on input data bus 152b from the output of the A/D converter 38 is prevented from being extended to the data bus 152a which now receives data from the read out of the nonvolatile waveform memory 164.

Writing of the information read out of the non-volatile memory 164 is controlled by the A/D address system 212 (FIG. 18), including selection and memory bank switching operations. However, the A/D address system 212 is clocked at the freeze clock rate rather than the VCO clock rate and is prevented from responding to sync pulses.

More specifically, with reference to FIG. 18D, signal FREEZE is applied to the VCO clock inhibit gate 207a, which is then prevented from passing the VCO clock pulses. The FREEZE CLOCK pulses provided by the main microprocessor at the 125 KHz rate trigger the monostable circuits 208 and 208a of the VCO clock generator 204.

Referring now to FIG. 18A, the freeze clock pulses are passed to the A/D address counter 225 for incrementing the A/D address counter 225 at the fixed freeze clock rate. The signal FREEZE inhibits the freeze gate 232 to prevent sync pulses from being applied to the hardware cylinder counter 227 or the to A/D address counter reset circuit 234. The A/D address counter address line ADRS8-X is gated with the signal FREEZE LATCHED and this signal is applied to the hardware cylinder counter 227, to increment the counter 227 at the end of each 512 byte time interval, effectively replacing the SYNC signal which normally increments the hardware cylinder counter.

When the Freeze feature is disabled, as by selection of a different mode or subsequent operation of the FREEZE key, the main microprocessor changes the state of the signal FREEZE LATCHED in the data latch 215a (FIG. 18) which initializes the A/D address system 212, the non-volatile memory 164 (FIG. 20), waveform switch 162 (FIG. 19) and delay circuit 163 (FIG. 19) to the operating condition described previously.

Fuel Injector Mode

When operating in the Fuel Injector mode, at least two complete injector pulses are displayed on the screen at one time. Although approximately four fuel injector pulses are usually displayed, the leading edge of one of the pulses and the trailing edges of another one of the pulses may be missing. The pattern can be expanded for detailed viewing by activating the Waveform Expansion feature and the pattern can be frozen by activating the Freeze feature to permit the operator to make a time measurement of fuel injector "on time" or any other segment of the pattern.

The operation of the memory control circuits 160 (FIG. 18) during Fuel Injector mode is similar to that previously described for the Primary Pattern mode, and the differences in operating modes is now described.

Referring first to FIG. 17, when Fuel Injector mode is selected, the main microprocessor outputs switch control data to port expander 201b setting signal SWITCH CONTROL 0 and SWITCH CONTROL 1 to logic high levels. These outputs are processed by fuel gain switch logic 239 which sets signal FUEL GAIN high. This signal is extended to the analog circuits 16 (FIG. 15).

Referring to FIG. 15, the signal FUEL GAIN is applied to the gain selector switch 113 which switches a larger feedback resistor to the waveform amplifier 112.

As described previously, the fuel injector signal applied to lead 22 passes through primary attenuator 84 and wave shaper 85 to sync select circuit 86 which is set to pass the sync pulse derived from fuel injector pulses through blanker circuit 87 and inverter 88 as output SYNC-X. Also, the fuel injector signals are passed through buffer 111 to the multiplexer 110 which is selected to pass this input since signals SWITCH CONTROL 0 and SWITCH CONTROL 1 are both set to logic high levels. The output of the multiplexer 110 is passed through waveform amplifier 112 and via conductor 38a to the fast A/D converter 38 (FIG. 17).

Referring to FIGS. 17-19, when Fuel Injector mode is selected, the main microprocessor sets cylinder ID line ID1 (from port expander 201b) high, momentarily, and latches this signal into the data latch 215c causing signal FUEL to set a logic high level and its complement FUEL-X is set at logic low level. These control signals are applied to the A/D address system 212 (FIG. 18A) and are used as gating signals to pass or block information.

When Fuel Injector mode is selected, the main microprocessor also causes cylinder ID line ID0 (from port expander 201b) to be set high and latches this input into data latch 215b which latches signal NORMAL TRIG high and latches signal PRE-TRIG low. These signals are applied to the delay circuit 163 to enable same and disable the waveform data switch 162, as previously described for Freeze feature, so that the fuel injector pulses provided at the output of the fast A/D converter are extended via data bus 152b through the delay circuit 163 to the waveform data bus 152a.

Referring to FIG. 18A, the signal FUEL is applied to the A/D address system 212 where it enables gate 229 to permit the A/D address counter 225 to be reset by incoming SYNC pulses. The signal FUEL-X inhibits gate 228 but the signal FUEL enables gate 229 to pass the incoming SYNC pulses, which are divided by divide-by-four circuit 233, to the gate 231 and through freeze gate 232 to the A/D address counter reset circuit 234. SYNC pulses are divided by four to enable up to four injector pulses to be displayed on the screen of the CRT monitor at the same time. The A/D address counter 225 receives only one reset sync pulse for four fuel injector pulses.

Referring to FIG. 18B, the memory bank switch control logic 213 operates in the manner previously described with respect to the Primary Pattern mode to effect memory bank switching operations, with the state of signals MA and MB being reversed for each eight fuel injector pulses but with the select signals CS1/CS2-X, and write signals WRA/WRB-X being generated for a time corresponding to four fuel injector pulses to enable at least to complete four injector pulses to be displayed. In the next cycle, the complements of the select signals and write pulses are generated for a period corresponding to four fuel injector pulses.

Referring to FIG. 18A, the sync pulses derived from the fuel injector pulses passed by gate 229, gate 231 and FREEZE gate 232 also increment the hardware cylinder counter 227. As indicated, because of the divide-by-4 function of gate 231, when eight injector pulses have occurred, only two count up pulses have occurred. At such time, address line ADRS 10 of the hardware cylinder counter 227 is set to logic high level and this output enables gate 227c to reset the cylinder hardware counter 227 to zero when signal FUEL is high.

Referring to FIG. 18B, the cylinder comparator circuit 236 provides a logic high level at its output whenever the state of the cylinder counter 227 (FIG. 18A)

corresponds to the state of the cylinder ID lines ID-0–ID2. When Fuel Injector mode is selected, the main microprocessor sets the cylinder ID lines ID0–ID2 low so that the output of the cylinder comparator circuit 236 will be set to logic high whenever the hardware cylinder counter 227 is cleared. This transition causes the signals MA and MB to change state effecting a memory bank switch operation via address and data switch logic 237. Also, memory enable and write logic 238 switches the state of select lines CS1 and CS2 to enable the appropriate switches for routing the A/D address pulses and the waveform data to the correct bank of memory when writing to memory and similarly to turn on appropriate switches for routing CRT address pulses and data to the CRT when reading from the memory.

In summary, a different memory bank is written to every eighth fuel injector pulse. Four fuel injector pulses are written to memory during each write phase.

Display Microprocessor and Sync Generator

Referring to FIGS. 21–24, the main microprocessor 151 sends mode select and function identifier words, control signals and numerical data to the display microprocessor 153 over serial transmit/receive lines 151a. The display microprocessor processes and generates data to the display memory circuit 154 and transfers data, representing character address data, from the screen ROM 155 and/or the instruction ROM 156 to the display memory circuit 154 from which it is ultimately moved to the character generator 157 (FIG. 16).

For example, when the Primary Pattern mode is selected, the display microprocessor causes the address data representing the format for the Primary Pattern mode screen (FIG. 4) to be read into both memory 169 and memory 170.

A memory bank switching arrangement, similar to that for the waveform memory circuit 152 (FIG. 20) is used for the display memory circuit 154. However, the display microprocessor 153 controls the memory bank switching and memory bank switching is effected on the basis of need to update the data being displayed, as when updated data is received from the main microprocessor rather than on a periodic basis. Note that the screen format information is fixed and then once the screen format information is written to both memory 169 and memory 170 from screen ROM 155, this information need not be rewritten until a new mode is selected. Variable information, such as numerical data values is stored in corresponding sections of the memory 169 and the memory 170 dedicated to variable data, and this data is updated on the screen as often as is necessary under control of the display microprocessor.

Figure 21:
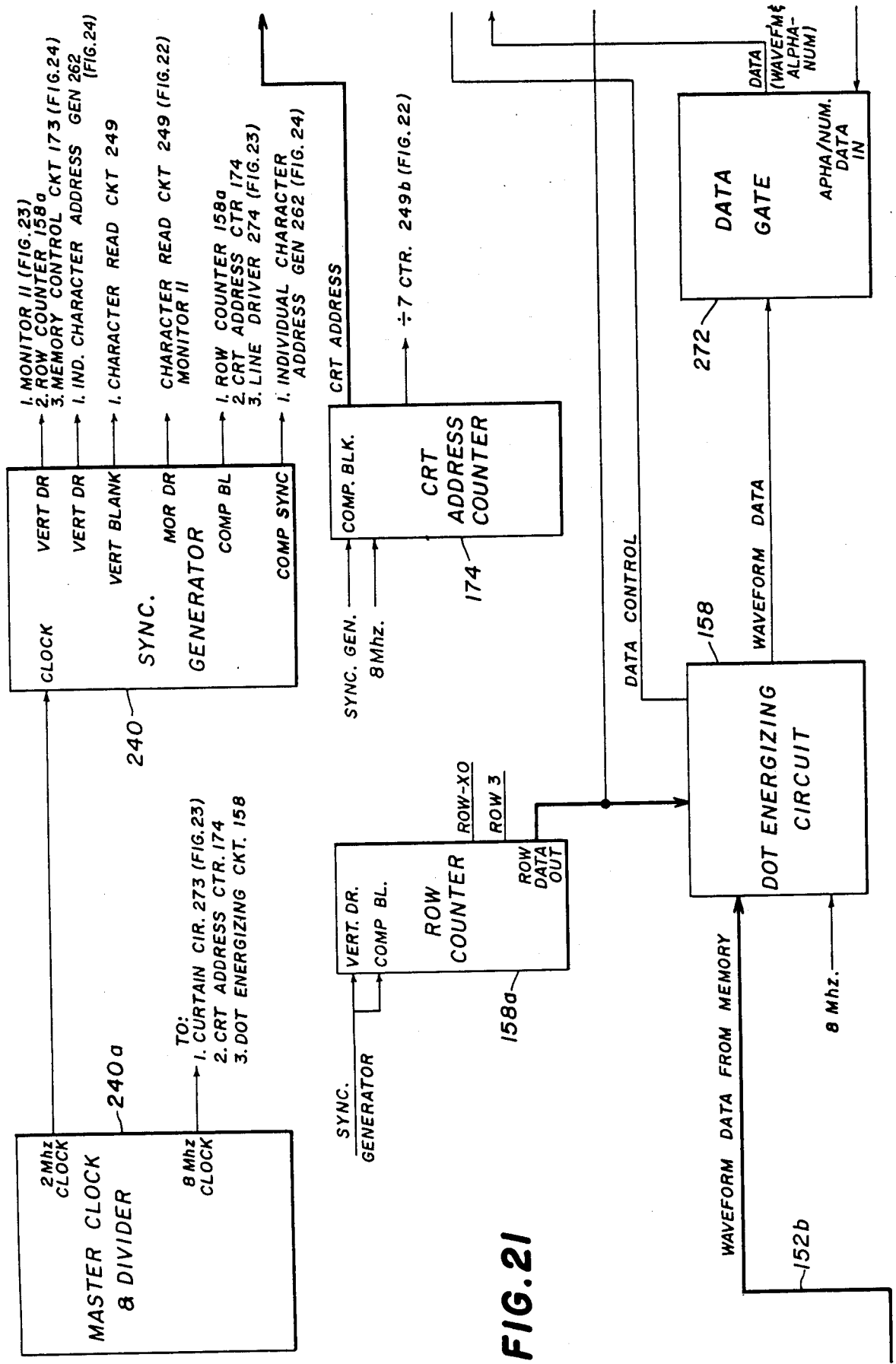

Referring to FIG. 21, the sync generator 240 receives a master clock signal at 2 MHz provided at the output of the master clock and divider 240a which generates an 8 MHz signal which is divided down to provide the 2 MHz signal for the sync generator 240.

The sync generator 240 provides a composite sync, a vertical drive signal and its complement at 60 Hz horizontal drive signal and its complement at 15,750 Hz, a composite sync, a gated composite sync, and a vertical blanking signal In an actual embodiment, the display microprocessor 153 was the INTEL Type 8051 the master clock 240 was the Intersil Type 7209 CMOS clock generator with external frequency determining elements selected to provide a 8 MHz clock signal, and including a divide by four stage to provide the 2 MHz signal for the sync generator 240. The sync generator was the Fairchild Semiconductor Type 3262A. The screen ROM and instruction ROM were the Types P2764 and P27128, respectively.

Display Memory Circuit

Referring to FIGS. 22 and 24, the display memory circuit 154 is controlled in a manner similar to that for the waveform memory circuit 152 (FIG. 20) with tri-state address and data switches being employed to enable addressing of each memory selectively for read operations via common address bus 250a and for write operations via a common address bus 153b writing data provided on input data bus 153a and reading out data to the CRT monitor via output data bus 154a.

Thus, memory select circuit 171 includes character address read switch 241 and character address write switch 242 associated with memory 169, character address read switch 243 and character address write switch 244 associated with memory 170 and data switches 246 and 248 which provide paths for data written into memory 169 and memory 170, respectively.

Memory select circuit 172 includes data switch 245 which provides a path for data being read out of memory 169, and data switch 247 which provides a path for data being read out of memory 170.

Memory enabling and write signals for the two memories 169 and 170 and associated address and data switches are provided by the memory control circuit 173 (FIG. 24) which outputs complementary select signals MA1 and MB1 for the address and data switches 241–248 and outputs complementary write signals WRA1-X and WRB1-X for the memory 169 and memory 170, which enable one memory such as memory 169 to be written into while the other memory 170 is being read from and vice versa.

Write addresses for the display memory circuit 154 are provided by the display microprocessor on address bus 153b. Read addresses for memory 169 and memory 170 are generated by character read circuit 249 which includes a divide by seven counter 249a, a character column address counter 249b and a character row counter 249c.

Referring to FIGS. 22, 24 and 24A, the memory control circuit 173 enables bank switching to occur only during the vertical blanking period for the CRT monitor to prevent the display of random data as may occur during bank switching. The memory control circuit 173 (FIG. 24A) includes latch 173a, latch 173b, gate circuit 173c and gate circuit 173d. Latch 173b provides complementary memory enabling signals MA1 and MB1 which control enabling of memory 169 and memory 170 and address and data switches 241–248 for read and write operations. Gates 173c and 173d, when enabled by the display microprocessor, pass signals MA1 and MB1, respectively, as write signals WRA1-X and WB1-X to the memories 169 and 170.

Referring to FIG. 22, when signal MA1 is logic high, memory 169 is selected to be read out, with address switch 241 being enabled to pass read addresses to the memory 169 and data switch 245 being enabled to pass the data read out to the output data bus 154a. At the same time, signal MB1 enables memory 170 for a write operation. Write address switch 244 and data switch 248 also being enabled to supply addresses and data to the memory 170, the data being written into the memory 170 in response to the write signals WRA1-X. When latch 173b (FIG. 24A) is toggled, its outputs switch state and memory 169 is selected for a write operation and memory 170 is enabled to be read from, with address switches 242 and 243 and data switches 246 and 247 being enabled.

Referring to FIGS. 24 and 24A, latch 173b is switched in response to the vertical drive pulse whenever the display microprocessor changes the state signal RD-X. The use of the vertical drive pulse to switch latch 173b ensures that the bank switching will occur during the vertical blanking period. To ensure that latch 173b has been switched before activating the memory write signals, the display microprocessor via signal VERT PRESET sets the latch 173a, enabling the latch to be reset in response to the next vertical drive pulse. The display microprocessor monitors signal DET provided at the output of latch 173a. When signal DET becomes logic low, if the memory is to be updated, the display microprocessor then generates signal WR-X which is passed by one of the gates 173c and 173d as determined by the state of signals MA1 and MB1 respectively.

In an actual embodiment, the memory 169 and memory 170 each were the RCA Type 6116 CMOS 2048×8-bit RAM. The address and data switches 241-248 were the TI Type 74HCT245 Octal Bus Transceiver, supplemented by an additional address switch, such as the Type 77LS244.

Character Generator

Referring to FIG. 24, the character address data read out of the display memory circuit 154 (FIG. 22) is applied to the character generator 157 which includes a character ROM 261, character matrix row address generator 262 and alphanumeric data generator 263. The character address data on the bus 154a read out of display memory circuit 154, represents characters selected to be displayed on the CRT screen. Address data is provided by the character matrix row address counter 262. The ROM 261 responds to such address data and the character address data on the bus 154a to provide information on the dot matrix formation of the character to the alphanumeric data generator 263. The output of the alphanumeric data generator is applied then to the output logic circuit 159 (FIG. 23) to ultimately cause the selected characters to be displayed on the CRT screen.

Character ROM

FIG. 23A illustrates the layout for a portion of the character ROM 261, such as the Type P2764, which stores 256 characters in a 16 by 16 grid of character matrices, such as character matrices 261a-261j and 261k, 261m, and 261n. The character ROM 261 (FIG. 24) is addressed in an eight bit code from the display memory 154 (FIG. 22). The 256 character matrices are arranged in 16 addressable character rows OH (row O in hexidecimal code) to FH (row F in hexidecimal code) by 16 addressable character columns OH to FH, portions of rows 5H-AH of columns OH to 9H being illustrated in FIG. 23A. Each character matrix such as character matrix 261k for the character "P" at location 50H is defined by seven matrix columns D7 to D1 and by nine matrix rows R0 to R8. Each character matrix row (R0 to R8) is addressed by character ROM address lines A0 thru A3. The character column is addressed by character ROM address lines RA4 thru RA7, and the character row is addressed by character ROM address lines RA8 thru RA11. Character ROM address lines RA4 thru RA11 receive the eight bit code from the display memory circuit 154 (FIG. 22).

Each character matrix stores data which defines a character, the data being read out and ultimately applied to the output circuit to drive the CRT monitor to turn on or off the beam at appropriate times to cause the character to be displayed on the CRT screen. For example, character ROM location 50H stores the data for generating the character "P". When the display memory circuit 154 (FIG. 22) provides the code for "P", row 5, column 0 is selected and with successive horizontal sweeps of the CRT monitor, the character data for character "P" is read out a row at a time. The character matrix row address generator 262 (FIG. 24) addresses the character a row (R0 to R8) at a time, causing read out of the seven bit word (columns D7 to D1) representing the coding for that row of the character. As such logic high level point (represented by the solid square) is read, the CRT beam is turned on. The beam is turned off for logic low level point.

The character ROM 261 (FIG. 24) stores all alphanumeric characters necessary to display all the pattern screens shown in FIGS. 4-14, including number 0-9 and letters A-Z (upper and lower case) in both standard and inverse video form, increasing the flexability of the character display system. The standard and inverse video form characters are stored in corresponding columns with the inverse form being located eight rows from its standard form. For example, the address for "P" is 50H, and for inverse "P" it is D0H. Full and partial character blocks are provided for each of the bar graph screens, that is, KV Bar Graph, Dwell Bar Graph, and Cylinder Shorting Bar Graph. Standard characters are addressed in the character ROM using standard ASCII code. The non-standard characters in the character ROM are addressed by a similar code.

The character blocks for the Dwell Bar Graph are located row AH, columns 1H thru 9H of the character ROM 261. Locations A1H and A9H store "blank" screen segments. Location A8H stores a full block (twenty-two full blocks are written to display a dwell bar full screen in length). Locations A2H thru A7H each store a partial character block for the dwell bar graph.

Character ROM Addressing

Referring to FIGS. 22 and 24, as was previously described, whenever a mode, such as Primary Pattern screen mode, is selected the display microprocessor 153 causes the character ROM address data necessary to display the Primary Pattern screen which is stored in the screen ROM 155 to be written to both memory 169 and memory 170. The address data stored in the display memory circuit 154 is read out under the control of the character read circuit 249. That data is presented to the character ROM to be displayed.

More specifically, the character column address counter 249b is incremented once for each fourteen dot matrix columns. There are 512 dot matrix columns in a horizontal row. The character column address counter 249b is set to zero by the horizontal drive signal at the end of each horizontal sweep.

The character row counter 249c is incremented once for each 16 CRT row sweeps, to count 16 character rows on the CRT screen. The character row counter 249c is set to zero by the vertical drive signal at the end of each vertical sweep.

In addressing the display memory circuit 154, the count outputs A5 thru A8 of character row counter 249c and count outputs A0 to A4 of character column address counter 249b enable read out in sequence the codes for the character selected for display. The codes read out are applied to address inputs RA4-RA11 of the character ROM which receives row select address counts on inputs RA0 thru RA3 from the character matrix address row generator 262.

Character row counter 249c, which is a four bit counter, counts the ROW 3 pulses generated by the row counter 158A (FIG. 21). The character row counter 249c is reset by the vertical blanking pulse at the end of each vertical sweep.

The character column address counter 249b comprises a five bit counter. Pulses at a 4 MHz rate which is ½ the rate needed to produce 512 dot matrix columns are divided by the divide-by-seven counter 249a and applied to the count up input of the character column address counter 249b such that the character column address counter 249b is incremented once for every fourteen dot matrix columns. The character column address counter 249b changes its output state once for every fourteen dot matrix columns. Each change in state of the output of the character column address counter 249b corresponds to the next character in the row which is indicated by the character row counter 249c. The character row counter 249c changes its output state once for every 16 horizontal row pulses.

Character read circuit 249 addresses each of the 512 byte storage locations of the display memory 169 (or 170) in sequence reading out the address data in code (one byte) which is stored at the memory location being addressed. This character address data, applied to the character ROM address inputs selects the row and column of the character ROM 261. The particular row within the character which is to be read out is determined by the character matrix row address generator 262.

The character matrix row address generator 262 comprises a four bit counter which counts the ROW-X 0 pulses provided by the row counter 158A (FIG. 21). The character matrix row address generator 262 is reset by the leading edge of a ROW 3 pulse (at the first row of the next character) provided by row counter 158A such that the character matrix row address generator 262 counts to a count of 9 and is then reset. Because pulse ROW-X 0 is used to increment the character matrix row address generator 262, the initial count up from its reset stage is advanced ½ clock cycle. Also, because the ROW 3 pulse is used to reset the character matrix row address generator 262, the count of 9 output is held for only ½ clock cycle. The character matrix row address generator 262 is reset to zero by each vertical drive signal at the end of each vertical sweep.

As described previously, the character matrix is defined by nine character matrix rows are R0–R8. For rows R1 thru R7, the use of the ROW-X 0 pulse rate will cause the character matrix row address generator 262 to hold the addressed row for two row counts, effectively doubling the vertical size of the character. For rows R0 and R8, the data will be held for only one row.

Thus, in response to the character address data and the character matrix row address applied to the character ROM address inputs, the character ROM 261 outputs an 8 bit word including bits D1–D7 which are coded to cause the CRT beam to be turned on or turned off to generate the addressed character matrix row information on the screen. The eight bit data word is loaded into the alphanumeric data generator 263 in response to a load command derived from the divide-by-seven counter 249a.

An eight bit data word which is loaded into the alphanumeric data generator 263 in parallel is clocked out serially by a clock pulse at the 4 MHz rate and applied to the output circuit 159 for application to the CRT monitor 11. Since the bits are clocked out at the 4 MHz rate, each bit is held for two dot matrix columns at the 8 MHz rate, so that two pixels are lit in response to each data bit read out of the alphanumeric data generator 263, which in one actual embodiment was the TI Type 74LS165 Parallel Load Shift Register.

In summary, each column and each row of character data is read out in a manner which doubles the size of the character displayed. Each seven bit word of character data read from the character ROM 261, representing a matrix row of the character, is loaded into the alphanumeric data generator 263 which comprises a parallel-to-serial converter. The seven bit data word is clocked out of the alphanumeric data generator at a 4 MHz rate, which is one half the rate which would produce 512 dot matrix columns in a single horizontal sweep. Thus, each bit of the 7-bit character matrix row data is held for the time of two dot matrix columns doubling the horizontal size of each character read out of the character ROM 261.

As previously indicated, the character matrix row address generator 262 is stepped once for every two CRT horizontal sweeps to cause the character matrix row data to be held for two CRT row sweeps, doubling the vertical height of each character on a row by row basis. Thus, each a single dot becomes a four-by-four pixel matrix due to doubling of the horizontal and vertical size of each pixel. Also, the character data for a 9 row by 7 column character is stored in character ROM locations for an 8 row by 7 column character. Although each character stored in the character ROM is defined by 9 rows R0–R8, the first and last character matrix row data is held for only one CRT row sweep and 7 columns D1–D7, defining a character 9 row high by 7 columns long (appearing to be 18 rows by 14 columns). The row R0 and row R8 are not held, when the character data is read out.

By way of illustration of the operation of the addressing of the character ROM 261, it is assumed that the Primary Pattern mode screen (FIG. 4), is to be displayed. In the top character row of the Primary Pattern screen, the first seven characters are "blanks", the next seven characters are the title "PRIMARY", the next character is a "blank" and the next seven characters are the title "PATTERN". The remaining characters in the first character row are all blanks, except for location 1DH which is a "degree sign" for the display of dwell in the second character row.

Referring to FIGS. 22 and 24, the main microprocessor accesses the screen ROM 155 and reads the character address data for the Primary Pattern screen to the display memory circuit 154, the format data being written into one memory, such as memory 169, then into the other memory 170, the memory switching being controlled by the display microprocessor.

The character code data is stored sequentially for each row, and thus in the present example, the first seven byte locations in memory 169, assumed to be configured for a read operation, store the code for a "blank", the eighth location stores the code 50 for the letter "P", the ninth location stores the code 52 for the letter "R", etc.

At the start of a read cycle, the address outputs of the character row counter 249c and the character column address counter 249b access the memory locations which store the ASCII code for the first character in the first character column which is 20H, the ASCII code for a "blank". This code is applied to the character ROM 261 selecting the character location 20H. The character matrix row address generator 262 addresses character matrix R0. Accordingly, the character ROM 261 outputs an 8 bit word including 7 logic low level bits D7–D1 which are loaded into the alphanumeric data generator 263 in response to a load pulse generated by the divide-by-seven counter 249a. The divide-by-seven counter 249a includes a latch (not shown) which is reset by the horizontal drive signal, generating signal LOAD-X which is used to clear the latch thereby generating signal LOAD at the start of each read cycle. The data loaded into the alphanumeric data generator 263 is shifted out at the 4 MHz rate and applied to the output logic 159 (FIG. 23).

When the character column address counter 249b is incremented, after 14 dot matrix columns have been swept, the second character in the first character row is addressed by the address outputs provided by the character row counter 249c and the character column address counter 249b. The character code is read out of the memory and applied to the character ROM 261. The character matrix row address generator 262 is addressing the first character matrix row R0, causing the character ROM 261 to output the appropriate data.

This operation continues, with the character column address counter 249b being incremented to select the next successive character in the display memory 154 and read out the code stored at the address location to the character ROM 261. The data for the first matrix character row R0 is read out for each of the characters in the first character row.

When the character column address counter 249b reaches a count of 32, the character column address counter 249b is reset to 0 by the horizontal drive signal. Also, the character matrix row address generator 262 steps from a count of 0 to a count of 1. The read sequence is then repeated with the character column address counter 249b effecting read out of the codes for successive characters in the first character row, but since the character matrix address counter has incremented one count, the row one data for each character is read out to the alphanumeric data generator 263. As has been indicated, the character matrix row address generator 262 is incremented by the row-X0 count, and for character rows R1–R7 the character matrix row address generator 262 will be incremented every other horizontal row pulse so that the character data words for character matrix rows R1 thru R7 will be read out twice. Due to the reset of the character matrix row address generator 262 by the ROW 3 count, the character matrix row R8 will be read out only once.

After 16 RT row counts, all the character data for the first row of characters has been read out and applied to the output logic circuit 159 (FIG. 23). At this time, character row counter 249c is incremented and the character data for the second row of characters is read out, with the code for each character of the second character row being read out and applied to the character ROM 261 and the character matrix row address generator 262 addressing each matrix character row, a row at a time as described above.

Sample Dwell Bar Calculation

The character ROM 261 is operated as a look-up table when creating bars for such features as Dwell Bar Graph, KV Bar Graph, and Cylinder Shorting Bar Graph.

There are eight different screen formats for the Dwell Bar Graph mode. The screen format used is selected by the display microprocessor on the basis of the number of cylinders and the number of cycles of the engine being analyzed, as indicated by engine start-up data which was received from the main microprocessor. The screens have different scale factors displayed numerically, six of the screens having maximum values of 45°, 60°, 90°, 120°, 180°, 360°, and two have lesser values. Twenty character blocks are used to display 60° and 120°. Twenty-two character blocks are used to display 45°, 90°, 180°, and 360°. The other two screens are based on the screens which display 45° and 60°. Since a fixed number (20 or 22) of character blocks is used to display different dwell scales, a different division factor and multiplication factor are used to convert a dwell numerical value to a graphical bar representation.

The following is a sample calculation showing operation of the display microprocessor in creating a bar for the dwell bar graph, to demonstrate how the character generator 157 is used as a look-up table. The dwell bar segments are located in character ROM locations (FIG. 23A) A1 thru A8, location A8 storing data for a full character portion and locations A1 thru A7 storing partial character portions from zero to six columns long, respectively, address A1 being the starting address for the dwell bar segments.

For example, it is assumed that the display microprocessor has received data from the main microprocessor indicating that a 4 cylinder, 4 cycle engine is being tested. Display microprocessor software uses that information to select the correct screen pattern. The dwell bar graph in this case would have a scale from 0 to 90 degrees with 22 blocks providing a full scale display across the screen. Since each block is approximately 4 degrees, the dividing number for a 4 cylinder, 4 cycle engine is 4. Since each full block is four degrees, one degree represents approximately 2 columns of a character block. Thus, the multiplying factor is 2.

Assuming that the dwell reading is 30 degrees, this value is $\frac{1}{3}$ of the full screen value of 90 degrees, and thus $\frac{1}{3}$ of the total number 22 of blocks are needed for a full scale screen. Thus, to display 30 degrees, 7.5 blocks, approximately, would be needed. Therefore, when this bar is created, the bar graph should show approximately 7.5 blocks to represent the dwell information to be displayed.

To generate the address, the scaling factors are applied to the numerical data received from the main microprocessor. First, the dwell value of thirty degrees (1E in hexadecimal code) is divided by 4, the dividing factor in this example. The result of this calculation (done in hexadecimal) is 7 with a remainder of 2. The resultant whole number 7 determines the total number of full blocks required for the bar. The remainder 2, is multiplied by the multiplying factor which is 2, in this case, providing an incrementing factor of 4. This factor is used to increment the character address from the initial row address A1 to locate the partial character required for this bar graph.

In this example, the starting address for block characters for the dwell bar graph is A1. When the incrementing factor of 4 is added to this starting address A1, the address is incremented to A5. The character stored at address A5 is a partial character block approximately $\frac{1}{2}$ the size of a full block. Therefore, the initial whole number of 7 designates the need for 7 full blocks across, and the partial character, now being designated as being at location A5 in the character generator ROM designates a partial block of ½ size. The display microprocessor then proceeds to write 7 full blocks across the screen horizontally, and then places the partial block required at the end, so that the bar displayed is 7.5 blocks in length for representing a dwell value of approximately 30 degrees for a 4 cylinder, 4 cycle engine.

Output Logic

Referring to FIG. 21 and 23, the output logic circuit 159 which drives the CRT monitor data input includes a split screen comparator circuit 271, a CRT data gate 272, curtain circuit 273, and a line driver 274.

The split screen comparator circuit 271 provides a data steering function directing alphanumeric data to the CRT monitor during a first portion of the vertical sweep and directing waveform data to the CRT monitor during the rest of the vertical sweep, for the waveform pattern screens Primary Pattern, Secondary Patter, Alternator Pattern, Voltage Pattern and Fuel Injection Pattern. For such screens, an alphanumeric display is produced on the top one-fourth of the CRT screen and the waveform pattern is displayed on the lower three-fourths of the CRT screen.

The split screen comparator circuit 271 has reference terminals 271a preprogrammed to a preset count and a signal input coupled to receive ROW DATA from the row counter 158a (FIG. 21). The comparator circuit 271 compares the output of the row counter 158A with the preset count. In an actual embodiment the preset count was 191 and the row counter 158a counted down from 255 to 8 as the CRT beam is swept across the CRT screen row by row. When the output of the row counter 158a is less than the preset count, signal DATA CONTROL from the split screen comparator circuit 271 becomes high. The signal DATA CONTROL and its complement DATA CONTROL-X are applied respectively, to the output stage of the dot energizing circuit 158 (FIG. 21), and the alphanumeric data generator 263 (FIG. 24). During waveform modes, for the first 64 sweeps of the CRT beam, signal DATA CONTROL is low, defining an inhibit signal, inhibiting the dot energizing circuit 158 and thereby preventing waveform data from being applied to the CRT data gate 272. Also, during the first 64 sweeps, signal DATA CONTROL-X is high, defining an enable signal, enabling the alphanumeric data generator 263 and thereby allowing alphanumeric data to be coupled to the CRT data gate 272. For the remaining 192 sweeps of the CRT beam, signal DATA CONTROL is high, enabling the dot energizing circuit 158 to pass waveform data to the CRT data gate, while signal DATA CONTROL-X being low inhibits the alphanumeric data generator 263 and prevents passage of alphanumeric data to the CRT data gate.

The preset count is produced in the split screen comparator circuit 271, under the control of the display microprocessor 153, only when a waveform pattern mode is selected, as indicated by the mode identifier word transmitted to the display microprocessor 153 from the main microprocessor. The display microprocessor responds to such mode identifier word to set high the signal SCREEN CONTROL from the display microprocessor 153, which enables the preset count for the split screen logic circuit. When signal SCREEN CONTROL is low, the split screen comparator circuit 271 maintains signal DATA CONTROL low for the entire vertical sweep cycle of the CRT beam, allowing a full screen display of alphanumeric information.

The alphanumeric data and the waveform data passed by the CRT data gate 272 passes through the curtain circuit 273 to the line driver 274 the signal output of which drives the CRT monitor data input.

Curtain Circuit

The curtain feature provides the operator with the ability to define and make a time measurement of any portion of a displayed waveform. For example, referring to FIG. 14, the secondary waveform is illustrated in a curtain or defined area 14d of the screen. The data in the defined area 14d, is inverted resulting in an inverse video effect. Normally, a waveform is displayed in green with a black background. The curtain feature causes the waveform in the defined area 14d to be black and the background green, resulting in a good highlight of the portion of the waveform within the defined area. The background area of the waveform is illuminated with the waveform being the dark area. A time measurement in milliseconds is displayed at the center of the screen (14b, FIG. 14) whenever the curtain feature is activated. The "curtain" is a visual aid to the user. The left side of the "curtain" is identified by an address of where to start inverse video and the right side is identified by an address as to where to end the inverse video.

As previously explained, the CRT data gate 272 (FIG. 21) combines the waveform data provided at the output of the dot energizing circuit 158 (FIG. 21) with the alphanumeric data provided at the output of alphanumeric data generator 263 (FIG. 24).

Information is derived from the keyboard 12 (FIG. 17) for selecting the width of the "curtain". The LEFT ARROW/STD TRIG key and RT ARROW/SPCL TRIG key are used to adjust the left and right edges of the "curtain". When the operator depresses one of these keys, the curtain circuit (via outputs from the main microprocessor) senses which key is depressed. When the operator releases the selected key, the limit is established and the length of time the key is depressed is used by the main microprocessor to generate commands for the display microprocessor via the curtain circuit 273. As indicated, there are 512 address lines relating to columns on the screen and the main microprocessor provides signals which determine column on and column off to determine beam on and beam off times for all the rows scanned.

When the operator releases the key, the main microprocessor determines the column off requirement and that information becomes one of two inputs to the curtain circuit 273, along with CRT address lines. Since the address lines are actually addressing every point of the screen, these 512 lines are constantly addressed at the proper rate for proper scanning. These three inputs, column on, column off and the address lines are used to determine whether the beam should be on or off.

Referring to FIG. 25, the curtain circuit 273 will be described. The curtain circuit 273 includes a column on comparator circuit 301, a column off comparator circuit 302, an intermediate logic circuit 303, a clock gated circuit 304 and a data output gate 305.

The column on comparator circuit 301 receives a COL ON input and a CRT ADD input. The column off comparator circuit 302 receives a COL OFF input and a CRT ADD input. The intermediate logic circuit 303 receives inputs over two lines from comparator circuit 301 indicating whether the CRT address count is greater than or equal to COL ON data, and two lines from comparator circuit 302 indicating whether the CRT address count is less than or equal to the COL OFF data. Intermediate logic circuit 303 provides a pulse to gate circuit 304 when at least one output of both comparator circuits, one from each comparator circuit is logic high. Gate circuit 304 also receives the 8 MHz clock and the data control line signal on other inputs. The gate circuit 304 provides a gate pulse to the data output gate 305, the output of which is extended to the line driver 274 (FIG. 23).

The curtain circuit input data ("COL ON" and "COL OFF") are generated by the main microprocessor 151 after scanning the keyboard 12 (FIG. 17) and applying the appropriate algorithim to such data. The COL ON data refers to the specific address at which the defined area or curtain begins, while the COL OFF data indicates where the defined area ends. Column on comparator circuit 301 compares the magnitude of the C0l ON data with the columnar position or current address of the CRT beam (CRT ADD). If the CRT address count is greater than or equal to the COL ON data, the appropriate output line of the comparator 301 becomes high. In a similar manner, column off comparator circuit 302 compares the magnitude of the COL OFF data with the current columnar position or address of the CRT beam (CRT ADD). If the CRT address count is less than or equal to the COL OFF data, the appropriate output line of the comparator circuit 302 becomes high. All four output lines define the inputs of the intermediate logic circuit 303.

The intermediate logic circuit 303 produces a logic high whenever the CRT address count is greater than or equal to the COL ON data and also less than or equal to the COL OFF data. In other words, whenever the count of the CRT address counter 174 (FIG. 21) is in the operator defined area 14d (FIG. 14) of the displayed waveform, the intermediate logic circuit 303 produces a logic high.

The output of the intermediate logic circuit 303 must be gated with the 8 MHz clock to insure that the comparator circuit 301 and 302 have had adequate time to settle. Since all data to the CRT monitor 11 (FIG. 23) is clocked out using the 8 MHz clock, this clock, or actually it's inverse is used to gate the output. The output is actually gated during the second half of the clock pulse insuring that all data passed on is valid.

The gate circuit 304 has an input coupled to conductor 304a on which appears an inhibit signal DATA CONTROL. The CRT screen is divided into an upper portion in which the alphanumeric data appears and a lower portion in which the waveform appears. The curtain feature must be disabled while the beam is in the upper portion of the screen. As previously explained, an inhibit signal appears on the conductor 304a whenever the electron beam is in the upper portion of the screen, and the inhibit signal is absent when the electron beam is in the lower portion of the screen. The inhibit signal being applied to the control input of the gate circuit 304 will disable same when the electron beam is in the upper portion of the screen. The logic signal at the output of the gate circuit 304 becomes high during the presence of the curtain and when the electron beam is in the lower portion of the screen.

The logic signal is applied to a data output gate 305 having its signal input coupled to the conductor 305a on which digital signals appear corresponding to the waveform data signals and also to the alphanumeric data. The data output gate 305 will not invert data when the first gate circuit 304 produces a logic low. When the gate circuit 304 produces a logic high, the data output gate 305 inverts all the information on the conductor 305a, which thereby produces the curtain or inverted video during the selected portion of the waveform. Gate 305 passes alphanumeric data and both inverted and non-inverted waveform data to the CRT monitor. This is only used with data coming from the waveform memory.

Dot Energizing Circuit

The dot energizing circuit 158 (FIG. 21) provides the displayed digitized waveform with the smooth continuous appearance of a similar analog waveform. A digital display, unlike it's analog counterpart, is made up of a finite number of discrete points, in this case only 512 of the maximum number of 131,072 points (256 rows by 512 columns). Because the relatively few number of points and the type of waveform displayed, the output would appear somewhat incomplete particularly in areas where fast rising transients occur, such as during the firing line of an ignition waveform. Without a way to fill in the dots, only a few points would appear on the screen making it difficult if not impossible to obtain any useful information from that area of the display.

In general, in the dot energizing circuit according to the present invention, the waveform data is compared with the status of the row counter 158A (FIG. 21) which generates a row count which is equivalent to the scan rate of the CRT monitor. The dot energizing circuit compares row data R-S representing the location of the CRT beam with row data R-CC representing the row location of data in the column presently being addressed and with row data R-PC representing the row location of data in the column previously addressed and determines whether the beam should be on or off. As each of the 256 rows of the CRT screen is swept, this comparison is made 512 times. The function of the dot energizing circuit is to turn on the beam for each waveform data point and to insert dots in the column of one of two adjacent columns having data points located in different rows.

Referring to FIG. 26, the dot energizing circuit 158 includes a data latch 321, a present data comparator circuit 322, a past data comparator circuit 323, a data selector circuit 324 and a data output gate 325.

The data latch 321 receives waveform data R-CC and latches or stores it during the rising edge of the 8 MHz clock. This data is stored until the next rising edge of the clock and becomes the past data input R-PC for past data comparator circuit 323.

The past data comparator circuit 323 compares the past data R-PC from the data latch 321 with the present row number R-S. The row number identifies the row in which the electron beam of the CRT monitor is sweeping. The beam scans from top to bottom and the row counter counts down from 255 to 0. The row at the top of the screen is row 255, the bottom row is row 0. When the past data R-PC is equal to or greater than the row data R-S, the corresponding output 323-1 or 323-2 becomes a logic low.

The present data comparator circuit 322 in a similar manner compares the present data R-CC with the current value R-S of the row counter. If the present data R-CC is equal to or greater than row data R-S then the appropriate output 322-1 or 322-2 is set to a logic low. The outputs 322-1, 322-2, 323-1 and 323-2 of the two data comparator circuits 322 and 323 become inputs to the data selector circuit 324 which outputs a logic high level signal whenever the row data R-S equals either the past data R-PC or present data R-CC or both, or has a value in between the same. Ultimately a logic high level signal turns on the electron beam to the CRT monitor 11 (FIG. 23).

The data selector circuit 324 has eight data inputs D0-D7 and three data selector inputs A, B, and C. Data inputs D0, D1, D3 and D6 are connected to logic low level and inputs D2 and D4 are connected to logic high level. Data inputs D5 and D7 are commonly connected to output 322-1 of the present data comparator circuit 322 which is at logic low level when R-CC=R-S and logic high level when R-CC≠R-S.

Data selector inputs A, B, and C are connected, respectively, to data comparator outputs 322-2, 323-1 and 323-2. Thus data selector input A is at logic low when R-CC is greater than R-S. Data selector input B is at logic low when R-PC=R-S and data selector input C is at logic low level when R-PC is greater than R-S.

The data inputs D0-D7 are selected in accordance with the relationships set forth in TABLE I where D is data comparator output 322-1 and E is the output of the data selector circuit 324.

TABLE I

| A | B | C | D | E |   |
|---|---|---|---|---|---|
| 0 | 0 | 0 | X | Z | (D0) |
| 1 | 0 | 0 | X | Z | (D1) |
| 0 | 1 | 0 | X | 0 | (D2) |
| 1 | 1 | 0 | X | 1 | (D3) |
| 0 | 0 | 1 | X | 0 | (D4) |
| 1 | 0 | 1 | 0 | 1 | (D5 R − S = R − CC) |
| 1 | 0 | 1 | 1 | 0 | (D5 R − S = R − CC) |
| 0 | 1 | 1 | X | 1 | (D6) |
| 1 | 1 | 1 | 0 | 1 | (D7 R − S = R − CC) |
| 1 | 1 | 1 | 1 | 0 | (D7 R − S = R − CC) |

Where:
Z = nonexistent state
X = don't care
A = 0 for R − CC > R − S
B = 0 for R − PC = R − S
C = 0 for R − PC > R − S
D = 0 for R − CC = R − S The manner in which the dot energizing circuit 158 is operative to supplement the waveform data in enhancing the displayed waveform by filling in data is best illustrated by the following example which makes reference to the secondary signal pattern waveform illustrated in FIG. 6, a portion of which is reproduced in enlarged form in FIG. 26A. As there illustrated, each data point which will result in lighting up of the CRT beam is represented by an "x", these being a data point in row 60, columns 124 and 125, a data point in row 160, column 126, a data point in row 125, in column 127, a data point in row 80, column 128, etc. Note that the firing line on the secondary waveform displayed at columns 125-128 is represented by only four widely spaced data points.

Figure 26B:
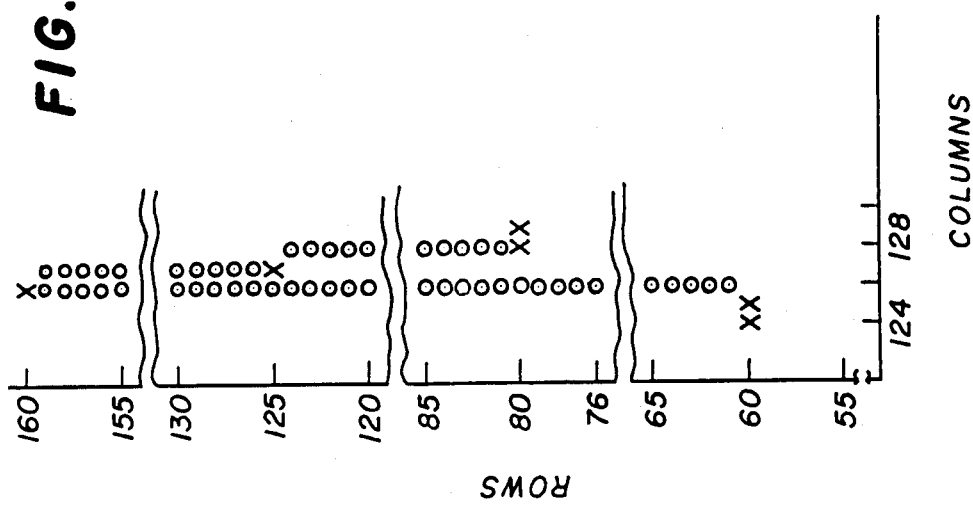
FIG. 26B illustrates a portion of the waveform shown in FIG. 26A which has been supplemented by "fill-in" dots.
Figure 26A:
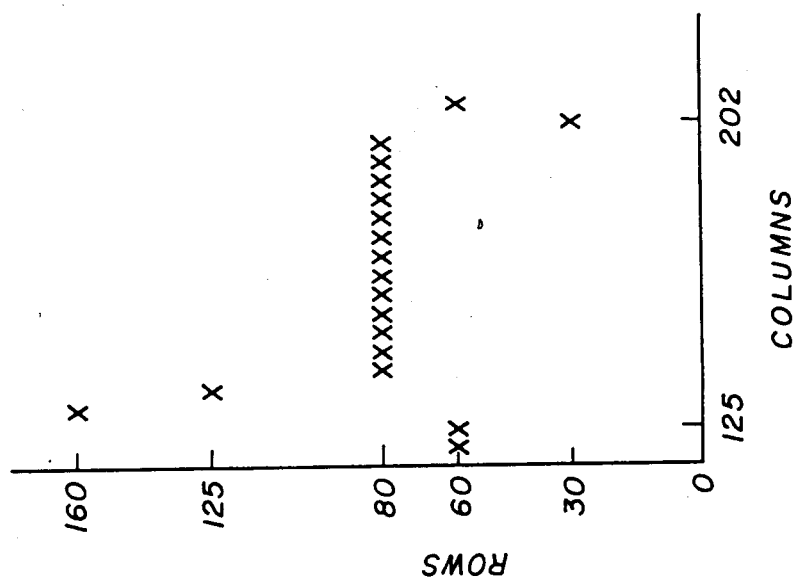
FIG. 26A illustrates a portion of the secondary sync pattern illustrated in FIG. 4, "enlarged form"

The dot energizing circuit 158 (FIG. 26) supplements the displayed waveform, filling in the dots in the appropriate columns which have data points located in different rows, producing a substantially continuous waveform. FIG. 26B illustrates a portion of the waveform shown in FIG. 26A which has been supplemented by "fill-in" dots represented by "O's" as the result of the operation of the dot energizing circuit 158 (FIG. 26). Note that "fill-in" dots have been inserted in column 126 in rows 159 to 61, effectively connecting the data point in row 60, column 125 with the data point in row 160, column 126, the adjacent column. Similarly, "fill-in" dots have been inserted in column 127 in rows 159 to 126, effectively connecting the dot at data point in row 160, column 126 with the dot at the data point in row 125, column 127, the adjacent column. In the third column 128 illustrated in FIG. 26B, "fill-in" dots have been inserted in each row when the row count R-S has a value between the row for present data R-CC and past data R-PC for a pair of data points in adjacent columns.

The conditions for turning on the CRT beam at data points and to produce "fill-in" dots are summarized in TABLE II for columns 126-128, rows 160 to 0.

TABLE II

|  | R−CC = 160; R−PC = 60 | R−CC = 125: R−PC = 160 | R−CC = 80; R−PC = 125 |
|---|---|---|---|
| ROW (R−S) | A B C D E | A B C D E | A B C D E |
| 160 | 1 1 1 0 1 | 1 1 0 1 0 | 1 1 1 1 0 |
| 159-126 | 0 1 1 1 1 | 1 1 0 1 1 | 1 1 1 1 0 |
| 125 | 0 1 1 1 1 | 1 1 0 0 1 | 1 0 1 1 0 |
| 124-81 | 0 1 1 1 1 | 0 1 0 1 0 | 1 1 0 1 1 |
| 80 | 0 1 1 1 1 | 0 1 0 1 0 | 1 1 0 0 1 |
| 79-61 | 0 1 1 1 1 | 0 1 0 1 0 | 0 1 0 1 0 |
| 60 | 0 0 1 1 0 | 0 1 0 1 0 | 0 1 0 1 0 |
| 59-0 | 0 1 0 1 0 | 0 1 0 1 0 | 0 1 0 1 0 |

In an actual embodiment, the data comparator circuits 322 and 323 were the TI type 74LS684 8-bit magnitude comparators. The data selector circuit 324 was the TI type 74S151 data selector.

Main Program Flow Chart

Figure 27:
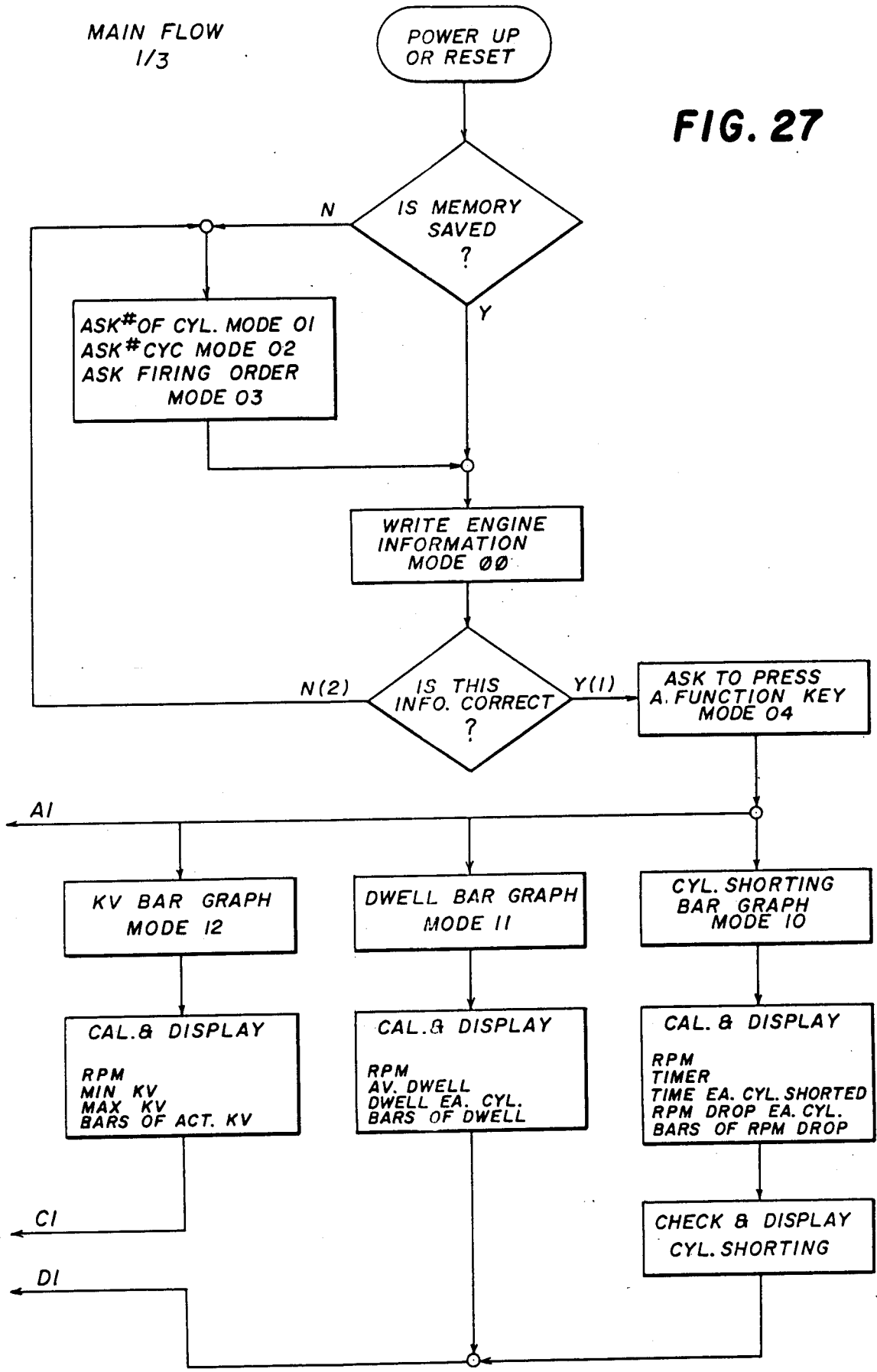
Figure 27B:
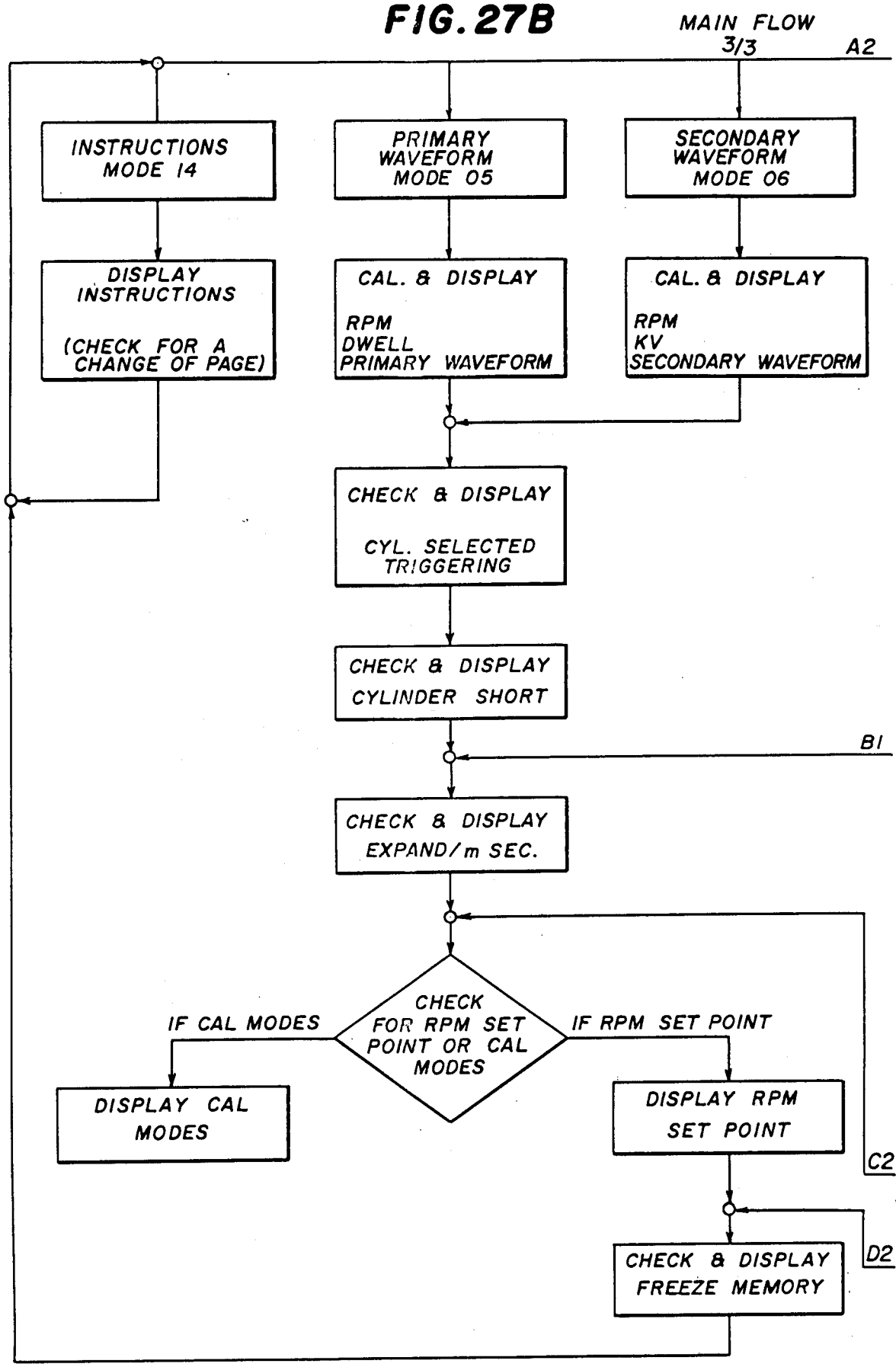

Turning now to FIGS. 27, 27A, and 27B, the flow chart depicted therein will be used to provide an overview of the main program under which the main microprocessor 151 (FIG. 16) and the display microprocessor 153 (FIG. 16) operate. Assuming that the digital engine analyzer 10 is connected to a source of 12 VDC (or 110 AC) power, when the power switch 13 (FIG. 1) is operated or whenever the RESET key is depressed, the two microprocessors 151 and 153 are initialized, meaning that certain internal registers are cleared and others are placed in a predetermined initialized condition.

After initialization, inquiry is made as to whether data is saved in memory. This is to check if the data representing the number of cylinders, the firing order and the number of cycles of the previous engine tested has been saved. If so, mode 00 identified by mode word OOH, (hexidecimal code being indicated by "H") is entered and the start-up screen (FIG. 3) is displayed with the previous information.

If the information has not been saved, a screen for modes 01-03 is displayed which in mode 01 prompts the user to enter the number of cylinders of the engine being tested using the proper digit key. After the number of cylinders has been entered via a digit key, the ENTER key is depressed. Since only up to 8 cylinders can be selected, if key 0 or 9 is depressed the program comes up with an error message which is displayed on the screen. In mode 02, the program then asks for the number of cycles. This data is entered via the digit key 2 or 4 and then the ENTER key is depressed. If a digit key other than 2 or 4 is depressed, an error message is displayed. In mode 03, the program then asks for the firing order. The digit keys are used to enter in the firing order and, before leaving this mode, the firing order is checked to determine if the number entered is greater than the number of cylinders that have been entered, and also that there is at least one of each number. If the firing order is 1-6, each of the numbers 1-6 must be entered. If there are two 5's, for example, an error message is displayed.

When the cycle and the cylinder firing order data for the cylinders are entered, mode 00 screen is displayed. At this point, the program causes display of the question "is this information correct?" and branches off into two different directions in response to depressing of either digit key 1 or digit key 2. If the data is not correct, and digit key 2 is depressed, the program loops back and asks the number of cylinders, and cycles and firing order again.

If the data is correct and digit key 1 is depressed, the program enters mode 04 and the screen displays the phrase "please press a function key". This screen also indicates which screens have data saved in non-volatile memories. When mode 04 is entered, the engine information displayed in the mode 00 start-up screen is stored in the non-volatile display memory 115 (FIG. 16). Also, any of the modes can be selected.

If INSTR is depressed, the Instructions mode OEH is entered (FIG. 27B), and the first page of the instructions is displayed. The LEFT ARROW/STD and RT ARROW/SPCL TRIG keys increment through the pages or decrement back through the pages of instruction screens. The first page of instructions is a table of contents. By holding the RT ARROW/SPCL TRIG key depressed, the user can increment through the instruction pages. By depressing the LEFT ARROW/STD TRIG key, the user can decrement back through the instruction pages. If while in the Instructions mode, a function key is depressed, the program exists to that function. For example, if the PRI PATTERN key is depressed, the program goes to Primary Pattern mode 05 to display the primary ignition pattern screen (FIG. 4).

The primary pattern screen displays a primary waveform for an individual selected cylinder, engine RPM, the value of the average ignition dwell, and the firing order entered. The program checks and indicates the cylinder selected by highlighting in inverse video that cylinder in the firing order. The program then checks for cylinder shorting. As long as a cylinder is selected, depressing and holding the digit key corresponding to a cylinder to be shorted will short that cylinder as long as the digit key is held depressed. When the key is released, shorting of the cylinder stops. Cylinder shorting is also available in the secondary mode.

The legend TRIG is displayed at 4d (FIG. 4) which means, at that point, the RT ARROW/SPCL TRIG or LEFT ARROW/STD TRIG keys can be used to shift the waveform towards the center or to the left. The ENTER key enables the user to toggle between the TRIG feature and the expand feature wherein the waveform can be expanded using the arrow keys. If the FREEZE key is depressed, the waveform and alphanumeric data is frozen on the screen and stored in the waveform and display non-volatile memories 164 and 115 (FIG. 16). If one of the LEFT ARROW/STD TRIG or RT ARROW/SPCL TRIG keys is depressed while the Freeze feature is activated, the Cursor/Msec feature is provided. This feature measures the milliseconds between points in the waveform displayed. Also the cursor forms a curtain (FIG. 14), providing inverse video highlighting of the waveform between the selected points. There is also an arrow legend displayed indicating which side of the cursor curtain the user has control of. When control is of the left side, depressing the ENTER key switches control of the cursor to the right side. This control enables the user to toggle back and forth with successive depressions of the ENTER key and therefore, position the cursor curtain to measure the time period for any segment of the frozen waveform.

While in a live data mode, RPM set point feature is selectable by depressing the RPM SET POINT key. An RPM set point value is entered using the digit keys to select the RPM value and depressing the enter KEY. Once a set point value is entered, the waveform and data on the screen will automatically freeze whenever the set point value is reached or exceeded.

Referring back to Select Function mode, should this screen show that Primary Pattern mode data is saved in non-volatile memory, when the Primary Pattern mode is selected a "memory" sign will be displayed which indicates that the data being displayed is the data saved in the non-volatile memory.

When the SEC PATTERN key is depressed, the Secondary Pattern mode 06 is entered and the Secondary Pattern screen (FIG. 6) is displayed. The only differences in the secondary mode are that the secondary waveform is displayed rather than primary waveform and KV of the individual cylinder selected is displayed instead of average dwell. Since individual KV is displayed, KV will change, depending on which cylinder is selected, if the KV's are varying from one cylinder to another.

Referring to FIG. 27A, if the ALT & Fuel INJ. key is depressed, the program displays a menu of three options selected by digits keys 1-3, key 1 for Alternator Pattern mode, key 2 for Fuel Injector Pattern mode, key 3 for Voltage Pattern mode. If key 1 is depressed for Alternator Pattern mode 07, the title ALTERNATOR PATTERN is displayed (FIG. 7) engine RPM, alternator voltage waveform and the alternator output voltage is indicated which can be up to 28 volts. If 27.99 volts is exceeded, the word "OVERRANGE" is displayed.

If key 2 is depressed, for Fuel Injector Pattern mode 09, the title FUEL INJECTOR PATTERN is displayed, along with engine RPM and the fuel injector waveform.

If key 3 is depressed, for Voltage Pattern mode 08, the title VOLTAGE PATTERN is displayed, along with engine RPM, DC voltage value and voltage waveform. This is a DC coupled input as opposed to the alternator being an AC coupled input. For these three modes, Freeze, Memory, RPM Setpoint, and Cursor/Msec Features are available.

Referring to FIG. 27, if the SHORTING BAR GRAPH key is depressed, the Cylinder Shorting Bar Graph mode OAH is selected. In the Cylinder Shorting Bar Graph mode, the screen (FIG. 10) displays engine RPM, the time indicating how long a cylinder is shorted and the RPM change (usually RPM drop) for each cylinder shorted. This screen also displays RPM changes in graphic form.

When the SHORTING BAR GRAPH key is depressed, one of the two available cylinder shorting bar graph formats is displayed. One is for shorting individual cylinders of an engine. The second format is available if shorting even or odd banks of cylinders of an engine is desired and can be selected by depressing either the 0/EVEN OR 9/ODD keys. To switch from the even/odd shorting format back to the individual cylinder shorting format, the operator need only depress a digit key 1 through the number of cylinders of the engine being tested.

The Even/Odd shorting format displays the same data as individual cylinder shorting except the individual cylinder numbers are replaced by the word EVEN and ODD for the numeric data and E and O for the bar graph area. Even/Odd shorting is used for carburetor balance testing performed on V-type engines equipped with multi-barrel carburetor and/or 2-plane (divided) intake manifold. All even or odd cylinders are shorted at one time with the resulting RPM change and time shorted displayed.

Referring to FIG. 27, if the DWELL BAR GRAPH key is depressed, the Dwell Bar Graph mode identified by mode word OBH is selected, and the dwell bar graph screen (FIG. 12) is displayed. The dwell bar graph screen includes the title DWELL BAR GRAPH, engine RPM, average dwell, the firing order of the cylinders and the individual dwell values for each cylinder. There is also a bar graph representation of the dwell values for each cylinder. The Freeze feature is available in this mode allowing the data to be frozen on the screen and saved in display non-volatile memory 115 (FIG. 16).

If the KV Bar Graph key is depressed, the KV Bar Graph mode identified by mode word OCH is selected. This screen (FIG. 13) displays the title KV BAR GRAPH, engine RPM, the firing order of the cylinders, max. and min. KV values for each cylinder and a bar graph representation of continuously sampled KV values for each cylinder. Each cylinder KV value is sampled every 3rd distributor revolution, so the graphical representation by the bars is a semi-real time KV value, not every KV event. For the min/max numeric values, the minimums and maximums are progressively displayed. The RPM Setpoint Freeze and Memory features are also available in the KV Bar Graph mode.

The subroutines of the main program are now described in detail with reference to FIGS. 28-44.

Mode 00-04 Flow Chart

Figure 28B:
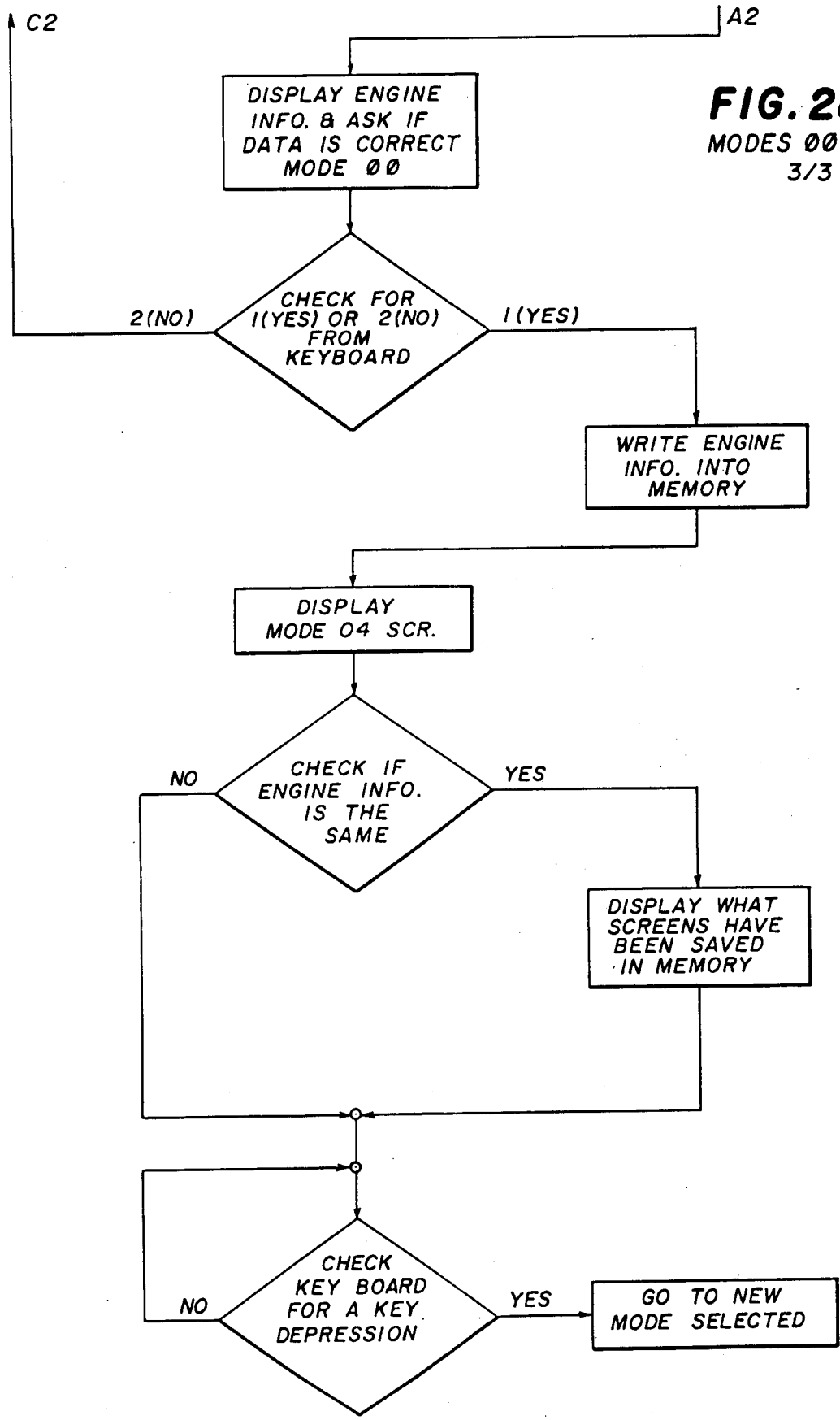

Referring to FIGS. 28, 28A and 28B, Mode 00 is the start-up (FIG. 3) screen that initially shows all engine information entered or stored, including number of cylinders and cycles, and the firing orders. Mode 01 is the screen where inquiry is made as to the number of cylinders. Mode 02 is the screen where the program asks for the number of cycles to be entered. Mode 03 asks for the firing order to be entered and mode 04 is the screen which displays the statement "please press a function key" and tells what data is saved in non-volatile memory.

Upon power up or reset the electronic hardware and software are initialized which includes clearing out registers and setting up all I/O lines on both microprocessors 151 and 153 (FIG. 16). Then, the main microprocessor reads the non-volatile memory 115 (FIG. 16) while the display microprocessor waits for either a mode 00 and mode 01 stream of data to be transmitted via the serial communications I/O lines. The main microprocessor reads the non-volatile memory 115 to determine if the data in the non-volatile memory 115 is valid or just random. It reads a power up word, mode recall word, firing order, cylinders and cycles.

The power up word is a byte of information used to determine if non-volatile data is valid and also to determine if 2 or 4 cycle engine setup is selected. Upon reset or power up, the non-volatile memory is read, if the power up word is equal to 2CH (identifying selection of 4 cycle engine) or 69H (identifying selection of 2 cycle engine) the non-volatile data is assumed to be correct. Otherwise, the data is assumed to be incorrect.

The mode recall word is a value which is stored in the non-volatile memory and is used to record which modes are stored in the memory. The status of any particular mode is recorded by having a particular bit set logic high or logic low in this word.

If the power up word is not correct, then the main microprocessor will ascertain that it has lost the data that was in non-volatile memory and will cause display of a screen requesting fresh data, that is, the "data entry" screen. This function is entered from the decision block "was valid data read".If yes, the program proceeds automatically to mode 00 which is display engine information and asks if data is correct.

If the data read was not valid, the mode 01 screen asks for the number of cylinders to be entered. This is shown on the screen by flashing a cursor. At that point, the keyboard is checked for an entry from the keyboard. If the ENTER key is not depressed, a check is made to determine if the digit key 0 or 9 is depressed to enter number 0 or 9. If an 0 or 9 is entered, an error message is sent to the display microprocessor. The display microprocessor will display an error message on the screen. The message displayed is: ERROR NUMBER 1 THROUGH 8. The main microprocessor will scan the keyboard for another entry. Only when a valid number key (not 0 or 9), followed by the ENTER key is depressed will data be saved and displayed on the screen. Once a valid number is received, the program looks for an ENTER key operation. When the ENTER key is detected, the program moves into mode 02 which asks for the number of cycles to be entered. If the ENTER key is not operated at that point, a check is made to determine if number 4 has been entered for 4 cycle engine, or if a 2 has been entered for a 2 cycle engine. If some key other than a 2 or 4 was depressed, this is an error and the display microprocessor displays the statement: ERROR ENTER ONLY 2 or 4 CYCLES. An ENTER key depressed while an error is detected will not be acknowledged. If 2 or 4 is depressed, the data is saved and the corresponding number 2 or 4 is displayed on the screen. Once the ENTER key is detected, the program proceeds to mode 03 which asks for the firing order.

Referring to FIG. 28A, again, a check is made for the ENTER key operation. If the ENTER key is not operated, a check is made to determine if either of the LEFT ARROW/STD or RT ARROW/SPCL TRIG keys is depressed. Operation of either of these keys will move the cursor right or left through the firing order. If the RT ARROW/SPCL TRIG key is not depressed, a check is made to determine if the LEFT ARROW/STD TRIG key is depressed. If the LEFT ARROW/STD TRIG key is not depressed, a check is made to determine if a digit key for a number 1 through the previously entered number of cylinders is depressed. If it is beyond the number of cylinders, an error message INCORRECT NUMBER is displayed. If a digit key is depressed for a number within the number of cylinders, the number is displayed on the screen and the cursor is moved one space to the right (until it coincides with the limit of the firing order).

If a LEFT ARROW/STD TRIG key or RT ARROW/SPCL TRIG key is depressed, the cursor is moved respectively right or left until it reaches the first or last position of the firing order. When the ENTER key is depressed, the main microprocessor checks the firing order from one through the number of cylinders and either accepts the order or displays an error message INCORRECT NUMBER. Referring to FIG. 28B, if accepted, the program moves into mode 00 inquiring as to whether the data is correct, and looks for digit key 1 for yes or digit key 2 for no as an input from the keyboard.

If digit key 2 is depressed, the program returns to mode 01. If the digit key 1 is depressed, the information that was either saved in the memory or entered is written into non-volatile display memory 115 (FIG. 16) and at the same time, the mode 04 screen is displayed with the instruction "please press a function key". At that time, the program looks to determine if any screens have been saved such as dwell bar graph, KV bar graph, or primary or secondary, and if they have been saved, the screens saved in non-volatile memories 115 (FIG. 16) and 164 (FIG. 16) are indicated by a flashing asterisk.

Then the keyboard is checked for a key depression to determine which function is being selected and the program goes to the new mode selected. While in mode 04, only the Instructions, Primary Pattern, Secondary Pattern, Dwell Bar Graph, etc. and reset keys are accepted.

Instruction Mode (Main Micro)

Figure 29:
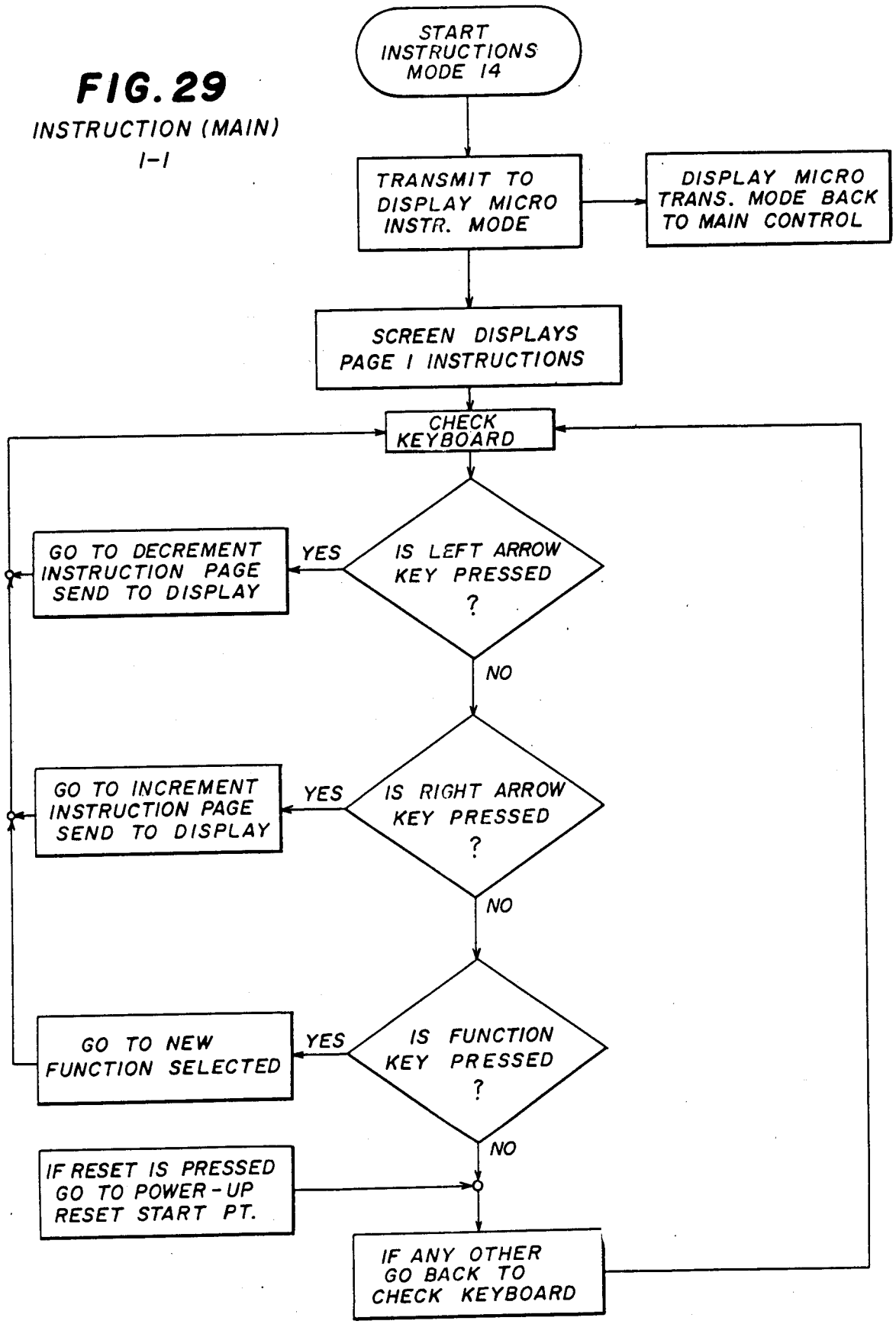
FIG. 29 depicts the instructions subroutine for the main microprocessor.

Referring to FIG. 29, if the INST. key is depressed, the Instructions mode OEH is entered. The main microprocessor 151 (FIG. 16) transmits to the display microprocessor the instruction identifier mode OEH and in accordance with the hardware handshake set up, the display microprocessor transmits back to the main microprocessor that the mode identifier was received for Instructions mode. At that point, upon receipt of the instruction mode identifier, the display microprocessor displays the first page of the instructions, which provides instructions as to the use of arrow keys, etc. The program then proceeds to check the keyboard. If the LEFT ARROW/STD TRIG key is depressed, the program decrements the instruction page sent to the display. If the LEFT ARROW/STD TRIG key is not depressed, an inquiry is made as to whether the RT arrow/SPCL TRIG key is depressed, and if so the instruction page sent to the display microprocessor is incremented. If neither arrow key is depressed, and the key depressed is for selecting a new mode, the program proceeds to the new selection. If a key is not depressed, the program goes back to check the keyboard to determine if any other key is depressed. In the Instructions mode, the only keys that are acknowledged are, RT ARROW/SPCL TRIG, LEFT ARROW/STD TRIG and reset. If the RESET key is depressed, the program goes back to the power up reset start point. Upon reset, the program will end up in the mode 00 screen or the mode 01 screen if data stored in non-volatile memory is determined to be invalid.

In the Instructions mode, the program continues in the loop looking for the RT ARROW/SPCL TRIG key, the LEFT ARROW/STD TRIG key or a mode key.

The instructions are stored in the instruction ROM and read out, in a read only operation, by the display microprocessor. The main microprocessor sends the mode word to the display microprocessor and the display microprocessor responsively accesses the instruction memory to read out the instruction page requested, that is, whatever page corresponds to that which should be on for the instruction. The display microprocessor reads data from the instruction ROM and writes the data into one of the memory banks. Then the display microprocessor switches the memory bank and writes the data from the instruction ROM into the other memory bank, while the data from the first bank written to is read out by the display circuitry so that it is displayed on the CRT.

Once the mode word is received by the display microprocessor, then the main microprocessor provides the command to either increment or decrement the page as a function of operation of the RT ARROW/SPCL TRIG or LEFT ARROW/STD TRIG keys. The display microprocessor keeps track of what page of instructions is being displayed and where the next page or previous pages are stored in memory, incrementing or decrementing the page as each command to increment or decrement is received. A roll over effect is provided i.e. roll over from the last instruction page to instruction page one or page one back to the last instruction page.

Primary/Secondary Pattern Modes (Main Micro)

Figure 30B:
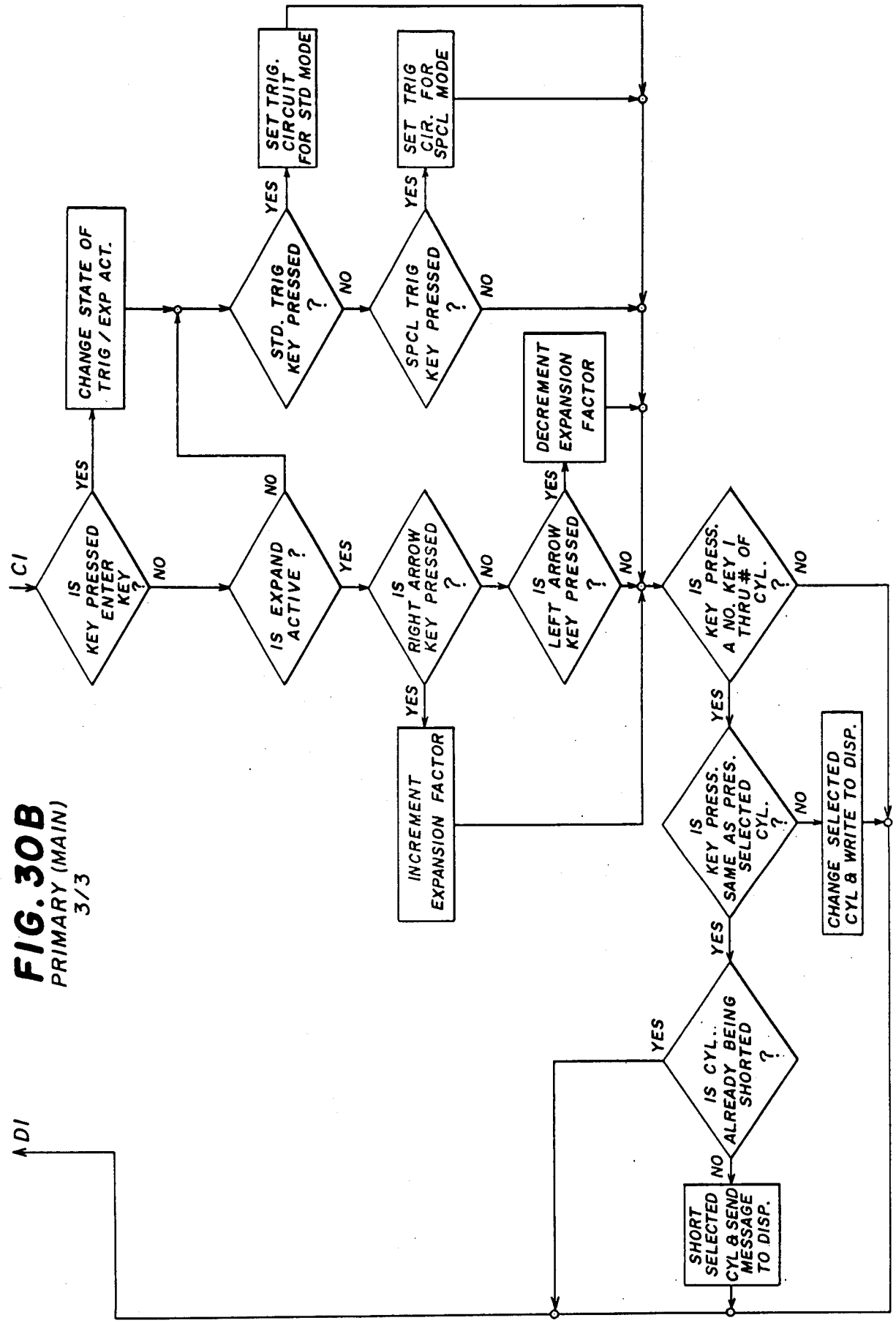

Referring to FIGS. 30, 30A and 30B, when the Primary Pattern mode is selected, the first operation is to check if this selection is Freeze/Memory feature or not. If so, a further check determines if primary mode data is stored in the non-volatile memory. If so, the non-volatile data is read and sent to the display microprocessor. The values sent include the Primary Pattern mode identifier 05, RPM set point, Trig/Expand word, and the current value for dwell. After the memory data is sent to the display microprocessor, another mode word 15H for the Memory Feature is sent to the display microprocessor. Then, the software loop for the Freeze/Memory feature is entered. Since the Memory feature is active, the step of saving data into the non-volatile memory is bypassed. If the Freeze feature is active, the data that was frozen is saved in non-volatile display memory 115 (FIG. 16) and non-volatile waveform memory 164 (FIG. 16), and the program remains in the freeze/software memory loop, looking at the keyboard until a function key is depressed which enables escape from the Freeze feature into a live data mode.

If there is no data saved in the non-volatile display memory 115 (FIG. 16) and non-volatile waveform memory 164 (FIG. 16) when the Primary Pattern mode is entered or if the d data is not used, the program initializes the hardware and software for the primary waveform and the display microprocessor is sent data indicating the cylinder selected, which normally would be cylinder 1. The cylinder ID line is set up for writing the proper cylinder into the waveform memory. If, for example, cylinder number 3 was the last cylinder selected, then data representing cylinder number 3 would be sent as the selected cylinder number.

Then a check is made for a flag which tells whether or not the VCO rate is ready to be recalculated, that is, whether enough data is captured for updating the VCO rate. If so, the new VCO rate is calculated by a VCO calculation subroutine (FIG. 41D) and applied to the VCO hardware. If the VCO rate is not ready to be calculated, the program proceeds to determine whether it is ready to recalculate the RPM rate. If so, the RPM calculation subroutine (FIG. 41C) is entered and the new RPM rate is calculated. If there is an RPM Set point, the new RPM rate is compared with the set point value, and if the RPM exceeds the set point, a freeze flag is set. Control is then returned to the Primary Pattern mode routine.

Next, if the display microprocessor is ready to accept new data, the data including current RPM, the dwell, and Trigger/Expand word are sent to the display microprocessor. Then a check is made to determine if the RPM Set point freeze flag is set. If so, the Freeze feature is activated, freezing all the data on the screen and entering the freeze/memory software loop.

If the display microprocessor was not ready to receive data, the program continues and next determines if it is time to calculate a new average dwell value. If so, the average dwell is calculated and stored. In either case, the program continues at the same point and sets up the trigger/expand word to its proper state. This value will tell the display microprocessor whether the word TRIG or EXPAND should be written on the screen. After that, the recall word is checked to determine whether a waveform screen has been saved in non-volatile memory. If in a live mode and the recall word shows that there is data saved in non-volatile memory, that word is changed to show that no data is saved in the non-volatile memory.

When the recall word is in the proper state, the program continues and checks the keyboard. The remaining portion of the program for the primary waveform checks the keyboard to determine if a key or what key is being depressed. If no key is being depressed, a check is made to determine if a cylinder was being shorted last time the keyboard was checked. If so, a stop shorting signal is sent to the display microprocessor. If no cylinder is being shorted, and no key is being depressed, the program returns to the start of the primary loop.

If a key is depressed, a check is made to determine if the key depressed is the RPM Set point key, FREEZE key, or a function key. If any one of these keys is being depressed, the program proceeds to the selected function or activates the selected feature.

Referring to FIG. 30B, if neither a function nor a feature key is depressed, a check is made to determine if the ENTER key is depressed. If it is, the state of the TRIG/EXP active mode identifier is changed. If the key depressed is not the ENTER key, a check is made to determine if the expand mode is active. If so, a check is made to determine if the key depressed is the RT ARROW/SPCL TRIG key or the LEFT ARROW/STD TRIG key. If the RT ARROW/SPCL TRIG key is depressed, the current expansion factor is checked to determine if it is less than four and if so, this expansion factor register is incremented one count. If the LEFT ARROW/STD TRIG key is depressed, the current expansion factor is checked to determine if it is greater than one, and if so, the expansion factor register is decremented.

If the Expand feature was not active, a check is made to determine whether the LEFT ARROW/STD TRIG key is depressed. If so, the trigger circuit is set up for the Standard trigger feature. If that key is not depressed, the program determines if the RT ARROW/SPCL TRIG key is depressed and if so sets up for the Special Trigger mode. If the Special Trigger feature is activated, the live waveform data is routed through the delay circuit 163 (FIG. 19). If the Standard Trigger feature is selected, the live waveform data is routed through the tri-state data switch 162 (FIG. 19) to the non-volatile waveform memory 164 (FIG. 20). After a check is made for a RT ARROW/SPCL TRIG or LEFT ARROW/STD TRIG key, the program proceeds to determine if the key depressed is a digit key number one through the number of cylinders. If so, a check is made to determine if the number corresponding to the key depressed corresponds to the presently selected cylinder. If so, a check is made to determine if the cylinder is already being shorted and if so the program returns to the input of the primary routine.

If the selected cylinder is not being shorted, the program causes that cylinder to be shorted and a message is sent to the display microprocessor to display a message on the CRT screen that the selected cylinder is now being shorted. If the key being depressed does not correspond to the presently selected cylinder, then the selected cylinder message is changed and the display microprocessor displays the new selected cylinder number on the CRT display. If the key depressed is not a number key one through the number of cylinders, the program returns to the input of the primary mode loop.

The Secondary Pattern mode waveform main microprocessor routine follows the same flow as for the Primary mode waveform main microprocessor routine. The only difference is in the data received, in that KV displayed is in the Secondary Pattern mode and dwell is displayed in the Primary Pattern mode. Dwell is not calculated (FIG. 30A) in the Secondary Pattern mode.

Alternator, Fuel Injection Voltage Pattern Mode (Main Micro)

Referring to FIGS. 31, 31A, 31B and 31C, when function mode ODH is selected, the display microprocessor after receiving the mode word ODH displays a menu requesting, "depress key 1 for Alternator Pattern, key 2 for Fuel Injection Pattern or key 3 for Voltage Pattern". The main microprocessor then checks the keyboard to determine which of the three digit keys 1-3 is depressed. If no key is depressed, it continues to loop and check the keyboard. If a key is depressed, it checks to determine if its a digit key 1, 2 or a 3.

If key 1 is depressed, the Alternator Pattern mode 07 is selected and the hardware and software are set up for the Alternator Pattern mode. If the 2 key is depressed, the Fuel Injector Pattern mode 09 is selected and the hardware and the software are set up for Fuel Injector Pattern mode. As far as the hardware set-up for Fuel Injector Pattern mode, the waveform that is displayed on the screen shows four different firings of fuel injection pattern at one time on the screen. In the primary and secondary screens only firing is shown.

If the key depressed is a 3, the Voltage Pattern mode 08 is selected and the hardware and software are set up for the voltage mode. The VCO rate is not varied depending on the period of the waveform during this mode, a fixed rate VCO is used. The hardware stores this predetermined fixed VCO rate.

If none of the keys 1, 2 or 3 are depressed, the program looks to determine if some other mode key is depressed, and if so, that mode is entered, or else the program loops back and waits for one of the digit keys 1-3 to be depressed. If a key other than a mode key is selected, such as the CLEAR key, the program loops back to the beginning of the flow and the key is ignored.

Figure 31A:
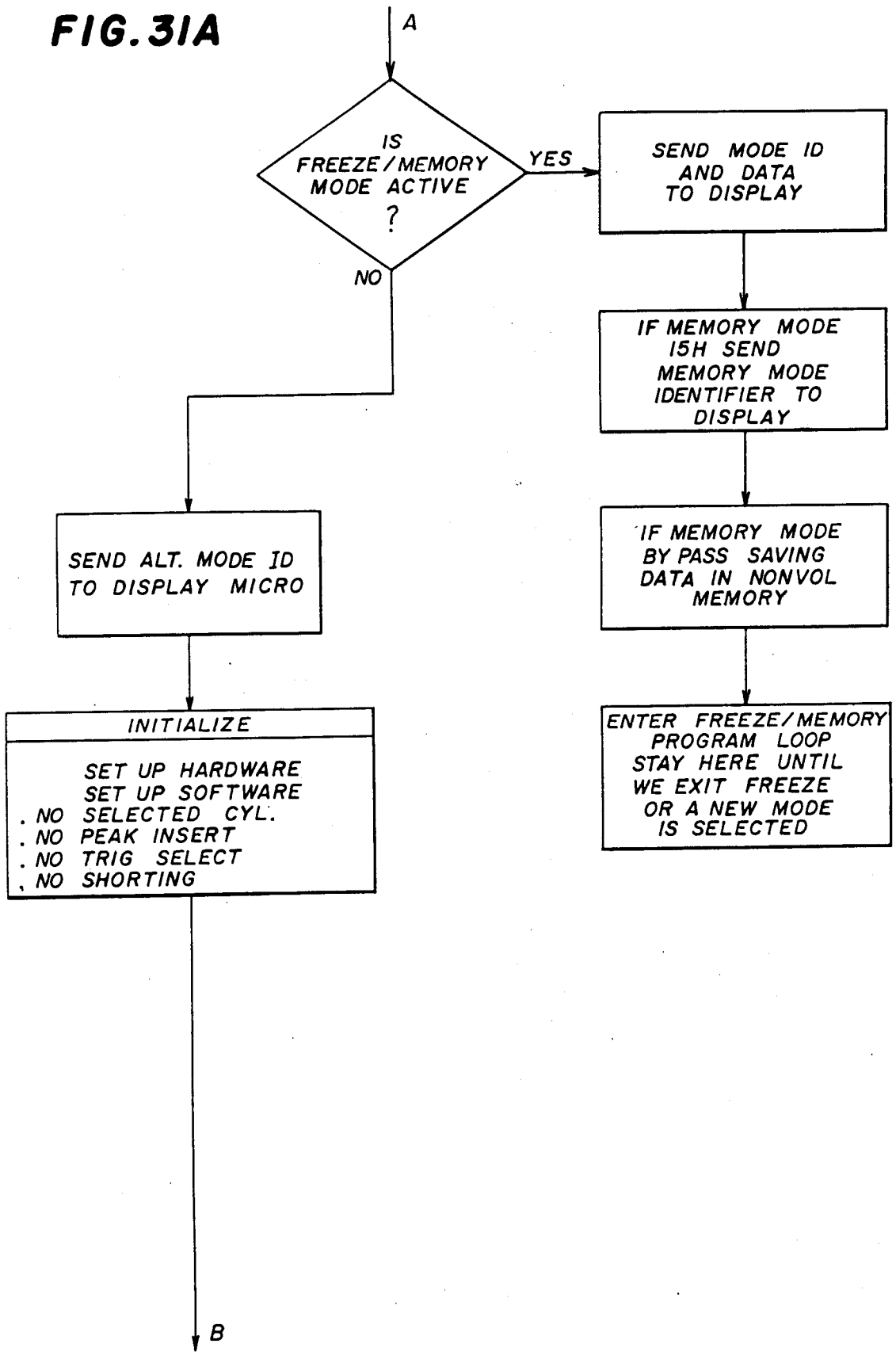
Figure 3I:
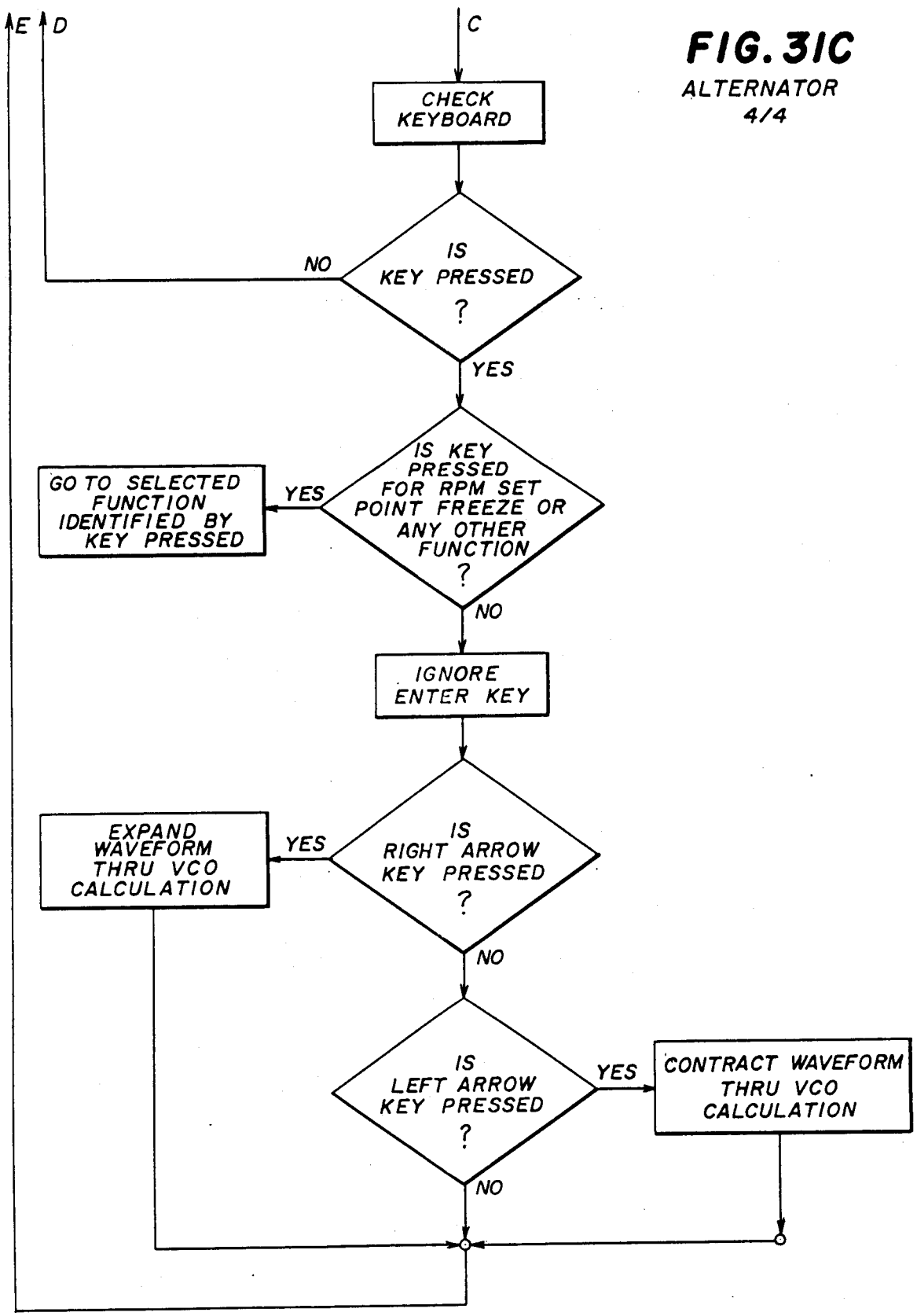

Referring to FIG. 31A, after one of the three modes—Alternator, Fuel Injector, or Voltage Pattern has been selected, an inquiry is made as to whether the Memory feature is active. If so, for the Alternator Pattern mode 07, the display microprocessor is sent a mode identifier for the Alternator Patter mode. Then the data saved in non-volatile memory for RPM, voltage, and voltage sign, plus or minus is sent to the display microprocessor. If the Memory feature is active, the mode word 15H is sent to the display microprocessor. Then bypassing the step of saving data in non-volatile memory, the freeze/memory program loop is entered until the program exists the Freeze feature or a new mode is selected.

For the fuel Injector or Voltage Pattern modes, the same operations are followed.

If Memory is not active, the program proceeds along the live waveform pattern loop. The main microprocessor sends the display microprocessor the mode identifier for Alternator Pattern mode 07, Fuel Injector Pattern mode 09 or Voltage Pattern mode 08, and then initializes the hardware and software for the mode selected.

Referring to FIG. 31B, an inquiry is then made to determine if the VCO rate is ready to be calculated and updated. If so, the VCO calculation subroutine is entered and a new VCO rate is calculated and operation is changed to the new VCO rate. Then, control returns to the Alternator (Voltage or Fuel Injection) mode routine and an inquiry is made as to whether a new RPM rate should be calculated. If so, the RPM calculation subroutine is entered and the new RPM rate is calculated and compared with the set point value, if one has been entered. The RPM set point freeze flag is set whenever the set point value is exceeded. Then, the Alternator Pattern mode is reentered and a determination is made as to whether the display microprocessor is ready for updated data. If not, the program proceeds to check to determine if the status of the recall word for the non-volatile memory must be updated.

If the display microprocessor indicates it is ready for data, the program proceeds as a function of the mode selected and sends the data to the display microprocessor. For the alternator Pattern mode, the data includes the Alternator Pattern mode identifier, RPM, voltage and voltage sign. For the Fuel Injector Pattern mode, the mode word and RPM values are sent. For the Voltage Pattern mode, the Voltage mode identifier, RPM, voltage value and voltage sign are sent. Then a check is made to determine if RPM Set Point freeze flag is set and if so the program activates the freeze feature. Otherwise, the status of the recall signal is checked.

Referring to FIG. 31C, then the program checks the keyboard. If no key is depressed, the program loops back and again checks for the status for the VCO rate.

If a key is depressed, an inquiry is made as to whether the key depressed is for the RPM Set Point, freeze or any other feature or mode. If so, the selected feature or mode is implemented.

If none of those keys are depressed, the ENTER key is ignored, and the program checks if the RIGHT ARROW/SPCL TRIG key is depressed or the LEFT ARROW/STD TRIG key is depressed. If the right arrow RIGHT ARROW/SPCL TRIG key is depressed, the waveform is expanded through VCO rate calculation and if the LEFT ARROW/STD TRIG key is depressed, the waveform is contracted through the VCO rate calculation. In both instances, the program loops back to the block where VCO rate is recalculated.

KV Bar Graph Mode (Main Micro)

Figure 32:
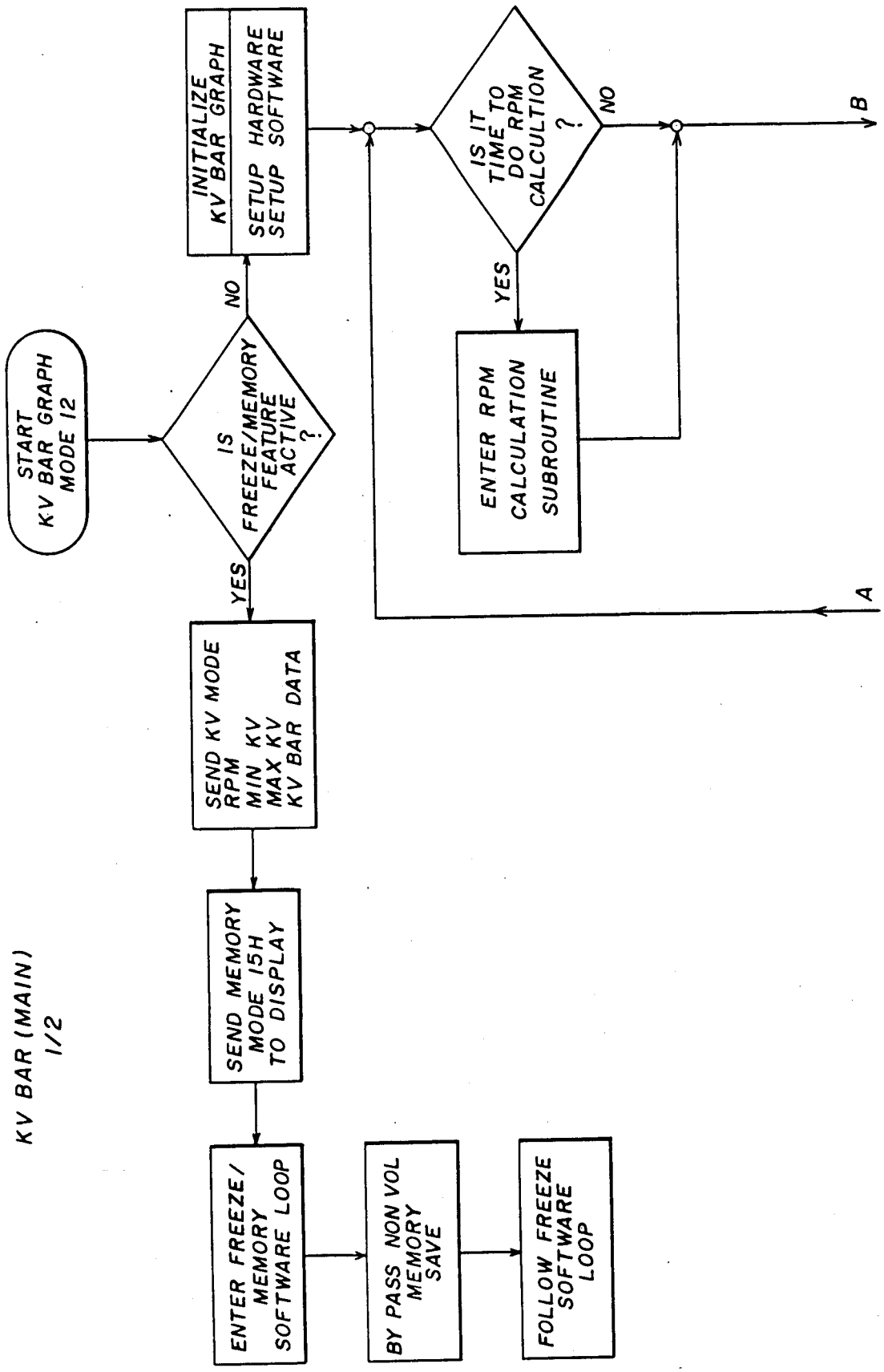
FIG. 32 and 32A depict the KV bar graph subroutine for the main microprocessor.
Figure 32A:
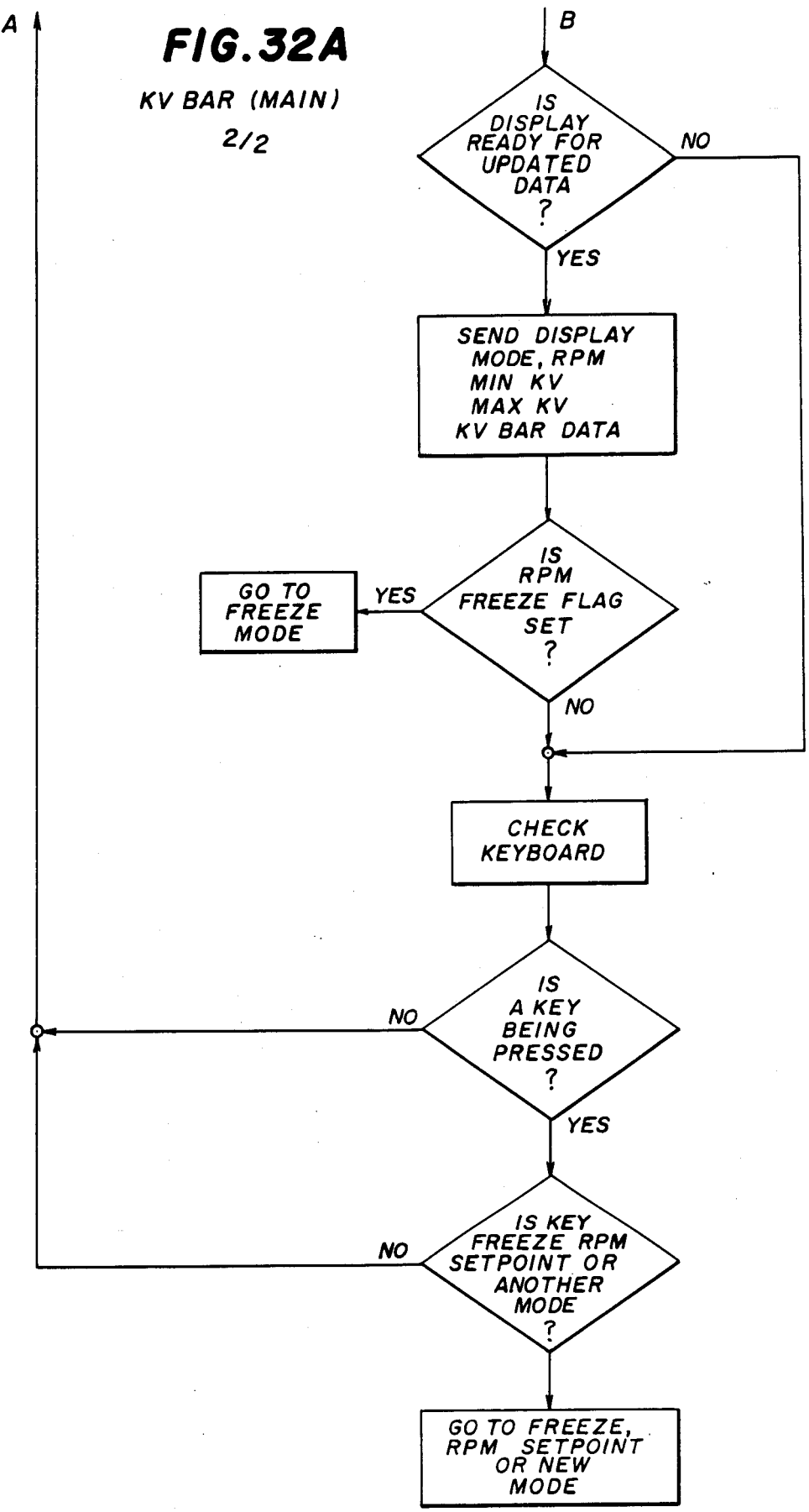

Referring to FIGS. 32 and 32A, when the KV Bar Graph mode has been selected, the word identifier mode OCH will be sent to the display microprocessor. The next step in the program flow is to check to determine if the Memory feature is active. If so, the KV Bar Graph mode word is again sent to the display microprocessor followed by the data saved in non-volatile memory for RPM value, minimum KV values, maximum KV values and the KV bar data that was saved. Then, the mode word 15H is sent to the display microprocessor indicating that the memory mode is active and that the label MEMORY should be written on the screen. Then the program enters into the Freeze Memory feature loop, bypassing non-volatile memory save and continuing into the Freeze feature program loop the same way as for all the other screens, staying in the freeze loop until the FREEZE key is depressed or another one of the function screens such as the primary or the secondary or alternator, fuel injector screens is selected.

If Memory feature is not active, that is if the system is operating in a live mode, then initialization of the KV Bar Graph is done, setting up the hardware and the software for KV Bar Graph mode. Then the program checks to determine if it is time to do an RPM rate calculation. If so, the RPM calculation subroutine is entered and, as in Primary and Secondary modes, the RPM value is calculated and compared to an RPM set point value, if one has been entered. The freeze flag is set if the RPM value calculated is equal to or exceeds the set point value.

Referring to FIG. 32A, the KV Bar Graph mode program is reentered and a check is made to determine if the display microprocessor has sent the mode word OCH back to indicate that the display microprocessor is ready to receive updated data. If so, the mode word OCH is sent followed by the RPM value, minimum KV values and maximum KV values and data which represents the KV bars as seen on the screen. Then a check is made to determine if the RPM set point freeze flag is set indicating that the RPM exceeded the RPM Set point value. If so, the Freeze feature is activated and data is frozen on the screen. If the RPM set point freeze flag is not set, or if the display microprocessor was not ready to receive data, the program checks the keyboard. If a key is depressed, a check is made to determine if that key is a freeze key, the RPM Set point key, or any one of the modes—Primary, Secondary, Alternator, Dwell Bar Graph, etc. If a key is not depressed or if a key other than a mode key was depressed, the program loops back to the start (FIG. 32) just after initialization, to determine if it is time to exit to the RPM calculation subroutine and continues in this loop checking to determine if it is time to perform a new RPM calculation or send the display microprocessor updated data. The KV values are all acquired with the coordination of the sync interrupt routine. These routines work together selecting which cylinder's KV to sample and interpreting the sample value. The new updated values for KV are stored and sent to the display microprocessor as described above. The sync interrupt routine, described hereinafter with reference to FIGS. 41, 41A and 41B indicates how KV values are stored and how the calculations are established for minimum KV and maximum KV.

Dwell Bar Graph Mode (Main Micro)

Referring to FIGS. 33 and FIG. 33A, when the DWELL BAR GRAPH key is depressed, the Dwell Bar Graph mode OBH is entered. The first thing done as in all the other modes is to check to determine if the memory mode is active. If it is, the display microprocessor is sent the mode word OBH for Dwell Bar Graph mode followed by the data saved in non-volatile memory which includes the current RPM value, the average dwell and individual cylinder dwell values. Once all that data has been sent to the display microprocessor, the memory mode word 15H is sent and then the freeze memory program loop is entered, bypassing saving of data into the non-volatile memory and the freeze program loop is followed until the FREEZE key is depressed or another function key, such as the Primary Pattern mode key or the Secondary Pattern mode key, or other function key is pressed.

If Memory feature is not active, the hardware and the software are initialized as needed and then an RPM rate calculation is done by the RPM calculation subroutine, if needed. The program then obtains dwell data for each of the individual cylinders in the firing order during the time between two #1 cylinder occurrences. The individual cylinder dwells are calculated.

Referring to DIG. 33A, once the individual cylinder dwells are calculated, the keyboard is checked. If a key is being depressed, it is determined if that key is a Freeze feature or a mode key, such as Primary or Secondary Pattern mode in which case that function is entered. If none of these keys are depressed, the dwell data for all cylinders together is obtained and a new average dwell is calculated. The program then again checks the keyboard, if the display microprocessor is ready to receive updated data, the code word for mode 11 followed by RPM, average dwell and individual cylinder dwell are sent. If the display microprocessor is not ready, the keyboard is continuously checked until the display microprocessor is ready to receive data at which time the data is sent. The program flow then returns to the point where the RPM calculation status is checked.

Cylinder Shorting Bar Graph Mode (Main Micro)

Referring to FIGS. 34, 34A, 34B, and 34C, when the Cylinder Shorting Bar Graph mode is selected, the mode word OAH is sent to the display microprocessor and then a check is made to determine if the Memory feature is active or if the live mode is active. If the Memory feature is active, the same general flow is followed as for Memory feature active in the Dwell Bar Graph or the KV Bar Graph modes, sending the display microprocessor the mode word OAH, followed by the data saved in non-volatile waveform memory 164 (FIG. 16) for engine RPM, RPM change for each cylinder in the firing order, the time for which each cylinder in the firing order is shorted, a byte indicating the polarity of each RPM change, and a word indicating if the data applies to the Even/Odd type shorting or to individual cylinder shorting. If the information is for the Even/Odd shorting type shorting, the RPM changes are grouped into two values, one for even cylinders and one for odd cylinders.

The data saved in the non-volatile memory is sent to the display microprocessor twice, and then the mode word 15H is sent. The double transmission is done to ensure that the proper display screen Even/Odd or individual cylinder is presented.

If the Memory feature is not active when the Cylinder Shorting Bar Graph mode is entered, then initialization of hardware and software is done. An inquiry is made as to whether the display microprocessor is ready for updated data. If so, the data is sent to the display microprocessor (the first group of data will be all zeros), and if not software registers are reinitialized. The program looks to determine if it is time to do an RPM rate calculation and if so, the RPM calculation subroutine is entered and a new RPM value is calculated. If not, the keyboard is checked to determine if a key is depressed. Referring to FIG. 34A, if a key is not depressed, the program loops back and again determines if the display microprocessor is ready to receive updated RPM values and cylinder shorting time values that may have occurred. If a key is depressed, an inquiry is made as to whether the CLEAR key is depressed. If the CLEAR key was depressed, the data would be zeroed and all the RPM changes and the cylinder shorting time data sent to the display microprocessor would be zero and the display microprocessor would show that.

If the CLEAR key is not depressed, a check is made to determine if the EVEN or ODD key is depressed. If so, then an inquiry is made as to whether individual cylinder shorting mode is displayed on the CRT screen. If so, all individual RPM changes and cylinder shorting time data are cleared and the display microprocessor is sent a mode word that identifies entry to the even/odd cylinder shorting screen format. The hardware and the software are then prepared for the actual shorting function.

With continued reference to FIG. 34A, if neither the EVEN key nor the ODD key is being depressed, an inquiry is made as to whether a numbered key is depressed, accepting the entry only if the numbers 1 through the number of cylinders is being depressed. If one of those keys is depressed, the selected cylinder is converted to that number key position in the firing order. Then an inquiry is made as to whether the even/odd shorting screen is displayed on the CRT screen. If so, change from the even/odd cylinder shorting format to the individual cylinder shorting format is required, including clear out of the even/odd drops and cylinder shorting times and sending the display microprocessor that information indicating return to the individual cylinder shorting mode. The hardware and software are then prepared to do the actual shorting (FIG. 34B).

Figure 34:
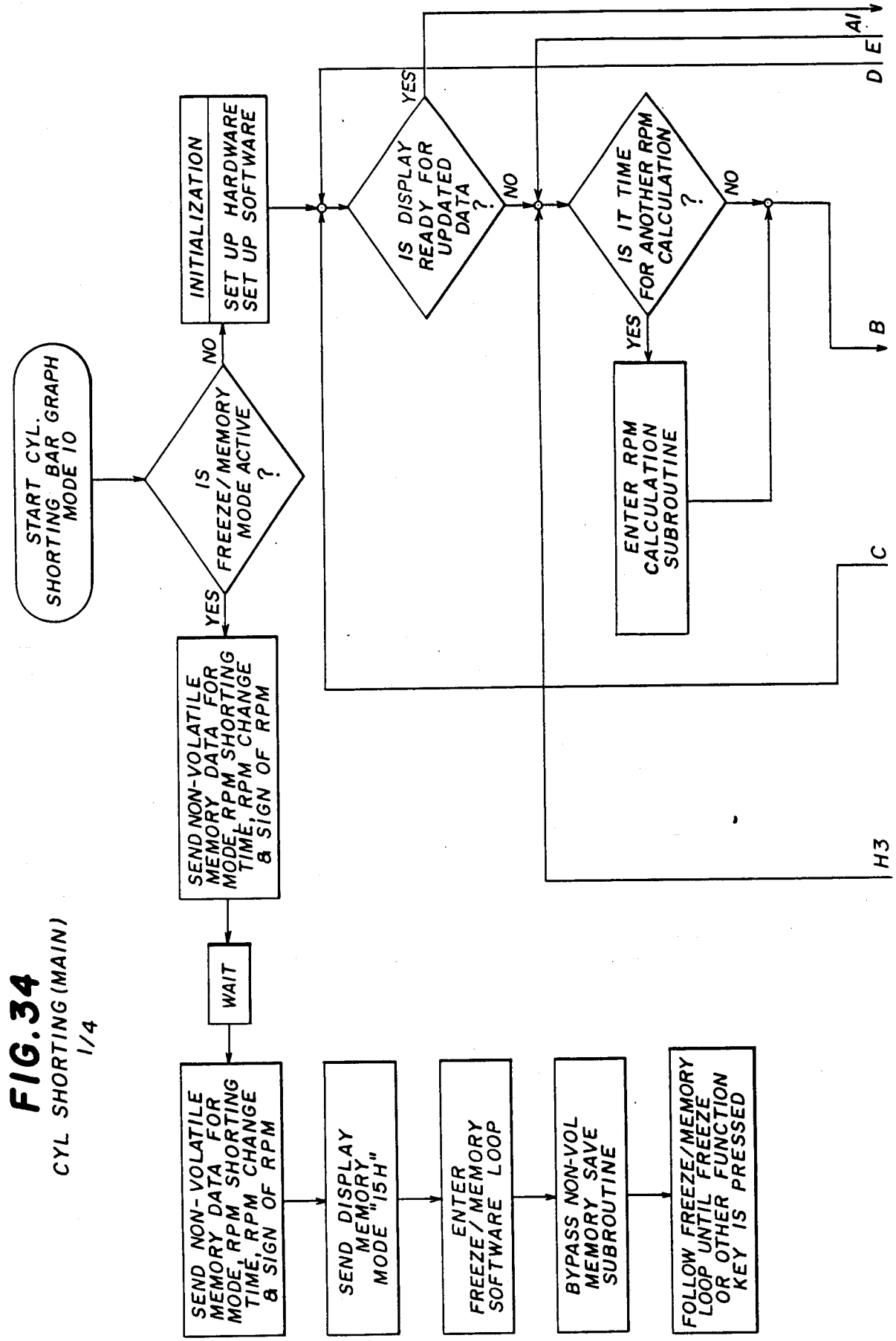

The next step, as shown in FIG. 34B, is to set up for storage of RPM drops and values and save RPM changes and time values. A check on the RPM calculation status is done and if a calculation is needed, the calculation is done in the RPM calculation subroutine. The RPM changes are determined to be a loss of RPM or a gain in RPM. If there was a gain in RPM a plus sign is shown along with the RPM change, and if it was a drop in RPM, a minus sign is shown. While the cylinder shorting is being done, shorting is synchronized by the sync interrupt routine, the time associated with that shorting is saved. The flag indicating that the display microprocessor is ready for new values is checked. If not ready, the program (FIG. 34) skips over the data output routine and goes to the "short loop" keyboard check. If the display microprocessor is ready to accept new values, the new RPM changes and the cylinder shorting times are sent along with the signs indicating if there is an increase or a decrease in the data value from the previous value.

With reference to FIG. 34C, if this is the first time through this loop after a period of nonshorting, a time delay is initiated to allow the operator to determine the effect of the key selection. The program continues and an inquiry is made as to whether shorting is occuring. If so, the main microprocessor enters the "short loop" keyboard check to determine if a key is depressed and, if so, whether that key is the one depressed to enter the shorting loop. If not, the program flow goes to the beginning of this mode. If the same key is depressed, the flow remains in the "short loop" where shorting is enabled each time the selected cylinder is active and generates an interrupt.

Upon entering the program loop where actual shorting is taking place, when a sync interrupt occurs, the appropriate cylinder or bank of cylinders is shorted and following through the short loop while shorting, a check is made to determine if there is a change in RPM. Then an inquiry is made as to whether it is time to check RPM and do a new calculation, and if so, the RPM calculation subroutine is entered. If not, the program returns to a point in the software loop asking whether the selected cylinder or the appropriate bank of cylinders is still being shorted (FIG. 34A). If it was time to do an RPM rate calculation, the calculation is done in the subroutine, and the change is made in RPM rate value after doing the calculation from the point shorting began. If there is a change in the RPM rate value and that RPM rate change is an increase, the RPM increase is saved and the RPM change sign is set to show a plus. If the RPM rate change was not an increase, then either there was no change in RPM or there was a drop. If it was a drop or no change in the RPM rate, either an 0 is shown for RPM drop or a minus sign is shown along with RPM drop calculated. From this point, having decided what the RPM drops are, the program loops back again to the point just after initialization (FIG. 34) to determine if the display is ready to be sent updated values for the RPM drops and shorting times. Instructions Mode (Display Micro)

Figure 35:
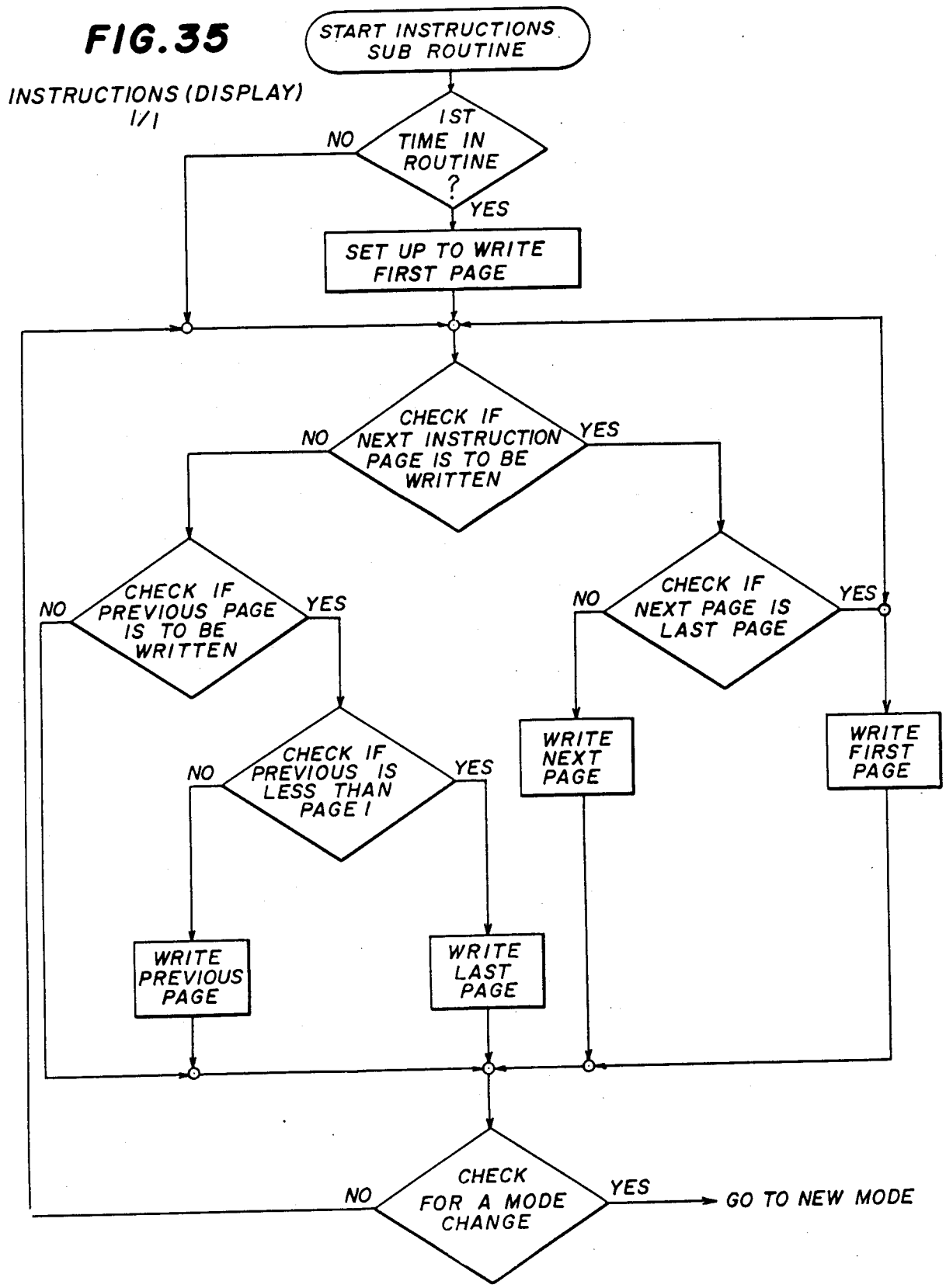
FIG. 35 depicts the instructions subroutine for the display microprocessor.

Referring to FIG. 35, the Instructions mode 14 is entered when the main microprocessor receives information from the keyboard 12 (FIG. 2) indicating that the Instructions mode is requested and sends the appropriate identifier mode OEH to the display microprocessor.

The display microprocessor transmits the mode word OEH back to the main microprocessor and then, if this is the first time through the routine, proceeds to write page 1 of the instructions to the screen. The program then proceeds to determine if the next instruction page is to be written, that is, whether the page should be incremented. A determination is made as to whether the page presently displayed is the last page of instructions. If not, the next page of instructions is written to the screen. Otherwise, the first page of instructions is written to the screen. This is a roll over feature which enables instructions to move from the last page to the first page.

If the determination indicates that the page is to be decremented, the program determines if the page of instructions being displayed is the first page. If not, the preceding page is written to the screen. If the first page of instruction is presently being displayed, the last instruction page is written to the screen. This is the roll over feature which enables instructions to move from the last page back to the starting page.

The program determines if a mode change is indicated. If so, the new mode is entered, otherwise the program loops back to the start of the routine and checks to determine if the next instruction page is to be written.

Primary/Secondary Mode (Display Micro)

Figure 36:
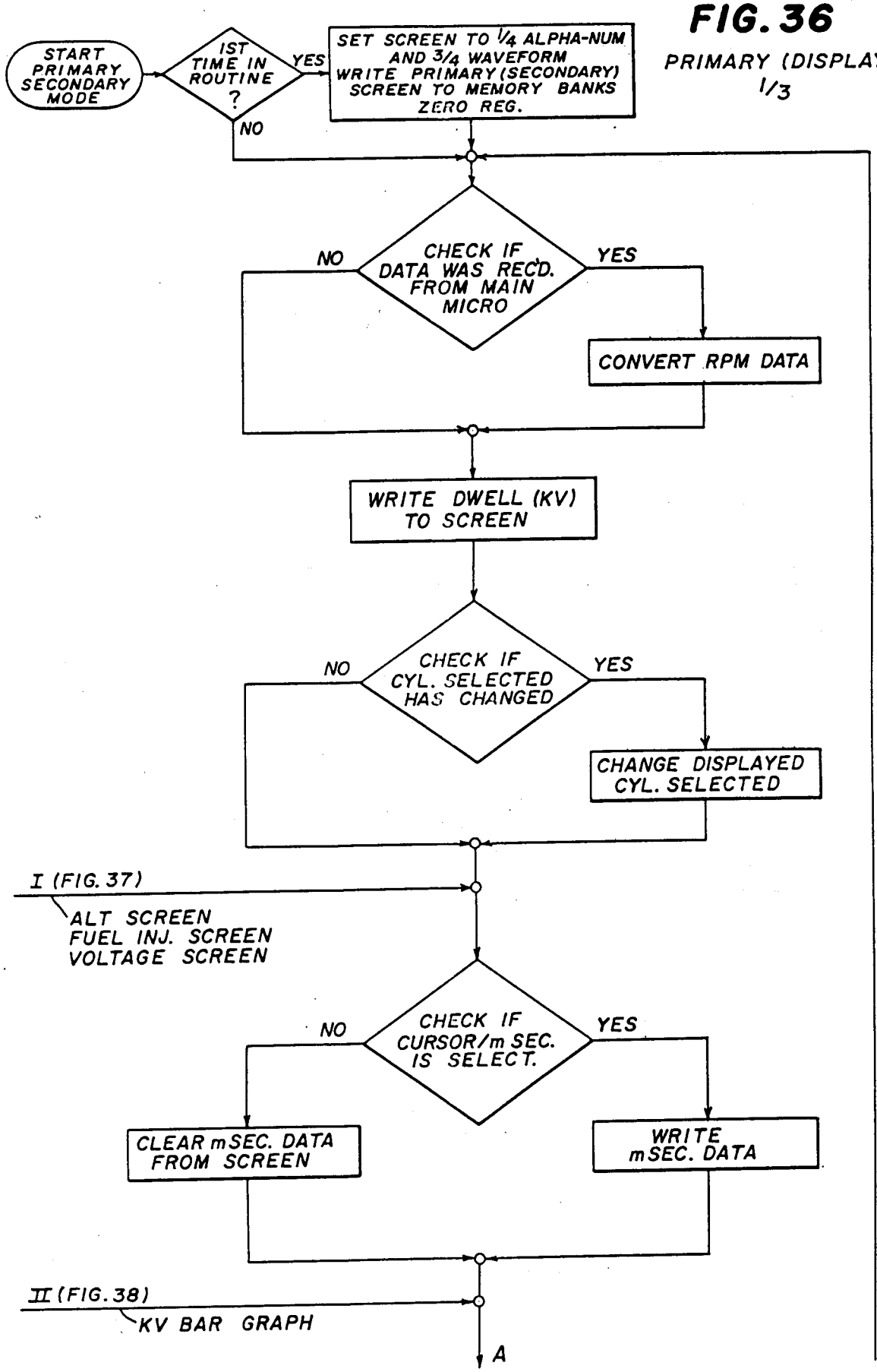
FIG. 36, 36A and 36B depict the primary/secondary waveform subroutine for the display microprocessor.
Figure 36A:
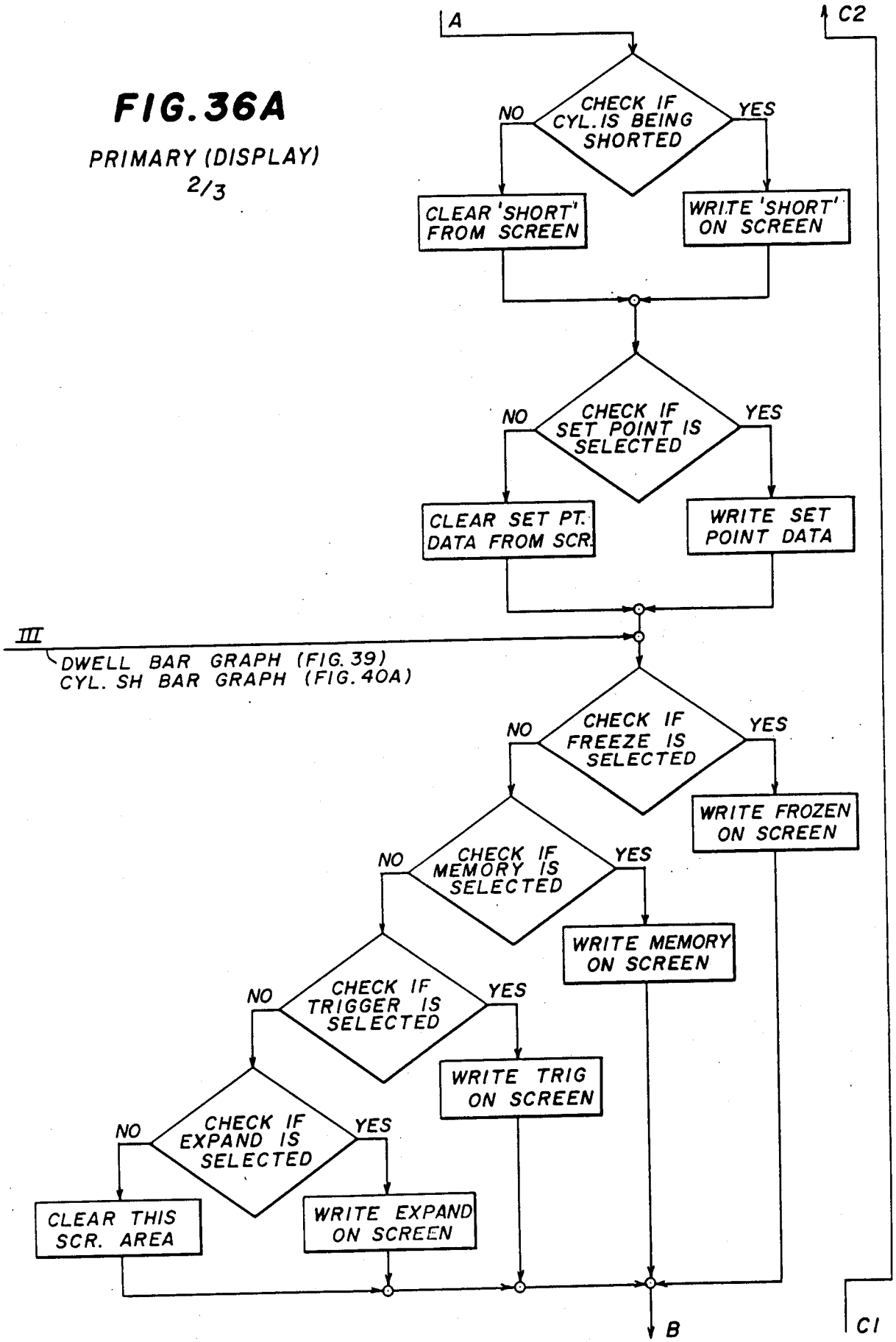
Figure 36B:
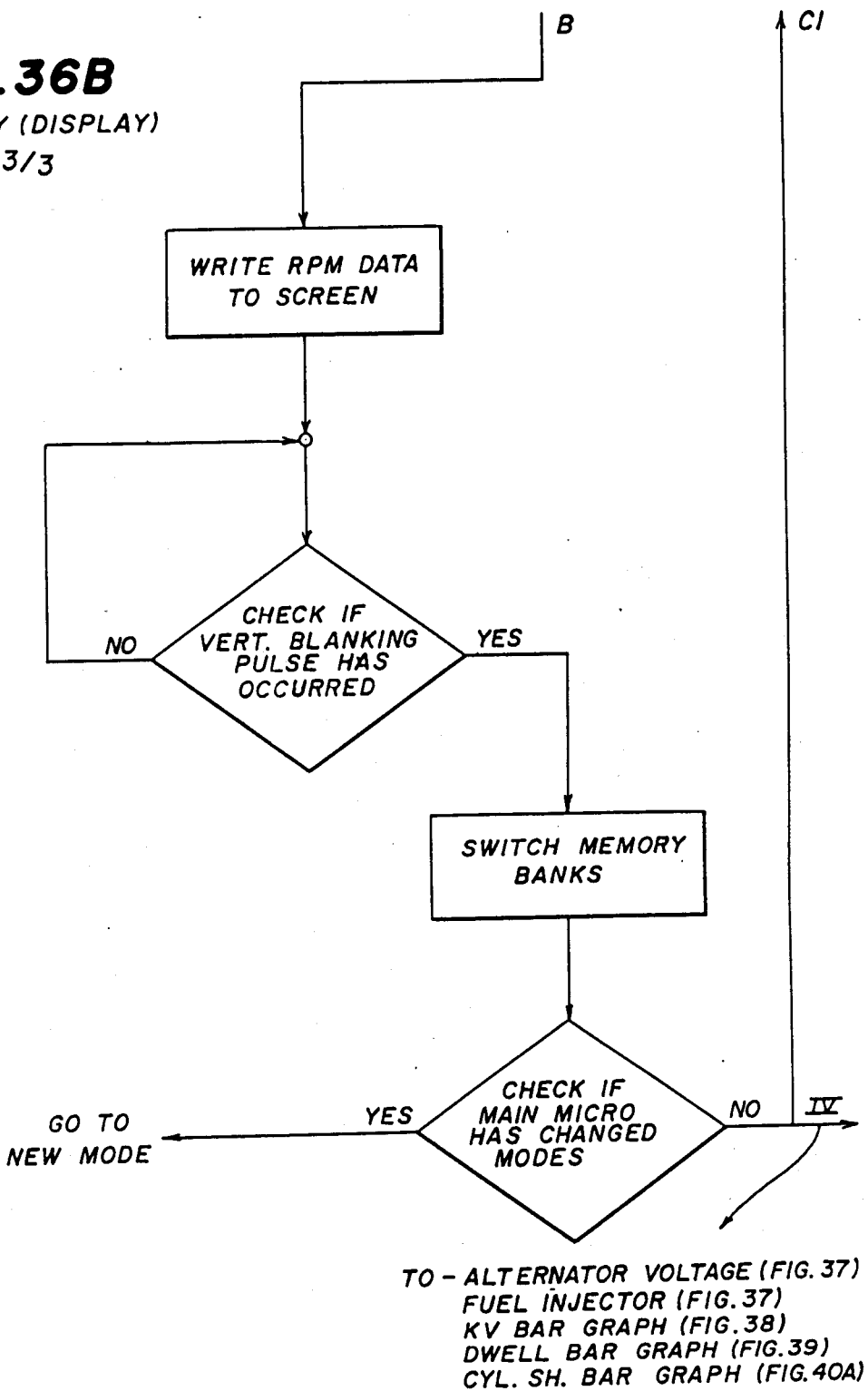

Referring to FIGS. 36, 36A and 36B, the format for the Primary and Secondary Pattern screen is stored in screen ROM 155 (FIG. 24) at preselected locations.

The Primary display loop is entered when the main microprocessor receives information from the keyboard 12 (FIG. 2) indicating that the Primary Pattern mode is requested and sends the Primary Pattern mode word 05 to the display microprocessor. At that point, the main microprocessor may be detecting whether Freeze or Memory features are active.

Referring to FIG. 23, at the same time, as soon as the mode word is received by the display microprocessor, the display microprocessor sets high the signal SCREEN CONTROL to initialize the split screen comparator circuit 271 because the Primary Pattern screen (FIG. 4) as well as the Secondary Pattern screen require the split screen page format. The split screen page format includes an alphanumeric display at the top ¼ of the screen and the signal waveform displayed on the lower ¾ of the screen. Thus, three-fourths of the information will be coming from the waveform memory circuit 152 (FIG. 20) and one-fourth will come from the display memory circuit 154 (FIG. 22). The first time that the routine is entered, the display microprocessor accesses the screen ROM 155 (FIG. 24) and writes the character address data for the Primary Pattern mode screen format into both memory 169 (FIG. 22) and memory 170 (FIG. 22).

Referring again to FIGS. 36, 36A and 36B, the display microprocessor initializes itself so that the features Cylinder Short, Freeze/Memory RPM Set Point, and Cursor/Msec are disabled. The display microprocessor causes all areas pertaining to inactive features to be cleared out.

At the same time, the display microprocessor zeroes out its registers clearing them of data such as RPM values, dwell values, etc. from previous displays. Since the display microprocessor previously has received from the main microprocessor the firing order, the number of cylinders, the cylinder selected, and number of cycles, the display microprocessor selects the firing order and automatically selects number one as the selected cylinder if a cylinder was not previously designated as the selected cylinder.

The display microprocessor then checks to determine whether the main microprocessor has sent any information. The display microprocessor proceeds through the basic loop until it is interrupted. The interrupt comes from the main microprocessor which indicates that data is coming.

The first check is to determine whether a complete set of data (RPM and dwell values for Primary Pattern mode, RPM and KV values for Secondary Pattern mode) was received from the main microprocessor. If so, the display microprocessor converts the RPM data from hexadecimal to decimal and then displays the RPM and dwell values on the CRT screen. The program then checks to determine if the number of the cylinder selected has been changed. If so, the display of the cylinder selected is changed. Then a check is made to determine if the Cursor/Msec feature is selected. If so, the Msec label and the data are written on the screen. If this feature has not been selected, the display microprocessor clears the Msec data from the screen.

Referring to FIG. 36A, then a check is made to determine if the selected cylinder is being shorted. If so, the shorting sign is written on the screen. If not, the shorting sign is cleared from the screen.

Then a check is made to determine if an RPM set point is selected. If so, the set point value is written on the screen, and if not, the area designated for set point is cleared from the screen.

Then a check is made to determine if Freeze feature is selected. If so, the title FROZEN is displayed on the screen. If the Freeze feature is not selected, a check is made to determine if Memory feature has been selected.

If Memory feature is selected, the word MEMORY is displayed the screen. If Memory feature is not active, the program checks to determine if Trigger feature is selected. If Trigger feature is selected, the word TRIG is displayed on the screen. If not, a check is made to determine if expand is selected and if so, the word EXPAND is displayed on the screen. If not, this area of the screen is cleared. Following this, the RPM data is written to the screen (FIG. 36B). Then the display microprocessor checks to determine if the vertical blanking pulse has occurred, and if not, keeps checking until one does occur. When the vertical blanking pulse has occurred, bank switching of the display memory circuit 154 (FIG. 22) is effected. After the display memory bank switching is completed, a check is made to determine if the main microprocessor has indicated a change in mode. If so, the display microprocessor goes to the new mode. If the main microprocessor is not indicating a change in mode, the program returns to determine if data has been received from the main microprocessor and proceeds through the routine again.

Alternator, Fuel Injector, Voltage Pattern Mode (Display Micro)

Figure 37:
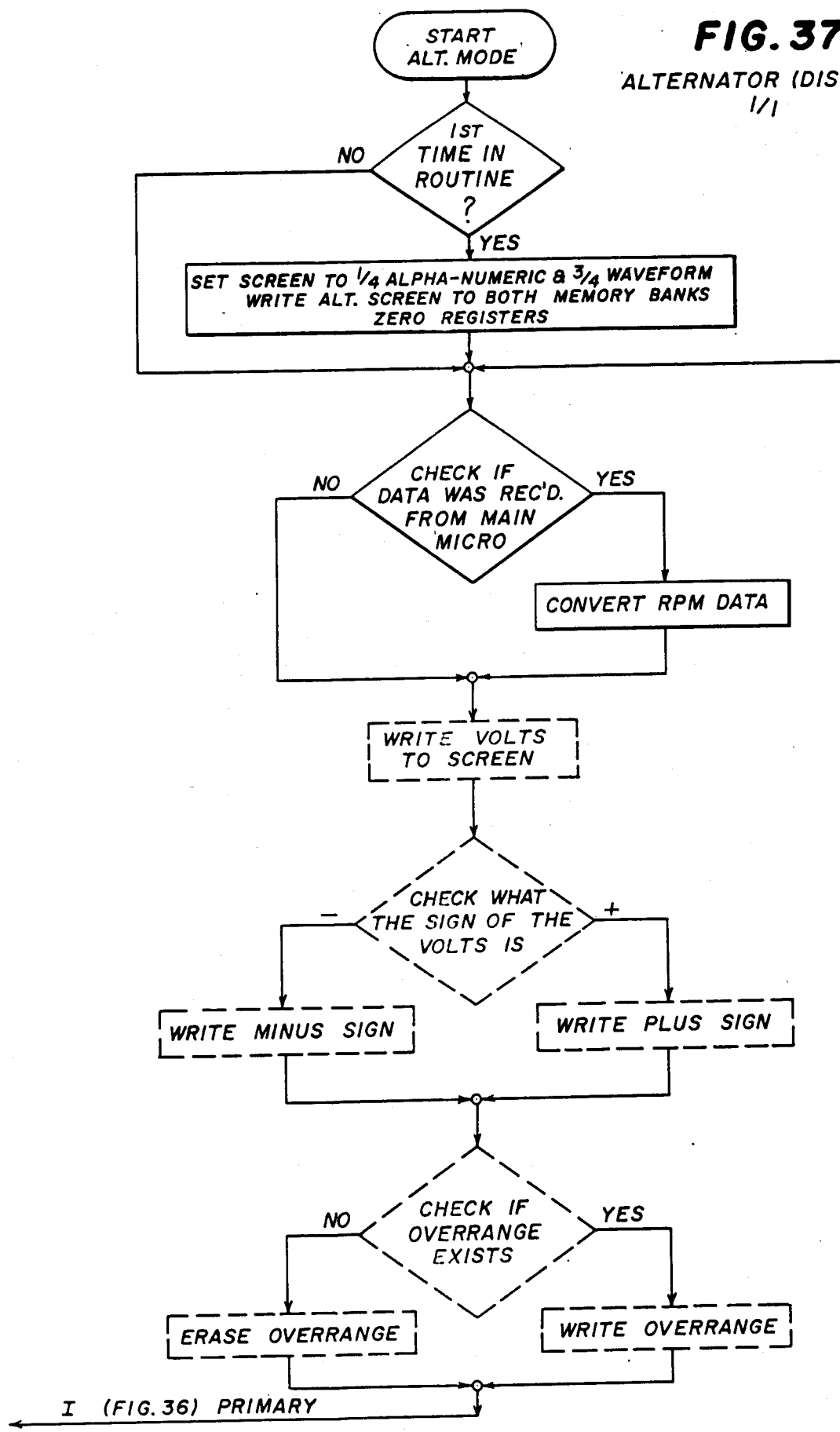
FIG. 37 depicts the alternator subroutine for the display microprocessor.

Referring to FIG. 37, when the main microprocessor sends the code for mode ODH for the alternator, the question screen is accessed. This screen is located in the screen ROM 155 (FIG. 24) at a location dedicated totally to the Alternator, Fuel Injector and Voltage Pattern modes screen patterns.

The first time that the routine is entered, the main microprocessor sends the code word for select function, that is select Alternator, Fuel Injector, or Voltage Pattern mode, the display microprocessor accesses the screen ROM and writes the character address data needed to display this statement to both memories 169 and 170 (FIG. 22) and enables the display circuitry to be full screen alpha-numerics. Then the display microprocessor blanks out the top ¼ of the screen. Displayed in the lower ¾ of the screen is the statement "select Alternator, Fuel Injector or Voltage Pattern screen", depress 1 for "alternator", 2 for "fuel injector", and 3 for "voltage".

For the Alternator waveform mode 07, the display screen (FIG. 7) will be set up for ¼ alpha-numeric, ¾ waveform screen. The display microprocessor will write this full block to both memory banks. Then the program checks to determine if data was received from the main microprocessor. If so, RPM data is converted from hex to decimal. Then the value of volts is written to the screen of the CRT monitor. Then a check is made to determine what the sign of the voltage is. If the sign is a minus, a minus sign is written on the screen. If the sign is a plus, a plus sign is written on the screen. Then a check is made to determine if there is an overrange condition. If overrange exists, the overrange sign is written. If not, the overrange sign is erased. The Alternator subroutine then joins the Primary (or Secondary) Pattern mode subroutine at point I (FIG. 36) and continues as for previous display features, and reenters the alternator subroutine at point IV (FIG. 38) after the display features have been checked.

For the Fuel Injector mode 09, the only difference in screen format (FIG. 8) is that title ALTERNATOR PATTERN is replaced with the title FUEL INJECTOR PATTERN and the voltage label is erased along with the overrange, and the blocks for these functions, shown in dashed lines in FIG. 37, are bypassed. Also, the fuel injector subroutine does not check for the sign on the voltage and does not write the voltage on the screen.

For the Voltage mode 08, the screen format (FIG. 9) is the same as for the Alternator Pattern mode except that the title ALTERNATOR PATTERN is changed to VOLTAGE PATTERN.

KV Bar Graph Mode (Display Micro)

Figure 38:
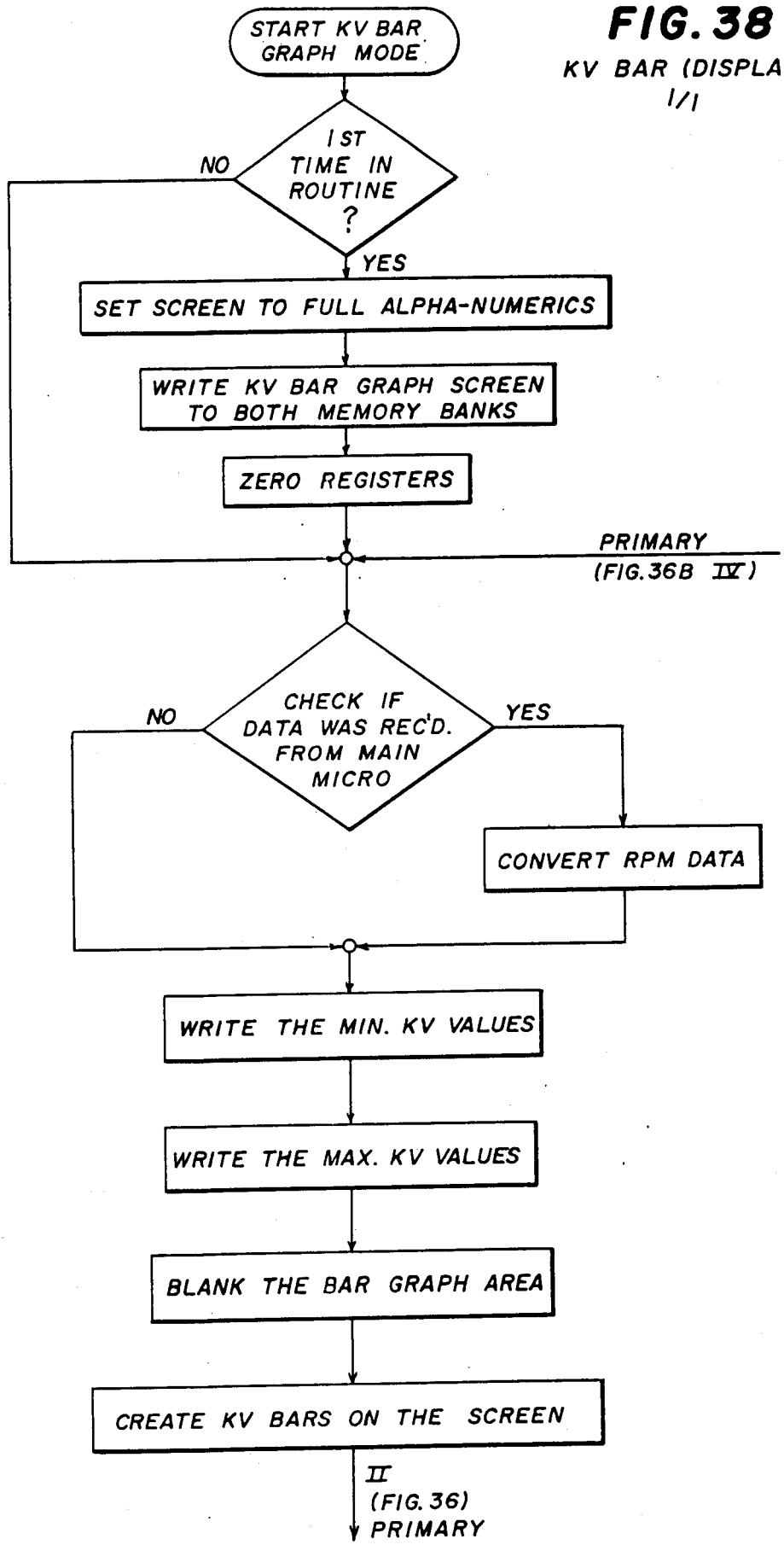
FIG. 38 depicts the KV bar graph subroutine for the display microprocessor.

Referring to FIG. 38, when the mode word OCH for the KV Bar Graph mode is received by the display microprocessor, the display microprocessor sets up the screen (FIG. 13) for full alphanumerics. When the routine is entered for the first time, the display microprocessor accesses preselected locations in the screen ROM to read out character data for the format for the KV Bar Graph screen.

The display microprocessor receives data from the main microprocessor, the display microprocessor converts RPM data from hex to decimal and then generates firing order data which the main microprocessor already has sent to the display microprocessor during modes 00–04. Numerics are generated as necessary to display the firing order. Then the display microprocessor writes out the maximum and minimum KV values. The number of KV values that are written are determined by the number of cylinders. If, for example, there are four cylinders there are 4 minimum KV values and 4 maximum KV values to write.

Next, the display microprocessor blanks out the whole bar graph area on the screen, and a new set of bars representing actual KV values is generated. The KV data value is divided by the number 2. For example, assume that the KV value sent form the main microprocessor is 17. Division by two yields 8 with a remainder of 1. The number 8 indicates that 8 character full blocks are to be used in the bar graph and the remainder indicates a partial (½ size) character block is also required. After the bar graph is generated and displayed, the program enters the Primary (or Secondary) Pattern mode subroutine at point II (FIG. 36) and continues as for previous display features, reentering the KV Bar Graph routine at point IV (FIG. 38) after the display features have been checked.

Dwell Bar Graph Mode (Display Micro)

Referring to FIG. 39, the main microprocessor will send the mode word OBH for the Dwell Bar Graph mode. At that time, the display microprocessor selects one of eight possible screens. For example, if a four-cylinder, four-cycle engine is being tested, the maximum scale is 90 degrees. As indicated previously in the section entitled "Sample Bar Graph Calculation", the scale depends on the number of cycles and the number of cylinders for the engine being analyzed. For the first time through the routine, the display microprocessor checks the number of cylinders and then the number of cycles. With this information, it calls up one of the eight possible screens for the dwell bar graph. For a four-cylinder, four-cycle engine, the bars will be displayed indexed by degrees horizontally on a 90 degree scale on a screen with the abscissa indexed with numerical values of 30, 60, and 90 degrees. Duty cycle is also represented on the bottom of the screen.

For an eight-cylinder engine, full scale dwell value is represented by 22 blocks displayed across the graph. The display microprocessor performs the calculations necessary to select the proper scale so that the dwell value numbers sent form the main microprocessor are properly displayed.

The display microprocessor writes that fixed data for the Dwell Bar Graph screen to both display memory 169 (FIG. 22) and memory 170 (FIG. 22). Next, the firing order is written along the side and then all the registers in the display microprocessor associated with the dwell bar graph are zeroed out. Those registers are shared with KV Bar Graph mode and with the Cylinder Shorting Bar Graph mode. The program then checks to determine if data has been sent from the main microprocessor. If data has been sent, it converts the RPM values and all the dwell values from hex to decimal values which are the actual numeric display numbers, in two bytes per cylinder degree value. Next, the average dwell and RPM are written on the screen. At that point, the bar graph area is blanked out as was done previously in the KV Bar Graph mode. Then, the display microprocessor starts creating the dwell bars on the screen.

The dwell bars are then created using the calculation described previously involving use of the number of cylinders and cycles to determine a dividing factor. A division is performed to determine the (whole) number and remainder. The whole number indicates the number of full blocks to display and the remainder indicates the memory location of the partial block needed to make the bar the proper length.

After that, the dwell numbers for all the cylinders will be displayed. Also, RPM is written to the screen. Then the subroutine joins the Primary (or Secondary) Pattern mode routine at point III (FIG. 36A) and continues for previous display features, ultimately returning to the Dwell Bar Graph Flow at point IV (FIG. 39).

Cylinder Shorting Bar Graph Mode (Display Micro)

Figure 40A:
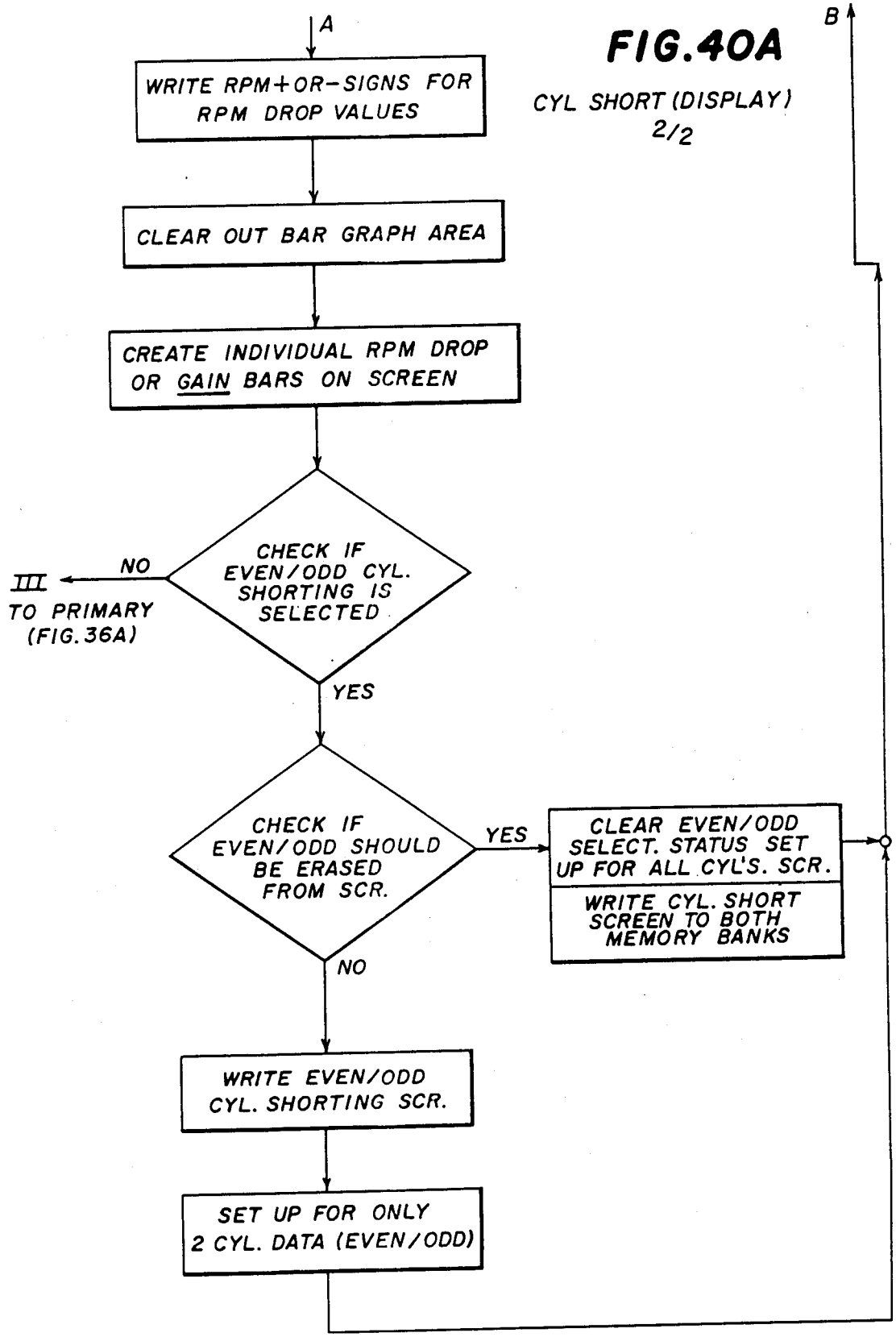

Referring to FIGS. 40 and 40A, for the Cylinder Shorting Bar Graph mode, the entire screen is set to display alphanumerics. For the first time through this routine, the display microprocessor accesses the basic screen location in the screen ROM 155 (FIG. 24) and writes that screen address data for the cylinder shorting bar graph (FIG. 10) to both memory 169 and memory 170 (FIG. 22). Then the registers are zeroed, and a check is made to determine if data was received from the main microprocessor. The time each cylinder was shorted is written to the screen as are the numeric RPM drops for each cylinder. Plus or minus signs are assigned for the RPM data written on the screen. Next, the bar graph area is cleared out as in previous bar graph modes. Then the individual bar graph drops or gains are created as bars on the screen. Calculations are made dividing the numerical value or gain by 20. Thus for the RPM change values in bar form, each block of the bar indicates 20 RPM gain or drop. The dividing factor is 20 RPM per block and the remainder is used to determine the magnitude of the partial block in a manner similar to that used in the Dwell and KV Bar Graphs. A drop in RPM will be displayed as a solid (filled-in) bar. A gain in RPM will be displayed as a hollow (outlined) bar.

Next, a check is made to determine if even/odd cylinder shorting is selected. If not, the program rejoins the Primary (or Secondary) Pattern mode routine at III (FIG. 36A) and continues as for previous display features returning to the Cylinder Shorting Bar Graph mode routine at IV (FIG. 40).

If even/odd cylinder shorting is selected, then a check is made to determine if the words EVEN or ODD should be erased from the screen as indicated by one of the bytes of data sent over by the main microprocessor. If the data should be erased, the even/odd selection status is cleared. Otherwise, the even/odd cylinder shorting screen is displayed. This screen (FIG. 11) is similar to the basic format for the cylinder shorting screen (FIG. 10) but instead of displaying the firing order, the firing order is blanked out and an "E" and "O" are displayed at the bottom of the bar graph. The display microprocessor now sets up as if a two cylinder engine were being tested. Accordingly, the data received represents the RPM drop for even cylinders and the RPM drop for odd cylinders. The rest of the data is ignored because the system is operating as if it were in a two cylinder mode. After setting up for two cylinder data, a full screen is written as if it were data for a two cylinder engine.

When it is determined that return to individual shorting mode is indicated by data received from the main microprocessor, the even/odd selection status is cleared and set up for the individual cylinder shorting screen. The program then joins the Primary (or Secondary) mode routine at point III (FIG. 36A) and ultimately returns at point IV (FIG. 40).

Sync Interrupt Routine (Main Micro)

Figure 41:
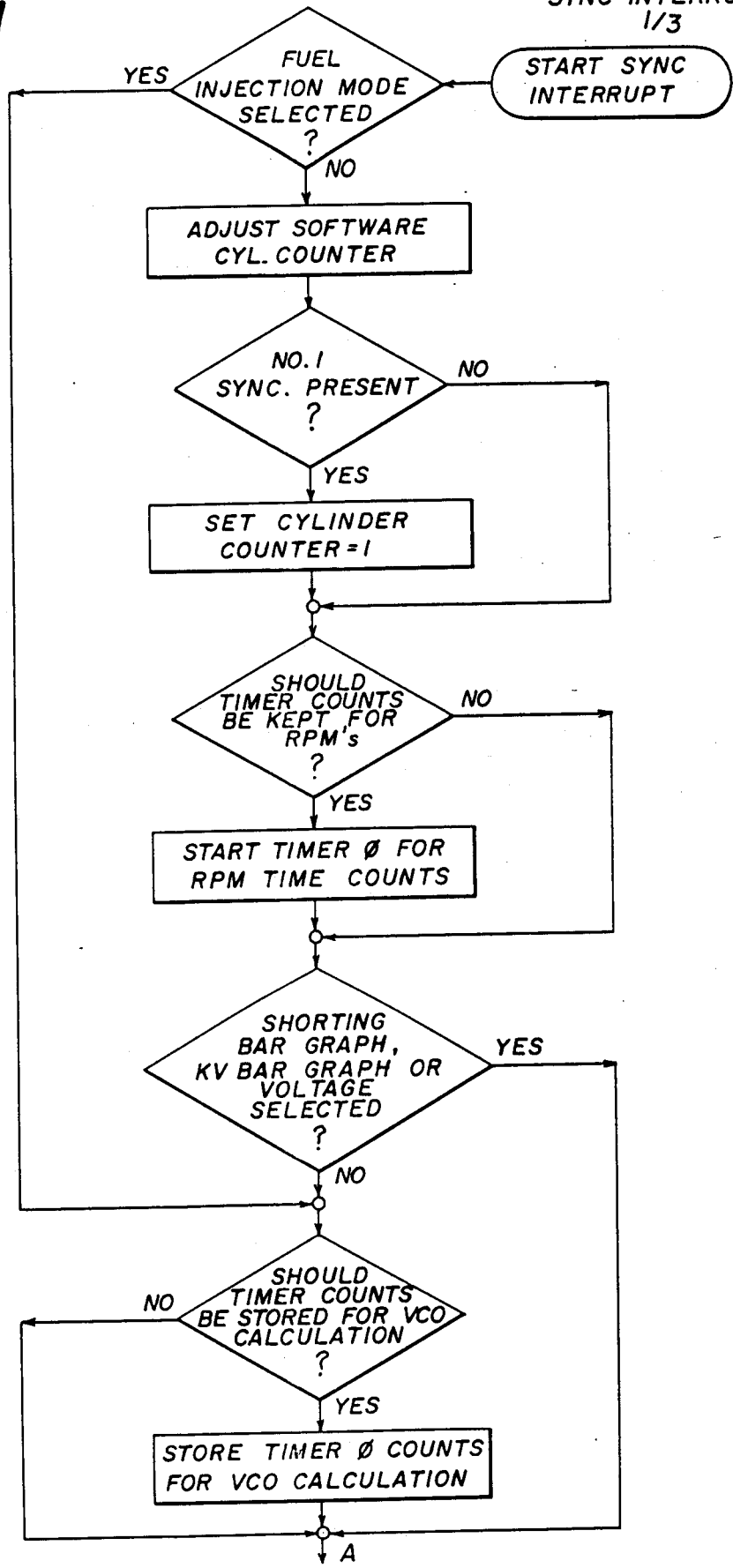
Figure 41B:
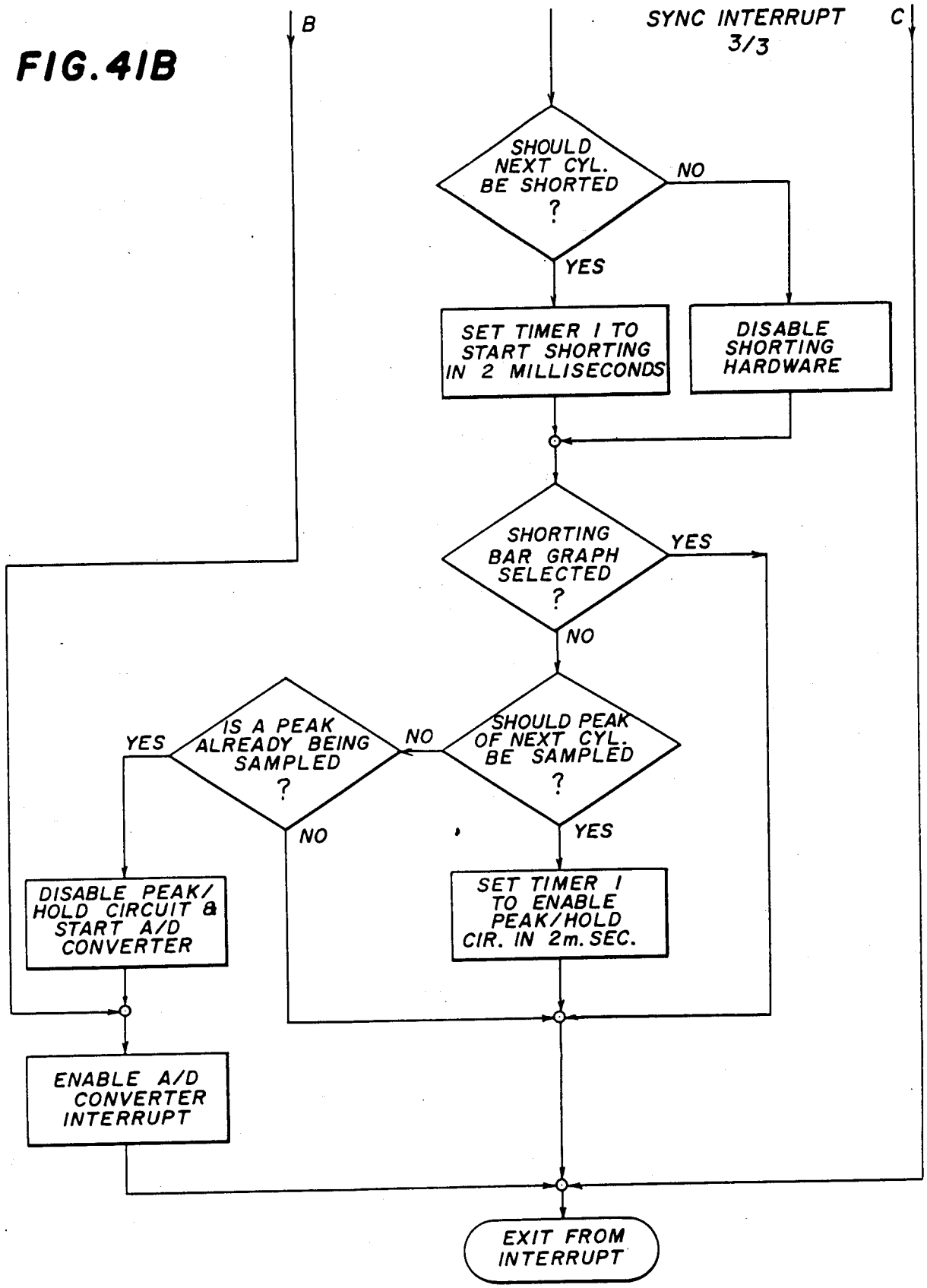
Figure 41C:
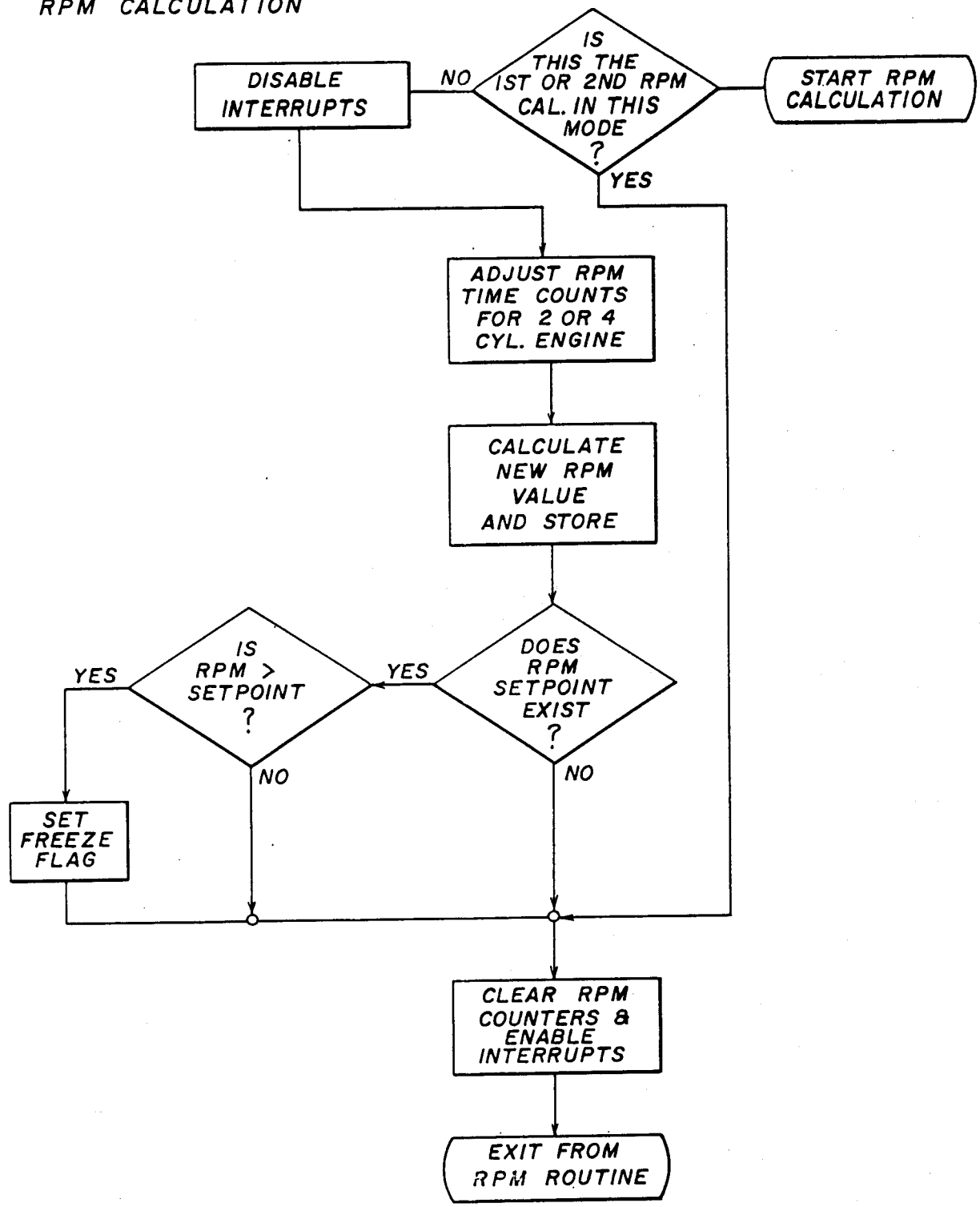
FIG. 41C and 41D depict the flow chart for RPM and VCO calculation subroutines, respectively.
Figure 41D:
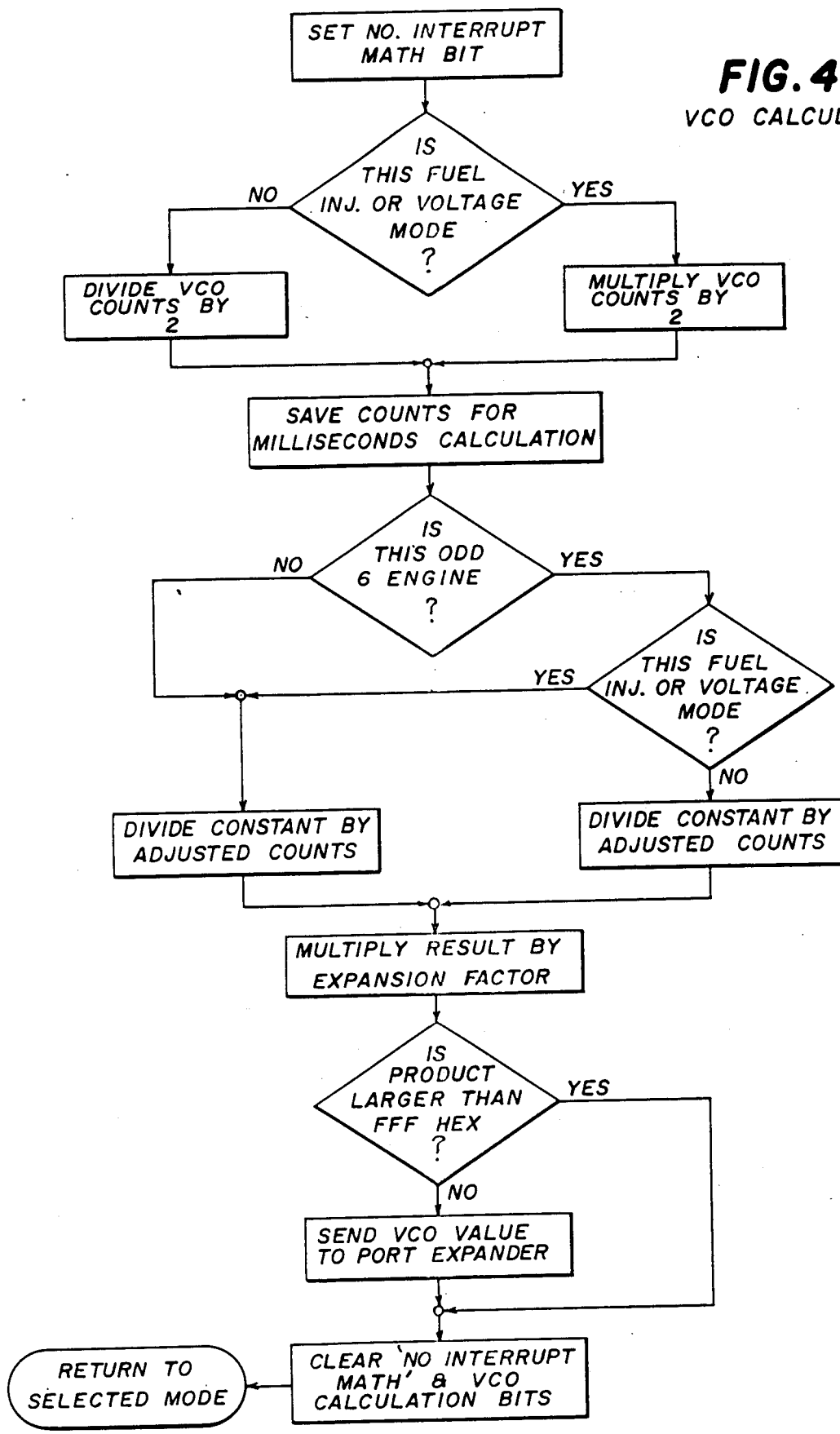

Referring to FIGS. 41, 41A, and 41B, the sync interrupt routine is used to establish and maintain program synchronization of cylinder counts and of RPM and VCO time counts. The sync interrupt routine is entered in response to the occurrence of a #1 SYNC-X pulse and the SYNC-X pulse provided by the analog circuits 16 (FIG. 15). Software timers, timer 0 and timer 1, in the main microprocessor program are used for generating data indicative of engine RPM and VCO rates for the digital circuits. The sync interrupt routine also controls the insertion of the peak insert value of the waveform for Primary and Secondary Pattern modes and controls enabling of the peak detector circuit 120 in the analog circuits 16 (FIG. 15).

Timer 0 counts pulses occurring at a one MHz rate to time the interval between the first and last of three consecutive SYNC-X pulses. This interval is the time duration for two successive cylinder firings. The count stored by timer 0 is used for VCO calculation. In addition, the count accumulated in timer 0 is added to a count stored in a register (which is reset to zero when the number one cylinder fires). At the end of a distributor revolution cycle, the total count stored in that register is used for RPM calculation.

Timer 1 is used for RPM calculation for Fuel Injection mode because there is no input signal from which a SYCN-X pulse can be derived that is related directly to cylinder firing. Although fuel injector pulses are detected and used to control memory bank switch operations, the fuel injector pulses are not related directly to cylinder firing. Thus, timer 1 is used to derive "RPM pulse count" on the basis of elapsed time between detection of two consecutive #1 SYNC-X pulses. Timer 1 is started in response to a first #1 SYNC-X pulse and is stopped when the next successive #1 SYNC-X pulse is detected. During this time, however, timer 0 is used for counting fuel injector pulses for other control operations required by the software.

For Fuel Injector mode, the pulse SYNC-X is derived from the #1 sync pulse. The microprocessor normally selects the primary SYNC-X pulse derived from the input even when Secondary Pattern mode is selected. The main microprocessor will switch to select the SYNC-X derived from the secondary signal if the primary SYNC-X pulse is not detected within a reasonable time.

When the Cylinder Shorting feature is active, timer 1 is used in controlling when cylinder shorting is initiated. When a sync interrupt occurs, the "next cylinder" software counter is checked to determine if the next cylinder in the firing sequence is to be shorted. If so, timer 1 is set for a two millisecond delay. At the end of this delay, timer 1 times out and this generates an interrupt which causes the main microprocessor to set signal SHORT-X high.

For Voltage/Alternator mode, timer 1 is used to enable the slow A/D converter 37 (FIG. 19). In other modes, such as KV Bar Graph mode, the slow A/D converter is turned on only when the peak value is captured. Since there is no peak value to capture when Voltage/Alternator mode is active, the slow A/D converter is enabled periodically.

For obtaining peak value of the next cylinder, a flag is set to generate a two millisecond interval which is done by initiating timer 1. When timer 1 times out after two milliseconds, signal PEAK GATE is set high to enable passage of the waveform to the peak detector circuit 120 (FIG. 15). This delay prevents the peak detector circuit from capturing any high voltage value of the present cylinder.

Timer 1 is also used to generate a one second count for the cylinder shorting feature in which timer 1 times one second at a time and increments a register to indicate each one second time duration that a cylinder is shorted.

Timer 1 is also used in generating the signal HANDSHAKE used in reset of the hardware cylinder counter at the end of a distributor revolution. When the main microprocessor determines that the last cylinder is firing, it sets timer 1 to provide a two millisecond delay and a flag is set. When timer 1 times out, an interrupt is generated which, when detected, causes the flag to be detected and the signal HANDSHAKE is set to logic high.

For purposes of simplification, the flow through the sync interrupt routine will be described for the condition where the unit is operating in either the Primary or Secondary Pattern modes, with references made to other modes in the program flow where relevant. Referring to FIGS. 41, 41A and 41B, for Primary and Secondary Pattern modes, the flow through the sync interrupt is as follows:

Upon entering the sync interrupt routine, the software cylinder counter is incremented by one count and is checked to determine if it registers a value exceeding the number of cylinders of the engine. If so, the cylinder counter is reset to one, and the main microprocessor sets signal HANDSHAKE to logic low. The signal HANDSHAKE was set to logic high in order to reset the hardware cylinder counter upon the occurrence of next SYNC-X pulse. Next, a software delay of approximately 80 microseconds is established by timer 1. During this time, the main microprocessor input line for the #1 SYNC-X pulse is checked for the existence of that pulse. If the #1 SYNC-X pulse occurs, the software cylinder counter is set to one (1). This ensures that the software cylinder counter maintains an accurate count of the cylinder firings as they occur.

If the software cylinder counter is set to one, a bit is cleared to signify to the dwell routine that a new engine cycle is beginning. Also the status of keeping RPM time counts is checked. If RPM counts are not being kept, a flag is set so that RPM counts will be kept for the next cycle. If RPM counts have been kept during the last cycle, this flag will already exist and another flag is set to indicate that no more counts should be kept. Both of these flags are cleared once the counts stored are used to calculate the RPM value. Time counts for RPM are accumulated for a full engine cycle.

If this occurrence of the sync interrupt is the first time for the Primary (or Secondary) Pattern mode since powering up the unit or since a RESET, and if the engine to be tested is a six cylinder engine, the next two occurrences of this interrupt will check the first time durations for firing times of the first and second cylinders in the firing order which are used to determine if the engine is an odd six type. An odd six engine is one in which the times between firings of consecutive cylinders are unequal. This is done by checking if the time count for the longer duration cylinder is greater than 125% of the time count for the other cylinder. If so, an odd six engine situation is assumed. These operations are bypassed in the program flow for Alternator, Fuel Injection, Voltage Pattern modes and Dwell, Cylinder Shorting, and KV Bar Graph modes.

The data representing the number of cylinders selected is checked to determine if that number is one (1). If so, the VCO time counts are kept on a single cylinder basis. Otherwise, for engines with multiple cylinders, the VCO time counts are kept on a two cylinder time duration basis. Software timer 0 is run for the two cylinders and then its value is stored in a register within the main microprocessor. The process of storing these counts is as follows: If this is an odd numbered cylinder and counts are not already waiting for a calculation, the timer value is stored and a flag is set indicating that a VCO calculation is needed; if this is an even numbered cylinder, no time counts are kept; if a calculation is waiting to be made, no time counts are kept and program flow continues. The preceding operations are bypassed for Voltage Pattern modes and Dwell, Cylinder shorting and KV Bar Graph modes. Fuel Injection mode, sync signals are derived from the fuel injector pulses.

Next, the flags determining whether RPM time counts are to be kept are checked, and if so, and this interrupt is due to an odd numbered cylinder, the time counts are added to a running sum kept for the entire engine cycle.

The cylinder counter is checked to determine if the last cylinder in the firing order is active, and if so, a condition is set-up so that after a two millisecond delay time by timer 1, the signal HANDSHAKE is set to logic high to enable the next SYNC-X pulse to reset the hardware cylinder counter. These operations are bypassed for Alternator, Fuel Injection, Voltage Pattern modes and Cylinder Shorting and KV Bar Graph modes.

The main microprocessor increments the "next cylinder" counter or sets that counter to one if the value would have been greater than the number of cylinders. These operations are also done for the three bar graph modes.

The peak KV value of the next cylinder is written out to a hardware latch in the port expander 201 (FIG. 17) where upon the occurrence of the SYNC-X pulse generated in response to firing of the next cylinder in the firing order, the peak value is inserted into the waveform data for display at the proper time. Then, if a flag indicates that a transfer of program flow to the Freeze routine is desired, a "number-of-cylinders" more interrupts will be allowed to occur, then another flag will be set allowing the transfer to occur.

If a flag indicating that shorting of cylinders can occur is present, the value of the cylinder to be shorted is compared with the value of the next cylinder and if they match, a flag is set so that shorting will start after a two millisecond delay set by timer 1. After this delay, the output line SHORT-X of the main microprocessor is set low. For Shorting Bar Graph mode, timer 1 is then reset to zero and is incremented once every microsecond to count seconds for use in indicating and displaying the time the cylinder is shorted: the timer 1 count is stored in a register of the main microprocessor each time a count of one second is reached. If the next cylinder is not to be shorted, the signal SHORT-X is set to logic high. These functions are also executed for the Cylinder Shorting Bar Graph mode.

The conditions determining if the peak value of the next cylinder is to be captured are checked next. If the slow A/D converter 37 (FIG. 15) is presently running, the sync routine is exited. Otherwise, if the number of the next cylinder desired matches the value of the next cylinder counter, the peak gate 119 (FIG. 15) is enabled after a two millisecond delay timed by timer 1, to gate the selected signal to the peak detector circuit 120 (FIG. 15). The sync interrupt routine is then exited. If the slow A/D converter 37 (FIG. 15) is prepared to capture the peak value of the selected signal, then the peak gate 119 is disabled and the slow A/D converter 37 is enabled via run line and the sync routine is exited. These functions are also executed for the KV Bar Graph mode.

When the slow A/D converter 37 finishes its conversion, the slow A/D converter STATUS output is set high generating a further interrupt, the convert complete interrupt routine is entered to control the main microprocessor in reading the data provided by the slow A/D converter. This operation is done for all modes except Dwell and Cylinder Shorting Bar Graph modes.

RPM Calculation

RPM values are determined by timing the duration between two consecutive #1 SYNC-X pulses and then manipulating that time duration. For all modes except Fuel Injection and Dwell Bar Graph, the time counts are collected by the sync interrupt routine with the use of software timer 1. For Fuel Injection and Dwell Bar Graph modes, the RPM counts are obtained using software timer 0. When the full engine cycle duration has been obtained a flag is set to indicate that an RPM calculation is needed. The program flow through the selected mode will detect that flag and the flow will be diverted to do the RPM calculation.

Referring to FIG. 41C, upon entering the RPM calculation subroutine, a flag is set that will prevent interrupts from using the math subroutines since such use would destroy the RPM calculation. This flag will be removed after the RPM math is completed.

The RPM time counts are first adjusted to compensate for 2 cycle or 4 cycle engines by dividing the RPM time counts obtained for four cylinder engines by two. All RPM time counts are then divided by four to allow the math to take place in three-byte register groups.

A scaling factor of 15,000,000, is then divided by the adjusted RPM counts and the resultant is stored as the new RPM value in the two byte RPM registers. Actually, the scaling factor would be 60,000,000 (the number of microseconds in one minute), but to simplify the math, a scaling factor of 15,000,000 is used, and the number of clock pulses is divided by 4 as mentioned above.

If an RPM Set point exists, the RPM value is compared to the set point value and if the RPM is equal to or greater than the set point value, a flag is set to indicate that condition. The flag will be checked in the normal mode loop, and if the flag is set the CRT display will be frozen.

The registers and bit flags used in accumulating the RPM counts are then zeroed and the program flow returns to the mode that accessed this subroutine.

VCO Calculation

During any waveform mode, the VCO data word is used to control the VCO clock generator 204 (FIG. 18) which generates a VCO clock signal that varies as a function of engine RPM. As previously described, the VCO clock signal is used to set the sampling rate for the fast A/D converter 38 (FIG. 19) to maintain the waveform sample rate at a value such that 512 samples will be taken of a certain part of the input signal. This typically means that 512 samples will be taken during a one cylinder period of the engine cycle. The sampling is performed evenly during that time. If the displayed waveform is to be expanded, the 512 samples will all be taken in a time period of less than one cylinder duration and they will be grouped around the occurrence of the firing line of any given cylinder.

The VCO clock signal is also used to increment the A/D address counter 225 (FIG. 18A) to synchronize the storage of the waveform data samples in memory with the operation of the fast A/D converter.

When the Fuel Injector mode is selected, the VCO data word is adjusted so that the resultant VCO clock signal rate will cause the waveform for four fuel injector solenoid firings to be displayed simultaneously. When the Voltmeter mode is selected, the VCO data word is set to a constant value providing a preselected constant frequency VCO clock signal. For all other waveform modes the VCO data word is adjusted periodically to compensate for engine RPM variations.

As described previously, during the sync interrupt routine, the timer 0 is enabled to count pulses at a one megahertz rate for a time interval corresponding to the firing time for two successive cylinders in the firing order. When the sync interrupt determines that two subsequent cylinder firing cycles have been completed, the timer 0 count is maintained and a flag is set indicating that a VCO calculation is needed. During the program loop for the active mode, that is Primary Pattern mode, Secondary Pattern mode, etc., that flag is detected and the VCO calculation subroutine is accessed.

Referring to the flow chart of FIG. 41D, upon entering the VCO calculation subroutine, a flag is set that will prevent any interrupts that occur from using the math subroutine since such use would destroy the VCO calculation. The flag is removed after the VCO calculation is complete.

If either the Fuel Injector or Voltage Pattern mode is active, the timer 0 count value is stored in a temporary register to be used for millisecond calculations for the Cursor/Msec feature should they be desired. When the Fuel Injector Pattern mode is active, the value of the timer 0 counts is doubled prior to calculating the VCO data word. This will result in a VCO clock signal that provides a display of four fuel injector pulses on the CRT display. For all other modes, the timer 0 count is divided by two such that the resultant VCO clock signal will provide a display of the waveform for only one cylinder.

A scaling factor of 8,387,492 (or 9,239,910 if the calculation is for Primary or Secondary pattern modes of an odd six cylinder engine) is divided by the adjusted timer 0 count.

The scaling factor of 8,387,492 takes into account transfer function characteristics of the digital/analog converter 205 (FIG. 18D) (which has a 2.44 mv/bit resolution) and of the voltage/frequency converter 207 (FIG. 18D) (which has a 25/KHz volt resolution), yielding a factor 61.04 Hz/bit (approximately), and the number of samples (512 per waveform in this example).

For example, for a six cylinder, four cycle engine, when the engine speed is 3000 RPM, the VCO rate would be about 76.8 KHz. At 2000 RPM, the VCO rate would be about 51.2 KHz. For an engine speed of 1000 RPM, the VCO rate would be approximately 25.6 KHz.

The value of the VCO data word is multiplied by the waveform expansion factor selected by the operator. The waveform expansion factor can have a maximum value of four for Primary and Secondary Pattern modes or a maximum value of six for alternator, Fuel Injector, and Voltage Pattern modes. The minimum value for the waveform expansion factor is one. The waveform expansion factor is entered by the operator. To expand the waveform, the operator depresses the RT ARROW/SPCL TRIG key. To contract the waveform, the operator depresses the LEFT ARROW/STD TRIG key. As long as the RT ARROW/SPCL TRIG key is held depressed, a register in the main microprocessor is incremented under software control up to the maximum count which is four for Primary or Secondary Pattern modes or six for the other waveform modes. When the LEFT ARROW/STD TRIG key is held depressed, the register is decremented back to a count of one.

Increasing the VCO value, with its attendant increase in the sampling rate, will result in sampling of a smaller portion of the waveform which in effect will expand the size of the portion of the waveform as displayed on the screen. For example, if the waveform expansion factor is 2, the VCO rate of 17 KHz, for an engine speed of 1000 RPM, will be doubled to 34 KHz.

The resultant VCO value is checked to be sure that it is not larger than 4095 (FFF H) as this is the largest value for the VCO data word that can be applied to the digital-to-analog converter 205 (FIG. 18D). If the value is too large, this entire calculation is ignored and the previous VCO value is maintained. If the resultant is within range, the new VCO data word is transmitted to the port expander which will send the VCO data word to the digital-to-analog converter 205 (FIG. 18D).

RPM Set Point Feature

Figure 42:
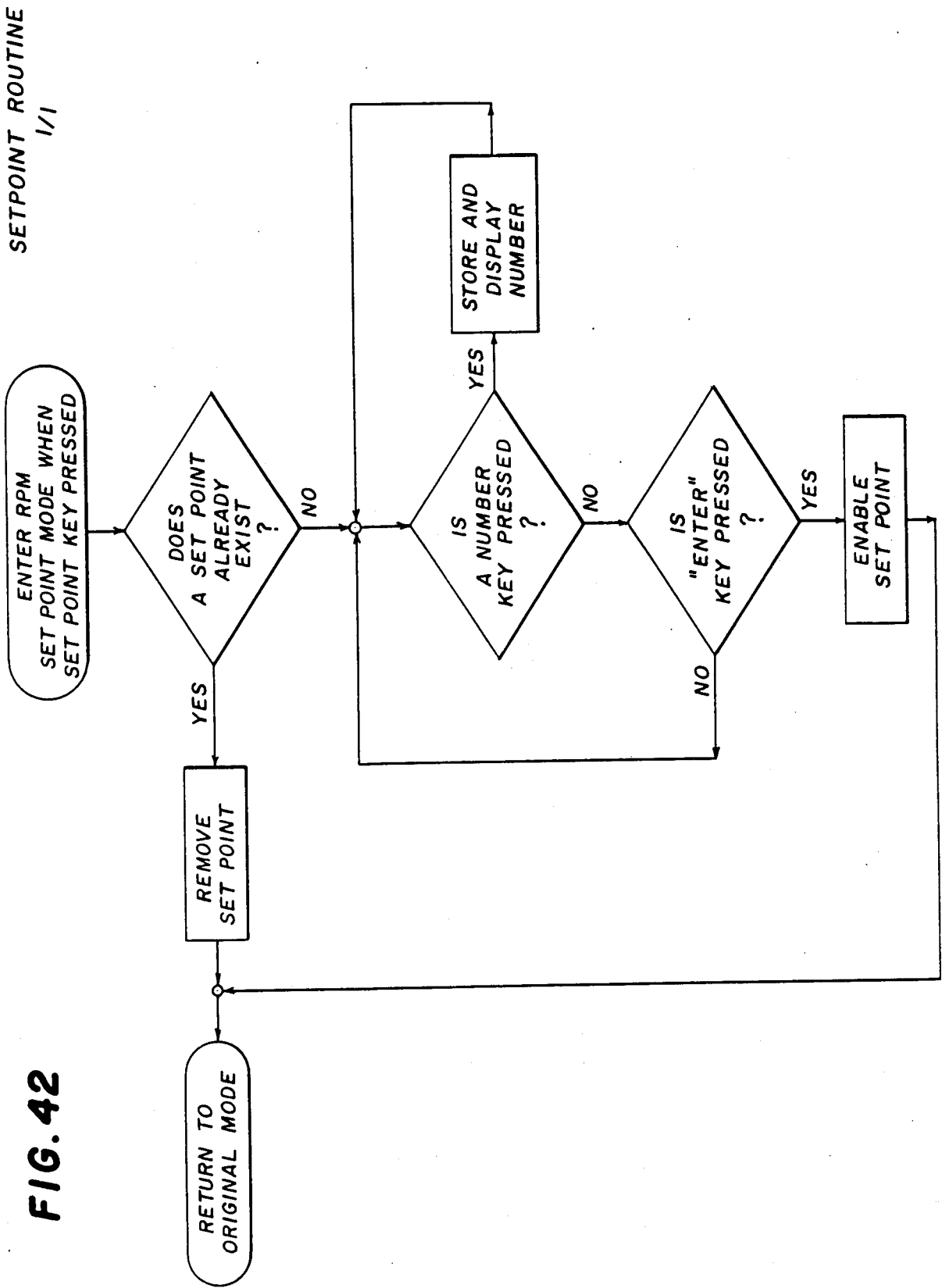
FIG. 42 depicts the flow chart for the RPM Set point.

Referring to the flow chart of FIG. 42, the RPM Set Point feature subroutine is entered whenever the RPM SET POINT key is depressed. If the RPM Set Point feature was previously inactive, the display microprocessor causes the title SET POINT and the set point value to be written on the screen. The set point value is initially written as four zeros on the screen with the right-most zero being highlighted in flashing inverse video. As each digit of the set point value is entered via the keyboard, the number representing the digit entered is displayed on the CRT screen in the right-most position with numbers previously entered shifting one space to the left. When the ENTER key is depressed, the flashing cursor is removed, the set point value entered is enabled and the program returns to its original mode.

The serial interrupt routine (FIG. 44) handles the receipt of data from the main microprocessor. To indicate that the RPM Set Point feature has been selected, the main microprocessor first sends a mode word 13H to the display microprocessor which designates entry into the RPM Set Point mode. Subsequently, the main microprocessor again sends the mode word 13H followed by data representing the key number for the first digit being entered for RPM set point value. The data word is stored in the display microprocessor. Up to four successive digits can be entered enabling selection up to 9,990 RPM for a set point. The data for each digit being preceded by the mode word 13H. Once the four numbers are sent, should a 5th number be entered, the first number originally entered will be shifted out of the display microprocessor and the new number will be shifted into the display microprocessor. This process will continue until an enter command, generated by the main microprocessor in response to detection of ENTER key operation, is sent to the display microprocessor.

To clear the RPM set point value, the set point mode word 13H is sent from the main microprocessor followed by the mode word 13H and a code word FFH which instructs the display microprocessor to clear RPM set point information from the screen. The display microprocessor then clears the screen of numerics and the RPM set point value and title.

Freeze Feature

Figure 43A:
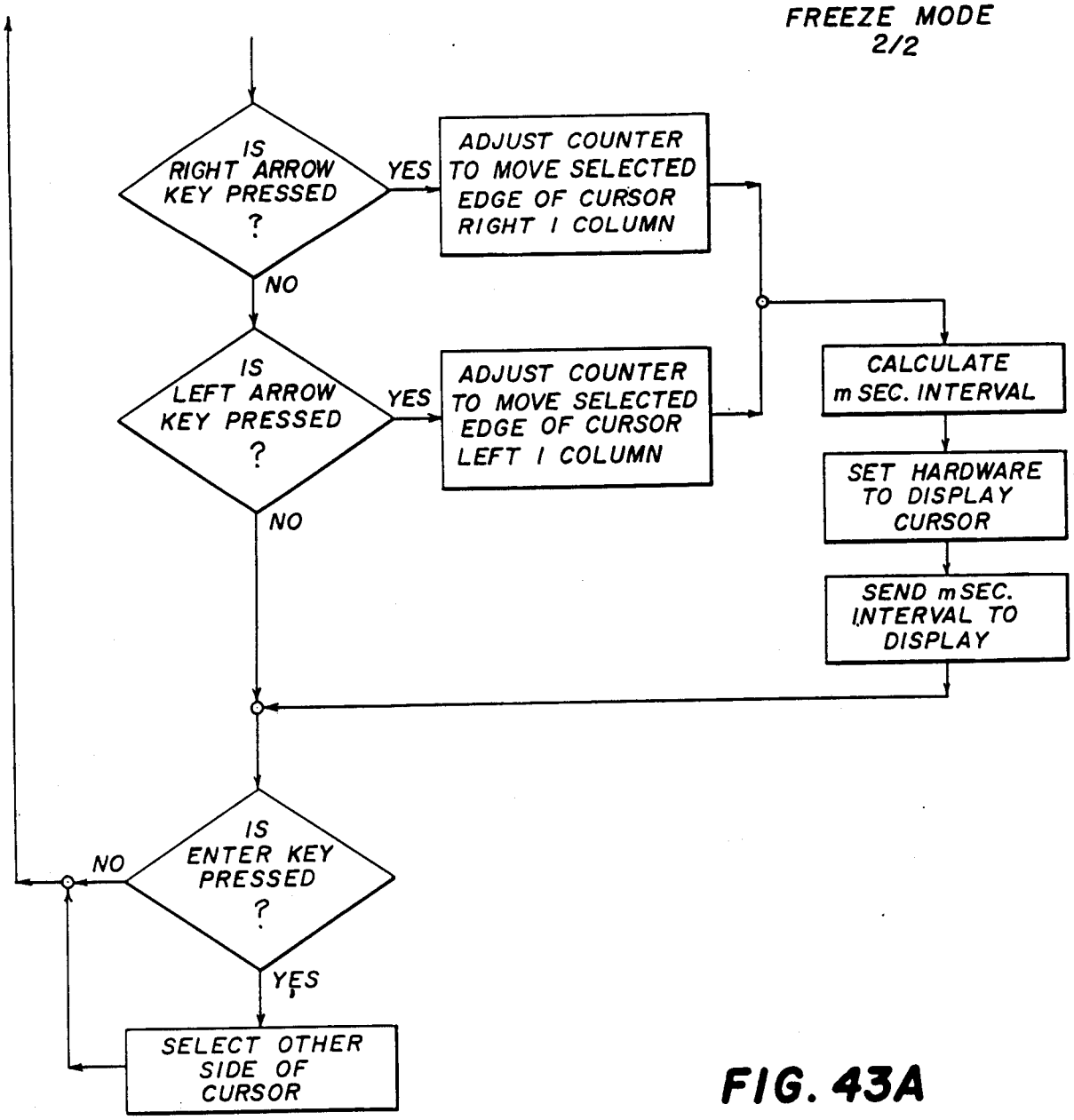

Referring to FIGS. 43 and 43A, throughout the main portion of the program of the display microprocessor, the status of Freeze feature, the Memory feature and Cylinder Shorting Selected feature are checked. If the Freeze feature is selected, as indicated by the transmission of the code word 12H from the main microprocessor to the display microprocessor, the word FROZEN is written to the screen (FIG. 14). If the Freeze feature is not selected, this screen area is constantly being cleared. The same operations are provided for the Memory feature. The Cylinder Selected feature is also checked to determine if the cylinder selection has changed. The number for the cylinder selected is displayed in inverse video. If the number of the cylinder selected has changed, the previously selected number of the cylinder presentingly selected is displayed in inverse video.

Referring to FIG. 43, when the Freeze feature is activated, the freeze hardware (explained in section entitled "Waveform Memory Circuits") is enabled, the main microprocessor checks the keyboard and the program then checks the keyboard to determine if a key is depressed. If a number key is depressed, a determination is made as to whether or not the key corresponds with the number of cylinders. If not, the keyboard is checked again. Otherwise, a determination is made as to whether or not Primary or Secondary Pattern mode is selected. If not, the keyboard is checked again. Otherwise, the display is changed to display the cylinder number selected. The keyboard is then checked again.

If a key is depressed and it is not a number key, then a determination is made as to whether or not a function key is depressed. If so, the Freeze feature is disabled and the selected mode is entered. If not, a determination is made as to whether or not the FREEZE key is depressed. If so, the Freeze feature is disabled and the last mode active is reentered. If not, a determination is made as to whether or not a waveform mode key is depressed. If not, the keyboard is checked for a key depressed. Otherwise, checks are made to determine if either one of the RT ARROW/SPCL TRIG or LEFT ARROW/STD TRIG keys are depressed. If either key is depressed, the column counter is adjusted and the millisecond interval is calculated, and sent to the display microprocessor. When the ENTER key is depressed, the other edge of the cursor curtain is selected for adjustment.

For the serial interrupt routine (FIG. 44), a check is made for the code word 12H used to select the Freeze feature. In the case of the Memory feature, a check is made for a code word 15H. Receipt of code word 12H sets the freeze bit which instructs the display microprocessor to write the word FREEZE to the screen. Once that bit is set, the bit cannot be cleared until any mode word is subsequently received from the main microprocessor. If the mode word received is that for the present mode, the word FREEZE is cleared from the screen and the display microprocessor remains in that mode, Otherwise, the display microprocessor will move into the new mode with the Freeze feature disabled.

Once the Freeze feature is activated, if another Freeze code word is sent, then the display microprocessor sets up to receive another four more bytes of data which is millisecond data. Once the four bytes of data of millisecond data are received, the display microprocessor converts the millisecond data from hex to decimal and then sets the cursor millisecond flag and writes milliseconds and the data to the screen. A code word 14H sent to the display microprocessor while in the Freeze feature indicates that there is to be a change in cylinder selected. Initially the cylinder selected is set up to receive the new cylinder number. Once the new cylinder number is received, a check is made to determine if the Freeze feature is active. If so, the display microprocessor prepares to receive one more byte of data which represents the new KV values. Otherwise, the program returns to normal operation.

Milliseconds Subroutine

Figure 43B:
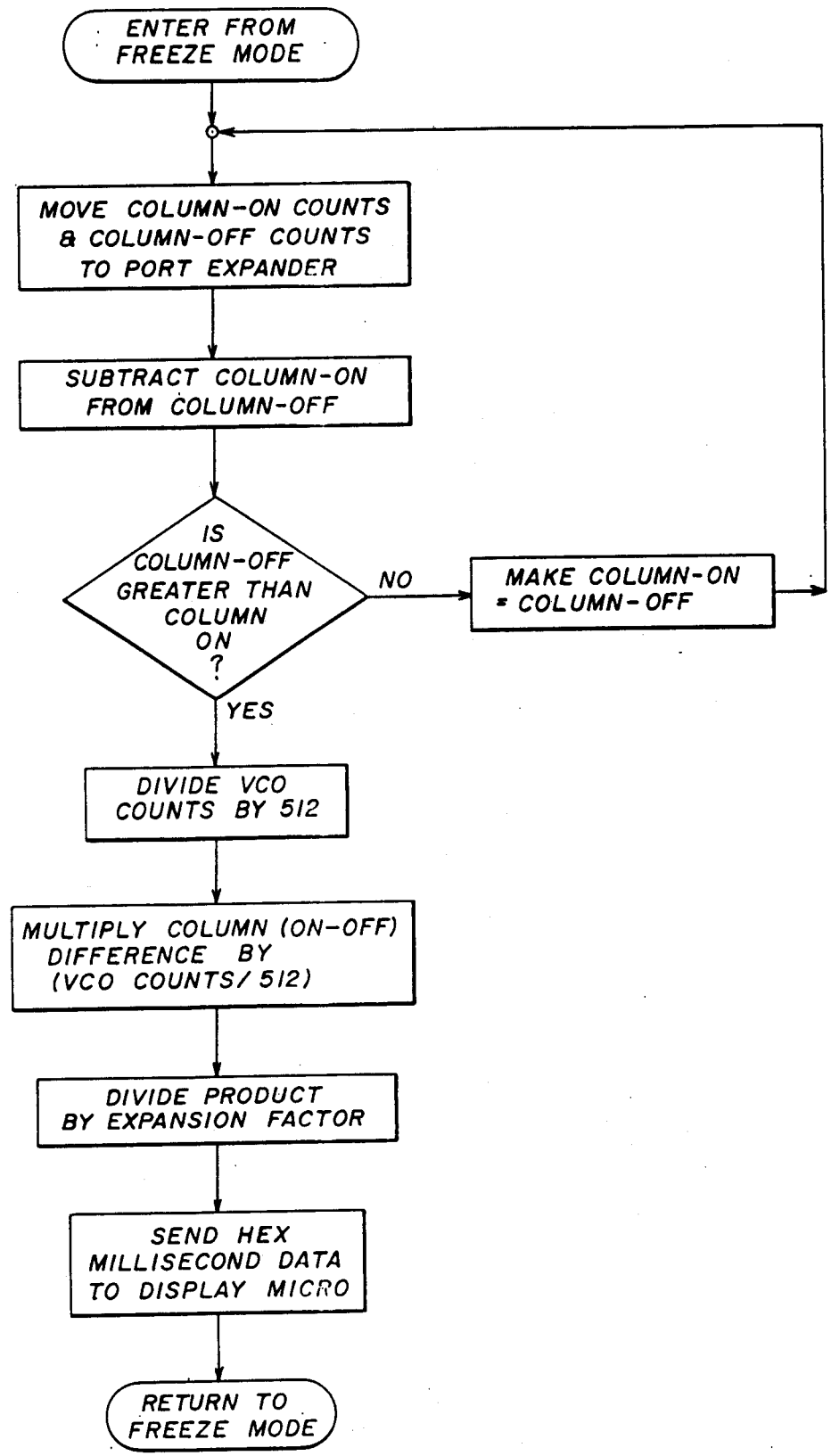
FIGS. 43B depicts the flow chart for the millisecond calculation subroutine.

Referring to FIG. 43B, the millisecond calculation subroutine is entered in response to the operator manipulating the keyboard arrow keys LEFT ARROW/STD TRIG or RT ARROW/SPCL TRIG while a waveform pattern is displayed on the CRT screen and the freeze or memory feature is activated.

The RT ARROW/SPCL TRIG and LEFT ARROW/STD TRIG keys are used to increment or decrement either of two software counters, column on count and column off count. The state of a cursor select flag indicates which of the two counters is to be effected by a key action. The cursor select flag is toggled in response to depression of the keyboard ENTER key. The column on count is used to control where the left edge of the cursor "curtain" displayed on the CRT screen begins and the column off count is used to control where the right edge of the cursor "curtain" displayed on the CRT screen ends.

The millisecond subroutine is accessed immediately after it is determined that the LEFT ARROW/STD TRIG or RT ARROW/SPCL TRIG key is depressed and the column on or column off value is adjusted. The values of the column on count and column off count are sent to port expander 201b (FIG. 17) as signals COL ON and COL OFF for application to the curtain circuit 273 (FIG. 23) to control the width of the "curtain" displayed on the CRT screen. Then, the column on counts are subtracted from the column off counts. If the column on count is greater than the column off count, the column on count is set equal to the column off count and the subroutine is exited.

If the column off count is greater than the column on count, the waveform time counts saved for the millisecond calculation in the VCO calculation subroutine are then divided by 512, and this quotient is multiplied by the difference between the "on count" and the "off count". The VCO count represents the total time for obtaining the 512 samples of the waveform being displayed, and by dividing the VCO counts by 512 the resultant value represents the time for one sample. This value is multiplied by the difference between the "on count" and "off count" yielding the time duration for that portion of the waveform contained within the "curtain". This value is then divided by the waveform expansion factor calculated in the VCO calculation subroutine previously described.

The resultant value represents the time duration in milliseconds of the curtain area. This value (in hexadecimal code) is sent to the display microprocessor, converted to decimal numbers and displayed on the CRT screen. The millisecond subroutine is then exited.

Serial Interrupt Routine (Display Micro)

Figure 44:
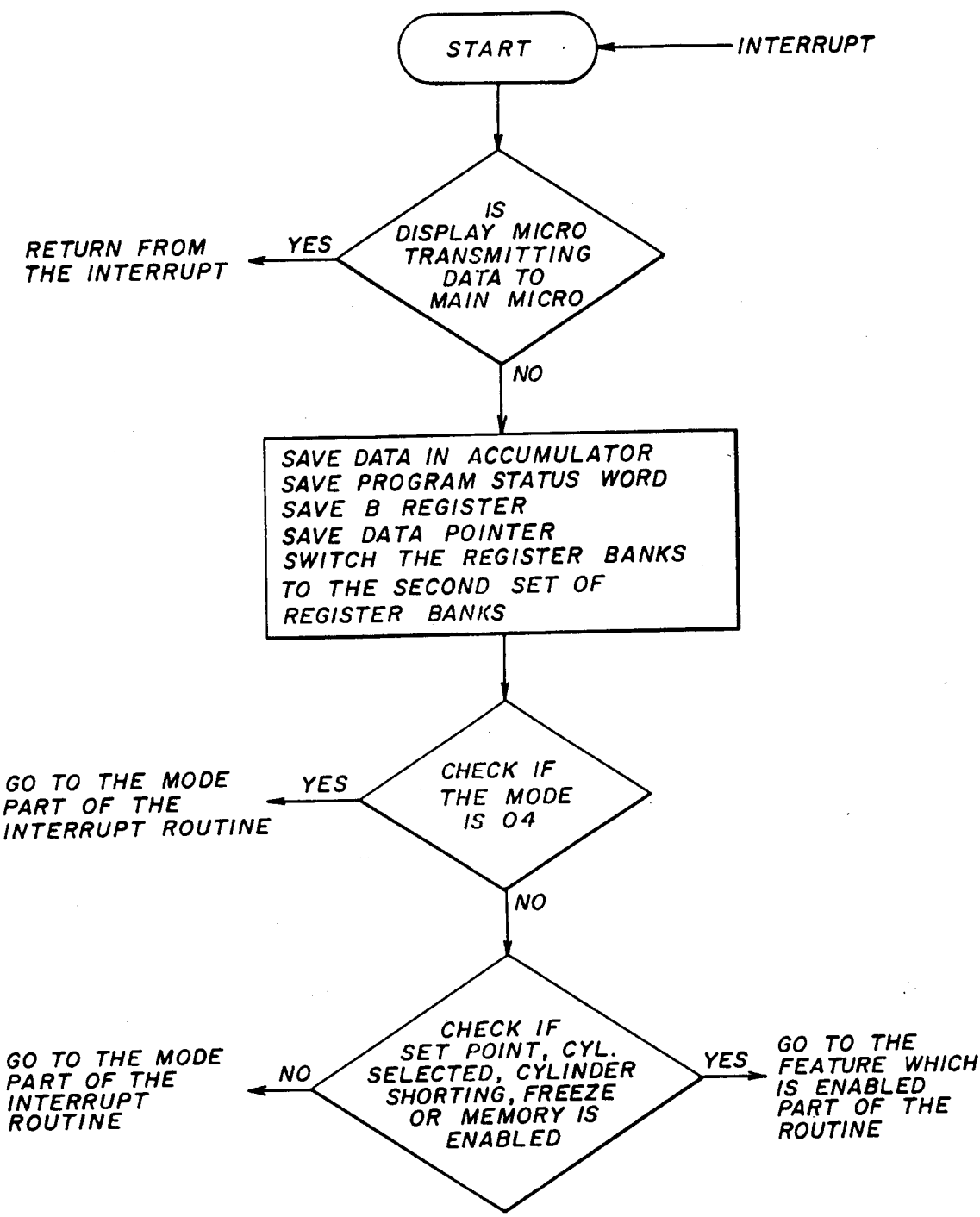

Referring to FIG. 44, both the main microprocessor and the display microprocessor have serial interrupt routines which are entered when data is being received or transmitted by the microprocessors. The serial interrupt routine for the main microprocessor indicates to the main microprocessor that the display microprocessor is ready to receive more data. The serial interrupt routine for the display microprocessor controls the display microprocessor in receiving data from the main microprocessor, processing, formatting and storing the data.

The display microprocessor runs through the main part of its program during normal operation until data is sent from the main microprocessor to the display microprocessor. At that time, the data transmission produces an interrupt in the display microprocessor. In servicing this interrupt, the display microprocessor will halt at any point in the main program and revert to the serial interrupt routine, and execute the serial interrupt routine. After it has completed the tasks in the serial interrupt routine, the display microprocessor returns to the point in the main program where it had left restoring itself to its original status before the interrupt occurred, and proceeds through normal opertions of the main program.

When the first entering the serial interrupt routine, the display microprocessor first checks to determine if data is being transmitted to the main microprocessor. When the display microprocessor transmits data to the main microprocessor, there is created the same interrupt as if data were being received from the main microprocessor. In checking for this, if the display microprocessor is transmitting data, the display microprocessor will ignore this interrupt and return to the main program at this point. If the display microprocessor is not transmitting data to the main microprocessor then data is being received from the main microprocessor. The display microprocessor will then proceed to save the data stored in the accumulator. The program status word is also saved as is data that is in a display microprocessor interval register and the data pointer. This is all necessary so that when the display microprocessor returns from this interrupt routine, the display microprocessor can restore itself to the conditions existing before the interrupt and proceed through the program without having altered data in these registers.

The display microprocessor also will change to a different internal register. The display microprocessor has four sets of registers. In the main part of the program, the display microprocessor uses a first set of registers upon entering the serial interrupt routine, the display microprocessor will switch to a second set of registers to save any data in the register banks stored in connection with operation in the main part of the program.

After the display microprocessor saves the data as necessary, the display microprocessor proceeds to check if the mode 00 to 04 is selected. If so, the program proceeds to a part of the serial interrupt routine which is related to the modes 00-04. This is done because after this point a check is made to determine if RPM Set point, Cylinder selected, Cylinder Shorting, Freeze, or Memory mode is selected. These features are not active and, therefore, do not have to be checked in the initial modes 00-04. In modes greater than 04 or 05, a check is made to determine if any of these conditions exists. If one of these conditions has been enabled the program proceeds to the part of the serial routine relating to the active condition and proceeds from there. If not of these features or modes are enabled, the program proceeds to the mode part of the interupt routine.

There are 22 mode words sent over from the main microprocessor to the display microprocessor. This includes all the features and functions of the unit as well as the data entry screens and the start-up screens. The display microprocessor, when receiving data, will be in a data reception condition for a specific mode and at that point the display microprocessor enters a section of its serial interrupt routine which is concerned with that mode.

By way of example, the following is a description of a typical data handling condition in one mode. This is very similar to how all the mode routines or subroutines handle the data transfer from the main microprocessor to the display microprocessor.

Referring to FIG. 44A, in a typical data transfer from the main microprocessor to the display microprocessor, the serial interrupt routine detects when a word is sent over from the main microprocessor. It is stored in a serial receive register. At that point, when moving into the serial interrupt routine, the display microprocessor will move the data that is in the serial receive register into the accumulator. The display microprocessor will then check to determine if this data should be saved.

When initially moving into a mode, the display microprocessor first receives a mode word and checks to determine if a new mode is to be entered. If so, the display microprocessor is set up to move into that mode, and at that point prepares to receive data which pertains to that mode. After that occurs, the display microprocessor is ready for full data transfers in that mode, which will be formatted as the mode word for that mode followed by a specified number of bytes of data. That operation will continue until a different mode is received. At that time, the display microprocessor again enters the new mode and follows the same order.

Moving through a data transfer in a typical mode, the display microprocessor will first check to determine if this data should be saved. If the data is not to be saved, the display microprocessor checks to determine if this is the first time the display microprocessor is in this mode. If this is a new mode, the display microprocessor sets itself up to move into this mode and prepares to put up the formatted screen for that mode and set up internal registers to handle data transfers and calculations necessary for that mode. After that the display microprocessor returns to the main portion of the program which was being executed before the interrupt. If this is not the first time in the mode, the display microprocessor will set up for a full data transfer.

Setting up for a full data transfer includes preparing address locations necessary to place the incoming data and preparing for the amount of data that will be transferred. After this is done the display microprocessor again returns to the main portion of the program until more data is received. When the data is received, a check is made to determine if this data should be saved. The display microprocessor then checks to determine if this is the last piece of data for a full data transfer. If not, this data is placed into the proper memory location and then the display microprocessor returns back to the main part of the program. If this is the last piece of data being transferred over, the display microprocessor will save this piece of data, indicate that a full data transfer has occurred, set up to convert any data that will have to be converted, and then prepare for another full data transfer.

For features such as Cylinder Selected, Freeze, Memory, and Cylinder Shorting data transfers are not handled as in the case of modes.

For Cylinder Selected feature, a word is sent over indicating that a change in the cylinder is going to occur. After that, another byte of data is sent over indicating what the new cylinder selected is to be. After those two transfers have occurred, the display microprocessor then returns for normal transmission of data in the mode which is active.

For Freeze or Memory features, the display microprocessor will receive a mode word indicating one of these conditions. These two conditions are very similar in their operation. The display microprocessor will receive a word indicating freeze or memory has occurred. At that point the display microprocessor will expect only data transferred as dictated by a freeze or memory type condition. In this state, the display microprocessor will be in a mode, but it will be in a freeze or memory condition. This means only during cylinder selected will KV numbers change on the secondary pattern and incoming data transfers are not allowed at this point. The only way to have a normal data transfer is to move out of the freeze state. In the freeze state, cursor millisecond data is possible. Whereas cursor millisecond data cannot be transmitted during normal mode operation.

Cylinder Shorting data transfer is indicated only by whether a cylinder is being shorted or is not being shorted, and only occurs when necessary.

Convert Complete Interrupt Subroutine

Figure 45A:
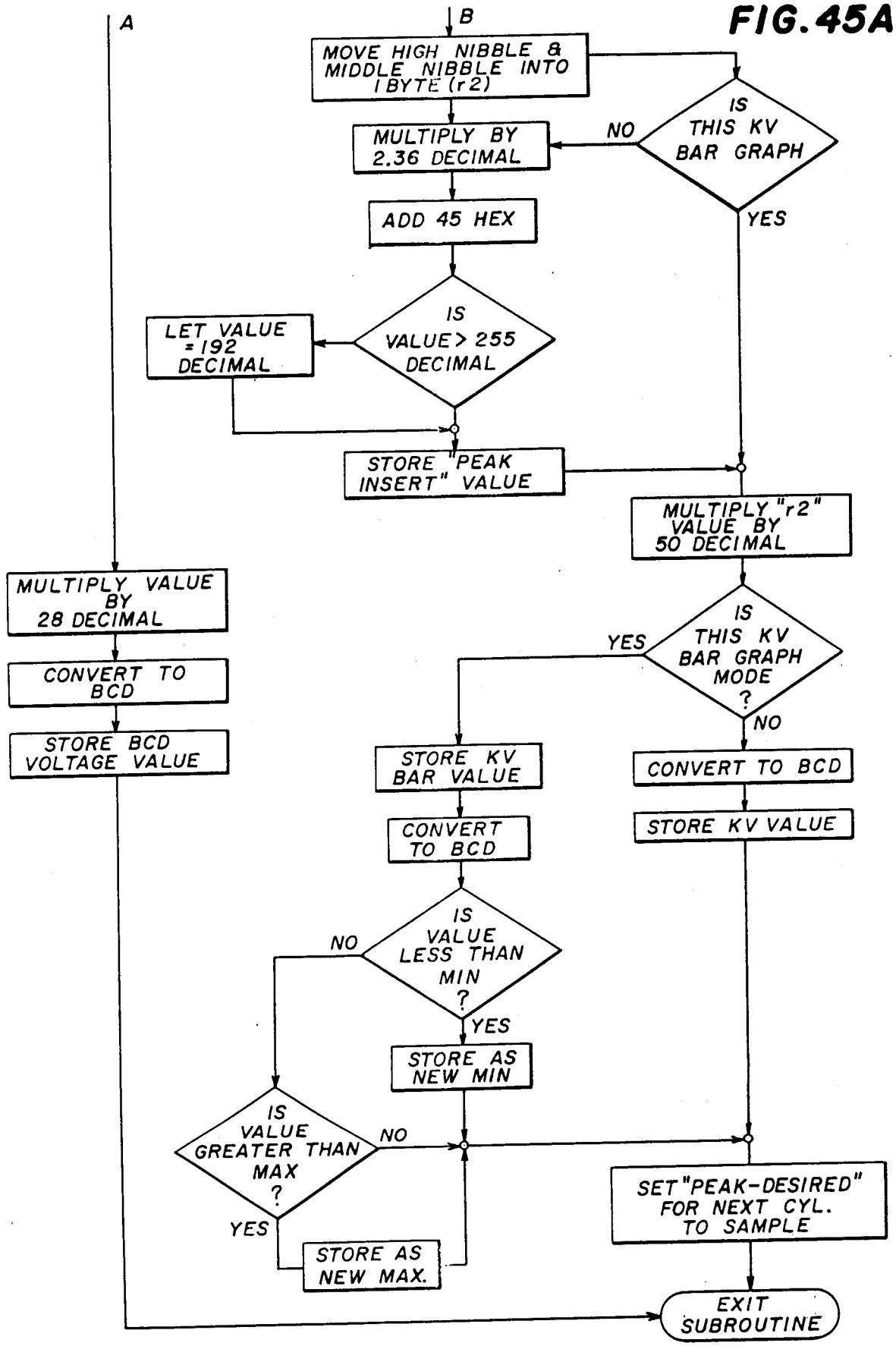

Referring to FIGS. 45, 45A, the convert complete interrupt service subroutine calculates and formats the peak insert values for Primary and Secondary Pattern modes, KV values for Secondary pattern and KV Bar Graph modes and voltage values for Alternator and Voltage Pattern modes.

As described previously in the section entitled "Sync Interrupt Routine", in the Primary Pattern mode, the Secondary Pattern mode, or the KV Bar Graph mode, the peak values are captured by the peak detector circuit 120 (FIG. 15) under the control of the sync interrupt routine. Once a peak value is captured, the slow A/D converter 37 (FIG. 17) is run and when its conversion is complete, the slow A/D converter sets high signal STATUS which interrupts the normal program flow in the main micro. For Alternator or Voltage modes, the slow A/D converter is run at regular intervals and the interrupt occurs to indicate that a voltage calculation can be made.

Upon entering the convert complete interrupt subroutine, the run line which controls the slow analog/digital converter is disabled, as are all devices that share the input/output bus lines to the main micro. The data provided at the output of the slow analog/digital converter is then read by the main micro using the bus line. The data is in two bytes, the higher order byte containing four output data bits, an overrange bit, and a polarity bit, and the lower order byte containing eight data bits. If the data represents a voltage value, all twelve data bits are used, as are the overrange and polarity bits. For KV values, only the upper order eight data bits are used. Thus, if the data is a KV value, the data is manipulated to drop the four lowest order bits and the sign and polarity bits, the remaining four bits of each of the two bytes being combined into one eight bit word. This byte is then stored.

If the data represents a voltage value, the overrange and polarity bits are checked and the data which will be sent to the display microprocessor are set to indicate the state of these bits to enable the word "overrange" or the polarity to be displayed as appropriate.

Referring to FIG. 45A, voltage values are scaled such that a voltage value FFFH (hexadecimal) received from the slow analog/digital converter represents a full scale value of 28 volts (the hardware is also calibrated for that full scale value). The voltage value received is multiplied by a scaling factor 28, and the scaled voltage value is converted to decimal and that value is stored. The subroutine is then exited.

Referring to FIG. 45B, for Primary or Secondary Pattern mode values, the data is multiplied by a constant 2.36 which will cause a 10 KV value to be located at the top of the waveform viewing area on the CRT screen. Next, an offset value 45H is added to that result so that when the peak insert value obtained is displayed, it is positioned properly relative to the zero line for the waveform into which it is inserted. That peak insert value is checked to ensure that it does not exceed a selected maximum value. If so, the peak insert value is replaced with a constant value which corresponds to the maximum height of the peak value that can be displayed, and this peak insert value is stored rather than the actual value obtained.

For Secondary Pattern mode and KV Bar Graph modes, the KV data is scaled, first by multiplying by a constant (50 decimal) and then by dividing by 256 to obtain scaled numeric KV values. The scaled values (in hexadecimal) are then saved for use in creating the KV Bar Graph display bars if that mode is selected. The scaled values are converted to packed BCD and stored for Secondary Pattern mode. For the KV Bar Graph mode, the scaled values are first compared to stored values representing the current minimum and maximum KV values and the new values are stored if they represent a change in the minimum or maximum values.

The pointer which selects the next cylinder for which a peak insert value is to be obtained is then set. As indicated previously, the time required for the slow A/D converter 37 (FIG. 17) to complete conversion of an analog peak value to a digital value is greater than the duration for one cylinder firing. Thus, to facilitate the fastest sampling for peak insert values for all cylinders, the sampling is done on an "every third" cylinder basis. For example, for an eight cylinder engine, the sample order is 1-4-7-2-5-8-3-6-1.

When the convert complete interrupt servicing is completed, the program flow returns to the point where it was before the interrupt.

Dwell Calculation Subroutine

Figure 46:
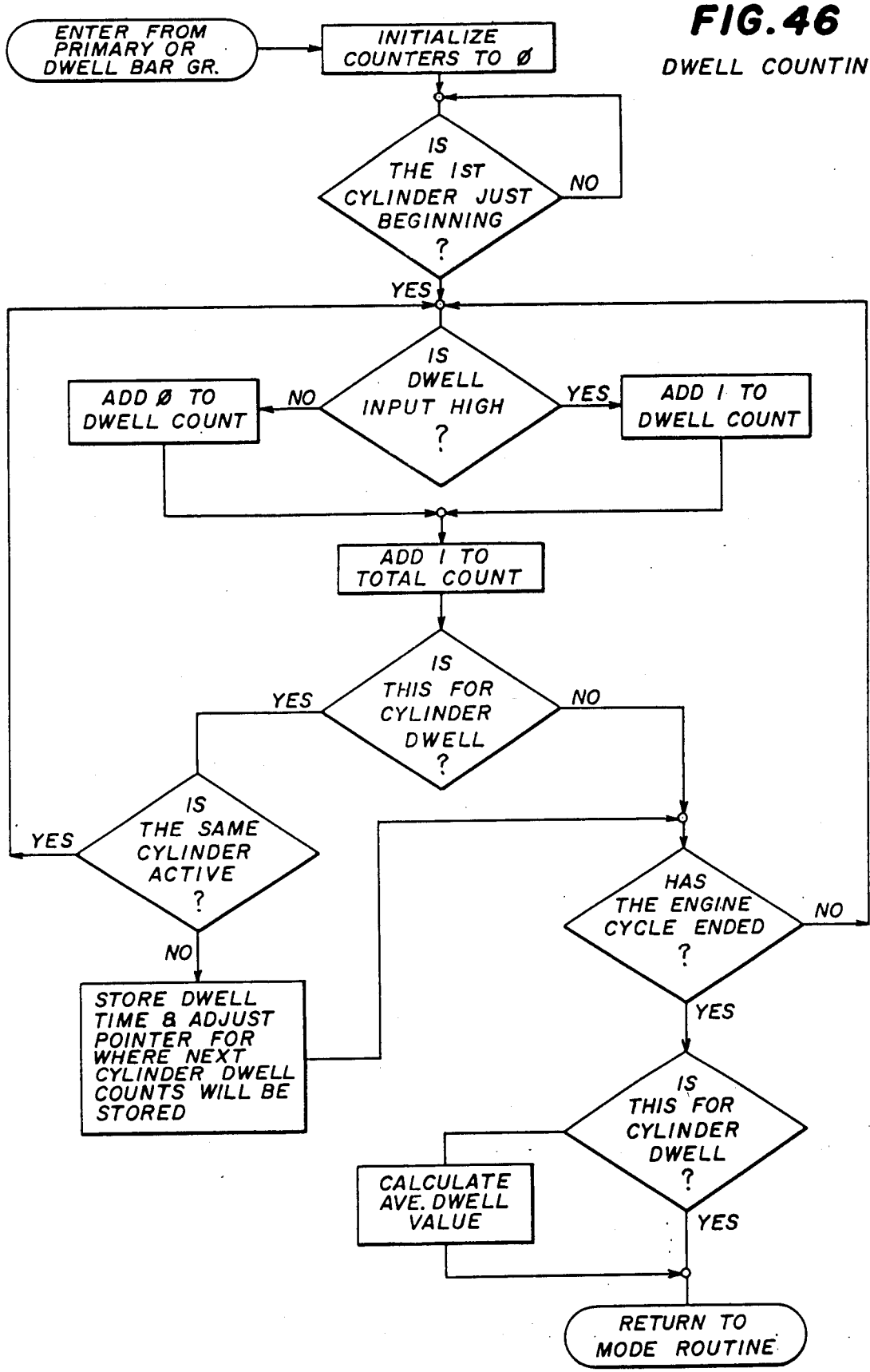
FIG. 46 depicts the flow chart for the dwell calculation subroutine.

Referring to FIG. 46, the dwell calculation subroutine accumulates time counts for calculation of dwell values. This subroutine is accessed from either the Primary Pattern mode or from the Dwell Bar Graph mode. The dwell input, signal DWELL-X, to the main microprocessor is derived from the Primary signal input by the analog circuits (FIG. 15). The Primary signal is conditioned such that an input level below two volts appear as a high logic level and all higher voltage levels appear as a low logic level. The high logic levels represent dwell time and the low logic levels represent anti-dwell time.

Upon entering the dwell subroutine, the main microprocessor sets dwell count registers to zero. The program enters a software loop, waiting for the occurrence of the #1 SYNC-X pulse. Upon that occurrence, the program sets high a flag indicating that it is in a counting state and advances into another loop in which, on each pass through, the state of the signal DWELL-X is checked. If the signal DWELL-X is high, one is added to the "dwell count register". On each pass through the loop, a one is added to a "total loops register". The flag that was set high to indicate the counting state is also checked on each pass through the loop. When the next #1 SYNC-X pulse occurs, the sync interrupt routine sets this flag low. Upon the next check of the flag in the dwell calculation subroutine, the dwell counting loop is exited.

Determining the value for dwell for individual cylinders is done in the same manner, with the additional step that the software cylinder counter is checked on each pass through the counting loop. Each time the software cylinder counter changes value, the contents of the dwell count register is stored, and the register is set to zero. The dwell count register then counts dwell time for the next cylinder. This routine ends in the same manner as for average dwell counts, when the next #1 SYNC-X pulse occurs.

When all dwell counts have been obtained, the dwell counts are converted to a dwell value. To obtain average dwell values, the dwell counts are divided by the number of cylinders of the engine. That result is multiplied by 360 (for 360 degrees per distributor revolution), and divided by the total loop counts. The resulting value is stored in the average dwell register.

For individual cylinder dwell values, the dwell count for each cylinder is multiplied by 360, divided by the total loop count, and then stored. After individual and average dwell values have been calculated and stored, the mode routine is reentered.

From the foregoing, it can be seen that there has been provided a microprocessor controlled digital engine analyzer which is smaller and less expensive than those heretofore available, and which is portable and can be powered by the DC battery voltage from a vehicle as well as AC power. The digital engine analyzer responds to analog input signals derived from the engine being analyzed and displays waveform patterns and/or information in alphanumeric or bar graph form on a CRT monitor. The digital engine analyzer includes circuitry which electronically splits the CRT screen into two sections, with the upper section displaying alphanumeric data and the lower section displaying waveform information in order to reduce the quantity of memory required and to alleviate the "traffic" on the system data bus. Two memory banks are provided for both alphanumeric and waveform data, and a memory bank switching arrangement is used to permit the memories to be alternately written to and read from. A read-only memory contains programmed patterns of various alphanumeric and graphic characters that are to be displayed on the CRT screen to enable greater flexibility on the characters displayed and making the circuitry and software required to produce the character is relatively simple. The digital engine analyzer includes circuitry which enhances waveform patterns displayed by filling in the dots even during fast rise and fall portions of an engine signal so that the waveform displayed appears continuous. Also, a peak value for the waveform is generated using a slow A/D converter and inserted into the waveform data in the appropriate location so as to be displayed on the CRT screen at the proper time to render more accurate the representation of the peak of the firing line displayed on the CRT screen. Circuitry shifts to the right on the CRT screen the firing of the cylinder so that the firing line portion of the waveform displayed and information prior to firing can be analyzed. Also, measurement of the time between two points on a displayed waveform is facilitated by generating a curtain or highlighted area between those points. Also, two complete fuel injector waveform periods can be displayed so that the time between the two consecutive fuel injector firings can be measured. The digital engine analyzer also includes means to select an engine speed at which a particular waveform is to be frozen, so that when the engine reaches that speed, the waveform is automatically frozen and can be viewed and examined by the operator. The digital engine analyzer further includes non-volatile memory which allows the operator to save data that has been frozen for any one of the waveform screens and all of the bar graph screens so that the data can be recalled later even after power has been removed. The engine analyzer derives synchronization signals from the analog input signals being provided, so that extraneous ignition signals do not affect the analyzer.

We claim:

1. An engine analyzer for analyzing analog signals produced by an internal combustion engine, comprising an analog-to-digital converter for converting the analog signals into digital signals, a cathode ray tube including a screen and an electron beam which is swept across said screen, said screen being defined by a plurality of beam rows and a plurality of beam columns, said screen being further divided into a plurality of character rows and a plurality of character columns defining a plurality of character areas, the electron beam scanning said screen along a row in one row after the next, the electron beam being selectively operable to illuminate selected points at the intersections of the beam rows and the beam columns, monitor means for monitoring the beam row in which the electron beam is sweeping at an instant of time, character ROM means having stored at a multiplicity of locations therein character matrices respectively corresponding to a multiplicity of characters and respectively being accessed by a multiplicity of character access signals, each character matrix being defined by m rows and n columns, memory means coupled to said character ROM means for storing character access signals for the character matrices to be displayed in the character areas, characters address means for addressing said memory means with respect to each character matrix one after another in each character now one character row after the other for supplying character matrices corresponding to the characters to be displayed respectively in the character areas, matrix row address means coupled to said character ROM means for causing one row of data for each character matrix selected by said memory means to be simultaneously released, said matrix row address means addressing the data in the first and last rows of each character matrix selected of said character ROM means for a single beam row and said matrix row address means addressing the same data in said character ROM means for two consecutive beam rows for the intermediate ones of said rows of each character matrix selected, whereby each character displayed is increased in vertical height for only said intermediate beam rows and the number of character rows displayed on the screen is $2(m-1)$, and data generator means coupled to said character ROM means for changing the data simultaneously released therefrom into a sequence of data.

2. The engine analyzer of claim 1, wherein said character address means includes a column address portion that increments at a rate no greater than the scanning rate of the electron beam divided by the number of beam columns in each character area, and a row address portion that increments at a rate equal to the output of said monitor means divided by the number of beam rows in each character area.

3. The engine analyzer of claim 1, and further comprising screen ROM means having stored at a multiplicity of locations therein data respectively corresponding to a multiplicity of formats to appear on said screen and respectively being accessed by a multiplicity of screen access signals, a microprocessor for developing alphanumeric information from the analog signals, the formats and the alphanumeric information being written into said memory means under control of said microprocessor.

4. The engine analyzer of claim 1, wherein said matrix row address means includes a counter which is advanced by the leading edge of a clock pulse to a count of m and is then reset by a reset pulse, the initial count up from the reset state of the counter being advanced one half clock cycle and the counter being reset one half clock cycle after it registers a count of m whereby said matrix row address means addresses the same data in said character ROM means for two consecutive beam rows except for the first and last rows.

5. The engine analyzer of claim 1, wherein said data generator means is clocked at one-half the scanning rate of the electron beam so that each pair of adjacent intersections is illuminated or not, thereby doubling the width of each character.

6. The engine analyzer of claim 1, wherein the number, m, of rows of each character matrix is 9 and the number of character rows displayed on the screen is 16, and the number, n, of columns of each character matrix is 7, said data generator means being clocked at one-half the scanning rate of the electron beam.

* * * * *

UNITED STATES PATENT AND TRADEMARK OFFICE
CERTIFICATE OF CORRECTION

PATENT NO. :  4,849,744
DATED      :  July 18, 1989
INVENTOR(S) :  Michael C. Putrow and Craig F. Govekar It is certified that error appears in the above-identified patent and that said Letters Patent is hereby corrected as shown below:

Column 82, line 7, "characters" should be --character--; and line 10, "now" should be --row--.

Signed and Sealed this

Nineteenth Day of June, 1990

*Attest:*

HARRY F. MANBECK, JR.

*Attesting Officer*     *Commissioner of Patents and Trademarks*